US009418986B2

(12) United States Patent
Uno et al.

(10) Patent No.: US 9,418,986 B2
(45) Date of Patent: Aug. 16, 2016

(54) SEMICONDUCTOR DEVICE

(75) Inventors: Tomoaki Uno, Kanagawa (JP);
Yoshitaka Onaya, Kanagawa (JP);
Hirokazu Kato, Kanagawa (JP);
Ryotaro Kudo, Kanagawa (JP); Koji Saikusa, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 13/589,160

(22) Filed: Aug. 19, 2012

(65) Prior Publication Data

US 2013/0049137 A1    Feb. 28, 2013

(30) Foreign Application Priority Data

Aug. 26, 2011  (JP) ................................ 2011-184430

(51) Int. Cl.
| | |
|---|---|
| *H01L 27/088* | (2006.01) |
| *H01L 23/495* | (2006.01) |
| *H01L 25/16* | (2006.01) |
| *H02M 1/32* | (2007.01) |

(Continued)

(52) U.S. Cl.
CPC ...... *H01L 27/088* (2013.01); *H01L 21/823487* (2013.01); *H01L 23/49524* (2013.01); *H01L 23/49562* (2013.01); *H01L 23/49575* (2013.01); *H01L 24/40* (2013.01); *H01L 25/16* (2013.01); *H02M 1/32* (2013.01); *H02M 3/156* (2013.01); *H01L 24/73* (2013.01); *H01L 25/074* (2013.01); *H01L 2224/05554* (2013.01); *H01L 2224/32245* (2013.01); *H01L 2224/40245* (2013.01); *H01L 2224/48091* (2013.01); *H01L 2224/48137* (2013.01); *H01L 2224/48247* (2013.01); *H01L 2224/73265* (2013.01); *H01L 2924/13091* (2013.01); *H01L 2924/181* (2013.01); *H01L 2924/30107* (2013.01); *H02M 2001/0009* (2013.01)

(58) Field of Classification Search
CPC ............. H01L 21/823487; H01L 2224/48247; H01L 2924/13091; H01L 23/49524; H02M 2001/0009; H02M 3/1588
USPC .................. 257/117, 676, 678, 690; 323/225
See application file for complete search history.

(56) References Cited

U.S. PATENT DOCUMENTS

| | | | | |
|---|---|---|---|---|
| 7,245,116 | B2 * | 7/2007 | Tateno et al. ................. | 323/316 |
| 7,342,391 | B2 * | 3/2008 | Tateno et al. ................. | 323/316 |

(Continued)

FOREIGN PATENT DOCUMENTS

| | | |
|---|---|---|
| JP | 2002-314086 A | 10/2002 |
| JP | 2008-017620 A | 1/2008 |

*Primary Examiner* — Jerome Jackson, Jr.
*Assistant Examiner* — Fang-Xing Jiang
(74) *Attorney, Agent, or Firm* — Shapiro, Gabor and Rosenberger, PLLC

(57) ABSTRACT

A semiconductor device is improved in reliability. A power MOSFET for switching, and a sense MOSFET for sensing a current flowing in the power MOSFET, which is smaller in area than the power MOSFET, are formed in one semiconductor chip. The semiconductor chip is mounted over a chip mounting portion, and sealed in a resin. To first and second source pads for outputting the current flowing in the power MOSFET, a metal plate is bonded. A third source pad for sensing the source voltage of the power MOSFET is at a position not overlapping the metal plate. A coupled portion between a source wire forming the third pad and another source wire forming the first and second pads is at a position overlapping the metal plate.

9 Claims, 67 Drawing Sheets

(51) Int. Cl.
  *H02M 3/156* (2006.01)
  *H01L 21/8234* (2006.01)
  *H01L 23/00* (2006.01)
  *H01L 25/07* (2006.01)
  *H02M 1/00* (2006.01)

(56) References Cited

U.S. PATENT DOCUMENTS

| | | | |
|---|---|---|---|
| 8,633,550 B2* | 1/2014 | Uno et al. | 257/401 |
| 2003/0102489 A1* | 6/2003 | Nam et al. | 257/177 |
| 2003/0141579 A1* | 7/2003 | Oda et al. | 257/678 |
| 2005/0231177 A1* | 10/2005 | Tateno | H02M 3/1588 323/225 |
| 2007/0236204 A1* | 10/2007 | Tateno | H02M 3/1588 323/316 |
| 2008/0246137 A1* | 10/2008 | Mahler et al. | 257/690 |
| 2009/0001535 A1* | 1/2009 | Heng et al. | 257/676 |
| 2013/0001792 A1* | 1/2013 | Uno | H01L 23/49524 257/773 |
| 2013/0082334 A1* | 4/2013 | Nakamura | H01L 23/49524 257/401 |

* cited by examiner

SEMICONDUCTOR DEVICE

CROSS-REFERENCE TO RELATED APPLICATIONS

The disclosure of Japanese Patent Application No. 2011-184430 filed on Aug. 26, 2011 including the specification, drawings and abstract is incorporated herein by reference in its entirety.

BACKGROUND

The present invention relates to a semiconductor device, and particularly to a technology which is effective when applied to a semiconductor device in which a semiconductor chip formed with a switching transistor is sealed in a resin.

In recent years, to achieve the miniaturization and high-speed response of a power source circuit or the like, a power MOSFET (Metal Oxide Semiconductor Field Effect Transistor) used in the power source circuit has become high frequency.

In particular, the CPU (Central Processing Unit), DSP (Digital Signal Processor), or the like of a desk-top personal computer, a note-type personal computer, a server, a game machine, or the like tends to be larger in current and higher in operating frequency. Accordingly, to allow a power MOSFET forming a non-insulated-type DC-DC converter for controlling the power source of the CPU or DSP to be adapted to the large current and the high operating frequency, the technical development thereof has been promoted.

A DC-DC converter widely used as an example of the power source circuit has a configuration in which a power MOSFET for high-side switch and a power MOSFET for low-side switch are coupled in series to each other. The power MOSFET for high-side switch has a switching function for controlling the DC-DC converter, while the power MOSFET for low-side switch has a switching function for synchronous rectification. The two power MOSFETs are alternately turned ON/OFF, while being synchronized, to thereby effect conversion of a power source voltage.

Japanese Unexamined Patent Publication No. 2002-314086 (Patent Document 1) discloses MOSFETs with sense terminals in which a sense pad is provided near the surface of the chip, and a sense portion as a sense terminal is arranged immediately under the sense pad. In order to solve the problem that a crack occurs in a chip due to the impact upon compression bonding of a bonding wire, this publication describes a technique in which a planar region where cells are not disposed is provided adjacent to the sense portion, and the sense pad electrode is provided thereover.

Japanese Unexamined Patent Publication No. 2008-17620 (Patent Document 2) describes a technique related to a semiconductor device in which first, second, and third semiconductor chips are mounted in one package. The first chip is a first power MOSFET, the second semiconductor chip is a second power MOSFET, and a third semiconductor chip includes a drive circuit for driving the first and second power MOSFETs.

RELATED ART DOCUMENTS

Patent Documents

[Patent Document 1]
Japanese Unexamined Patent Publication No. 2002-314086
[Patent Document 2]
Japanese Unexamined Patent Publication No. 2008-17620

SUMMARY

As a result of conducting study, the present inventors have made the following findings.

The present inventors have studied a semiconductor device manufactured by forming a switching power MOSFET and a sense MOSFET for sensing a current flowing in the power MOSFET, which is smaller in area than the power MOSFET, in one semiconductor chip, mounting the semiconductor chip over a chip mounting portion via a conductive bonding material, and sealing them. The semiconductor device senses the current flowing in the power MOSFET by means of the sense MOSFET, and controls the power MOSFET in accordance with a current flowing in the sense MOSFET. For example, when it is determined that an excessive current is flowing in the power MOSFET based on the current flowing in the sense MOSFET, the power MOSFET is forcibly turned OFF to protect the semiconductor device and an electronic device using the semiconductor device.

In the semiconductor device, a large current flows so that, as a conductive coupling member bonded to the bonding pad of the semiconductor chip, a metal plate is used. However, when the metal plate is bonded to the semiconductor chip, if a bonding position is displaced and the position at which the metal plate is bonded varies from one manufactured semiconductor device to another, the ratio between the current flowing in the power MOSFET and the current flowing in the sense MOSFET varies from one semiconductor device to another. As a result, accuracy in sensing the current flowing in the power MOSFET by means of the sense MOSFET may deteriorate, which degrades the reliability of the semiconductor device.

An object of the present invention is to provide a technology which can improve the reliability of a semiconductor device.

The above and other objects and novel features of the present invention will become apparent from a statement in the present specification and the accompanying drawings.

The following is a brief description of the outline of a representative aspect of the invention disclosed in the present application.

A semiconductor device, according to a representative embodiment is a semiconductor device in which a semiconductor chip is bonded to the upper surface of a chip mounting portion, and sealed in a resin. The semiconductor chip is formed with a main MOSFET and a sense MOSFET for sensing a current flowing in the main MOSFET, which is smaller in area than the main MOSFET. To a first source pad for outputting the current flowing in the main MOSFET, a conductor plate is bonded. A second source pad for sensing a source voltage of the main MOSFET is at a position not overlapping the conductor plate, and a coupled portion between a source wire forming the second source pad and a source wire forming the first source pad is at a position overlapping the conductor plate.

A semiconductor device according to another representative embodiment is a semiconductor device in which first and second semiconductor chips are bonded to the respective upper surfaces of first and second chip mounting portions, and sealed in a resin. The first semiconductor chip is formed with a main MOSFET and a sense MOSFET for sensing a current flowing in the main MOSFET, which is smaller in area than the main MOSFET. To a first source pad for outputting the current flowing in the main MOSFET, a conductor plate is bonded. The second semiconductor chip is formed with a control circuit for controlling the main MOSFET and the sense MOSFET. The pad of the second semiconductor chip is coupled to the conductor plate with a wire.

A semiconductor device according to still another representative embodiment is a semiconductor device in which first, second, and third semiconductor chips are bonded to the respective upper surfaces of first, second, and third chip mounting portions, and sealed in a resin. The first semiconductor chip is formed with a main MOSFET and a sense MOSFET for sensing a current flowing in the main MOSFET, which is smaller in area than the main MOSFET. A first source pad for outputting the current flowing in the main MOSFET of the first semiconductor chip is electrically coupled to the third chip mounting portion via a conductor plate. The third semiconductor chip is also formed with a MOSFET. The second semiconductor chip is formed with a control circuit for controlling the main MOSFET and the sense MOSFET of the first semiconductor chip and the MOSFET of the third semiconductor chip. The pad of the second semiconductor chip is coupled to the third chip mounting portion with a wire.

The following is a brief description of effects achievable by the representative aspect of the invention disclosed in the present application.

According to each of the representative embodiments, the reliability of the semiconductor device can be improved.

DETAILED DESCRIPTION

Figure 1:
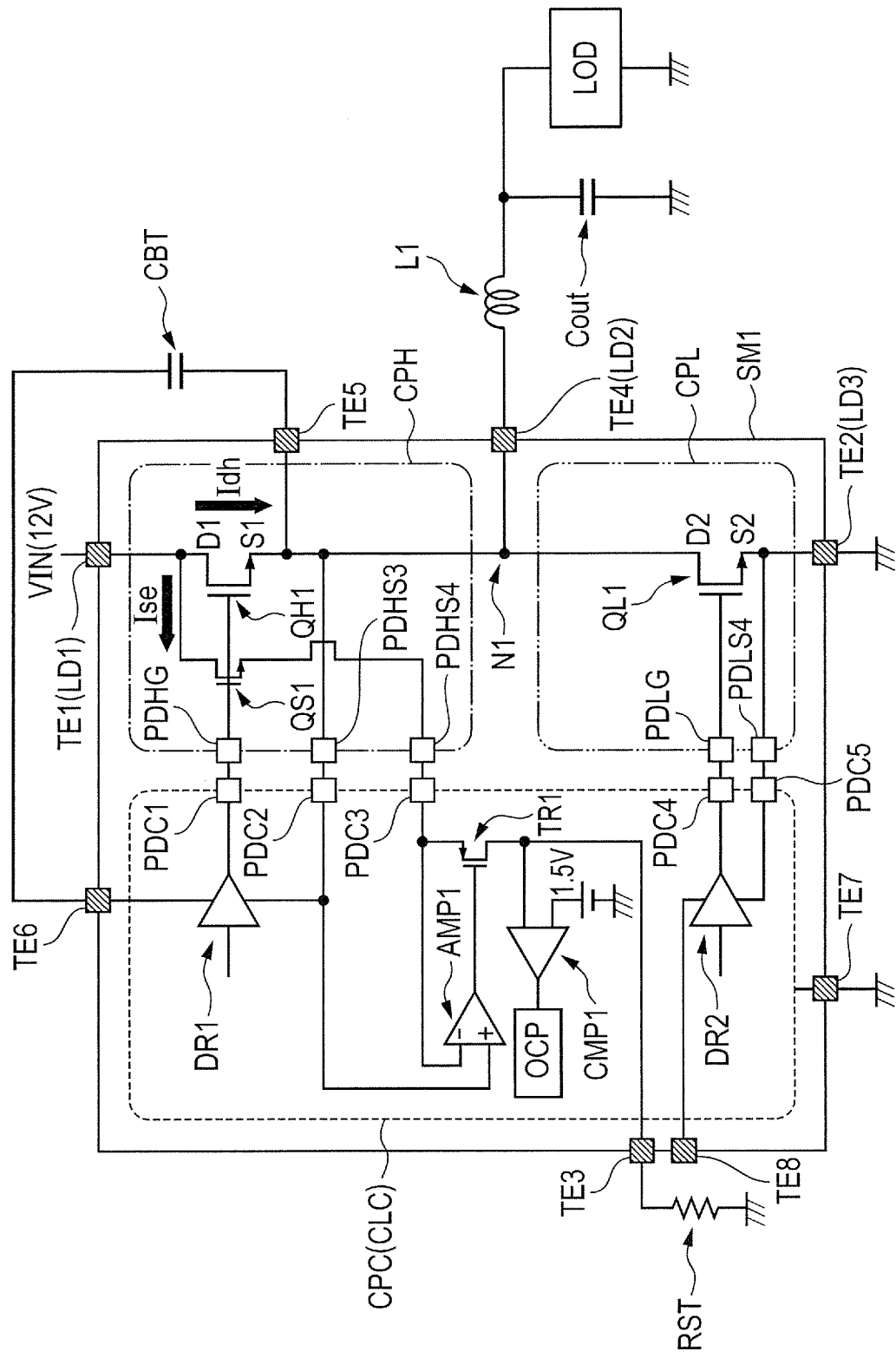
FIG. 1 is a circuit diagram showing an example of an electronic device using a semiconductor device of an embodiment of the present invention.

In each of the following embodiments, if necessary for the sake of convenience, the embodiment will be described by being divided into a plurality of sections or embodiments. However, they are by no means irrelevant to each other unless particularly explicitly described otherwise, and one of the sections or embodiments is, details, supplementary explanation, and so forth of part or the whole of the others. When the number and the like (including the number, numerical value, amount, range, and the like thereof) of elements are referred to in the following embodiments, they are not limited to specific numbers unless particularly explicitly described otherwise or unless they are obviously limited to specific numbers in principle. The number and the like of the elements may be not less than or not more than specific numbers. It will be appreciated that, in the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

Hereinbelow, the embodiments of the present invention will be described with reference to the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

In the present invention, a field effect transistor is referred to as MOSFET (Metal Oxide Semiconductor Field Effect Transistor) or simply as MOS, but it is not intended to exclude a non-oxide film from examples of a gate insulating film. The MOSFET described above is not limited to a case where the gate insulating film is formed of an oxide film, but is assumed to include a MISFET (Metal Insulator Semiconductor Field Effect Transistor) in which the gate insulating film is formed of an insulating film taken in a broad category. That is, in the present specification, the term "MOSFET" is used for the sake of convenience, but the MOSFET is used also as a term intended to include even a MISFET in the present specification.

First Embodiment

<About Circuit Configuration>

FIG. 1 is a circuit diagram showing an example of an electronic device using a semiconductor device (semiconductor package) SM1 of an embodiment of the present invention.

Here, a circuit diagram when a non-insulated-type DC-DC converter is formed using the semiconductor device SM1 is shown. Note that, in FIG. 1, the portion enclosed by the dotted line is formed in a semiconductor chip CPC to form a control circuit CLC, the portion enclosed by the dot-dash line is formed in a semiconductor chip CPH, and the portion enclosed by the two-dot-dash line is formed in a semiconductor chip CPL.

The non-insulated-type DC-DC converter shown in FIG. 1 is used for the power source circuit or the like of electronic equipment such as, e.g., a desk-top personal computer, a note-type personal computer, a server, or a game machine.

The semiconductor device SM1 used in the non-insulated-type DC-DC converter shown in FIG. 1 has two power MOSFETs (Metal Oxide Semiconductor Field Effect Transistors, hereinafter simply referred to as power MOS) QH1 and QL1, a sense MOSFET (hereinafter simply referred to as a sense MOS) QS1 for sensing a current flowing in the power MOSFET QH1, and the control circuit CLC. As will be described later in detail, the control circuit CLC is formed in the semiconductor chip (control semiconductor chip) CPC, the power MOSFET QH1 and the sense MOSFET QS1 are formed in the semiconductor chip CHP (high-side semiconductor chip) CPH, and the power MOSFET QL1 is formed in the semiconductor chip (low-side semiconductor chip) CPL. The three semiconductor chips CPC, CPH, and CPL are sealed in one and the same package to form the semiconductor device SM1.

The control circuit CLC has two driver circuits (drive circuits) DR1 and DR2 each as a drive circuit. The driver circuits DR1 and DR2 respond to a Pulse Width Modulation (PWM) signal supplied from (a control circuit) outside the semiconductor device SM1 to the control circuit CLC or the like to control respective potentials at the gate terminals of the power MOSFETs QH1 and QL1. In another form, a circuit for generating the pulse width modulation (PWM) signal can also be provided in the control circuit CLC.

The output of the driver circuit DR1 is electrically coupled to the gate terminal of the power MOSFET QH1, while the output of the driver circuit DR2 is electrically coupled to the gate terminal of the power MOSFET QL1. The driver circuit DR1 can be regarded as the driver circuit (drive circuit) of the power MOSFET QH1, while the driver circuit DR2 can be regarded as the driver circuit (drive circuit) of the power MOSFET QL1.

The power MOSFETs QH1 and QL1 are coupled in series to each other between an input-voltage supply terminal (external coupling terminal of the semiconductor device SM1) TE1 and a reference-potential supply terminal (external coupling terminal of the semiconductor device SM1) TE2. That is, the power MOSFET QH1 has a source-drain path thereof coupled in series between the input-voltage supply terminal TE1 and an output node (output terminal of the semiconductor device SM1) N1, while the power MOSFET QL1 has a source-drain path thereof coupled in series between the output node N1 and the reference-potential supply terminal TE2. Note that, to the input-voltage supply terminal TE1, a high-potential-side potential (power source potential) VIN of a power source (input power source) outside the semiconductor device SM1, which is, e.g., 12 V, is supplied. To the reference-potential supply terminal TE2, a reference potential lower than the input potential (potential VIN) supplied to the input-voltage supply terminal TE1, e.g., a ground potential (0 V) is supplied. In FIG. 1, the marks D1 and S1 respectively denote the drain and source of the power MOSFET QH1, and the marks D2 and S2 respectively denote the drain and source of the power MOSFET QL1. The output node N1 is coupled to an output terminal (external coupling terminal or output node of the semiconductor device SM1) TE4. To the output terminal TE4, a load LOD is coupled via a coil (e.g., chalk coil) L1. That is, the output node N1 is coupled to the load LOD via the coil L1.

The power MOSFET (field effect transistor or power transistor) QH1 is a field effect transistor for high-side switch (high-potential-side or a first operating voltage, hereinafter simply referred to as high-side), and has a switching function for storing energy in the foregoing coil L1. That is, the power MOSFET QH1 is a switching transistor (switching element). The coil L1 is an element for supplying power to the output (i.e., the input of the load LOD) of the non-insulated-type DC-DC converter.

The high-side power MOSFET QH1 is formed in the semiconductor chip (high-side semiconductor chip) CPH, as will be described later. The power MOSFET QH1 is formed of, e.g., an n-channel field effect transistor. Here, the channel of the field effect transistor is formed in the thickness direction of the semiconductor chip CPH. In this case, compared to a field effect transistor in which the channel is formed along the main surface (surface orthogonal to the thickness direction of the semiconductor chip CPH) of the semiconductor chip CPH, the channel width per unit area can be increased to allow a reduction in ON resistance. As a result, it is possible to miniaturize the element, and reduce the scale of packaging.

On the other hand, the power MOSFET (field effect transistor or power transistor) QL1 is a field effect transistor for low-side switch (low-potential-side or second operating voltage, hereinafter simply referred to as low-side), and has the function of reducing the resistance of a transistor in synchronization with the frequency of a signal supplied from (the control circuit) outside the semiconductor device SM1 and performing rectification. That is, the power MOSFET QL1 is a rectifier (synchronous rectifier) transistor, which is the rectifier transistor of the non-insulated-type DC-DC converter here.

As will be described later, the low-side power MOSFET QL1 is formed in a semiconductor chip (low-side semiconductor chip) CPL. The power MOSFET QL1 is formed of, e.g., an n-channel power MOSFET, and the channel thereof is formed in the thickness direction of the semiconductor chip CPL in the same manner as in the foregoing power MOSFET QH1. The following is the reason for using the power MOSFET in which the channel is formed in the thickness direction of the semiconductor chip CPL. The ON time (time during which the voltage is applied) of the low-side power MOSFET QL1 is longer than the ON time of the high-side power MOSFET QH1 and, in the low-side power MOSFET QL1, a loss due to the ON resistance seems to be larger than a switching loss. Therefore, the use of the field effect transistor in which the channel is formed in the thickness direction of the semiconductor chip CPL allows the channel width per unit area to be increased compared to the case of using the field effect transistor in which the channel is formed along the main surface of the semiconductor chip CPL. That is, by forming the low-side power MOSFET QL1 of the field effect transistor in which the channel is formed in the thickness direction of the semiconductor chip CPL, the ON-resistance can be reduced. Therefore, even if a current flowing in the non-insulated-type DC-DC converter increases, voltage conversion efficiency can be improved.

Note that the foregoing high-side power MOSFET QH1 can be regarded as the high-side MOSFET (MOSFET for the high side) of the DC-DC converter (which is the non-insulated-type DC-DC converter), while the foregoing low-side power MOSFET QL1 can be regarded as the low-side MOSFET (MOSFET for the low side) of the DC-DC converter (which is the non-insulated-type DC-DC converter).

A wire coupling the source of the power MOSFET QH1 and the drain of the power MOSFET QL1 is provided with the foregoing output node N1 for supplying an output power source potential to the outside of the semiconductor device SM1. The output node (i.e., the output terminal TE4 coupled to the output node N1) is electrically coupled to the coil L1 via an output wire (wire outside the semiconductor device SM1), and is further electrically coupled to the load LOD via the output wire (wire outside the semiconductor device SM1). Examples of the load LOD include a hard disc drive HDD, ASIC (Application Specific Integrated Circuit), FPGA (Field Programmable Gate Array), an expansion card (PCI CARD), a memory (such as a DDR memory, a DRAM (Dynamic RAM), or a flash memory), and a CPU (Central Processing Unit).

In addition, an output capacitor $C_{out}$ is electrically coupled (interposed) between the output wire coupling the coil L1 and the load LOD and the terminal for supplying a reference potential GND.

Moreover, a capacitor CPT provided outside the semiconductor device SM1 is electrically coupled (interposed) between the source of the power MOSFET QH1 and the driver circuit DR1. Specifically, between a terminal (external coupling terminal) TE5 of the semiconductor device SM1 and a terminal (external coupling terminal) TE6 thereof, the capacitor CBT provided outside the semiconductor device SM1 is interposed. The terminal TE5 of the semiconductor device SM1 is electrically coupled to one electrode of the capacitor CBT provided outside the semiconductor device SM1. The terminal TE6 of the semiconductor device SM1 is electrically coupled to the other electrode of the capacitor CBT.

In the circuit diagram of FIG. 1, to a terminal (external coupling terminal) TE7 of the semiconductor device, the ground potential (0 V) is supplied and, to a terminal (external coupling terminal) TE8 of the semiconductor device, an operation/drive power source is supplied.

In such a non-insulated-type DC-DC converter, conversion of a power source voltage is performed by alternately turning ON/OFF the power MOSFETs QH1 and QL1, while providing synchronization therebetween. That is, when the high-side power MOSFET QH1 is ON, a current flows from the terminal TE1 to the output node N1 (i.e., the output terminal TE4) through the power MOSFET QH1. On the other hand, when the high-side power MOSFET QH1 is OFF, a current flows due to the counter electromotive voltage of the coil L1. By turning ON the low-side power MOSFET QL1 when the current is flowing, a voltage drop can be reduced.

The current flowing in the power MOSFET QH1 is sensed (detected) by the sense MOSFET QS1 and, in accordance with a current flowing in the sense MOSFET QS1, the power MOSFET QH1 is controlled. For example, when it is determined (sensed) that an excessive current is flowing in the power MOSFET QH1 based on the current flowing in the sense MOSFET QS1, the power MOSFET QH1 is forcibly turned OFF to allow the semiconductor device SM1 and the electronic device using the semiconductor device SM1 to be protected.

As will be described later, the sense MOSFET (field effect transistor) QS1 is formed together with the high-side power MOSFET QH1 in the semiconductor chip CPH. The sense MOSFET QS1 is formed to configure, in conjunction with the power MOSFET QH1, a current mirror circuit in the semiconductor chip CPH. For example, the sense MOSFET QS1 has a size corresponding to $\frac{1}{20000}$ of that of the power MOS- FET QH1. The size ratio therebetween can be changed as necessary but, here, a description will be given below on the assumption that the size ratio is 1/20000.

The sense MOSFET QS1 has a drain and a gate which are common to those of the power MOSFET QH1. That is, the sense MOSFET QS1 and the power MOSFET QH1 have the drains thereof electrically coupled to each other to provide a common drain. The common drain is coupled to the terminal TE1 so that the same potential is supplied to the drain of the sense MOSFET QS1 and to the drain of the power MOSFET QH1. The sense MOSFET QS1 and the power MOSFET QH1 also have the gates thereof electrically coupled to each other to provide a common gate. The common gate is coupled to the driver circuit DR1 so that the same gate signal (gate voltage) is inputted from the driver circuit DR1 to the gate of the sense MOSFET QS1 and to the gate of the power MOSFET QH1. Therefore, the driver circuit DR1 can be regarded as a drive circuit (first drive circuit) for supplying the gate signal (gate voltage) to the gate of each of the power MOSFET QH1 and the sense MOSFET QS1. The foregoing driver DR2 can be regarded as a drive circuit (second drive circuit) for supplying the gate signal (gate voltage) to the gate of the power MOSFET QL1.

On the other hand, the source of the sense MOSFET QS1 is not common to the source of the power MOSFET QH1. While the source of the power MOSFET QH1 is coupled to the output node N1, the source of the sense MOSFET QS1 is coupled to a terminal (external terminal or external coupling terminal of the semiconductor device SM1) TE3 via a transistor TR1. Specifically, the source of the sense MOSFET QS1 is coupled to the source of the transistor TR1 formed in the semiconductor chip CPC described later, and the drain of the transistor TR1 is coupled to the terminal TE3. It is also possible to couple a protective diode (not shown) between the source of the power MOSFET QH1 and the source of the sense MOSFET QS1.

To the two input nodes of an amplifier circuit AMP1 (which is formed in the semiconductor chip CPC described later), the source of the power MOSFET QH1 and the source of the sense MOSFET QS1 are coupled and, by the output node of the amplifier circuit AMP1, the gate of the transistor TR1 is driven. The sense MOSFET QS1 is an element for detecting (sensing) a current Idh flowing in the power MOSFET QH1. When the source voltages of the sense MOSFET QS1 and the power MOSFET QH1 are equal, in the sense MOSFET QS1, a current corresponding to a predetermined ratio (which is 1/20000 here) of the current Idh flows due to the current mirror configuration mentioned above. That is, the size ratio between the power MOSFET QH1 and the sense MOSFET QS1 is set such that, when the current Idh flows in the power MOSFET QH1, a current Ise flowing in the sense MOSFET QS1 corresponds to 1/20000 of the current Idh (i.e., Ise=Idh/20000 is satisfied). To equalize the source voltages of the sense MOSFET QS1 and the power MOSFET QH1 and detect the current Idh in the power MOSFET QH1 with high accuracy, the amplifier circuit AMP1 and the transistor TR1 are provided. Specifically, the amplifier circuit AMP1 drives the transistor TR1 in accordance with the difference between the source voltage of the sense MOSFET QS1 and the source voltage of the power MOSFET QH1 which are inputted to the amplifier circuit AMP1. The transistor TR1 is controlled such that the difference therebetween becomes zero to thereby control the current flowing in the sense MOSFET QS1. Thus, the source voltage of the sense MOSFET QS1 and the source voltage of the power MOSFET QH1 are controlled to be equal.

The terminal (terminal of the semiconductor device SM1) TE3 is coupled to a resistor RST provided outside the semiconductor device SM1. The resistor RST is an external terminal for current-voltage conversion. Specifically, the resistor RST has one terminal to which the terminal TE3 is coupled and the other terminal coupled to the ground potential (0 V). By coupling the resistor RST to the terminal TE3, the value of the current flowing in the sense MOSFET QS1 can be converted to the value of the voltage at the terminal TE3 (as the current Ise flowing in the sense MOSFET QS1 increases, the value of the voltage at the terminal TE3 increases and, specifically, the value of the voltage at the terminal TE3 is substantially proportional to the value of the current Ise flowing in the sense MOSFET QS1).

The voltage at the terminal TE3 is compared to a comparison voltage (e.g., 1.5 V) by a comparator circuit CMP1 in the control circuit CLC. When it is detected by the comparator circuit CMP1 that the value of the voltage at the terminal TE3 is larger than the comparison voltage (e.g., 1.5 V), an overcurrent protection circuit OCP in the control circuit CLC operates to control the driver circuits DR1 and DR2 and bring each of the power MOSFETs QH1 and QL1 into an OFF state (i.e., the gate signals inputted to the respective gates of the power MOSFETs QH1 and QL1 are turned OFF).

That is, when it is determined (detected) that the voltage value at the terminal TE3 is larger than the comparison voltage (e.g., 1.5 V) (i.e., when the current Ise flowing in the sense MOSFET QS1 is excessively large), the control circuit CLC turns OFF (OFF state or non-conductive state) each of the power MOSFETs QH1 and QL1. The control circuit CLC senses the current Idh flowing in the power MOSFET QH1 (as the current Ise flowing in the sense MOSFET QS1) by means of the sense MOSFET QS1. When determining (detecting) that the current Ise flowing in the sense MOSFET QS1 is excessively large, the control circuit CLC turns OFF each of the power MOSFETs QH1 and QL1. In this manner, when an excessively large current flows in the power MOSFET QH1, each of the power MOSFETs QH1 and QL1 can be forcibly turned OFF.

Specifically, the resistance value of the resistor RST is set such that, when a current corresponding to 1/20000 of an allowable upper-limit value Ilm of the current Idh of the power MOSFET QH1 flows in the sense MOSFET QS1 (i.e., when Ise=Ilm/20000 is satisfied), the voltage at the terminal TE3 becomes the foregoing comparison voltage (e.g., 1.5 V). As a result, when a current of not less than the allowable upper-limit value Ilm flows in the power MOSFET QH1, a current of not less than Ilm/20000 flows in the sense MOSFET QS1 and the voltage at the terminal TE3 becomes the foregoing comparison voltage (e.g., 1.5 V) or more so that the control circuit CLC forcibly turns OFF each of the power MOSFETs QH1 and QL1. This can prevent a current of not less than the allowable upper-limit value Ilm from flowing in the power MOSFET QH1 and improve the reliability of the semiconductor device SM1 and the electronic device using the semiconductor device SM1.

<About Structure of Semiconductor Device>

Figure 2:
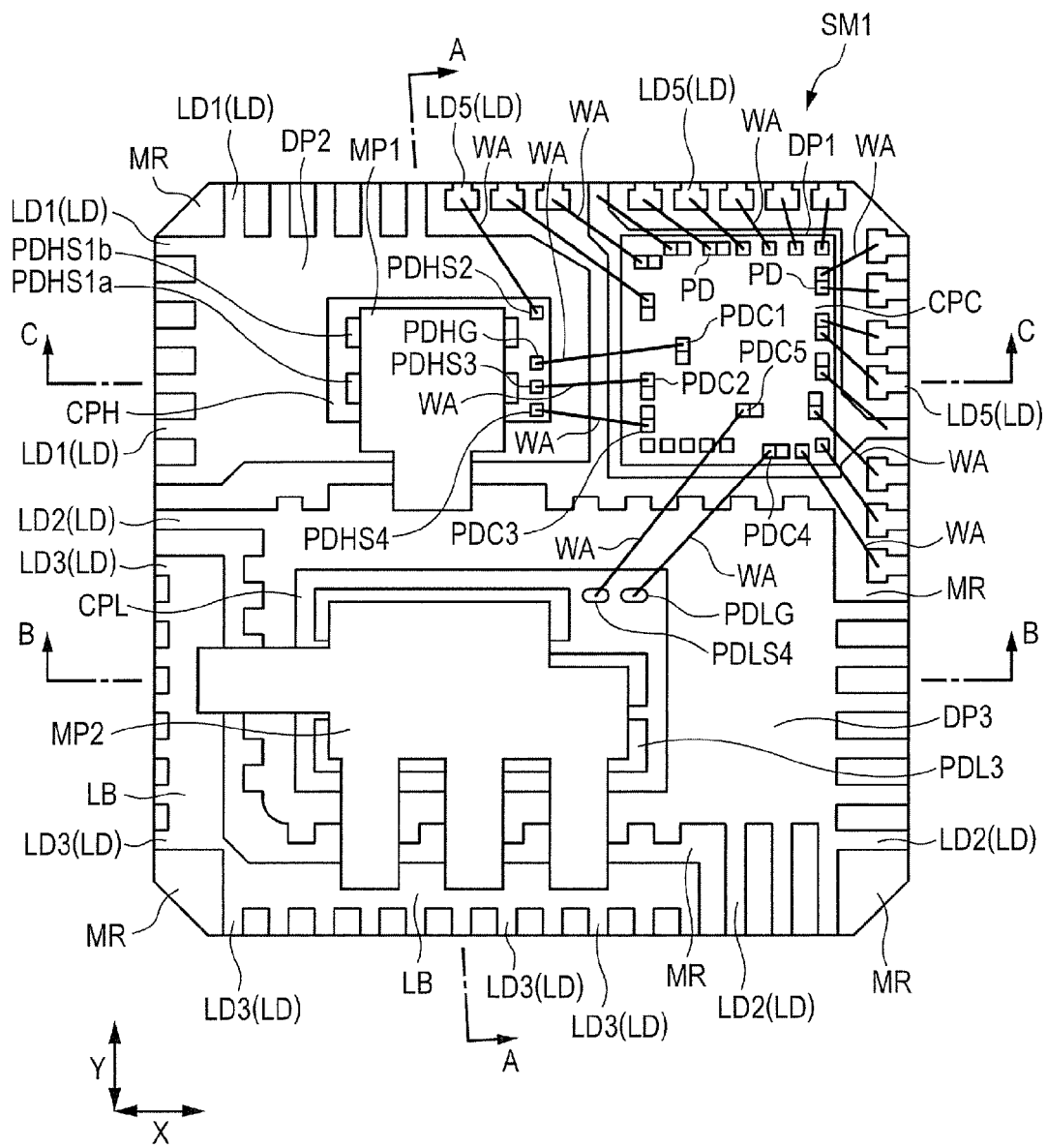
FIG. 2 is a perspective plan view of the semiconductor device as the embodiment of the present invention.
Figure 3:
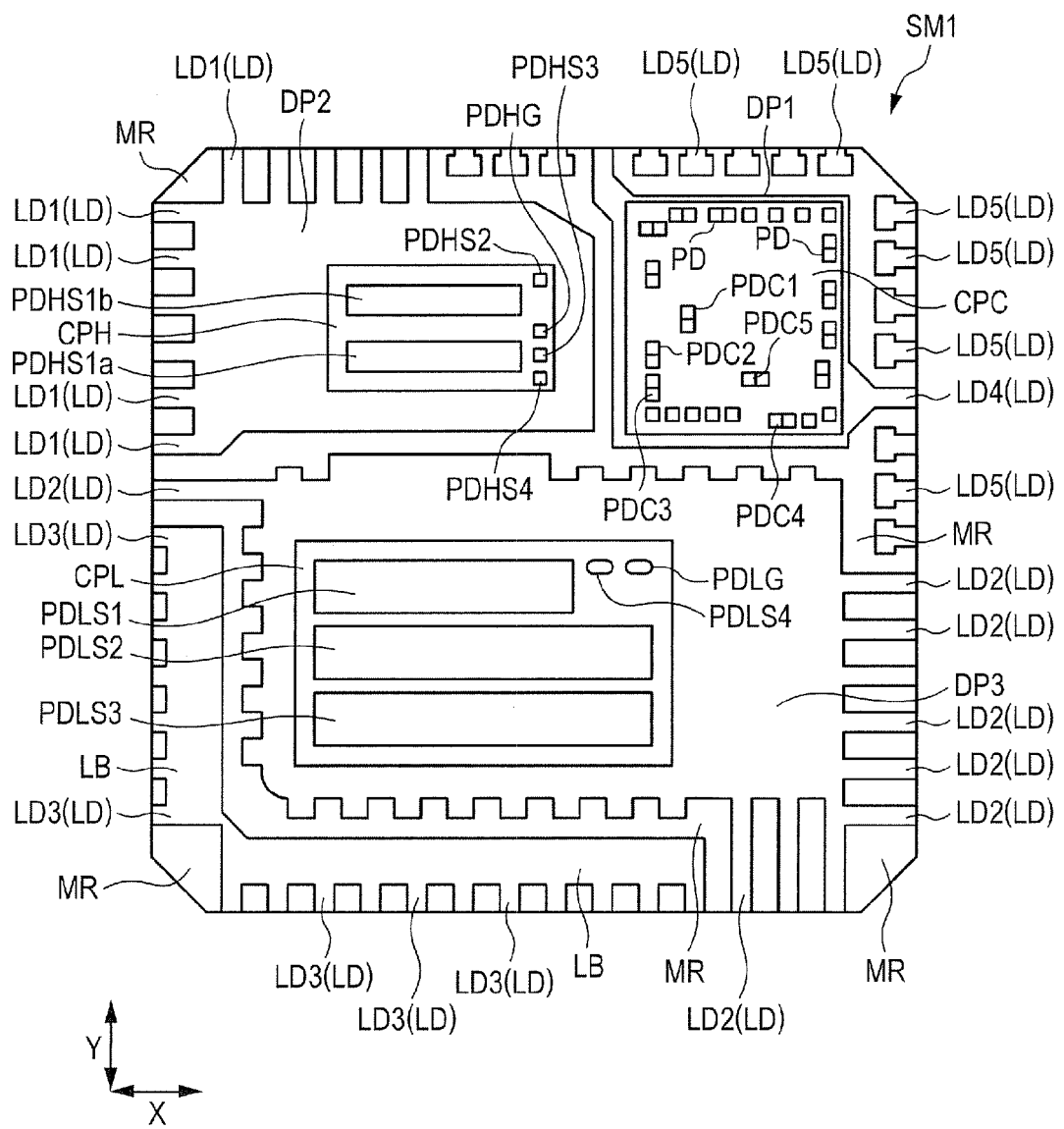
FIG. 3 is a perspective plan view of the semiconductor device as the embodiment of the present invention.
Figure 4:
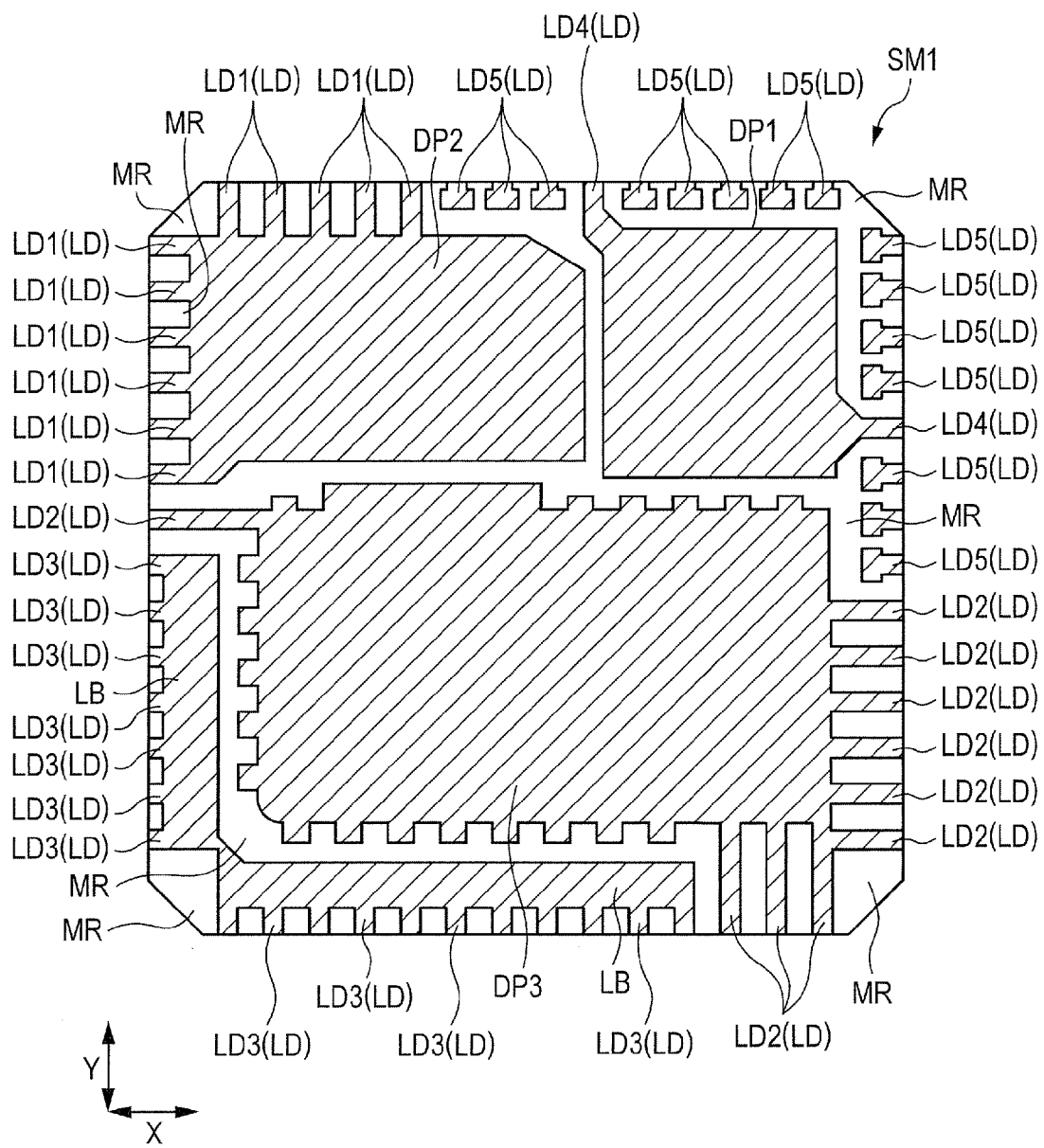
FIG. 4 is a perspective plan view of the semiconductor device as the embodiment of the present invention.
Figure 5:
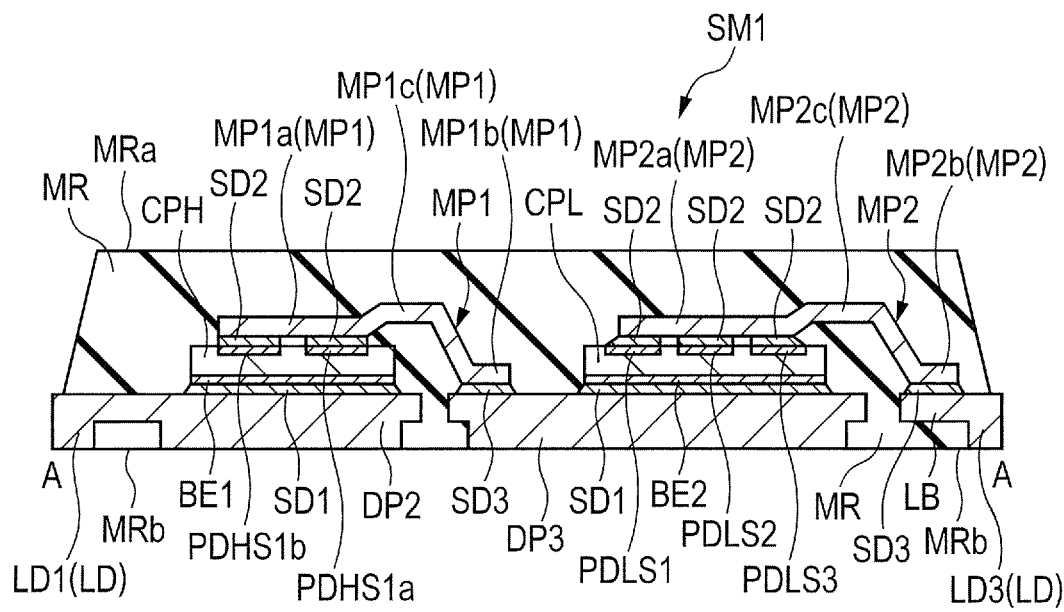
FIG. 5 is a cross-sectional view of the semiconductor device as the embodiment of the present invention.
Figure 6:
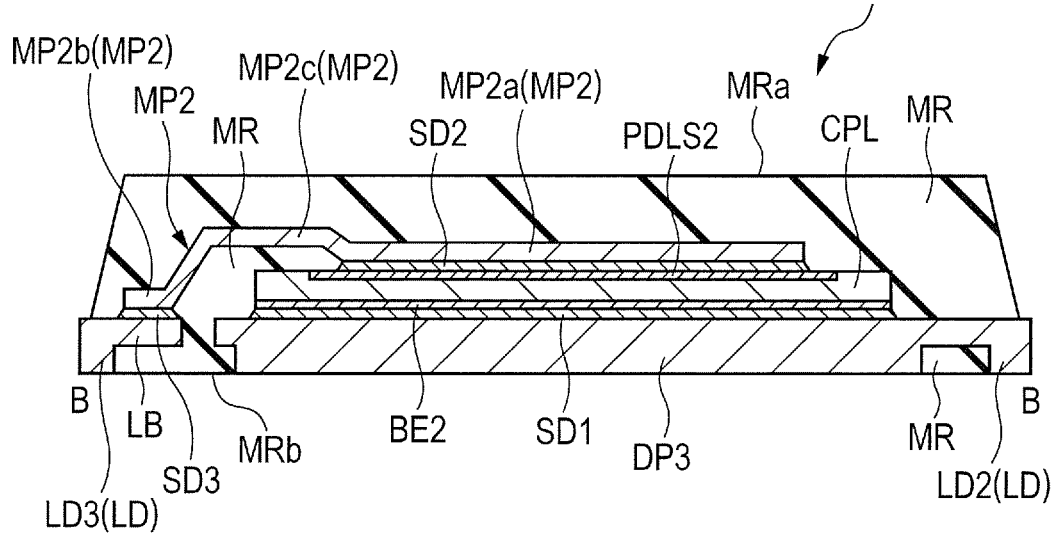
FIG. 6 is a cross-sectional view of the semiconductor device as the embodiment of the present invention.
Figure 7:
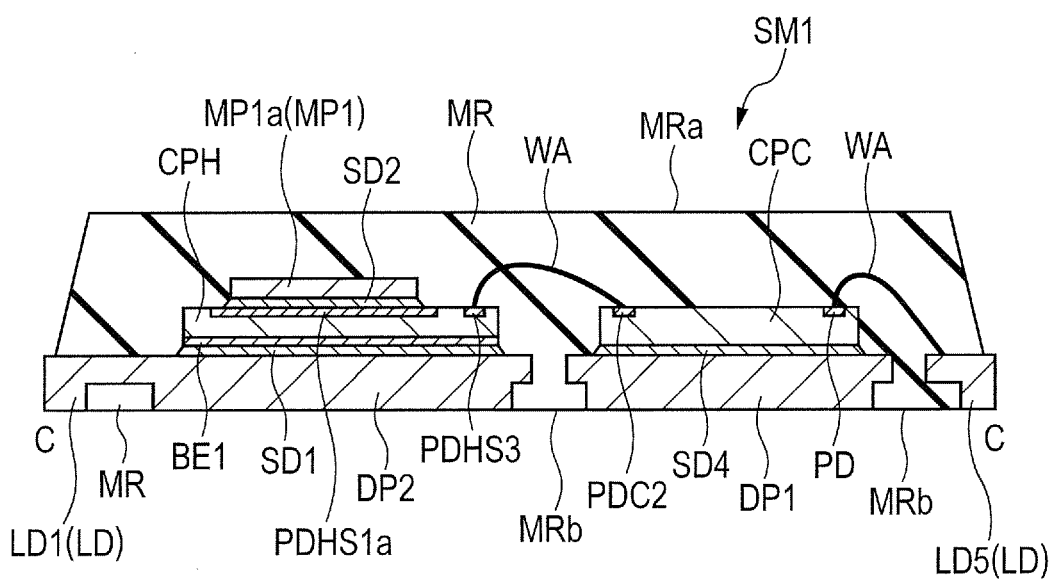
FIG. 7 is a cross-sectional view of the semiconductor device as the embodiment of the present invention.
Figure 8:
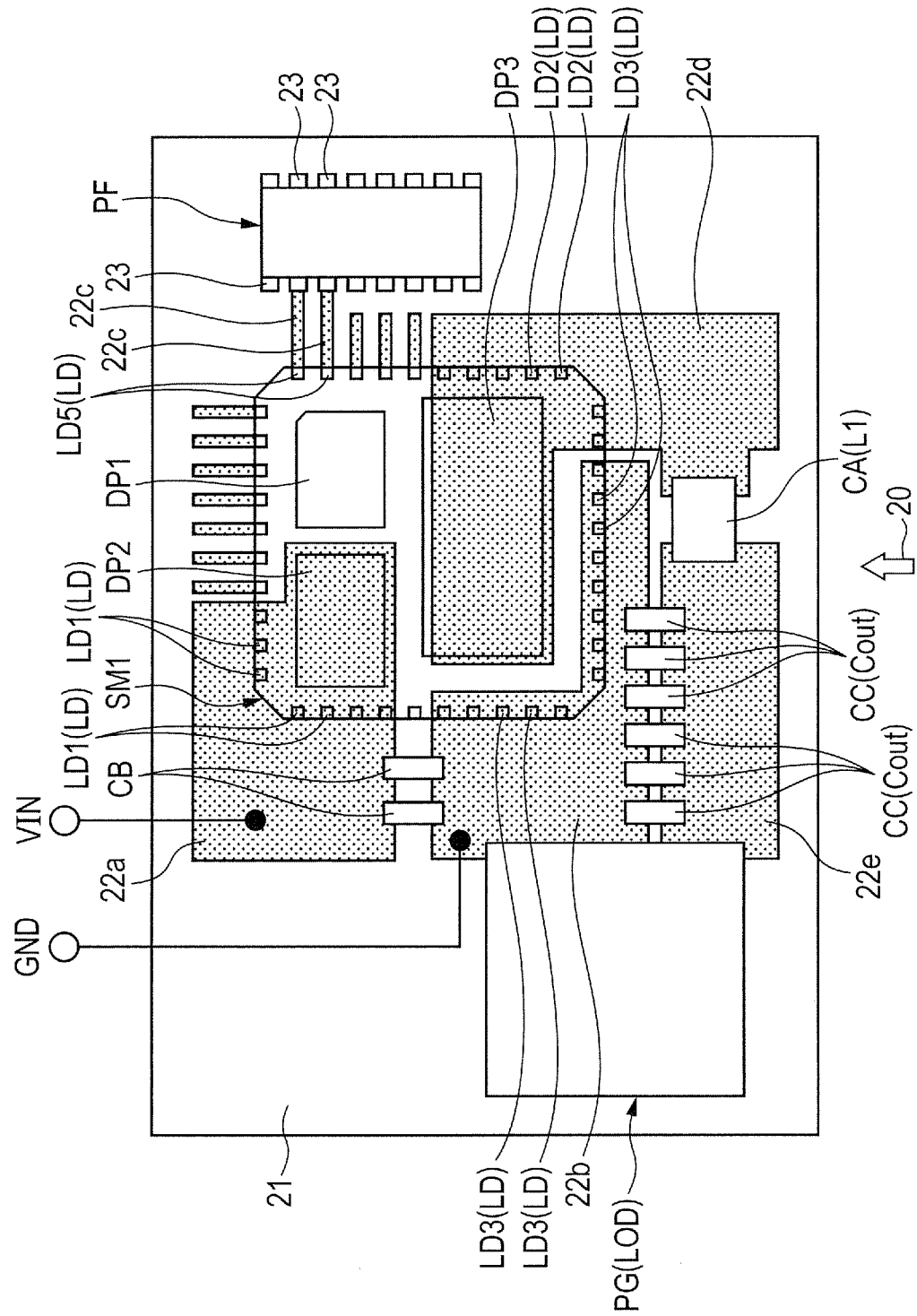
FIG. 8 is a main-portion plan view showing an example of the mounting of the semiconductor device as the embodiment of the present invention.

FIGS. 2 to 4 are perspective plan views of the semiconductor device SM1 of the present embodiment. FIGS. 5 to 7 show plan views (top views) in which the semiconductor device SM1 is viewed from the top side thereof through a sealing portion (sealing resin portion) MR. FIG. 3 is a perspective plan view of the semiconductor device SM1 in a state where metal plates MP1 and MP2 and the bonding wires WA, which are shown in FIG. 2, have been removed (when viewed without the metal plates MP1 and MP2 and the bonding wires WA). FIG. 4 is a perspective plan view of the semiconductor device SM1 in a state where the semiconductor chips CPC, CPH, and CPL shown in FIG. 3 have been removed (when viewed without the semiconductor chips CPC, CPH, and CPL). Note that FIG. 8 is a plan view but, for improved clarity of illustration, die pads DP1, DP2, and DP3, a lead wire LB, and leads LD are obliquely hatched. FIG. 5 substantially corresponds to a cross-sectional view along the line A-A of FIG. 2. FIG. 6 substantially corresponds to a cross-sectional view along the line B-B of FIG. 2. FIG. 7 substantially corresponds to a cross-sectional view along the line C-C of FIG. 2. Note that the mark X denotes a first direction, and the mark Y denotes a second direction orthogonal to the first direction X.

In the present embodiment, as described above, the semiconductor chip CPC formed with the control circuit CLC, the semiconductor chip CPH formed with the power MOSFET QH1 as the field effect transistor for high-side switch, and the semiconductor chip CPL formed with the power MOSFET QL1 as the field effect transistor for low-side switch are integrated in one semiconductor package (packaged) to provide the one semiconductor device SM1. By doing so, it is possible to achieve reductions in the size and thickness of the electronic device (e.g., a non-insulated-type DC-DC converter), and additionally reduce wiring parasitic inductance. Therefore, it is possible to provide a higher operating frequency and higher efficiency. Note that, in the semiconductor chip CPH, the sense MOSFET QS1 for sensing a current flowing in the power MOSFET QH1 is also embedded.

The semiconductor device SM1 of the present embodiment includes the die pads (tabs or chip mounting portions) DP1, DP2, and DP3, the semiconductor chips CPC, CPH, and CPL mounted over the respective main surfaces (top surfaces) of the die pads DP1, DP2, and DP3, the metal plates (conductor plates) MP1 and MP2, the plurality of bonding wires (hereinafter simply referred to as wires) WA, the plurality of leads LD, the lead wire (wiring portion) LB, and the sealing portion (sealing resin portion) MR sealing therein the foregoing members.

The sealing portion (sealing resin portion) MR is comprised of a resin material such as, e.g., a thermosetting resin material, and can also contain a filler or the like. The sealing portion MR can be formed using, e.g., an epoxy resin containing a filler or the like. Besides an epoxy-based resin, for example, a phenol curing agent, silicone rubber, or a biphenyl thermosetting resin to which a filler or the like is added may also be used as the material of the sealing portion MR.

The semiconductor device SM1 of the present embodiment is formed as a QFN (Quad Flat Non-leaded package) surface-mounting-type semiconductor package.

The sealing portion MR has an upper surface (top surface) MRa, a back surface (lower surface or bottom surface) MRb as a main surface opposite to the upper surface MRa, and side surfaces (four side surfaces) intersecting the upper surface MRa and the back surface MRb. That is, the outer appearance of the sealing portion MR is in the form of a thin plate defined by the upper surface MRa, the back surface MRb, and the side surfaces. The sealing portion MR is formed such that the two-dimensional shapes of the upper surface MRa and the back surface MRb thereof are, e.g., rectangles. It is also possible to truncate (or chamfer) the corners of the rectangles (two-dimensional rectangles) or round the corners of the rectangles (two-dimensional rectangles). When the upper surface MRa and the back surface MRb of the sealing portion MR are designed to have rectangular two-dimensional shapes, the two-dimensional shape (outer shape) of the sealing portion MR which intersects the thickness thereof is a rectangle (quadrilateral).

At the side surfaces of the sealing portion MR and at the outer periphery of the back surface (MRb) thereof, the plurality of leads LD are exposed along the outer periphery of the sealing portion MR. Here, the leads LD are formed without significantly protruding outwardly of the sealing portion MR so that the semiconductor device SM1 has a QFN configuration. At the back surface MRb of the sealing portion MR, the back surfaces (lower surfaces) of the three die pads (chip mounting portion) DP1, DP2, and DP3 each having, e.g., a generally rectangular two-dimensional shape are exposed. Among them, the area of the exposed die pad DP3 is the largest, and the area of the exposed die pad DP2 is the second largest.

However, the configuration of the semiconductor device SM1 is not limited to the QFN configuration, and can be variously changed. The semiconductor device SM1 may also have another flat package configuration such as, e.g., a QFP (Quad Flat Package) configuration or a SOP (Small Out-line Package) configuration. In the case where the semiconductor device SM1 has the QFP configuration, the plurality of leads LD are exposed in a state significantly protruding outwardly from the four sides (side surfaces and the outer periphery of the back surface) of the sealing portion MR. In the case where the semiconductor device SM1 has the SOP configuration, the plurality of leads LD are exposed in a state significantly protruding outwardly from the two sides (side surfaces and the outer periphery of the back surface) of the sealing portion MR.

The pads DP1, DP2, and DP3 are disposed adjacent to each other in a separated state with predetermined intervals kept therebetween. The die pads DP1, DP2, and DP3 are disposed to have respective centers thereof displaced from the center of the semiconductor device SM1 (sealing portion MR). Among them, the gross area (two-dimensional size) of the die pad DP3 is the largest, the gross area (two-dimensional size) of the die pad DP2 is the second largest, and the gross area (two-dimensional size) of the die pad DP1 is the smallest. The die pads DP1, DP2, and DP3 are disposed such that the respective long sides thereof extend along each other. The die pad DP1 is disposed such that one of the sides thereof extends along the short sides of the die pad DP2, and another side of the die pad DP1 intersecting the foregoing one side thereof extends along the long sides of the die pad DP3. The die pad DP1 is a chip mounting portion (driver chip mounting portion or control chip mounting portion) for mounting the semiconductor chip CPC. The die pad DP2 is a chip mounting portion (high-side chip mounting portion) for mounting the semiconductor chip CPH. The die pad DP3 is a chip mounting portion (low-side chip mounting portion) for mounting the semiconductor chip CPL.

Each of the die pads DP1, DP2, and DP3 has at least one part thereof sealed in the sealing portion MR. In the present embodiment, a part of the back surface (lower surface) of each of the die pads DP1, DP2, and DP3 is exposed from the back surface MRb of the sealing portion MR. In this manner, heat generated during the operation of the semiconductor chips CPC, CPH, and CPL can be released mainly from the back surfaces (lower surfaces) of the semiconductor chips CPC, CPH, and CPL to the outside of the semiconductor device SM1. The die pads DP1, DP2, and DP3 are formed larger than the areas of the respective semiconductor chips CPC, CPH, and CPL mounted thereover to be able to have improved heat releasing properties.

The die pads DP1, DP2, and DP3, the leads LD, and the lead wire LB are each formed of a conductor, and preferably comprised of a metal material such as copper (Cu) or a copper alloy. Each of copper (Cu) and a copper (Cu) alloy is excellent in terms of its excellent workability, high thermal conductivity, and relatively low price. Therefore, copper (Cu) or a copper alloy is preferred as a main material of each of the die pads DP1, DP2, and DP3, the leads LD, and the lead wire LB. If the die pads DP1, DP2, and DP3, the leads LD, and the lead wire LB are formed of the same material (the same metal material), the semiconductor device SM1 can be manufactured using the same lead frame so that it is easily manufactured. Because the die pads DP1, DP2, and DP3, the leads LD, and the lead wire LB are each formed of a conductor, each of them can also be regarded as a conductor portion.

Of the main surfaces (upper surfaces) of the die pads DP1, DP2, and DP3, the leads LD, and the lead wire LB, in the regions with which the semiconductor chips CPC, CPH, and CPL come in contact, in the regions with which the wires WL come in contact, and in the regions with which the metal plates MP1 and MP2 come in contact, plating layers (not shown) comprised of silver (Ag) or the like can also be formed. This allows the semiconductor chips CPC, CPH, and CPL, the metal plates MP1 and MP2, and the wires WA to be more reliably coupled to the die pads DP1, DP2, and DP3, the leads LD, and the lead wire LB.

A part of each of the die pads DP1, DP2, and DP3, the lead wire LB, and the leads LD on the back surface (lower surface) side thereof has a relatively smaller gross thickness (is thinner than the other portion thereof). This allows the sealing material (sealing resin material) of the sealing portion MR to enter the thinner portions of the die pads DP1, DP2, and DP3, the lead wire LB, and the leads LD on the back surface side thereof. As a result, the adhesion between each of the die pads DP1, DP2, and DP3, the lead wire LB, and the leads LD and the sealing portion MR can be improved, and also the die pads DP1, DP2, and DP3, the lead wire LB, and the leads LD are less likely to come off the sealing portion MR. Therefore, it is possible to reduce or prevent the peeling of the die pads DP1, DP2, and DP3, the lead wire LB, and the leads LD and deformation defects therein.

It is also possible to form plating layers (not shown) such as solder plating layers over the respective lower surfaces of, the die pads DP1, DP2, and DP3, the lead wire LB, and the leads LD which are exposed at the back surface MRb of the sealing portion MR. This allows easy mounting (solder mounting) of the semiconductor device SM1 over a mounting substrate (corresponding to a wiring substrate 21 described later) or the like.

The die pad (high-side chip mounting portion) DP2 is formed in a rectangular two-dimensional shape which is longer in the first direction X than in the second direction Y. To the two sides (two sides along the outer periphery of the sealing portion MR) of the die pad DP2 intersecting each other, a plurality of leads LD1 included in the foregoing plurality of leads LD are integrally coupled along the two sides. That is, the die pad DP2 and the plurality of leads LD1 are integrally formed. The plurality of leads LD1 (in some cases, the die pad DP2 also) serve as the foregoing terminal TE1 so that the foregoing high-potential-side potential (power source potential) VIN of the power source (input power source) outside the semiconductor device SM1 is supplied to the leads LD1 (terminal TE1).

Over the main surface (upper surface) of the die pad DP2, the foregoing power transistor semiconductor chip (semiconductor chip) CPH is mounted with the main surface (top surface or upper surface) thereof facing upward and the back surface (lower surface) thereof facing the die pad DP2. That is, the semiconductor chip CPH is mounted (by face-up bonding) over the die pad DP2 via a conductive adhesive layer (bonding material) SD1, and bonded (fixed) thereto. The main surface and the back surface of the semiconductor chip CPH are opposite to each other.

The semiconductor chip CPH is formed in a rectangular two-dimensional shape longer than the semiconductor chip CPC, and disposed such that the long sides of the semiconductor chip CPH extend along the longitudinal direction of the die pad DP2. The back surface (entire back surface) of the semiconductor chip CPH is formed with a back-side electrode (electrode) BE1. The back-side electrode BE1 is bonded to the die pad DP2 via the conductive adhesive layer SD1 to be electrically coupled thereto. The back-side electrode BE1 of the semiconductor chip CPH is electrically coupled to the drain of the foregoing high-side power MOSFET QH1 formed in the semiconductor chip CPH, and is also electrically coupled to the drain of the foregoing sense MOSFET QS1. That is, the back-side electrode BE1 of the semiconductor chip CPH serves as each of the drain electrode of the foregoing high-side power MOSFET QH1 and the drain electrode of the foregoing sense MOSFET QS1. The adhesive layer SD1 is comprised of a conductive bonding material (adhesive material), which is preferably a solder. However, a paste-type conductive adhesive material (which is already in a cured state) such as a silver paste can also be used.

Over the main surface (top surface or upper surface) of the semiconductor chip CPH, a gate bonding pad (hereinafter simply referred to as a pad) PDHG and source bonding pads (hereinafter simply referred to as pads) PDHS1a, PDHS1b, PDHS2, PDHS3, and PDHS4 are disposed. Among them, the gate pad PDHG and the source pads PDHS2, PDHS3, and PDHS4 are electrodes (pad electrodes, electrode pads, or bonding pads) to be coupled to the wires WA, and the source pads PDHS1a and PDHS1b are electrodes (pad electrode, electrode pads, or bonding pads) to be coupled to the metal plate MP1.

The gate pad PDHG of the semiconductor chip CPH is electrically coupled to the respective gate electrodes of the foregoing high-side power MOSFET QH1 and the foregoing sense MOSFET QS1 which are formed in the semiconductor chip CPH. That is, the gate pad PDHG of the semiconductor chip CPH serves as each of the gate pad (bonding pad) of the foregoing high-side power MOSFET QH1 and the gate pad (bonding pad) of the foregoing sense MOSFET QS1. The gate pad PDHG is disposed closer to one end (end portion opposing the semiconductor chip CPC) in the longitudinal direction of the semiconductor chip CPH. That is, the gate pad PDHG is disposed over the main surface of the semiconductor chip CPH and along the side thereof opposing the semiconductor chip CPC (more specifically, in the vicinity of the middle of the foregoing side). The semiconductor chip CPH is disposed in a state where the gate pad PDHG faces the semiconductor chip CPC. The gate pad PDHG is electrically coupled to a pad PDC1 over the main surface of the semiconductor chip CPC through the wire or wires WA. That is, one end of the wire WA is bonded to the gate pad PDHG of the semiconductor chip CPH, while the other end thereof is bonded to the pad PDC1 of the semiconductor chip CPC. The wires WA are each formed of a thin wire of a metal such as, e.g., gold (Au). Specifically, the gate pad PDHG of the semiconductor chip CPH is electrically coupled to the pad PDC1 of the semiconductor chip CPC via the wire WA, and is further electrically coupled to the foregoing driver circuit DR1 in the semiconductor chip CPC through the internal wiring of the semiconductor chip CPC (see FIG. 1 described above).

The source pads PDHS1a, PDHS1b, PDHS2, and PDHS3 of the semiconductor chip CPH are each electrically coupled to the source of the foregoing high-side power MOSFET QH1 formed in the semiconductor chip CPH. On the other hand, the source pad PDHS4 of the semiconductor chip CPH is electrically coupled to the source of the foregoing sense MOSFET QS1 formed in the semiconductor chip CPH. That is, the source pads PDHS1a, PDHS1b, PDHS2, and PDHS3 of the semiconductor chip CPH correspond to the source pads (bonding pads) of the foregoing high-side power MOSFET QH1, while the source pad PDHS4 of the semiconductor chip CPH corresponds to the source pad (bonding pad) of the foregoing sense MOSFET QS1. The source pads PDHS1a and PDHS1b are formed larger than the foregoing gate pad PDHG and the source pads PDHS2, PDHS3, and PDHS4. On the other hand, the source pads PDHS2, PDHS3, and PDHS4 are disposed closer to one end (end portion opposing the semiconductor chip CPC) in the longitudinal direction of the semiconductor chip CPH to which the foregoing gate pad PDHG is disposed closer. That is, the source pads PDHS2, PDHS3, and PDHS4 are arranged over the main surface of the semiconductor chip CPH and along the side thereof opposing the semiconductor chip CPC. Accordingly, the gate pad PDHG and the source pads PDHS2, PDHS3, and PDHS4 are arranged over the main surface of the semiconductor chip CPH and along the side thereof opposing the semiconductor chip CPC. The source pads PDHS1a, PDHS1b, PDHS2, and PDHS3 are isolated from each other by the uppermost-layer protective film (insulating film corresponding to a protective film 12 described later) of the semiconductor chip CPH. However, as will be described later, the source pads PDHS1a, PDHS1b, PDHS2, and PDHS3 are integrally formed and electrically coupled to each other in the layers under the protective film (uppermost-layer protective film of the semiconductor chip CPH).

The source pads PDHS1a and PDHS1b of the semiconductor chip CPH (i.e., the source of the foregoing high-side power MOSFET QH1) are electrically coupled to the die pad DP3 via the metal plate (high-side metal plate) MP1. That is, the metal plate MP1 is bonded to the source pads PDHS1a and PDHS1b of the semiconductor chip CPH via a conductive adhesive layer (bonding material) SD2, and is also bonded to the upper surface of the die pad DP3 via a conductive adhesive layer (bonding material) SD3. The adhesive layers SD2 and SD3 are each comprised of a conductive bonding material (adhesive material), which is preferably a solder. However, a paste-type conductive adhesive material (which is already in a cured state) such as a silver paste can also be used. By using the metal plate MP1, compared to the case where the source pads PDHS1a and PDHS1b of the semiconductor chip CPH are coupled to the die pad DP3 via the wires, the ON resistance of the high-side power MOSFET QH1 can be reduced. Therefore, it is possible to reduce package resistance and reduce a conduction loss.

The source pads PDHS1a and PDHS1b of the semiconductor chip CPH are pads (bonding pads) for outputting a current flowing in the power MOSFET QH1. The current flowing in the power MOSFET QH1 is outputted from the pads PDHS1a and PDHS1b to the outside of the semiconductor chip CPH, passes through the metal plate MP1 and the die pads DP3, and is outputted from one of leads LD2 (corresponding to the foregoing terminal TE4) to the outside of the semiconductor device SM1 (outputted to the coil L1 of FIG. 1 described above).

The metal plate MP1 is a conductor plate comprised of a conductor. Preferably, the metal plate MP1 is formed of a metal (metal material) having a high electrical conductivity and a high thermal conductivity, such as copper (Cu), a copper (Cu) alloy, aluminum (Al), or an aluminum (Al) alloy. More preferably, the metal plate MP1 is formed of copper (Cu) or a copper (Cu) alloy in terms of its excellent workability, high thermal conductivity, and relatively low price. By thus using the metal plate MP1 formed of a metal material lower in price than gold instead of wires formed of gold (Au), the cost of the semiconductor device SM1 can be reduced. The dimensions (widths) of the metal plate MP1 in the first direction X and the second direction Y are each larger than the diameter of each of the wires WA.

To bond (couple) the metal plate MP1 to the source pads PDHS1a and PDHS1b of the semiconductor chip CPH and to the die pad DP3, it is also possible to directly bond (couple) the metal plate MP1 thereto by compression bonding or the like without using the conductive adhesive layers (bonding materials) SD2 and SD3. In this case, the metal plate MP1 is preferably formed of aluminum (Al) or an aluminum (Al) alloy. However, in the case of bonding (coupling) the metal plate MP1 to the source pads PDHS1a and PDHS1b of the semiconductor chip CPH and to the die pad DP3 using a solder (i.e., using a solder for the adhesive layers SD2 and SD3), displacement of the metal plate MP1 is more likely to occur. Therefore, as will be described later, the effect of applying the present embodiment is enhanced. In the case of using a solder for the adhesive layers SD2 and SD3, the metal plate MP1 is preferably formed of copper (Cu) or a copper (Cu) alloy.

The metal plate MP1 integrally has a first portion MP1a, a second portion MP1b, and a third portion MP1c as shown below.

The first portion (chip contact portion or high-side chip contact portion) MP1a is bonded to the source pads PDHS1a and PDHS1b via the conductive adhesive layer SD2 to be electrically coupled thereto, and has, e.g., a rectangular shape. As shown in the cross-sectional view of FIG. 5, the first portion MP1a is formed flat so as to extend along the main surface of the semiconductor chip CPH.

The second portion (mounting-portion contact portion or chip-mounting-portion contact portion) MP1b is bonded to the die pad (DP3) (to the main surface thereof) via the conductive adhesive layer SD3 to be electrically coupled thereto. As shown in the cross section of FIG. 5, the second portion MP1b is formed flat so as to extend along the main surface of the die pad DP3.

The third portion (middle portion) MP1c joins (couples) the first portion MP1a and the second portion MP1b. The third portion MP1c and the second portion MP1b are provided to extend from the long side of the first portion MP1a along the second direction Y so as to couple the first portion MP1a to the die pad DP3. As shown in the cross section of FIG. 5, between the semiconductor chip CPH and the die pad DP3, the third portion MP1c is provided at a height higher than those of the first portion MP1a and the second portion MP1b in such a manner as to go further away from the main surface of the semiconductor chip CPH. Note that the height mentioned herein means a distance from each of the back surfaces of the die pads DP1, DP2, and DP3 used as a reference to a position away therefrom in the thickness direction (direction perpendicularly intersecting the main surface of the semiconductor chip CPH) of the sealing portion MR.

Each of the semiconductor chip CPH and the semiconductor chip CPL has a rectangular two-dimensional shape having a pair of long sides and a pair of short sides intersecting the pair of long sides. The semiconductor chip CPH and the semiconductor chip CPL have the respective long sides thereof opposing each other. The metal plate MP1 is disposed so as to intersect the long side of the semiconductor chip CPH opposing the semiconductor chip CPL.

The metal plate MP1 is disposed so as to cover a part of the main surface of the semiconductor chip CPH serving as a heat generation source. The semiconductor chip CPH is sandwiched between the metal plate MP1 and the die pad DP2. Accordingly, heat generated in the semiconductor chip CPH can be not only radiated from the back surface of the semiconductor chip CPH through the die pad DP2, but also radiated from the main surface of the semiconductor chip CPH through the metal plate MP1. As a result, it is possible to improve the heat radiation property of the heat generated in the semiconductor chip CPH.

The source pad PDHS2 of the semiconductor chip CPH is electrically coupled to one of leads LD5 included in the plurality of leads LD and not coupled to the die pads DP1, DP2, and DP3 through the wire or wires WA. That is, one end of the wire WA is bonded to the source pad PDHS2 of the semiconductor chip CPH, while the other end thereof is bonded to the lead LD5. The lead LD5 coupled to the pad PDHS2 of the semiconductor chip CPH via the wire or wires WA serves as the foregoing terminal TE5. Specifically, the source pad PDHS2 of the semiconductor chip CPH is electrically coupled to the lead LD5 via the wire WA, and is further electrically coupled to the foregoing capacitor CBT outside the semiconductor device SM1 through the wiring or the like of the mounting substrate (corresponding to the wiring substrate 21 described later) over which the semiconductor device SM1 is mounted (see FIG. 1 described above).

The source pad PDHS3 of the semiconductor chip CPH is electrically coupled to a pad PDC2 over the main surface of the semiconductor chip CPC through the wire or wires WA. That is, one end of the wire WA is bonded to the source pad PDHS3 of the semiconductor chip CPH, while the other end thereof is bonded to the pad PDC2 of the semiconductor chip CPC. Specifically, the source pad PDHS3 of the semiconductor chip CPH is electrically coupled to the pad PDC2 of the semiconductor chip CPC via the wire or wires WA, and is further electrically coupled to the foregoing amplifier circuit AMP1 and the foregoing driver circuit DR1 in the semiconductor chip CPC through the internal wiring of the semiconductor chip CPC (see FIG. 1 described above). The source pad PDHS3 of the semiconductor chip CPH is a pad (bonding pad) for detecting the source voltage of the power MOSFET QH1.

The source pad PDHS4 of the semiconductor chip CPH is electrically coupled to a pad PDC3 over the main surface of the semiconductor chip CPC through the wire or wires WA. That is, one end of the wire WA is bonded to the source pad PDHS4 of the semiconductor chip CPH, while the other end thereof is bonded to the pad PDC3 of the semiconductor chip CPC. Specifically, the source pad PDHS4 of the semiconductor chip CPH is electrically coupled to the pad PDC3 of the semiconductor chip CPC via the wire WA, and is further electrically coupled to the foregoing amplifier circuit AMP1 and the foregoing transistor TR1 in the semiconductor chip CPC through the internal wiring of the semiconductor chip CPC (see FIG. 1 described above).

Here, the pads PDC2 and PDC3 are coupled to the amplifier circuit AMP1 by the internal wiring of the semiconductor chip CPC. The amplifier circuit AMP1 drives the transistor TR1 in accordance with the difference between the input voltage of the pad PDC2 and the input voltage of the pad PDC3 to control a current flowing in the sense MOSFET QS1 such that the input voltage of the pad PDC2 is the same as (equal to) the input voltage of the pad PDC3. Therefore, a circuit formed of the amplifier circuit AMP1 and the transistor TR1 can be regarded as a circuit (first circuit) for controlling the current flowing in the sense MOSFET QS1 such that the voltage (input voltage) of the pad PDC2 is the same as the voltage (input voltage) of the pad PDC3. The circuit is coupled to the pads PDC2 and PDC3 in the semiconductor chip CPC. Since the pad, PDHS3 is coupled to the pad PDC2 by one of the wires WA and the pad PDHS4 is coupled to the pad PDC3 by another of the wires WA, the output voltage of the pad PDHS3 of the semiconductor chip CPH corresponds to the input voltage of the pad PDC2, and the output voltage of the pad PDHS4 of the semiconductor chip CPH corresponds to the input voltage of the pad PDC3.

The die pad (low-side chip mounting portion) DP3 is formed in a rectangular two-dimensional shape which is longer in the first direction X than in the second direction Y. To the die pad DP3, the plurality of leads LD2 included in the foregoing plurality of leads LD are integrally coupled. That is, the die pad DP3 and the plurality of leads LD2 are integrally formed. The plurality of leads LD2 (in some cases, the die pad DP3 also) serve as the foregoing terminal (output terminal) TE4.

Over the main surface (upper surface) of the die pad DP3, the foregoing power transistor semiconductor chip CPL is mounted with the main surface (top surface or upper surface) thereof facing upward and the back surface (lower surface) thereof facing the die pad DP3. That is, the semiconductor chip CPL is mounted (by face-up bonding) over the die pad DP3 via the conductive adhesive layer SD1, and bonded (fixed) thereto. The main surface and the back surface of the semiconductor chip CPL are opposite to each other.

The semiconductor chip CPL is formed in a rectangular two-dimensional shape, and disposed such that the long sides of the semiconductor chip CPL extend along the longitudinal direction of the die pad DP3. The planar area of the semiconductor chip CPL is larger than the planar area of each of the foregoing semiconductor chips CPH and CPC. Since the ON time of the low-side power MOSFET QL1 is longer than that of the high-side power MOSFET QH1, the ON resistance of the power MOSFET QL1 needs to be reduced to be lower than the ON resistance of the power MOSFET QH1. Accordingly, the semiconductor chip CPL is formed to have an outer size (area) larger than the outer size (area) of the semiconductor chip CPH. The back surface (entire back surface) of the semiconductor chip CPL is formed with a back-side electrode (electrode) BE2. The back-side electrode BE2 is bonded to the die pad DP3 via the conductive adhesive layer SD1 to be electrically coupled thereto. The back-side electrode BE2 of the semiconductor chip CPL is electrically coupled to the drain of the foregoing low-side power MOSFET QL1 formed in the semiconductor chip CPL. That is, the back-side electrode BE2 of the semiconductor chip CPL corresponds to the drain electrode of the foregoing low-side power MOSFET QL1.

Over the main surface (top surface or upper surface) of the semiconductor chip CPL, a gate bonding pad (hereinafter simply referred to as a pad) PDLG and source bonding pads (hereinafter simply referred to as pads) PDLS1, PDLS2, PDLS3, and PDLS4 are disposed. Among them, the gate pad PDLG and the source pad PDLS4 are electrodes (pad electrodes or electrode pads) to be coupled to the wires WA, and the source pads PDLS1, PDLS2, and PDLS3 are electrodes (pad electrodes or electrode pads) to be coupled to the metal plate MP2.

The gate pad PDLG of the semiconductor chip CPL is electrically coupled to the gate electrode of the foregoing low-side power MOSFET QL1 formed in the semiconductor chip CPL. That is, the gate pad PDLG of the semiconductor chip CPL corresponds to the gate pad (bonding pad) of the foregoing low-side power MOSFET QL1. The gate pad PDLG is disposed in the vicinity of the corner portion closer to one end in the longitudinal direction of the semiconductor chip CPL. The semiconductor chip CPL is disposed in a state where the foregoing gate pad PDLG faces the foregoing semiconductor chip CPC. The gate pad PDLG is electrically coupled to a pad PDC4 over the main surface of the foregoing semiconductor chip CPC through the wire or wires WA. That is, one end of the wire WA is bonded to the gate pad PDLG of the semiconductor chip CPL, while the other end thereof is bonded to the pad PDC4 of the semiconductor chip CPC. Specifically, the gate pad PDLG of the semiconductor chip CPL is electrically coupled to the pad PDC4 of the semiconductor chip CPC via the wire WA, and is further electrically coupled to the foregoing driver circuit DR2 in the semiconductor chip CPC through the internal wiring of the semiconductor chip CPC (see FIG. 1 described above).

The source pads PDLS1, PDLS2, PDLS3, and PDLS4 of the semiconductor chip CPL are each electrically coupled to the source of the foregoing low-side power MOSFET QL1 formed in the semiconductor chip CPL. That is, the source pads PDLS1, PDLS2, PDLS3, and PDLS4 of the semiconductor chip CPL correspond to the source pads (bonding pads) of the foregoing low-side power MOSFET QL1. The source pads PDLS1, PDLS2, and PDLS3 are formed larger than the foregoing gate pad PDLG and the source pad PDLS4 into, e.g., a rectangular shape extending along the longitudinal direction (first direction X) of the semiconductor chip CPL. On the other hand, the source pads PDLS4 are disposed in the vicinity of the corner portion closer to one end in the longitudinal direction of the semiconductor chip CPL in which the foregoing gate pad PDLG is disposed. The source pads PDLS1, PDLS2, PDLS3, and PDLS4 are isolated from each other by the uppermost-layer protective film (insulating film corresponding to the protective film 12 described later) of the semiconductor chip CPL. However, the source pads PDLS1, PDLS2, PDLS3, and PDLS4 are integrally formed and electrically coupled to each other in the layers under the protective film (uppermost-layer protective film of the semiconductor chip CPL).

The source pads PDLS1, PDLS2, and PDLS3 (i.e., the source of the foregoing low-side power MOSFET QL1) are electrically coupled to the lead wire LB via the metal plate (low-side metal plate) MP2. Accordingly, compared to the case where the source pads PDLS1, PDLS2, and PDLS3 are electrically coupled to the lead wire LB via the wires, the ON resistance of the low-side power MOSFET QL1 can be reduced. Therefore, it is possible to reduce package resistance and a conduction loss.

The metal plate MP2 is a conductor plate comprised of a conductor. Preferably, the metal plate MP1 is formed of the same material as that of the foregoing metal plate MP1, and is preferably formed of a metal (metal material) having a high electrical conductivity and a high thermal conductivity, such as copper (Cu), a copper (Cu) alloy, aluminum (Al), or an aluminum (Al) alloy. Similarly to the foregoing metal plate MP1, the metal plate MP2 is also more preferably formed of copper (Cu) or a copper (Cu) alloy in terms of its excellent workability, high thermal conductivity, and relatively low price. By thus using the metal plate MP2 formed of a metal material lower in price than gold instead of wires formed of gold (Au), the cost of the semiconductor device SM1 can be reduced. The dimensions (widths) of the metal plate MP2 in the first direction X and the second direction Y are each larger than the diameter of each of the wires WA. In addition, the planar area of the metal plate MP2 is larger than the planar area of the metal plate MP1.

Note that, to bond (couple) the metal plate MP2 to the source pads PDLS1, PDLS2, and PDLS3 of the semiconductor chip CPL and to the lead wire LB, it is also possible to directly bond (couple) the metal plate MP2 thereto by compression bonding or the like without using the conductive adhesive layers (bonding materials) SD2 and SD3. In this case, the metal plate MP2 is preferably formed of aluminum (Al) or an aluminum (Al) alloy. On the other hand, in the case of bonding (coupling) the metal plate MP2 to the source pads PDLS1, PDLS2, and PDLS3 of the semiconductor chip CPL and to the lead wire LB using a solder (i.e., using a solder for the adhesive layers SD2 and SD3), the metal plate MP2 is preferably formed of copper (Cu) or a copper (Cu) alloy.

The metal plate MP2 integrally has a first portion MP2a, a second portion MP2b, and a third portion MP2c as shown below.

The first portion (chip contact portion or low-side chip contact portion) MP2a is bonded to each of the source pads PDLS1, PDLS2, and PDLS3 via the conductive adhesive layer SD2 to be electrically coupled thereto, and has, e.g., a rectangular shape. As shown in the cross-sections of FIGS. 5 and 6, the first portion MP2a is formed flat so as to extend along the main surface of the semiconductor chip CPL.

The second portion (lead contact portion) MP2b is bonded to the lead wire LB via the conductive adhesive layer SD3 to be electrically coupled thereto. The second portion MP2b two-dimensionally overlaps a part of the lead wire LB. As shown in the cross sections of FIGS. 5 and 6, the second portion MP2b is formed flat so as to extend along the main surface of the lead wire LB.

The third portion (middle portion) MP2c joins (couples) the first portion MP2a and the second portion MP2b.

A pair of the third portion MP2c and the second portion MP2b or a plurality of pairs of the third portions MP2c and the second portions MP2b can be provided. In the case of FIG. 2, one pair of the third portion MP2c and the second portion MP2b provided to extend from the short side of the first portion MP2a along the first direction X so as to couple the first portion MP2a to the lead wire LB and three pairs of the third portions MP2c and the second portions MP2b provided to extend from the long side of the first portion MP2a along the second direction Y so as to couple the first portion MP2a to the lead wire LB are provided. As shown in the cross sections of FIGS. 5 and 6, between the semiconductor chip CPL and the lead wire LB, the third portion MP2c is provided at a height higher than those of the first portion MP2a and the second portion MP2b in such a manner as to go further away from the main surface of the semiconductor chip CPL.

The metal plate MP2 is disposed so as to cover a part of the main surface of the semiconductor chip CPL serving as a heat generation source. The semiconductor chip CPL is sandwiched between the metal plate MP2 and the die pad DP3. Accordingly, heat generated in the semiconductor chip CPL can be not only radiated from the back surface of the semiconductor chip CPL through the die pad DP3, but also radiated from the main surface of the semiconductor chip CPL through the metal plate MP2. As a result, it is possible to improve the heat radiation property of the heat generated in the semiconductor chip CPL.

The source pad PDLS4 of the semiconductor chip CPL is electrically coupled to a pad PDC5 over the main surface of the semiconductor chip CPC through the wire or wires WA. That is, one end of the wire WA is bonded to the source pad PDLS4 of the semiconductor chip CPL, while the other end thereof is bonded to the pad PDC5 of the semiconductor chip CPC. Specifically, the source pad PDLS4 of the semiconductor chip CPL is electrically coupled to the pad PDC5 of the semiconductor chip CPC via the wire WA, and is further electrically coupled to the foregoing driver circuit DR2 in the semiconductor chip CPC through the internal wiring of the semiconductor chip CPC (see FIG. 1 described above).

The lead wire LB is disposed in the vicinity of one of the corner portions of the die pad DP3 and in a state apart from and adjacent to the die pad DP3. The two-dimensional shape of the lead wire LB is in a two-dimensional L-shaped pattern extending along the short side and the long side of the die pad DP3 intersecting each other with one of the corner portions of the die pad DP3 interposed therebetween. This can shorten the current path of the main circuit and therefore reduce inductance.

To the lead wire LB, a plurality of leads LD3 included in the foregoing plurality of leads LD are integrally coupled. That is, the lead wire LB and the plurality of leads LD3 are integrally formed. The plurality of leads LD3 serve as the foregoing terminal TE2 so that the foregoing reference potential GND is supplied to the leads LD3 (terminal TE2). Therefore, the lead wire LB and the plurality of leads LD3 integrally coupled thereto can be regarded as a ground terminal portion for supplying the ground potential.

By thus collectively couple the plurality of leads LD3 to the lead wire LB, the volume can be increased to be higher than in the case where the plurality of leads LD3 are provided separately. Accordingly, wiring resistance can be reduced, and the reference potential GND can be strengthened. In such a configuration, consideration is given to the fact that an increase in the source-side ON resistance of the low-side power MOSFET QL1 greatly affects an increase in switching loss. That is, by providing a configuration as described above, it is possible to reduce the source-side ON resistance of the power MOSFET QL and therefore reduce a conduction loss in the power MOSFET QL1. Moreover, since the reference potential GND can be strengthened, operational stability can be improved.

The foregoing die pad (control chip mounting portion) DP1 is formed in a generally rectangular two-dimensional shape. To the die pad DP1, a plurality of leads LD4 included in the foregoing plurality of leads LD are integrally coupled. That is, the die pad DP1 and the plurality of leads LD4 are integrally formed. Over the main surface (upper surface) of the die pad DP1, the semiconductor chip CPC formed with the foregoing control circuit CLC is mounted with the main surface (top surface or upper surface) thereof facing upward and the back surface (lower surface) thereof facing the die pad DP1. The semiconductor chip CPC is mounted (by face-up bonding) over the die pad DP1 via an adhesive layer SD4, and bonded (fixed) thereto. The adhesive layer SD4 may be either conductive or insulating. The semiconductor chip CPC is also formed in a rectangular two-dimensional shape. Of the pads formed over the main surface of the semiconductor chip CPC, the pads PDC1, PDC2, and PDC3 coupled to the semiconductor chip CPH (power MOSFET QH1 and sense MOSFET QS1) by the wires WA are disposed over the main surface of the semiconductor chip CPC so as to be closer to the side thereof which is adjacent to the semiconductor chip CPH. On the other hand, the pads PDC4 and PDC 5 coupled to the semiconductor chip CPL (power MOSFET QL1) with the wires WA are disposed over the main surface of the semiconductor chip CPC so as to be closer to the side thereof which is adjacent to the semiconductor chip CPL. This can further shorten the lengths of the wires WA and therefore further reduce parasitic inductance occurring in the wiring path.

The plurality of pads PD disposed over the main surface of the semiconductor chip CPC include not only the foregoing pads PDC1 to PDC5, but also pads for inputting signals to the respective driver circuits DR1 and DR2 or outputting signals therefrom, a pad for supplying the reference potential GND, and the like. These pads (PD) are electrically coupled to the leads LD5 included in the plurality of leads LD and not coupled to the die pads DP1, DP2, and DP3 through the plurality of wires WA. The plurality of pads PD disposed over the main surface of the semiconductor chip CPC can also include pads electrically coupled to the foregoing leads LD4 through the wires WA. Of the plurality of leads LD, the leads LD5 not coupled to the die pads DP1, DP2, and DP3 include a lead serving as the foregoing terminal TE3, and the lead is also electrically coupled to the pad (that one of the pads PD which is electrically coupled to the drain of the foregoing transistor TR) of the semiconductor chip CPC through the wire WA.

<About Example of Mounting of Semiconductor Device SM1>

Figure 9:
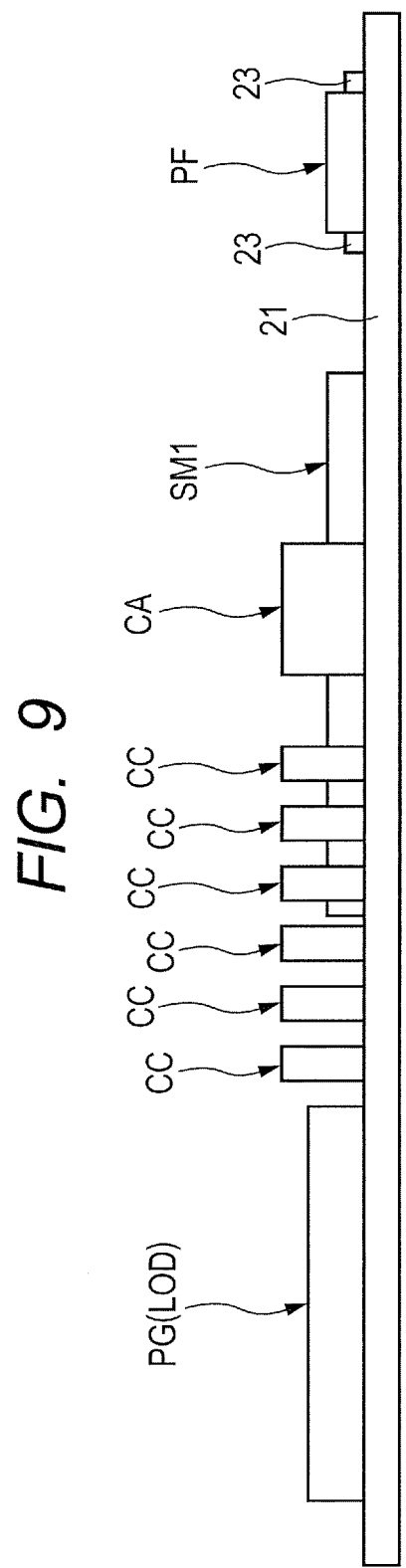
FIG. 9 is a side view of the example of the mounting of FIG. 8.

FIG. 8 is a main-portion plan view showing an example of the mounting of the semiconductor device SM1. FIG. 9 is a side view obtained by viewing FIG. 8 from the direction shown by an arrow 20.

The wiring substrate (mounting substrate) 21 is comprised of, e.g., a printed wiring substrate, and has the semiconductor device SM1, packages PF and PG, and chip components CA, CB, and CC mounted over the main surface thereof. Note that, in FIG. 8, wires 22a to 22d are shown through the semiconductor device SM1 to be clearly seen. FIG. 8 is a plan view but, for improved clarity of illustration, the wires 22a, 22b, 22c, 22d, and 22e of the wiring substrate 21 are hatched.

The package PF is formed with a control circuit for controlling the semiconductor chip CPC (control circuit CLC) of the semiconductor device SM1. The package PG is formed with the foregoing load LOD. The chip component CA is formed with the foregoing coil L1. The chip component CB is formed with an input capacitor. The chip component CC is formed with the foregoing output capacitor Cout.

The potential (power source potential) VIN of the input power source is supplied to the leads LD1 and the die pad DP2 of the semiconductor device SM1 through the wire 22a of the wiring substrate 21. The ground potential GND is supplied to the leads LD3 of the semiconductor device SM1 through the wire 22b of the wiring substrate 21.

To the leads LD5 of the semiconductor device SM1, leads (terminals) 23 of the package PF are electrically coupled through the wires 22c of the wiring substrate 21. The leads LD2 as the output terminals (each, corresponding to the foregoing output node N1) and the die pad DP3 of the semiconductor device SM1 are each electrically coupled to one end of the chip component CA (coil L1) through the wire 22d of the wiring substrate 21. The other end of the chip component CA (coil L1) is electrically coupled to the wire 22e of the wiring substrate 21.

To the wire 22e, the input lead (terminal) of the package PG (load LOD) is electrically coupled. The lead (terminal) for the reference potential of the package PG (load LOD) is electrically coupled to the foregoing wire 22b. Between the wires 22b and 22e, the foregoing chip component CC (output capacitor Cout) is electrically coupled.

The semiconductor device SM1 is solder-mounted over the wiring substrate 21. That is, the leads LD and the die pads DP2 and DP3 which are exposed at the back surface (lower surface) of the semiconductor device SM1 are bonded to the wires 22a to 22d of the wiring substrate 21 via a solder to be electrically coupled thereto.

<About Configuration of Semiconductor Chip CPH>

Next, a description will be given to a configuration of the semiconductor chip CPH formed with the foregoing power MOSFET QH1 and the sense MOSFET QS1.

Figure 10:
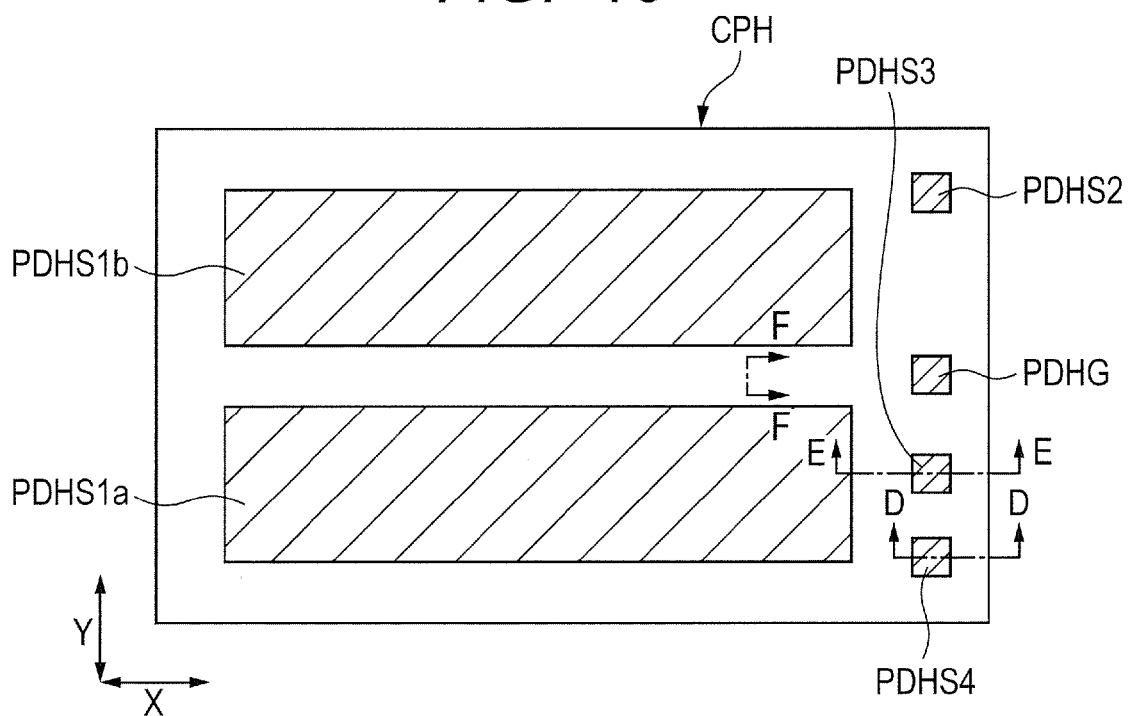
FIG. 10 is a plan view showing a chip layout of a semiconductor chip used in the semiconductor device as the embodiment of the present invention.
Figure 11:
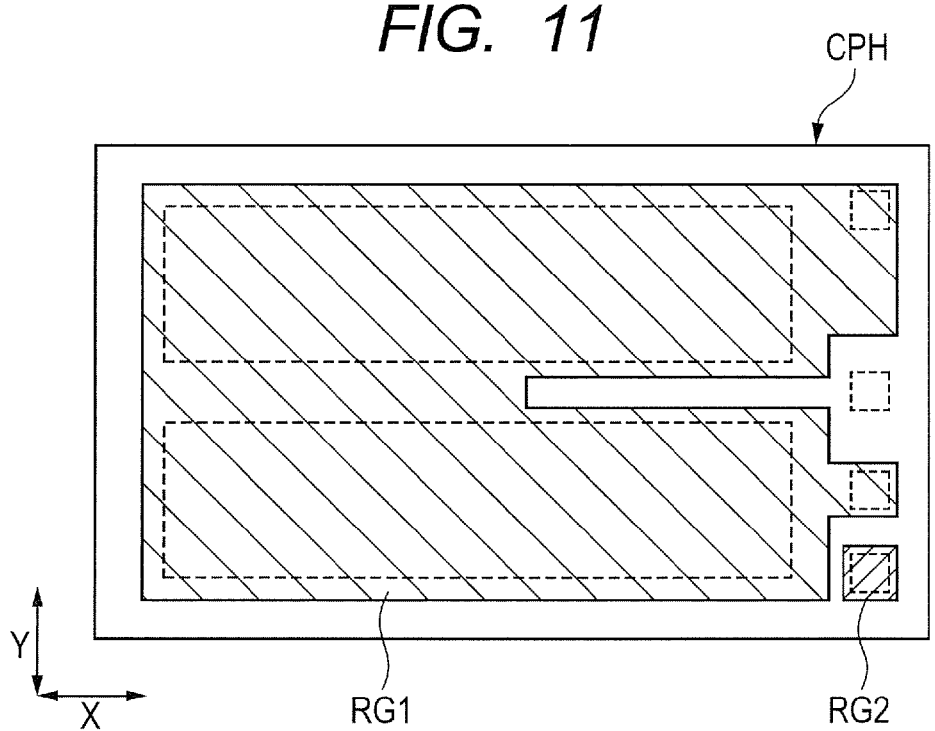
FIG. 11 is a plan view showing the chip layout of the semiconductor chip used in the semiconductor device as the embodiment of the present invention.
Figure 12:
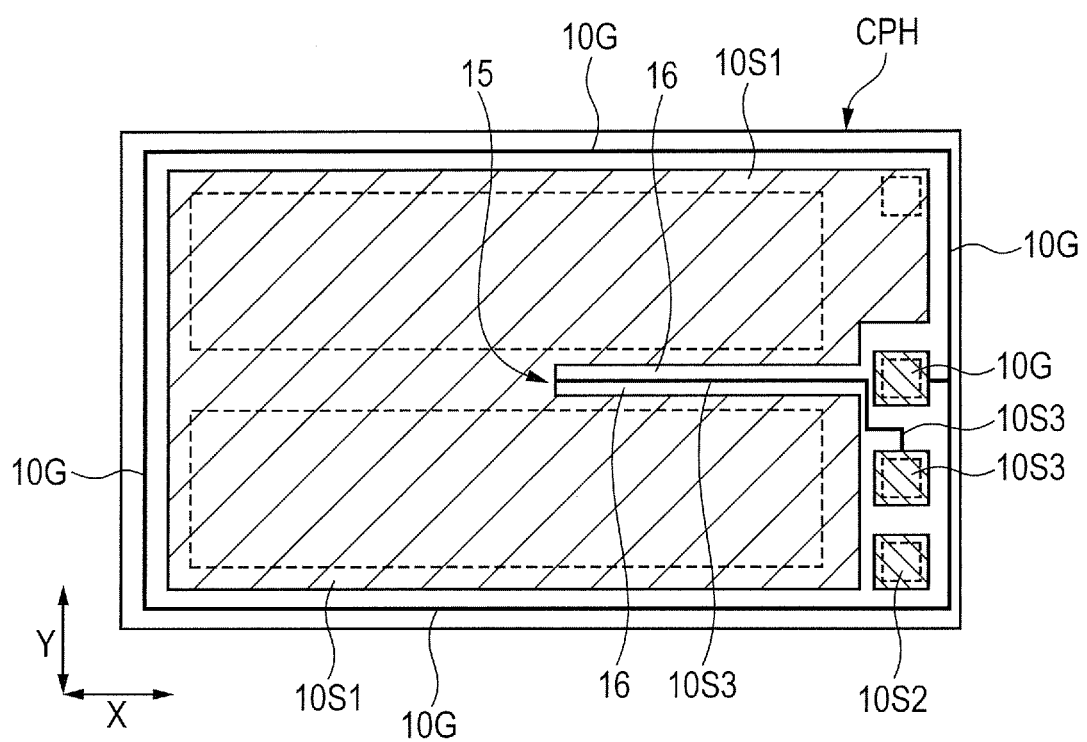
FIG. 12 is a plan view showing the chip layout of the semiconductor chip used in the semiconductor device as the embodiment of the present invention.
Figure 13:
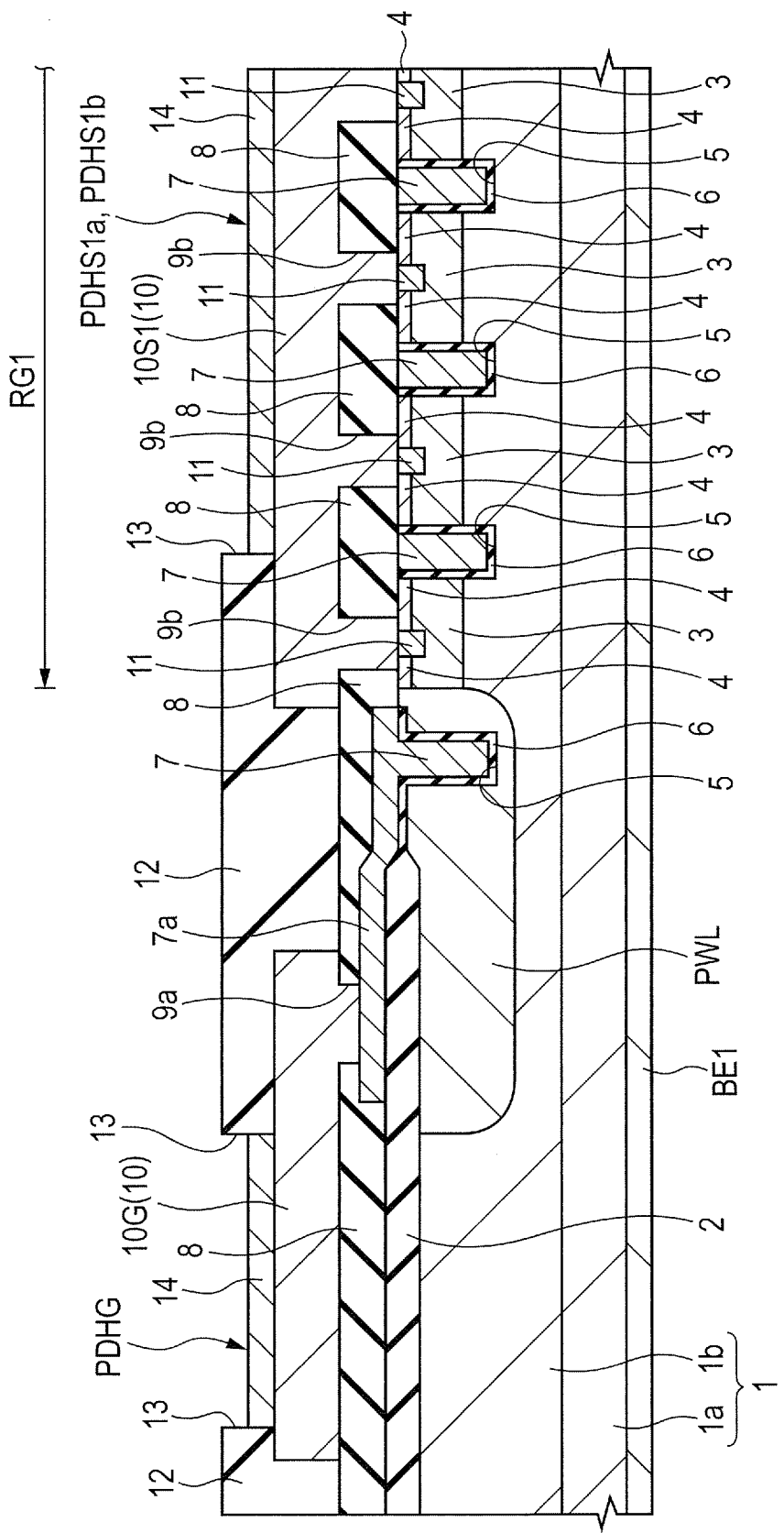
FIG. 13 is a main-portion cross-sectional view of the semiconductor chip used in the semiconductor device as the embodiment of the present invention.
Figure 14:
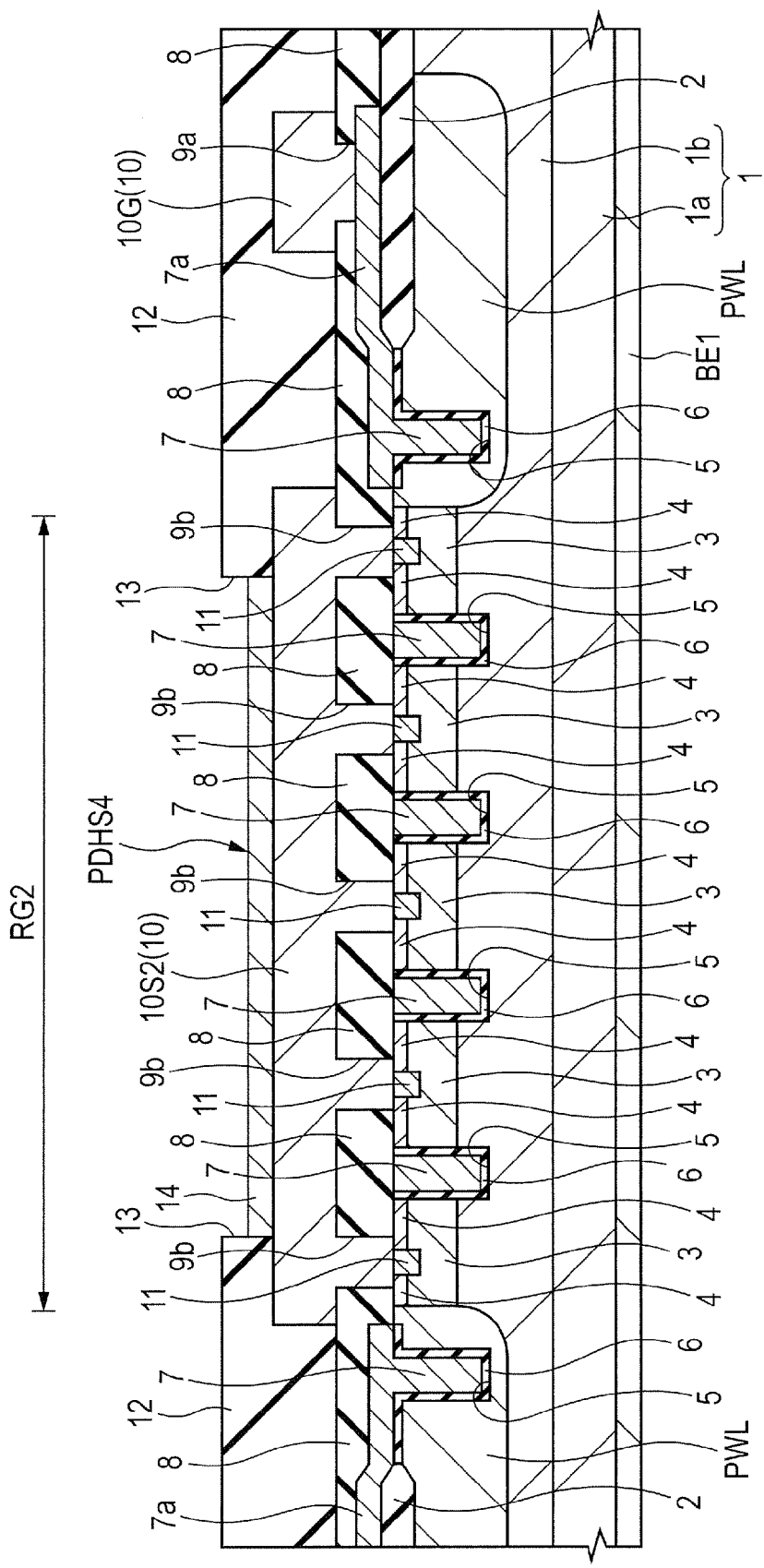
FIG. 14 is a main-portion cross-sectional view of the semiconductor chip used in the semiconductor device as the embodiment of the present invention.
Figure 15:
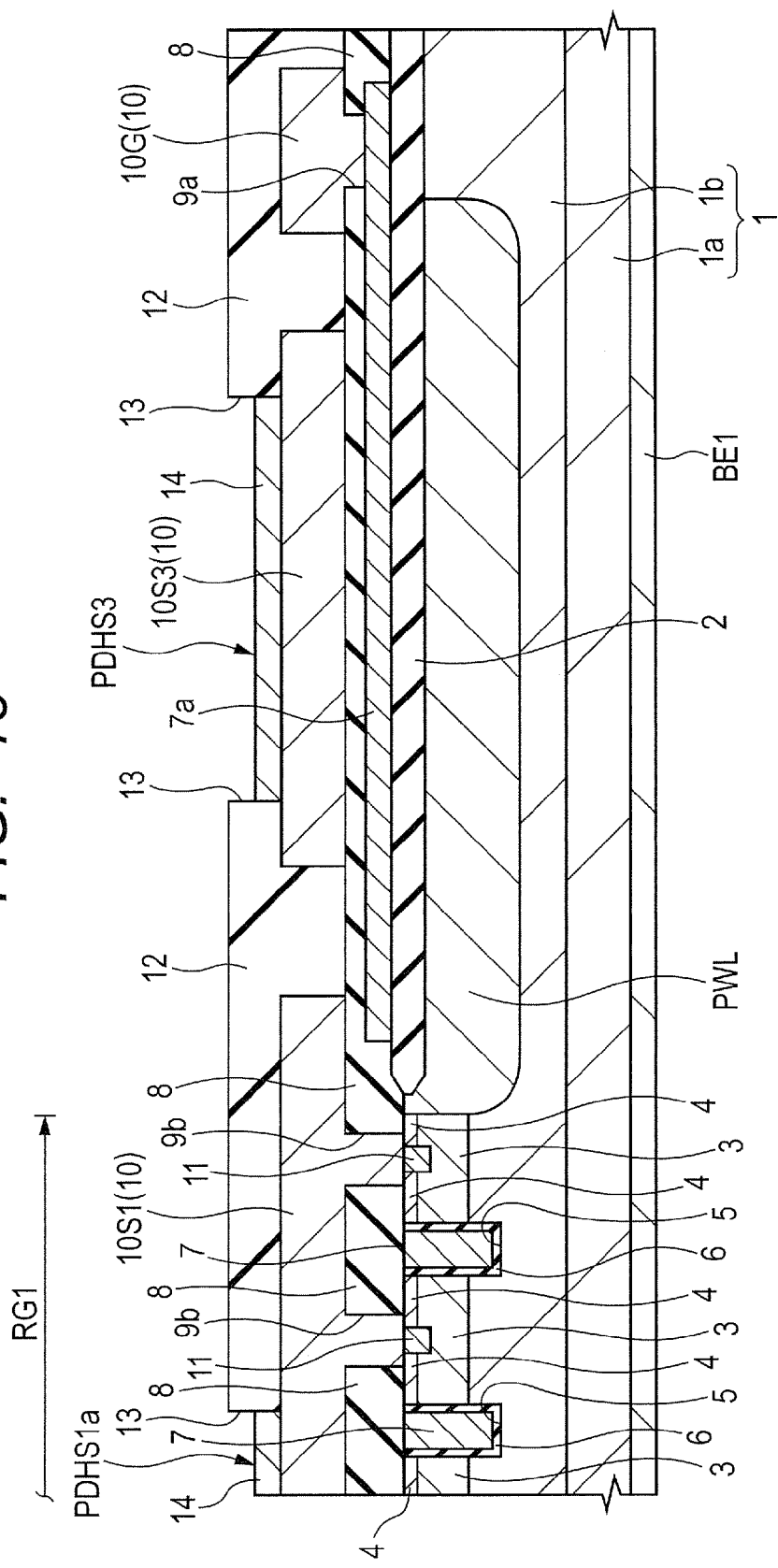
FIG. 15 is a main-portion cross-sectional view of the semiconductor chip used in the semiconductor device as the embodiment of the present invention.
Figure 16:
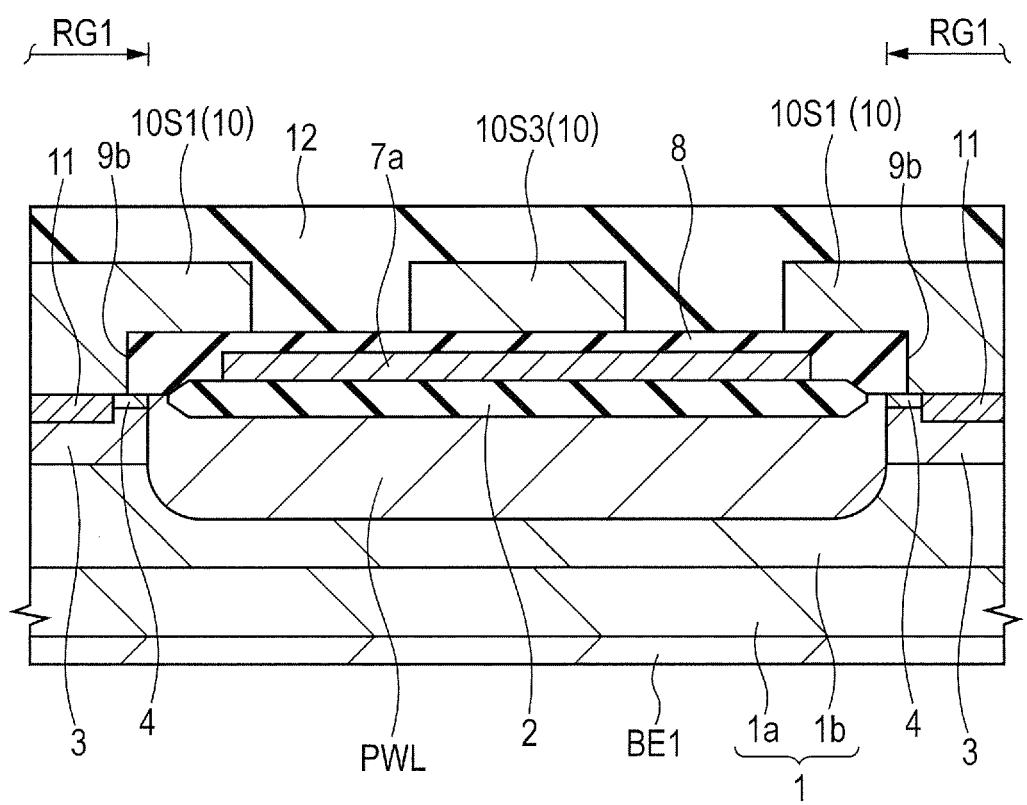
FIG. 16 is a main-portion cross-sectional view of the semiconductor chip used in the semiconductor device as the embodiment of the present invention.

FIGS. 10 to 12 are plan views showing the chip layout of the semiconductor chip CPH. FIGS. 13 to 16 are main-portion cross-sectional views of the semiconductor chip CPH. Among them, FIG. 10 corresponds to the top view of the semiconductor chip CPH. FIG. 10 is a plan view but, for easier understanding, the bonding pads (pads PDHG, PDHS1a, PDHS1b, PDHS2, PDHS3, and PDHS4) are hatched. In FIG. 11, a main MOSFET region RG1 and a sense MOSFET region RG2 in the semiconductor chip CPH are shown by hatching, and the positions of the bonding pads PDHG, PDHS1a, PDHS1b, PDHS2, PDHS3, and PDHS4 are shown by the dotted lines. In FIG. 12, the layout of metal wires (a gate wire 10G and source wires 10S1, 10S2, and 10S3) in the semiconductor chip CPH is shown by the hatched regions and the thick lines, and the positions of the bonding pads (pads PDHG, PDHS1a, PDHS1b, PDHS2, PDHS3, and PDHS4) are shown by the dotted lines. Note that the positions of the bonding pads (pads PDHG, PDHS1a, PDHS1b, PDHS2, PDHS3, and PDHS4) shown by the dotted lines in FIGS. 10 and 11 correspond to the regions shown by hatching in FIG. 10. In FIG. 13, the portion (range) denoted by the mark RG1 corresponds to the main-portion cross-sectional view of the main MOSFET region RG1. FIG. 14 substantially corresponds to a cross-sectional view along the line D-D of FIG. 10. In FIG. 14, the portion (range) denoted by the mark RG2 corresponds to the main-portion cross-sectional view of the sense MOSFET region RG2. FIG. 15 substantially corresponds to a cross-sectional view along the line E-E of FIG. 10. FIG. 16 substantially corresponds to a cross-sectional view along the line F-F of FIG. 10. Note that, hereinbelow, a description will be given to the configuration of the semiconductor chip CPH with reference to FIGS. 10 to 16 but, basically, the same description can be applied also to a configuration of the semiconductor chip CPL except that the sense MOSFET region RG2 and the source wires 10S2 and 10S3 are not provided therein.

The foregoing power MOSFET QH1 is formed over the main surface of a semiconductor substrate (hereinafter simply referred to as a substrate) 1 forming the semiconductor chip CPH. As shown in FIGS. 13 to 16, the substrate 1 has a substrate main body (semiconductor substrate or semiconductor wafer) 1a comprised of n$^+$-type single-crystal silicon into which, e.g., arsenic (As) has been introduced or the like, and an epitaxial layer (semiconductor layer) 1b comprised of, e.g., n$^-$-type single-crystal silicon and formed over the main surface of the substrate main body 1a. Accordingly, the substrate 1 is a so-called epitaxial wafer. In the main surface of the epitaxial layer 1b, a field insulating film (isolation region) 2 comprised of, e.g., a silicon oxide or the like is formed. The field insulating film 2 is formed of an insulator such as a silicon oxide film, and can function as the isolation region for delimiting (defining) active regions.

In the main MOSFET region RG1, in the active region surrounded by the field insulating film 2 and a p-type well PWL in a layer located thereunder, a plurality of unit transistor cells forming the power MOSFET QH1 are formed. The power MOSFET QH1 is formed of the plurality of unit transistor cells provided in the main MOSFET region RG1 and coupled in parallel to each other. In the sense MOSFET region RG2, in the active region surrounded by the field insulating film 2 and the p-type well PWL in the layer located thereunder, a plurality of unit transistor cells forming the sense MOSFET QS1 are formed. The sense MOSFET QS1 is formed of the plurality of unit transistor cells provided in the sense MOSFET region RG2 and coupled in parallel to each other. The individual unit transistor cells formed in the main MOSFET region RG1 and the individual unit transistor cells formed in the sense MOSFET region RG2 have basically the same structures (configurations). However, the main MOSFET region RG1 is different in area from the sense MOSFET region RG2, and the area of the main MOSFET region RG1 is larger than that of the sense MOSFET region RG2. In other words, the area of the sense MOSFET region RG2 is smaller than that of the main MOSFET region RG1. Accordingly, the number of the coupled unit transistor cells in the power MOSFET QH1 is different from the number of the coupled unit transistor cells in the sense MOSFET QS1. The number of the unit transistor cells forming the sense MOSFET QS1 and coupled in parallel to each other is smaller than the number of the unit transistor cells forming the power MOSFET QH1 and coupled in parallel to each other. As a result, as long as the source potential in the sense MOSFET QS1 is the same as the source potential in the power MOSFET QH1, in the sense MOSFET QS1, a current smaller than the current flowing in the power MOSFET QH1 flows. Each of the unit transistor cells of the main MOSFET region RG1 and the sense MOSFET region RG2 is formed of, e.g., an n-channel MOSFET having a trench gate structure.

The foregoing substrate main body 1a and the epitaxial layer 1b have the function of the drain region of each of the unit transistor cells. Over the back surface (entire back surface) of the substrate 1 (semiconductor chip CPH), the back-side electrode for drain (back-side drain electrode or drain electrode) BE1 is formed. The back-side electrode BE1 is formed by successively stacking, e.g., a titanium (Ti) layer, a nickel (Ni) layer, and a gold (Au) layer in an ascending order from the back surface of the substrate 1. In the foregoing semiconductor device SM1, the back-side electrode BE1 of the semiconductor chip CPH is bonded to the foregoing die pad DP2 via the foregoing adhesive layer SD1 to be electrically coupled thereto.

In the main MOSFET region RG1 and the sense MOSFET region RG2, a p-type semiconductor region 3 formed in the epitaxial layer 1b has the function of the channel formation region of each of the foregoing unit transistor cells. In addition, an n$^+$-type semiconductor region 4 formed over the p-type semiconductor region 3 has the function of the source region of each of the foregoing unit transistor cells. Accordingly, the semiconductor region 4 is a semiconductor region for sources.

In the main MOSFET region RG1 and the sense MOSFET region RG2, trenches 5 are formed in the substrate 1 to extend from the main surface of the substrate 1 in the thickness direction thereof. The trenches 5 are formed to extend from the upper surface of the n$^+$-type semiconductor region 4 through the n$^+$-type semiconductor region 4 and the p-type semiconductor region 3 and terminate in the epitaxial layer 1b in a layer located thereunder. Over the bottom surfaces and side surfaces of the trenches 5, gate insulating films 6 each comprised of a silicon oxide or the like are formed. In the trenches 5, gate electrodes 7 are embedded via the foregoing gate insulating films 6. The gate electrodes 7 are each comprised of a polysilicon film into which, e.g., an n-type impurity (e.g., phosphorus) has been introduced. Each of the gate electrodes 7 has the function of the gate electrode of each of the foregoing unit transistor cells.

Over a part of the field insulating film 2 also, wiring portions 7a for gate extraction each comprised of a conductive film in the same layer as those of the gate electrodes 7 are formed. The gate electrodes 7 and the wiring portions 7a for gate extraction are integrally formed and electrically coupled to each other. Each of the wiring portions 7a for gate extraction is electrically coupled to the gate wire 10G through a contact hole (opening or through hole) 9a formed in an insulating film 8 covering the wiring portions 7a for gate extraction.

The gate wire 10G is electrically coupled to the plurality of gate electrodes 7 formed in the main MOSFET region RG1 through the wiring portions 7a for gate extraction, and also electrically coupled to the plurality of gate electrodes 7 formed in the sense MOSFET region RG2 through the wiring portions 7a for gate extraction. Accordingly, the gate wire 10G is electrically coupled to the gate electrodes 7 (i.e., the gate electrodes 7 for the foregoing power MOSFET QH1) in the main MOSFET region RG1 and to the gate electrodes 7 (i.e., the gate electrodes 7 for the foregoing sense MOSFET QS1) in the sense MOSFET region RG2. FIG. 12 shows a case where the gate wire 10G extends along the outer periphery of the main surface of the semiconductor chip CPH. The gate wire 10G is a wire (wire for gate) electrically coupling the gate pad PDHG to the gate electrodes 7 for the power MOSFET QH1 formed in the main MOSFET region RG1 and to the gate electrodes 7 for the sense MOSFET QS1 formed in the sense MOSFET region RG2, and is formed in the same layer as those of the source wires 10S1, 10S2, and 10S3. That is, the gate wire 10G and the source wires 10S1, 10S2, and 10S3 are formed in the same layer.

On the other hand, the source wire 10S1 is electrically coupled to the n$^+$-type source semiconductor region 4 formed in the main MOSFET region RG1 through contact holes (openings or through holes) 9b formed in the insulating film 8 in the main MOSFET region RG1. The source wire 10S1 is also electrically coupled to a p$^+$-type semiconductor region 11 formed in the upper portions of the p-type semiconductor region 3 and between the portions of the n$^+$-type semiconductor region 4 adjacent to each other in the main MOSFET region RG1. Through the p$^+$-type semiconductor region 11, the source wire 10S1 is electrically coupled to the p-type semiconductor region 3 for channel formation in the main MOSFET region RG1. The source wire 10S1 is formed in a region substantially overlapping (matching) the main MOSFET region RG1 in planar view. Note that, when the wording "in planar view" is used, it means that something is viewed in a plane parallel with the main surface of the semiconductor chip CPH. The wording "in planar view" may also be expressed as "when viewed in two dimensions".

The source wire 10S2 is electrically coupled to the n$^+$-type source semiconductor region 4 formed in the sense MOSFET region RG2 through the contact holes (openings or through holes) 9b formed in the insulating film 8 in the sense MOSFET region RG2. The source wire 10S2 is electrically coupled to the p$^+$-type semiconductor region 11 formed in the upper portions of the p-type semiconductor region 3 and between the portions of the n$^+$-type source semiconductor region 4 adjacent to each other in the sense MOSFET region RG2. Through the p$^+$-type semiconductor region 11, the source wire 10S2 is electrically coupled to the p-type semiconductor region 3 for channel formation in the sense MOSFET region RG2. The source wire 10S2 is formed in a region substantially overlapping (matching) the sense MOSFET region RG2 in planar view.

The source wire 10S3 extends over the field insulating film (isolation region) 2, and the unit transistor cells are not formed under the source wire 10S3. Consequently, none of the contact holes 9b is formed at a position overlapping the source wire 10S3 in two dimensions (in planar view) (i.e., under the source wire 10S3). The source wire 10S3 is not coupled to the n$^+$-type source semiconductor region 4 through the contact holes 9b under the source wire 10S3. That is, in planar view, the main MOSFET region RG1 is provided so as to avoid the source wire 10S3 (i.e., so as not to overlap the source wire 10S3). However, since one end of the source wire 10S3 is coupled to the source wire 10S1 and the source wires 10S3 and 10S1 are integrally formed, the source wire 10S3 is electrically coupled to the source wire 10S1. It follows therefore that the source wire 10S3 is electrically coupled to the n$^+$-type source semiconductor region 4 formed in the memory MOSFET region RG1 through the source wire 10S1 and the contact holes 9b at positions overlapping the source wire 10S1 in two dimensions (in planar view).

The gate wire 10G and the source wires 10S1, 10S2, and 10S3 are formed by forming a conductor film 10 over the insulating film 8 formed with the contact holes 9a and 9b so as to fill the contact holes 9a and 9b, and patterning the conductor film 10. That is, the gate wire 10G and the source wires 10S1, 10S2, and 10S3 are each formed of the patterned conductor film 10. It is also possible to regard the patterned conductor film 10 as a wire. The conductor film 10 is comprised of a metal film, and preferably comprised of an aluminum film or an aluminum alloy film. Accordingly, the gate wire 10G and the source wires 10S1, 10S2, and 10S3 are each formed of the conductor film 10 in the same layer, but are isolated from each other. Note that the gate wire 10G is coupled to none of the source wires 10S1, 10S2, and 10S3 and the source wire 10S2 is coupled to none of the gate wire 10G and the source wires 10S1 and 10S3, while the source wire 10S3 has one end thereof (one end of the source wire 10S3) coupled to the source wire 10S1.

The conductor film 10 (including the gate wire 10G and the source wires 10S1, 10S2, and 10S3) is covered with the protective film (insulating film) 12 comprised of a polyimide resin or the like. That is, over the insulating film 8, the protective film 12 is formed so as to cover the conductor film 10 (including the gate wire 10G and the source wires 10S1, 10S2, and 10S3). The protective film 12 is the uppermost-layer film (insulating film) of the semiconductor chip CPH. In the protective film 12, a plurality of openings 13 are formed and, from each of the openings 13, a part of the conductor film 10 is exposed. The conductor film 10 exposed from the openings 13 serves as the pad electrodes (bonding pads). The foregoing pads PDHG, PDHS1, PDHS2, PDHS3, and PDHS4 are each formed of the conductor film 10 exposed from the openings 13.

That is, the gate wire 10G exposed from the opening 13 forms the gate pad (pad electrode) PDHG of the foregoing power MOSFET QH1 and the sense MOSFET QS1. Also, the source wire 10S1 exposed from the openings 13 forms the source pads (pad electrodes) PDHS1a, PDHS1b, and PDHS2 of the foregoing power MOSFET QH1. That is, the source pads PDHS1a and PDHS1b are each formed of the source wire 10S1 formed in the main MOSFET region RG1. Also, the source wire 10S2 exposed from the opening 13 forms the source pad (pad electrode) PDHS4 of the foregoing sense MOSFET QS1. That is, the source pad PDHS4 is formed of the source wire 10S2. Also, the source wire 10S3 exposed from the opening 13 forms the source pad (pad electrode) PDHS3 of the foregoing power MOSFET QH1. That is, the source pad PDHS3 is formed of the source wire 10S3.

As described above, the source pads PDHS1a, PDHS1b, and PDHS2 of the foregoing power MOSFET QH1 are separated by the uppermost-layer protective film 12, but are electrically coupled to each other through the source wire 10S1. Also, the source pad PDHS3 of the foregoing power MOSFET QH1 is separated from the source pads PDHS1a, PDHS1b, and PDHS2 of the foregoing power MOSFET QH1 by the uppermost-layer protective film 12, but is electrically coupled to the pads PDHS1a, PDHS1b, and PDHS2 through the source wires 10S3 and 10S1. On the other hand, the source wire 10S2 is separated from the source wires 10S1 and 10S3 so that the source pad PDHS4 of the sense MOSFET QS1 is electrically decoupled from the source pads PDHS1*a*, PDHS1*b*, PDHS2, and PDHS3 of the power MOSFET QH1 without being short-circuited thereto.

Over the surface of each of the pads PDHS1*a*, PDHS1*b*, PDHS2, PDHS3, PDHS4, and PDHG (i.e., over each of the portions of the conductor film 10 exposed at the bottom portions of the openings 13), a metal layer 14 may also be formed by a plating method or the like. The metal layer 14 is comprised of, e.g., a laminate film of a copper (Cu) film, a nickel (Ni) film, and a gold (Au) film which are formed successively in an ascending order, a laminate film of a titanium (Ti) film, a nickel (Ni) film, and a gold (Au) film formed successively in an ascending order, or the like. By forming the metal layer 14, it is possible to inhibit or prevent the surface of aluminum of the conductor film 10 from being oxidized.

In the semiconductor device SM1, as can be also seen from FIGS. 2 to 7 described above, the metal plate MP1 is bonded to the pads PDHS1*a* and PDHS1*b* included in the plurality of pad electrodes of the semiconductor chip CPH. To the other pad electrodes (which are PDHS2, PDHS3, PDHS4, and PDHG here), the wires WA are coupled.

In the semiconductor chip CPH having such a configuration, the operating currents of the unit transistor cells of the foregoing power MOSFET QH1 and the sense MOSFET QS1 flow in the thickness direction of the substrate 1 between the drain epitaxial layer 1*b* and the n$^+$-type source semiconductor region 4 and along the side surfaces of the gate electrodes 7 (i.e., the side surfaces of the trenches 5). That is, the channels are formed along the thickness direction of the semiconductor chip CPH.

Thus, in the semiconductor chip CPH, the vertical MOSFETs each having a trench-gate structure are formed, and each of the foregoing power MOSFET QH1 and sense MOSFET QS1 is formed of a trench-gate MISFET. Here, the vertical MOSFET corresponds to a MOSFET in which a current between the source and the drain flows in the thickness direction (direction generally perpendicular to the main surface of a semiconductor substrate) of the semiconductor substrate (substrate 1).

Figure 88:
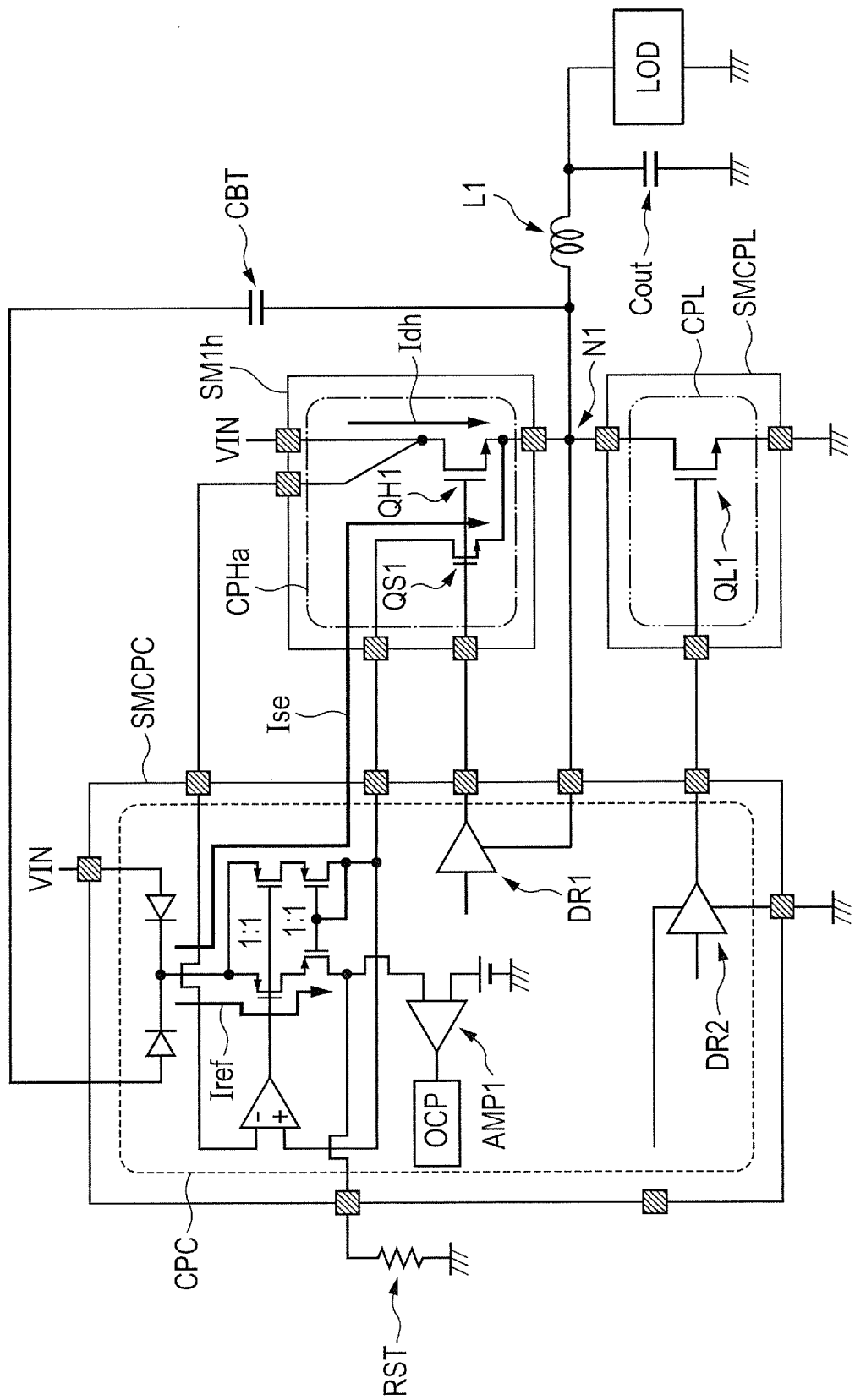
FIG. 88 is a circuit diagram showing an example of an electronic device using the semiconductor device of the other embodiment of the present invention.

Heretofore, the description has been given to the case where, as the foregoing power MOSFET QH1 and sense MOSFET QS1, the n-channel trench-gate MISFETs are formed. In another form, it is also possible to reverse the n-type and p-type conductivity types and form p-channel trench-gate MISFETs as the power MOSFET QH1 and the sense MOSFET QS1. However, in the case where the p-channel trench-gate MISFETs are formed as the power MOSFET QH1 and the sense MOSFET QS1, it is preferable to apply not the circuit of FIG. 1, but a circuit configuration in which, in the circuit diagram of FIG. 88 described later, the respective drain sides of the power MOSFET QH1 and the sense MOSFET QS1 are coupled to the output node N1 (i.e., a circuit configuration in which, in the circuit diagram of FIG. 88, the respective source sides and drain sides of the power MOSFET QH1 and the sense MOSFET QS1 are reversed).

The structure (cross-sectional structure) of the semiconductor chip CPL is basically the same as the structure (cross-sectional structure) of the semiconductor chip CPH. In the semiconductor chip CPL, the vertical MOSFETs each having a trench-gate structure are formed in the same substrate as the foregoing substrate 1. The configuration of each of the unit transistor cells formed in the semiconductor chip CPL is basically the same as that of each of the unit transistor cells in the semiconductor chip CPH.

However, in the semiconductor chip CPL, the sense MOSFET QS1 is not formed, and the plurality of unit transistor cells forming the power MOSFET QL1 are formed in substantially the entire semiconductor chip CPL. The plurality of unit transistor cells are coupled in parallel to each other to form the power MOSFET QL1. In the semiconductor chip CPL, the sense MOSFET QS1 is not formed so that neither the foregoing source wire 10S2 nor the foregoing source wire 10S3 is formed. In the case of the semiconductor chip CPL, the gate wire 10G exposed from the opening 13 of the foregoing uppermost-layer protective film 12 of the semiconductor chip CPL forms the gate pad (pad electrode) PDLG of the foregoing power MOSFET QL1, and the source wire 10S1 exposed from the openings 13 forms the foregoing pads PDLS1, PDLS2, PDLS3, and PDLS4.

<About Problem to be Solved>

In the semiconductor chip CPH, not only the power MOSFET QH1, but also the sense MOSFET QS1 for sensing a current flowing in the power MOSFET QH1 is formed. By bonding the semiconductor chip CPH to the upper surface of the conductive die pad DP2 as the chip mounting portion via the conductive bonding material (adhesive layer SD1), bonding the metal plate MP1 to the semiconductor chip CPH, coupling the wires WA thereto, and sealing them in a resin, the semiconductor device SM1 is formed.

However, the present inventors have found that, when displacement of the metal plate MP1 occurs in such a semiconductor device, the accuracy of sensing the current flowing in the power MOSFET QH1 by means of the sense MOSFET QS1 may be degraded. This will be described below with reference to FIGS. 17 to 23.

Figure 17:
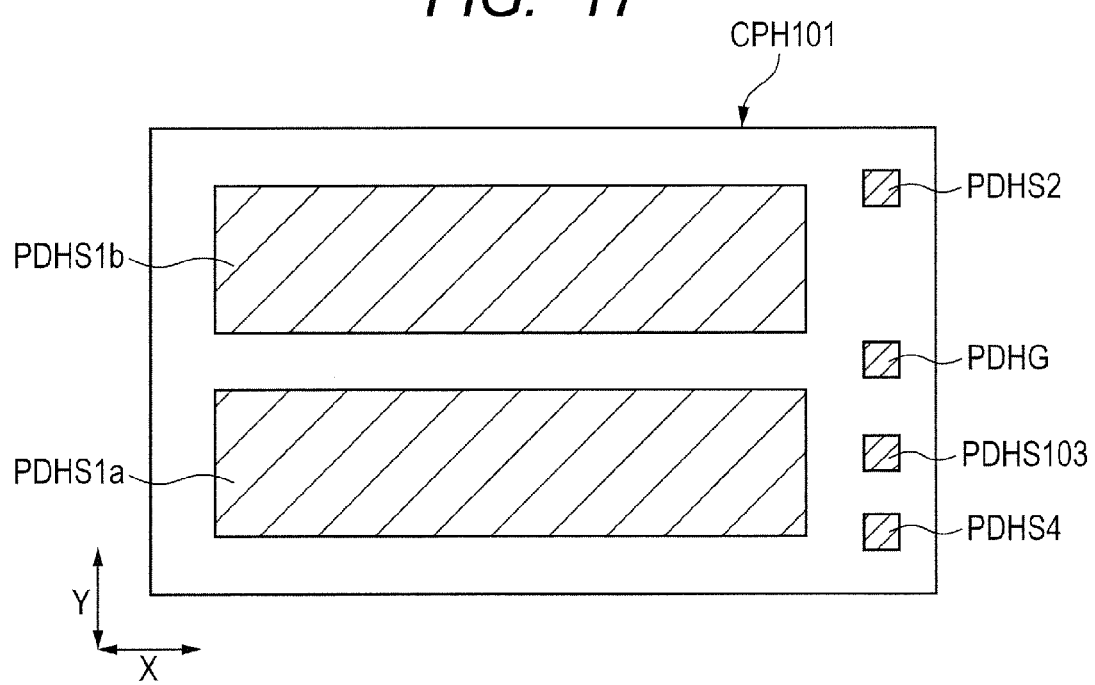
FIG. 17 is a plan view showing a chip layout of a semiconductor chip studied by the present inventors.
Figure 18:
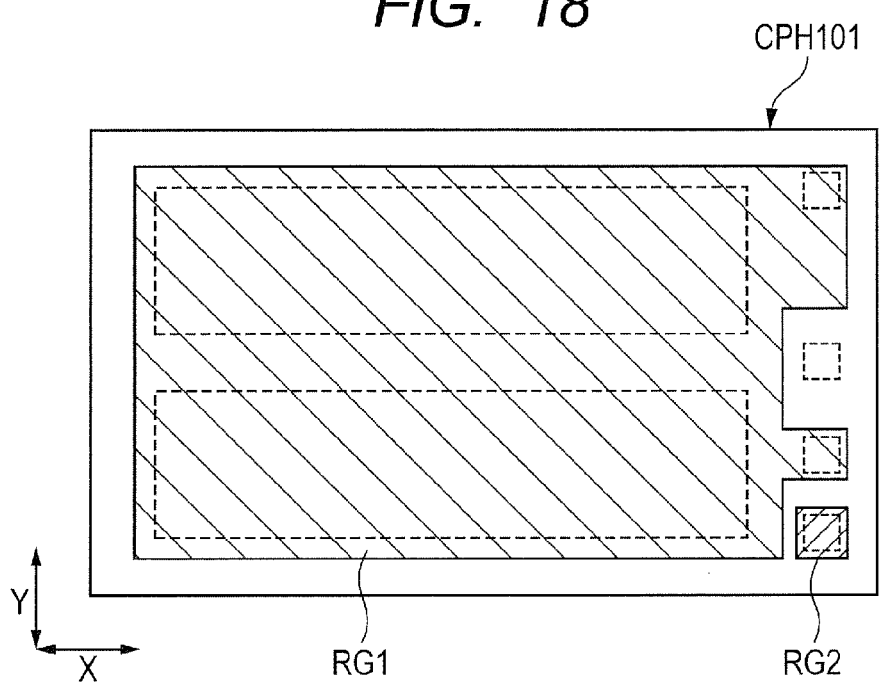
FIG. 18 is a plan view showing the chip layout of the semiconductor chip studied by the present inventors.
Figure 19:
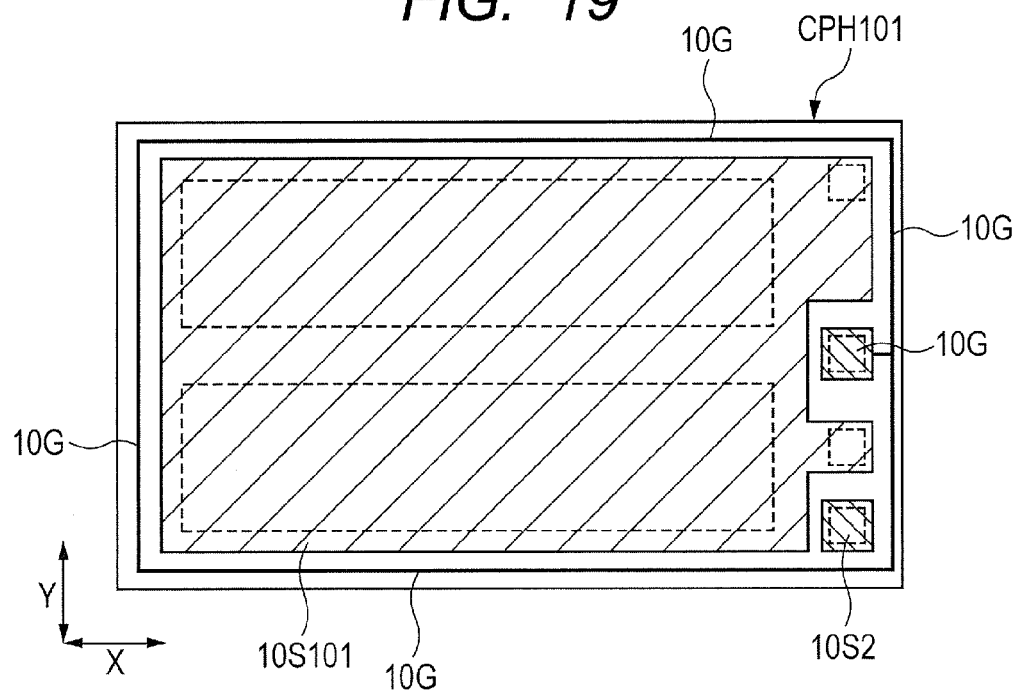
FIG. 19 is a plan view showing the chip layout of the semiconductor chip studied by the present inventors.
Figure 20:
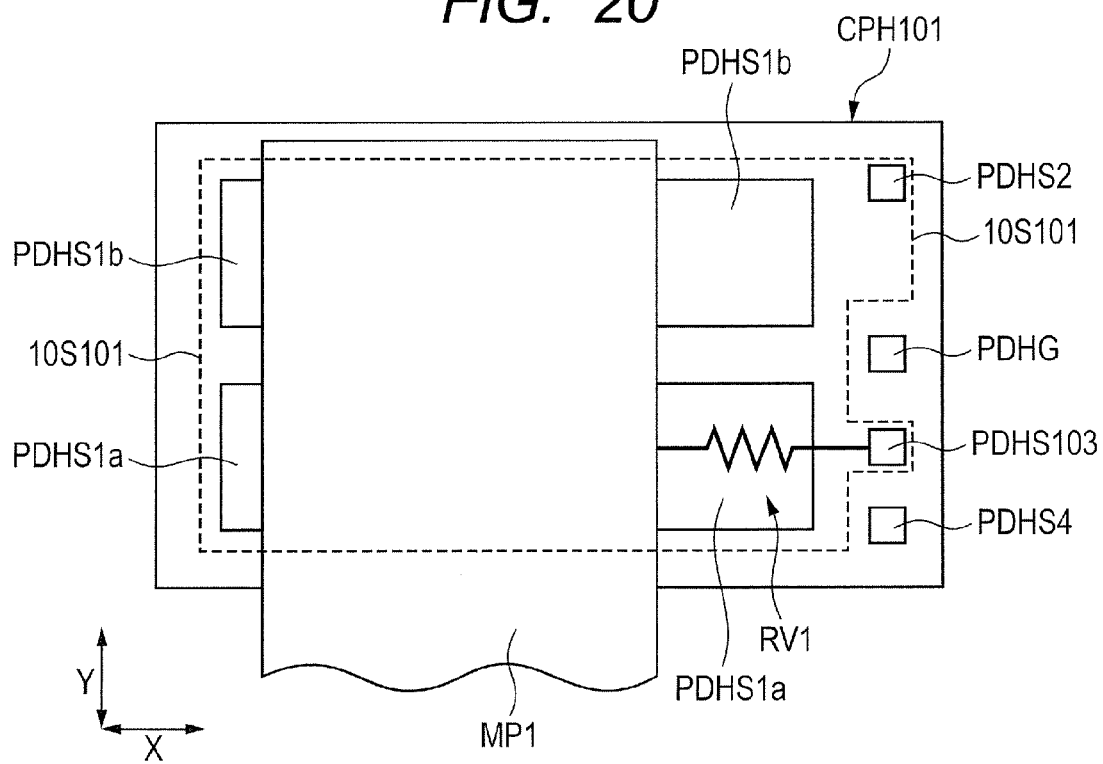
FIG. 20 is a plan view showing a state where a metal plate is bonded to the semiconductor chip of FIGS. 17 to 19.
Figure 21:
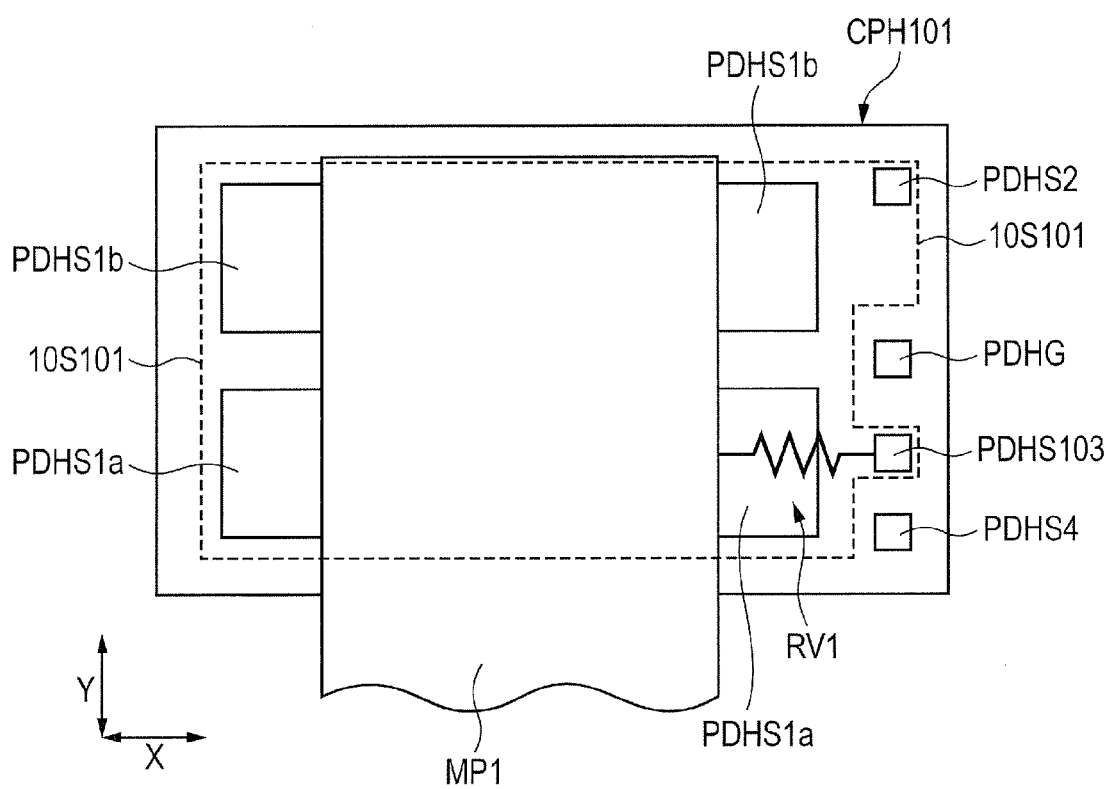
FIG. 21 is a plan view showing a state where the metal plate is bonded to the semiconductor chip of FIGS. 17 to 19.
Figure 22:
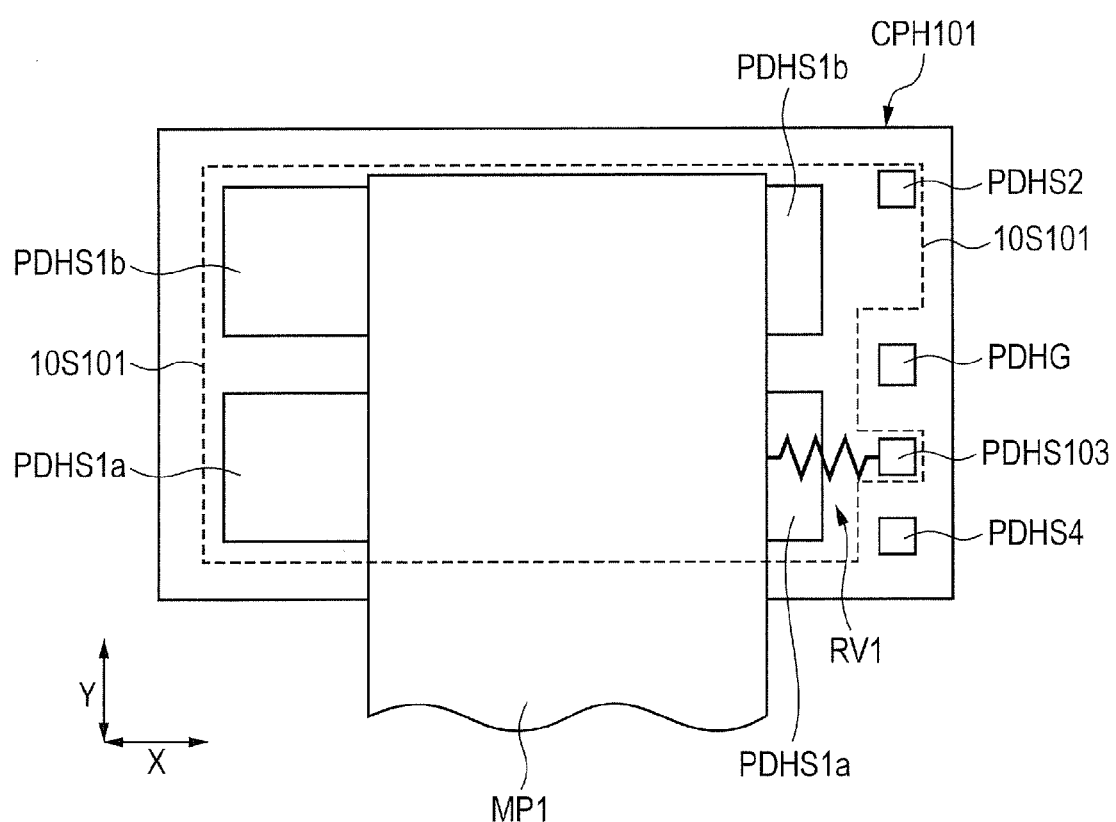
FIG. 22 is a plan view showing a state where the metal plate is bonded to the semiconductor chip of FIGS. 17 to 19.
Figure 23:
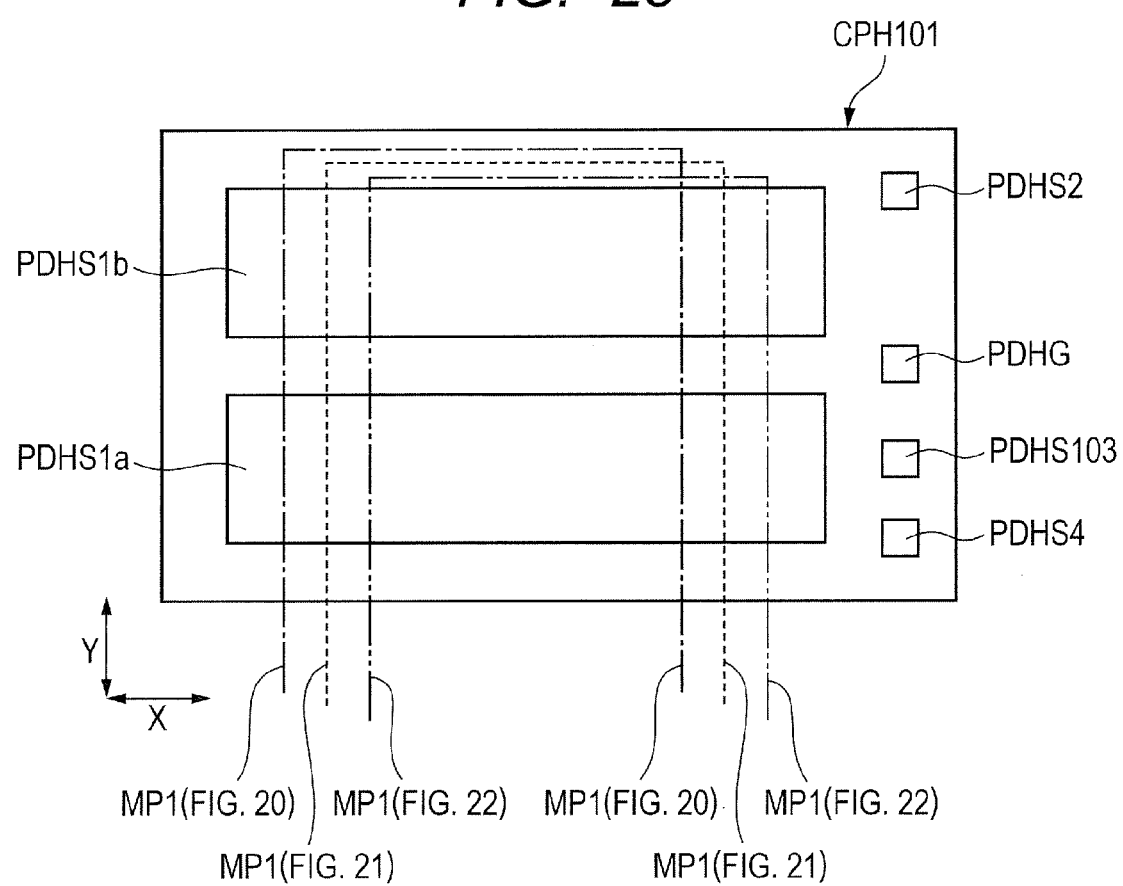
FIG. 23 is a plan view obtained by superimposing FIGS. 20 to 22 on each other.

FIGS. 17 to 23 are illustrative views of the problem found by the present inventors. Among them, FIGS. 17 to 19 are plan views each showing the chip layout of a semiconductor chip CPH101 studied by the present inventors, FIGS. 20 to 22 are plan views each showing a state in which the metal plate MP1 is bonded (coupled) to the semiconductor chip CPH101 (to the pads PDHS1*a* and PDHS1*b* thereof), and FIG. 23 is a plan view obtained by superimposing FIGS. 20 to 22 on each other. Note that FIG. 17 corresponds to FIG. 10 described above, FIG. 18 corresponds to FIG. 11 described above, and FIG. 19 corresponds to FIG. 12 described above.

The semiconductor chip CPH101 of FIGS. 17 to 23 is different from the foregoing semiconductor chip CPH in that the source wire 10S3 is not provided therein. In the semiconductor chip CPH101 of FIGS. 17 to 23, there is no equivalent to the foregoing source wire 10S3. A configuration obtained by extending (forming) the source wire 10S also into the region where the foregoing source wire 10S3 is formed and into the gap region between the foregoing source wires 10S3 and 100S in the foregoing semiconductor chip CPH corresponds to the semiconductor chip CPH101 of FIGS. 17 to 23. In the foregoing semiconductor chip CPH, the foregoing pad PDHS3 is formed of the source wire 10S3 exposed from the foregoing opening 13. By contrast, in the semiconductor chip CPH101 of FIGS. 17 to 23, the pad PDHS3 (a pad PDHS103 corresponding thereto) is formed of the source wire 10S1 exposed from the foregoing opening 13. In the semiconductor chip CPH101, the pad corresponding to the foregoing pad PDHS3 is denoted by the mark PDHS103 and referred to as the pad PDHS103.

In the case of manufacturing an equivalent to the foregoing semiconductor device SM1 using the semiconductor chip CPH101, in the same manner as in the case of using the foregoing semiconductor chip CPH, the metal plate MP1 is bonded to the pads PDHS1*a* and PDHS1*b* of the semiconductor chip CPH101. At this time, displacement of a position at which the metal plate MP1 is bonded may occur. If a comparison is made among FIGS. 20, 21, and 22 based on the position of the metal plate MP1 of FIG. 21, the metal plate PM1 in FIG. 20 has shifted to the left side of the drawing, while the metal plate MP1 in FIG. 22 has shifted to the right side of the drawing. FIG. 23 is a plan view obtained by superimposing FIGS. 20 to 22 on each other. In FIG. 23, the position of the metal plate MP1 in FIG. 20 is shown by the dot-dash line, the position of the metal plate MP1 in FIG. 21 is shown by the dotted line, and the position of the metal plate MP1 in FIG. 22 is shown by the two-dot-dash line.

When such displacement of the metal plate MP1 occurs and the position at which the metal plate MP1 is bonded varies from one manufactured semiconductor device to another, accuracy in sensing a current flowing in the power MOSFET QH1 by means of the sense MOSFET QS1 may be degraded, which will be described hereinbelow.

Figure 24:
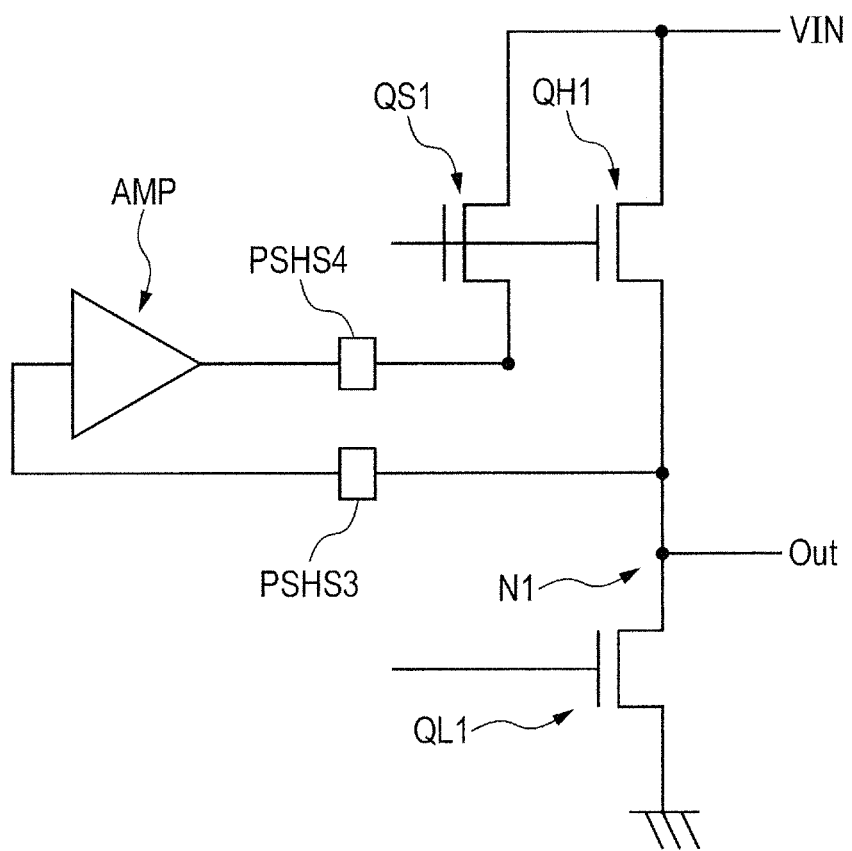
FIG. 24 is a circuit diagram showing an ideal circuit configuration in which a spreading resistance is not produced.
Figure 25:
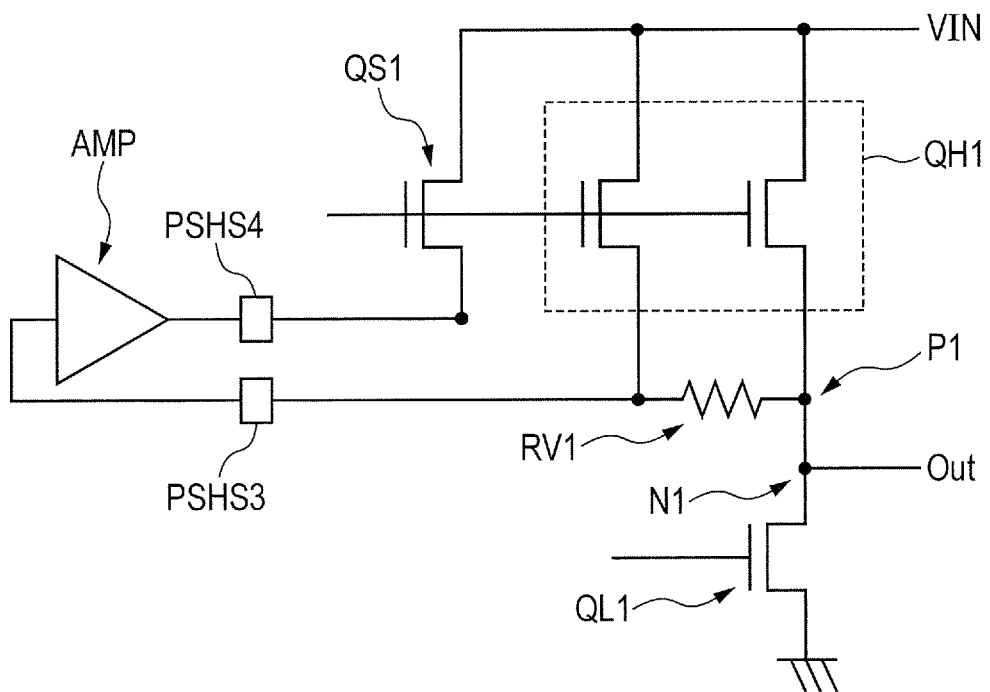
FIG. 25 is a circuit diagram showing a circuit configuration when a spreading resistance is produced.
Figure 26:
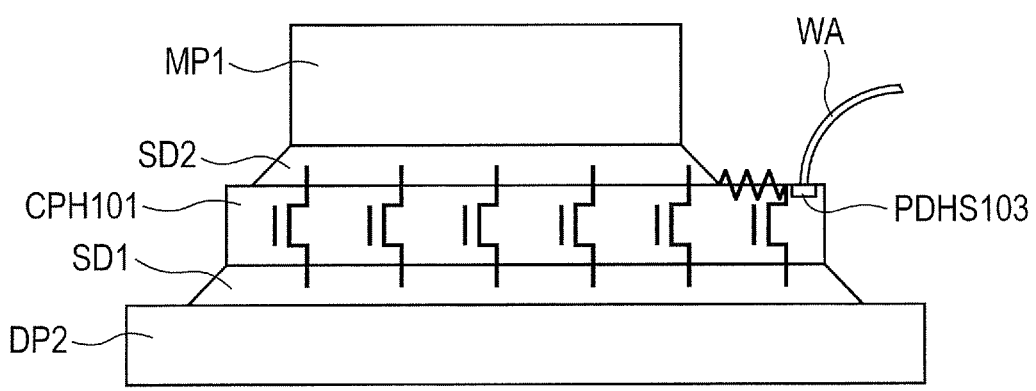
FIG. 26 is an illustrative view (cross-sectional view) showing a state where the metal plate is bonded to the semiconductor chip mounted over a die pad via an adhesive layer.

As schematically shown in FIGS. 20 to 22, in the semiconductor chip CPH101, between the pad PDHS103 and the metal plate MP1, electrical coupling is provided by the source wire 10S1 so that, between the pad PDHS103 and the metal plate MP1, a resistive component (spreading resistance) RV1 formed by the source wire 10S1 is produced (interposed). FIGS. 20 to 22 schematically show the resistive component RV1 using the circuit symbol showing resistance. As shown in FIGS. 20 to 23, when the position at which the metal plate MP1 is bonded fluctuates (varies), the resistive component RV1 also fluctuates (varies). FIG. 24 is a circuit diagram showing an ideal circuit configuration in which a spreading resistance (resistive component RV1) is not produced, which is a part of the circuit of FIG. 1 described above extracted and shown schematically (the illustration of the transistor TR1 of FIG. 1 described above is omitted in FIGS. 24 and 25). FIG. 25 is a circuit diagram showing a circuit configuration when a spreading resistance (resistive component RV1) is produced, which schematically shows the case where the resistive component RV1 is produced in the circuit of FIG. 24. FIG. 26 shows a state where, to the semiconductor chip CPH101 mounted over (bonded to) the upper surface of the die pad DP2 via the adhesive layer SD1, the metal plate MP1 is bonded via the adhesive layer SD2, which schematically shows vertical transistors TR2 forming the power MOSFET QH1 formed in the semiconductor chip CPH101, and the foregoing resistive component RV1. The power MOSFET QH1 is formed of the plurality of vertical transistors TR2 coupled in parallel to each other. Note that the metal plate MP1 is bonded to the pads PDHS1a and PDHS1b of the semiconductor chip CPH101 via the adhesive layer SD2 but, in FIG. 26, the illustration of the pads PDHS1a and PDHS1b is omitted for simpler illustration. If the resistive component RV1 is not produced, a circuit as shown in FIG. 24 is obtained. On the other hand, if the resistive component RV1 is produced as shown in FIGS. 20 to 22 and 26, a circuit as shown in FIG. 25 is obtained.

The amplifier circuit AMP1 controls the voltage (output voltage) of the pad PDHS4 and the voltage (output voltage) of the pad PDHS103 such that they are the same. In the circuit diagram of FIG. 25, a position P1 substantially corresponds to the metal plate MP1, and a voltage (potential) at the position P1 is assumed to be V1 (voltage V1). If the resistive component RV1 is small, an amount of voltage drop due to the resistive component RV1 is small so that the output voltage of the pad PDHS103 is substantially the same as the voltage V1 at the position P1. However, when the resistive component RV1 increases, the amount of voltage drop due to the resistive component RV1 increases so that the output voltage of the pad PDHS103 becomes larger than the voltage V1 at the position P1. That is, the difference between the output voltage of the pad PDHS103 and the voltage V1 at the position P1 varies depending on the magnitude of the resistive component RV1. The foregoing difference tends to be larger as the resistive component RV1 is larger.

Accordingly, if the potential difference between the foregoing potential VIN inputted to the common drain of the power MOSFET QH1 and the sense MOSFET QS1 and the voltage V1 at the position P1 is assumed to be the same, as the resistive component RV1 increases, the potential difference between the potential VIN and the output voltage of the pad PDHS103 decreases. Since the amplifier AMP1 controls the voltage of the pad PDHS4 and the voltage of the pad PDHS103 such that they are the same, as the resistive component RV1 increases, the potential difference between the potential VIN and the output voltage of the pad PDHS decreases. The decrease of the potential difference between the potential VIN and the output voltage of the pad PDHS4 leads to a decrease in a current flowing in the sense MOSFET QS1. Therefore, if the potential difference between the foregoing potential VIN inputted to the common drain of the power MOSFET QH1 and the sense MOSFET QS1 and the voltage V1 at the potential P1 is assumed to be the same, as the resistive component RV1 increases, the current flowing in the sense MOSFET QS1 decreases undesirably. Originally, a current ratio between a current flowing in the power MOSFET QH1 and the current flowing in the sense MOSFET QS1 should be defined by an area ratio between the main MOSFET region RG1 and the sense MOSFET RG2 each formed in the semiconductor chip CPH101. However, due to the resistive component RV1, the current ratio varies, which will be further described below.

In each of the foregoing semiconductor chip CPH and the semiconductor chip CPH101 shown in FIGS. 17 to 19, there are the main MOSFET region RG1 as a region where the MOSFETs forming the power MOSFET QH1 are formed and the sense MOSFET region RG2 as a region where the MOSFETs forming the sense MOSFET QS1 are formed. The main MOSFET region RG1 and the sense MOSFET region RG2 greatly differ in area (the area of the main MOSFET region RG1 is larger than that of the sense MOSFET region RG2). The area ratio between the main MOSFET region RG1 and the sense MOSFET region RG2 in each of the semiconductor chips CPH and CPH101 is set so as to achieve a predetermined ratio between the current flowing in the power MOSFET QH1 and the current flowing in the sense MOSFET QS1.

As described above, as the resistive component RV1 increases, the current flowing in the sense MOSFET QS1 decreases. Accordingly, when the resistive component RV1 varies (fluctuates), the ratio between the current flowing in the power MOSFET QH1 and the current flowing in the sense MOSFET QS1 varies (fluctuates). For example, it is assumed that, when the metal plate MP1 is at the position of FIG. 21 described above, the ratio between the current flowing in the power MOSFET QH1 and the current flowing in the sense MOSFET QS1 is 20000:1. In the case of FIG. 20 described above, the resistive component RV1 becomes larger than in the case of FIG. 21 described above to reduce the current flowing in the sense MOSFET QS1. As a result, the ratio between the current flowing in the power MOSFET QH1 and the current flowing in the sense MOSFET QS1 becomes larger than 20000:1 to reach, e.g., 22000:1. On the other hand, in the case of FIG. 22 described above, the resistive component RV1 becomes smaller than in the case of FIG. 21 described above to increase the current flowing in the sense MOSFET QS1. As a result, the ratio between the current flowing in the power MOSFET QH1 and the current flowing in the sense MOSFET QS1 becomes smaller than 20000:1 to reach, e.g., 18000:1.

Accordingly, even when the semiconductor chip CPH101 is designed such that the current flowing in the sense MOSFET QS1 is originally 1/20000 of the current flowing in the power MOSFET QH1, due to displacement (variation in the foregoing resistive component RV1) of the metal plate MP1, the current flowing in the sense MOSFET QS1 shifts from 1/20000 of the current flowing in the power MOSFET QH1. As a result, even if the current flowing in the power MOSFET QH1 is to be sensed by means of the sense MOSFET QS1, the accuracy thereof is degraded, and the current actually flowing in the power MOSFET QH1 is sensed as a current lower or higher than the actually flowing current.

Therefore, when whether or not the current flowing in the power MOSFET QH1 has exceeded a given limit value is to be sensed by means of the sense MOSFET QS1, if displacement of the metal plate MP1 has not occurred, accurate sensing can be performed by means of the sense MOSFET QS1. However, if displacement of the metal plate MP1 has occurred, sensing cannot be performed properly by means of the sense MOSFET QS1, and a moment at which the current flowing in the power MOSFET QH1 has exceeded the given limit value may be missed. For example, in the case where the current flowing in the sense MOSFET QS1, which is 1/20000 of the current flowing in the power MOSFET QH1 when displacement of the metal plate MP1 has not occurred, becomes 1/22000 of the current flowing in the power MOSFET QH1 due to displacement of the metal plate MP1, when the current flowing in the power MOSFET QH1 no longer has the limit value and exceeds 1.1 times the limit value, the sense MOSFET QS1 senses the value exceeding the limit value. To prevent this, it is effective to prevent displacement of the metal plate MP1, but it is difficult to completely prevent displacement of the metal plate MP1.

Accordingly, in the present embodiment, a layout in which the foregoing source wire 10S3 is provided in the semiconductor chip CPH is adopted to provide a structure in which, even when displacement of the metal plate MP1 occurs, the ratio between the current flowing in the power MOSFET QH1 and the current flowing in the sense MOSFET QS1 is unlikely to vary.

Note that the problem to be solved resulting from displacement of the metal plate MP1 described with reference to FIGS. 17 to 26 described above occurs particularly significantly when displacement of the metal plate MP1 is likely to occur. When a bonding material (i.e., the foregoing adhesive layer SD2) for bonding the metal plate MP1 is a solder, displacement of the metal plate MP1 is particularly likely to occur. Therefore, the present embodiment is particularly effective when the bonding material (i.e., the foregoing adhesive layer SD2) for bonding the metal plate MP1 to the semiconductor chip CPH is a solder. However, even when a conductive bonding material other than a solder, e.g., a paste-type conductive bonding material such as a silver paste is used as the bonding material (i.e., the foregoing adhesive layer SD2) for bonding the metal plate MP1 to the semiconductor chip CPH, when the metal plate MP1 is compression-bonded to the semiconductor chip CPH without using the bonding material, or in a like case, displacement of the metal plate MP1 may occur. Therefore, if the present embodiment is applied thereto, it is effective.

<About Layout in Main Surface of Semiconductor Chip CPH>

A specific description will be given below to the main feature of a layout in the main surface of the semiconductor chip CPH including the source wire 10S3 with reference to FIGS. 10 to 12 described above.

The semiconductor chip CPH is formed not only with the power MOSFET QH1, but also with the sense MOSFET QS1 for sensing a current flowing in the power MOSFET QH1. In the present embodiment, as can be also seen from FIGS. 10 and 11, over the main surface of the semiconductor chip CPH, the source pad PDHS4 of the sense MOSFET QS1 and the sense MOSFET region RG2 where the MOSFETs forming the sense MOSFET QS1 are formed are disposed at the same two-dimensional positions (vertically overlapping positions). This can reduce the area of the source wire 10S2, and is therefore advantageous in reducing the area of the semiconductor chip CPH. Here, the pad PDHS4 is the pad electrode (bonding pad) electrically coupled to the source of the sense MOSFET QS1, and the sense MOSFET region RG2 is a region where the MOSFETs forming the sense MOSFET QS1 (i.e., the plurality of unit transistor cells coupled in parallel to each other for the sense MOSFET QS1) are formed.

In the present embodiment, in the main surface of the semiconductor chip CPH, the source wire 10S1 is provided over the main MOSFET region RG1 and electrically coupled to the sources (each corresponding to the foregoing $n^+$-type semiconductor region 4) of the MOSFETs for the power MOSFET QH1 in the main MOSFET region RG1 through the contact holes 9b (which are formed at positions two-dimensionally overlapping the main MOSFET region RG1 and the source wire 10S1). By exposing parts of the source wire 10S1 from the foregoing openings 13, the foregoing pads PDHS1a, PDHS1b, and PDHS2 are formed. Here, the pads PDHS1a, PDHS1b, PDHS2, and PDHS3 are pad electrodes (bonding pads) electrically coupled to the source of the power MOSFET QH1, and the main MOSFET region RG1 is a region where the MOSFETs forming the power MOSFET QH1 (i.e., the plurality of unit transistor cells coupled in parallel to each other for the power MOSFET QH1) are formed.

In the present embodiment, in the main surface of the semiconductor chip CPH, the source wire 10S3 is provided separately from the source wire 10S1. By exposing a part of the source wire 10S3 from the foregoing opening 13, the foregoing pad PDHS3 is formed. The source wire 10S3 has one end thereof (one end of the source wire 10S3, which corresponds to a coupled portion 15) coupled to the source wire 10S1, and extends from the coupled portion 15 between the source wires 10S3 and 10S1 to the region where the pad PDHS3 is formed. The source wire 10S3 is spaced apart from the source wire 10S1 except at the coupled portion 15. That is, except at the coupled portion 15, a region (slit 16) where the source wires 10S1 and 10S3 are not formed is interposed between the source wires 10S3 and 10S1. In other words, the source wire 10S1 and the source wire 10S3 are integrally formed, but are separated by the slit 16 between the source wire 10S1 and the source wire 10S3 (coupled only at the coupled portion 15). Since the source wire 10S3 is coupled to the source wire 10S1 at the coupled portion 15, the source wires 10S3 and 10S1 are electrically coupled to each other. Therefore, the pad PDHS3 is electrically coupled to the source wire 10S1 through the source wire 10S3.

The source wire 10S3 is formed to extend not in the main MOSFET region RG1, but over the field insulating film 2 and, under the source wire 10S3, the foregoing unit transistor cells are not formed. That is, the source wire 10S3 is formed in the region other than the main MOSFET region RG1 and the sense MOSFET region RG2 (region not overlapping the main MOSFET region RG1 and the sense MOSFET region RG2 in planar view, specifically over the field insulating film 2).

Therefore, under the source wire 10S3, the foregoing contact holes 9b are not formed, and the source wire 10S3 is not coupled to the sources (each corresponding to the foregoing n+-type semiconductor region 4) of the MOSFETs for the power MOSFET QH1 in the main MOSFET region RG1 through the contact holes 9b under the source wire 10S3. The pad PDHS3 is coupled (electrically coupled) at the coupled portion 15 to the source wire 10S1 via the source wire 10S3 extending over the field insulating film 2, and the source wire 10S1 is formed throughout the entire main MOSFET region RG1. As a result, the pad PDHS3 is electrically coupled to the sources (each corresponding to the foregoing n+-type semiconductor region 4) of the MOSFETs for the power MOSFET QH1 in the main MOSFET region RG1 through the source wire 10S3, the source wire 100S coupled to the source wire 10S3, and the contact holes 9b under the source wire 10S1.

Figure 27:
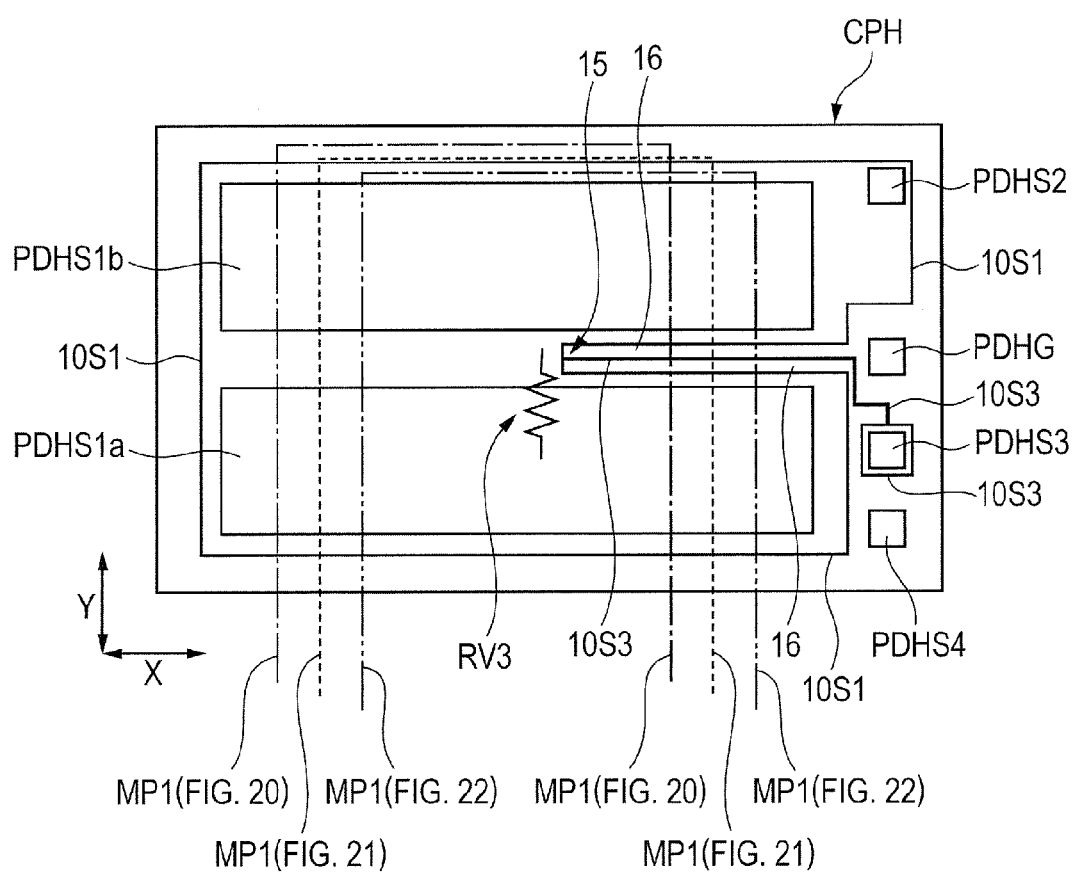
FIG. 27 is a plan view showing the positions of the metal plate bonded to the semiconductor chip, and a layout of source wires and pads.

In the present embodiment, in planar view, a part of the source wire 10S3 overlaps the metal plate MP1 and, at a position overlapping the metal plate MP1, the coupled portion 15 between the source wires 10S3 and 10S1 is located. That is, the metal plate MP1 is bonded (adhesively bonded) to the pads PDHS1a and PDHS1b of the semiconductor chip CPH, and the coupled portion 15 between the source wires 10S3 and 10S1 is located under the metal plate MP1. From another viewpoint, in planar view, a part of the slit 16 overlaps the metal plate MP1, and the end portion (adjacent to the coupled portion 15) of the slit 16 is at a position overlapping the metal plate MP1. This can be easily achieved if the coupled portion 15 between the source wires 10S3 and 10S1 is located in the vicinity of the center of the main surface of the semiconductor chip CPH. The coupled portion 15 between the source wires 10S3 and 10S1 is located at the position overlapping the metal plate MP1 in planar view for the purpose of fixing (not varying) the resistance from the metal plate MP1 to the pad PDHS3, which will be described with reference to FIG. 27. FIG. 27 is an illustrative view of the present embodiment, and corresponds to FIG. 23 described above. FIG. 27 shows the position of the metal plate MP1 bonded to the semiconductor chip CPH, a layout of the source wires 10S1 and 10S3, and a layout of the pads PDHS1a, PDHS1b, PDHS2, PDHS3, PDHS4, and PDHG.

In the case of manufacturing an equivalent to the foregoing semiconductor device SM1 using the semiconductor chip CPH, the metal plate MP1 is bonded to the pads PDHS1a and PDHS1b of the semiconductor chip CPH. At this time, displacement of the position at which the metal plate MP1 is bonded as shown in FIGS. 20 to 22 described above may occur. In FIG. 27, the position of the metal plate MP1 in FIG. 21 described above is shown by the dotted line, the position of the metal plate MP1 when the metal plate MP1 has shifted to the left side of the drawing as in FIG. 20 described above is shown by the dot-dash line, and the position of the metal plate MP1 when the metal plate MP1 has shifted to, the right side of the drawing as in FIG. 22 described above is shown by the two-dot-dash line. Even when such displacement of the metal plate MP1 occurs and the position at which the metal plate MP1 is bonded varies from one manufactured semiconductor device to another, in the present embodiment, it is possible to inhibit or prevent the degradation of accuracy in sensing a current flowing in the power MOSFET QH1 by means of the sense MOSFET QS1, which will be described below.

In the present embodiment, if the resistance from the metal plate MP1 bonded to the semiconductor chip CPH to the pad PDHS3 is assumed to be a resistance RV2, the resistance RV2 is the sum (total sum) of a resistive component RV3 from the coupled portion (bonded portion) between the metal plate MP1 and each of the pads PDHS1a and PDHS1b to the coupled portion 15 and a resistive component RV4 of the source wire 10S3. Note that, in FIG. 27, the resistive component RV3 is schematically shown by the circuit symbol showing resistance.

Here, even when displacement of the metal plate MP1 occurs, the resistive component RV4 of the source wire 10S3 is constant. That is, in FIG. 27, whether the position of the metal plate MP1 is the position of the dot-dash line (position corresponding to FIG. 20 described above), the position of the dotted line (position corresponding to FIG. 21 described above), or the position of the two-dot-dash line (position corresponding to FIG. 22 described above), the resistive component RV4 of the source wire 10S3 is constant. This is because the resistive component RV4 of the source wire 10S3 is determined by the shape and size of the source wire 10S3, and the position at which the metal plate MP1 is coupled is irrelevant thereto.

Therefore, even when displacement of the metal plate MP1 occurs, if the resistive component RV3 can be held constant, it is possible to hold constant the resistance RV2 from the metal plate MP1 to the pad PDHS3. Accordingly, in the present embodiment, to allow the resistive component RV2 to be held constant even when displacement of the metal plate MP1 occurs, the coupled portion 15 between the source wires 10S3 and 10S1 is located at the position overlapping the metal plate MP1 in planar view. That is, even when the plurality of semiconductor devices SM1 are manufactured and the position at which the metal plate MP1 is bonded to the semiconductor chip CPH varies in the plurality of semiconductor chips SM1, the coupled portion 15 between the source wires 10S3 and 10S1 is located at the position overlapping the metal plate MP1 in any of the semiconductor devices SM1. This can be easily achieved by locating the coupled portion 15 between the source wires 10S3 and 10S1 in the vicinity of the center of the main surface of the semiconductor chip CPH since the two-dimensional size of the metal plate MP1 is larger than that of each of the wires WA and, even when displacement of the metal plate MP1 occurs, the vicinity of the center of the main surface of the semiconductor chip CPH inevitably overlaps the metal plate MP1 in planar view.

As long as the coupled portion 15 between the source wires 10S3 and 10S1 is located at a position overlapping the metal plate MP1 in planar view (e.g., at each of the three positions of the metal plate MP1 in FIG. 27), the resistive component RV3 from the coupled portion (bonded portion) between the metal plate MP1 and each of the pads PDHS1a and PDHS1b to the coupled portion 15 is substantially fixed (is substantially constant) irrespective of the position at which the metal plate MP1 is bonded in the semiconductor chip CPH. Therefore, in the present embodiment, by providing the source wire 10S3 separately from the source wire 10S1 and locating the coupled portion 15 between the source wires 10S3 and 100S at a position overlapping the metal plate MP1 in planar view, even when displacement of the metal plate MP1 occurs, the resistive component RV2 does not vary but is substantially constant. Consequently, even when displacement of the metal plate MP1 occurs, the resistance RV2 from the metal plate MP1 to the pad PDHS3 can be held substantially constant without varying.

More preferably, at least two pads (which are the pads PDHS1a and PDHS1b here) to which the metal plate MP1 is bonded are provided over the main surface of the semiconductor chip CPH, and the coupled portion 15 is provided between the pads (between the pads PDHS1a and PDHS1b here). As a result, even when the position at which the metal plate MP1 is bonded varies, the foregoing resistive component RV3 (and also the foregoing resistance RV2) is easily fixed (easily held constant).

As described above with reference to FIGS. 17 to 26, when the foregoing resistive component RV1 varies due to displacement of the metal plate MP1, the current ratio between the current flowing in the power MOSFET QH1 and the current flowing in the sense MOSFET QS1 varies undesirably. By contrast, in the present embodiment, even when displacement of the metal plate MP1 occurs (i.e., even when the position at which the metal plate MP1 is bonded in the semiconductor chip CPH varies), the resistance RV2 from the metal plate MP1 to the pad PDHS3 does not vary (does not fluctuate), and can be held substantially constant. Therefore, it is possible to inhibit or prevent the current ratio between the current flowing in the power MOSFET QH1 and the current flowing in the sense MOSFET QS1 from varying.

That is, in the present embodiment, if the potential difference between the foregoing potential VIN inputted to the common drain of the power MOSFET QH1 and the sense MOSFET QS1 and the voltage V1 at the foregoing potential P1 is assumed to be the same, even when displacement of the metal plate MP1 occurs, the resistance RV2 from the metal plate MP1 to the pad PDHS3 is substantially constant. Therefore, the output voltage of the pad PDHS3 can be set to substantially the same value irrespective of the position at which the metal plate MP1 is bonded. The amplifier circuit AMP1 controls the voltage of the pad PDHS4 and the voltage of the pad PDHS3 such that they are the same. However, since the output voltage of the pad PDHS3 is not affected by the position at which the metal plate MP1 is bonded, the magnitude of a current flowing in the sense MOSFET QS1 is no longer affected by the position at which the metal plate MP1 is bonded. As a result, even when displacement of the metal plate MP1 occurs (i.e., even when the position at which the metal plate MP1 is bonded in the semiconductor chip CPH varies), the current ratio between the current flowing in the power MOSFET QH1 and the current flowing in the sense MOSFET QS1 is substantially the same. This allows an improvement in the accuracy of sensing the current flowing in the power MOSFET QH1 by means of the sense MOSFET QS1. Therefore, it is possible to improve the reliability of the semiconductor device SM1.

According to the verification experiment conducted by the present inventors, when the position at which the metal plate MP1 is bonded in the semiconductor chip CPH varied, the current ratio between the current flowing in the power MOSFET QH1 and the current flowing in the sense MOSFET QS1, which had varied from a predetermined current ratio by about ±15%, could be reduced to fluctuations (variations) within the range of ±5% by applying the present embodiment.

In addition, if the coupled portion 15 between the source wires 10S3 and 10S1 is located at a position overlapping the metal plate MP1 in planar view, though not in the vicinity of the center of the semiconductor chip CPH, the resistance RV2 from the metal plate MP1 to the pad PDHS3 is less susceptible to the influence of displacement of the metal plate MP1. Accordingly, it is possible to make the current ratio between the current flowing in the power MOSFET QH1 and the current flowing in the sense MOSFET QS less susceptible to the influence of displacement of the metal plate MP1. Therefore, it is possible to improve the accuracy of sensing the current flowing in the power MOSFET QH1 by means of the sense MOSFET QS1.

However, if the coupled portion 15 between the source wires 10S3 and 10S1 is located in the vicinity of the center of the main surface of the semiconductor chip CPH, even when displacement of the metal plate MP1 is extremely large, the coupled portion 15 between the source wires 10S3 and 10S1 can be located at a position overlapping the metal plate MP1 in planar view. This can make the resistance RV2 from the metal plate MP1 to the pad PDHS3 least susceptible to the influence of displacement of the metal plate MP1. Therefore, the coupled portion 15 between the source wires 10S3 and 10S1 is more preferably located in the vicinity of the center of the main surface of the semiconductor chip CPH. In this manner, it is possible to reliably prevent the current ratio between the current flowing in the power MOSFET QH1 and the current flowing in the sense MOSFET QS1 from being affected by displacement of the metal plate MP1, and more definitely improve the accuracy of sensing the current flowing in the power MOSFET QH1 by means of the sense MOSFET QS1.

Moreover, since the pad PDHS3 is a pad to be coupled to the wire WA, the pad PDHS3 is disposed at a position (position not overlapping the metal plate MP1 in planar view) not covered by the metal plate MP1. On the other hand, the coupled portion 15 is disposed at a position overlapping the metal plate MP1 in planar view. Accordingly, the source wire 10S3 extends so as to couple the pad PDHS3 at the position not overlapping the metal plate MP1 and the coupled portion 15 at the position overlapping the metal plate MP1. Here, the width (width parallel with the main surface of the semiconductor chip CPH and perpendicular to the extending direction of the source wire 10S3) of the source wire 10S3 between the pad PDHS3 and the coupled portion 15 is preferably smaller than the width of the pad PDHS3 (which is the length of one side of a square of the pad PDHS3 when the pad PDHS3 is in the form of a square, the length of one of the short sides of the pad PDHS3 when the pad PDHS3 is in the form of a rectangle, or the diameter of the pad PDHS3 when the pad PDHS3 is in the form of a circle). This makes it easy to ensure an area size for the main MOSFET region RG1.

The pad PDHS3 is preferably disposed along the lateral side (lateral side opposing the semiconductor chip CPC) of the main surface of the semiconductor chip CPH. This makes it easy to provide coupling between the pad PDHS3 of the semiconductor chip CPH and the pad PDC of the semiconductor chip CPC with the wires WA. Therefore, the pads PDHS2, PDHG, PDHS3, and PDHS4 of the semiconductor chip CPH to be coupled to the wires WA are more preferably arranged along the lateral side (lateral side opposing the semiconductor chip CPC) of the main surface of the semiconductor chip CPH. This allows easy coupling of the wires WA to the pads PDHS2, PDHG, PDHS3, and PDHS4.

In the present embodiment, the case has been described in which the pad PDHS4 and the sense MOSFET region RG2 are disposed at positions overlapping each other in planar view. However, in another form, the pad PDHS4 and the sense MOSFET region RG2 can also be disposed at different positions (positions not overlapping each other) in planar view. In this case, the source wire 10S2 may be extended appropriately from the region where the pad PDHS4 is formed to the region where the sense MOSFET region RG2 is formed. When the pad PDHS4 and the sense MOSFET region RG2 are disposed at different positions (positions not overlapping each other) in planar view, it is preferred that, in the main surface of the semiconductor chip CPH, the sense MOSFET region RG2 is disposed inwardly of the pad PDHS4 (i.e., the pad PDHS4 is disposed closer to the outer peripheral portion of the main surface of the semiconductor chip CPH than the sense MOSFET region RG2). By thus inwardly disposing the sense MOSFET region RG2, even if a crack occurs in the foregoing adhesive layer SD1 due to a thermal stress, the crack is less likely to extend under the sense MOSFET region RG2. Accordingly, the current flowing in the sense MOSFET QS1 is less likely to be affected by the crack, and it is possible to inhibit or prevent the accuracy of sensing the current flowing in the power MOSFET QH1 by means of the sense MOSFET QS1 from being degraded by the crack. Also, by disposing the pad PDHS4 outwardly (near the outer peripheral portion of the main surface of the semiconductor chip CPH), it is possible to facilitate the coupling of a conductive member such as the wire WA to the source pad PDHS4 of the sense MOSFET QS1. Note that, in determining which one of the two positions is located inwardly in the main surface of the semiconductor chip CPH, the position at a larger distance (space) from the outer periphery of the main surface of the semiconductor chip CPH is regarded as the inward position.

Figure 28:
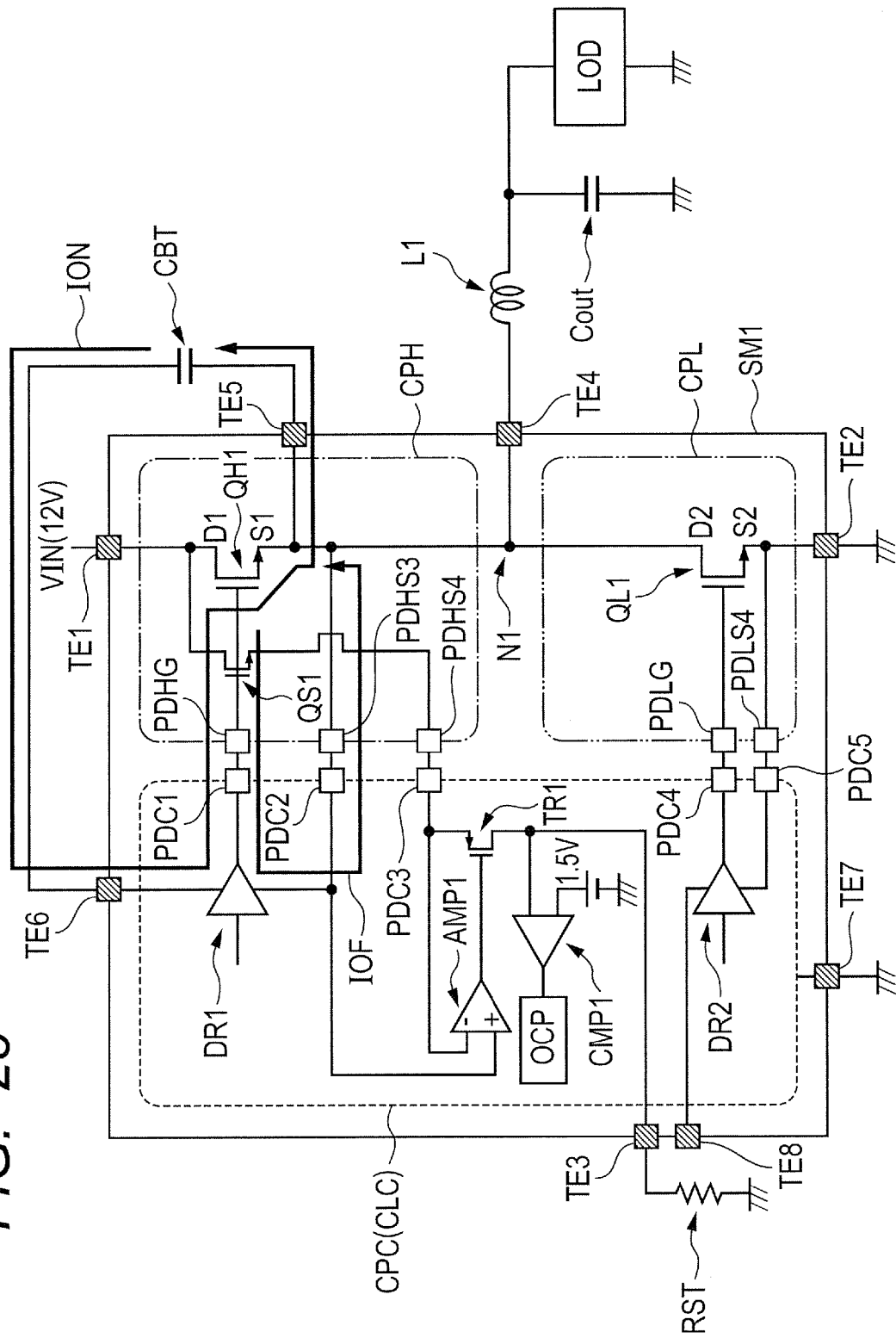
FIG. 28 is a circuit diagram showing a current path when a power MOSFET is turned ON, and a current path when the power MOSFET is turned OFF.

FIG. 28 is the same circuit diagram as the circuit diagram of FIG. 1 described above, in which a current path ION when the power MOSFET QH1 is turned ON and a current path IOF when the power MOSFET QH1 is turned OFF are schematically shown by the arrows.

As can be seen from FIG. 28, the current path IOF when the power MOSFET QH1 is turned OFF is a path extending from the gate of the power MOSFET QH1 through the driver circuit DR1 to reach the source of the power MOSFET QH1. In the case of the foregoing semiconductor device SM1, the current path IOF passes through wires (i.e., the source wires 10S3 and 10S1) coupling the pad PDHS3 and the power MOSFET QH1. By providing the source wire 10S3, the resistive component RV4 of the source wire 10S3 increases to be larger than the resistance of the source wire 10S1. Accordingly, the current path IOF having the relatively large resistive component RV4 becomes a path with a high wiring resistance to possibly reduce a switching speed when the power MOSFET QH1 is turned OFF and increase a turn-OFF loss. Therefore, the foregoing semiconductor device SM1 is preferably applied to a use which involves relatively little need to worry about a turn-OFF loss such as a small number of switchings or the long ON period of the power MOSFET QH1. On the other hand, to a use which regards the turn-OFF loss as important, the following modifications are preferably applied. A description will be given below to various modifications of the present embodiment.

<About First Modification>

The first modification of the present embodiment will be described. It is assumed that, hereinafter, the semiconductor device SM1 of the first modification is referred to as a semiconductor device SM1a, and the semiconductor chip CPH used in the semiconductor device SM1 (i.e., semiconductor device SM1a) of the first modification is referred to as a semiconductor chip CPHa.

Figure 29:
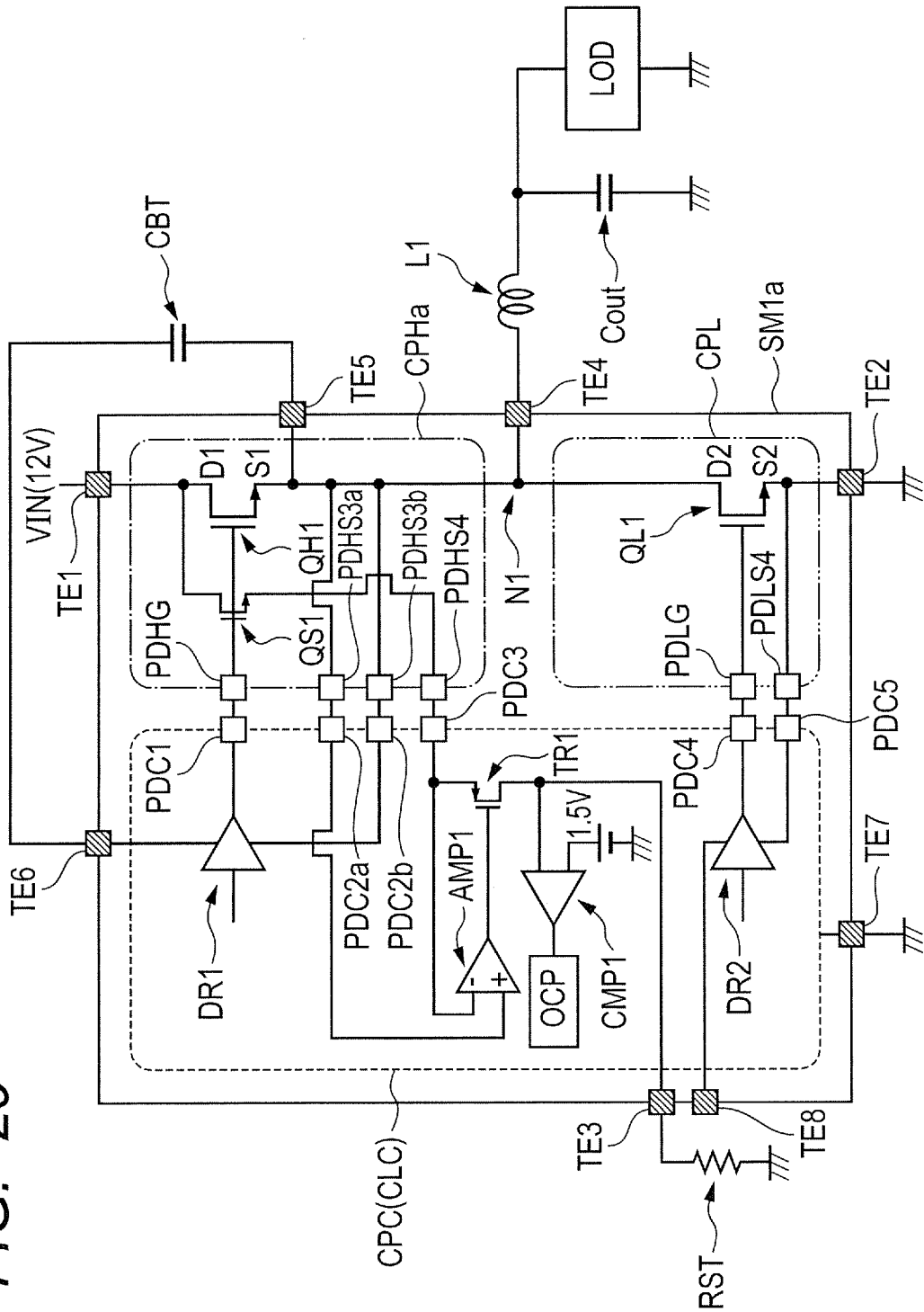
FIG. 29 is a circuit diagram showing an electronic device using a semiconductor device of a first modification of the embodiment of the present invention.
Figure 30:
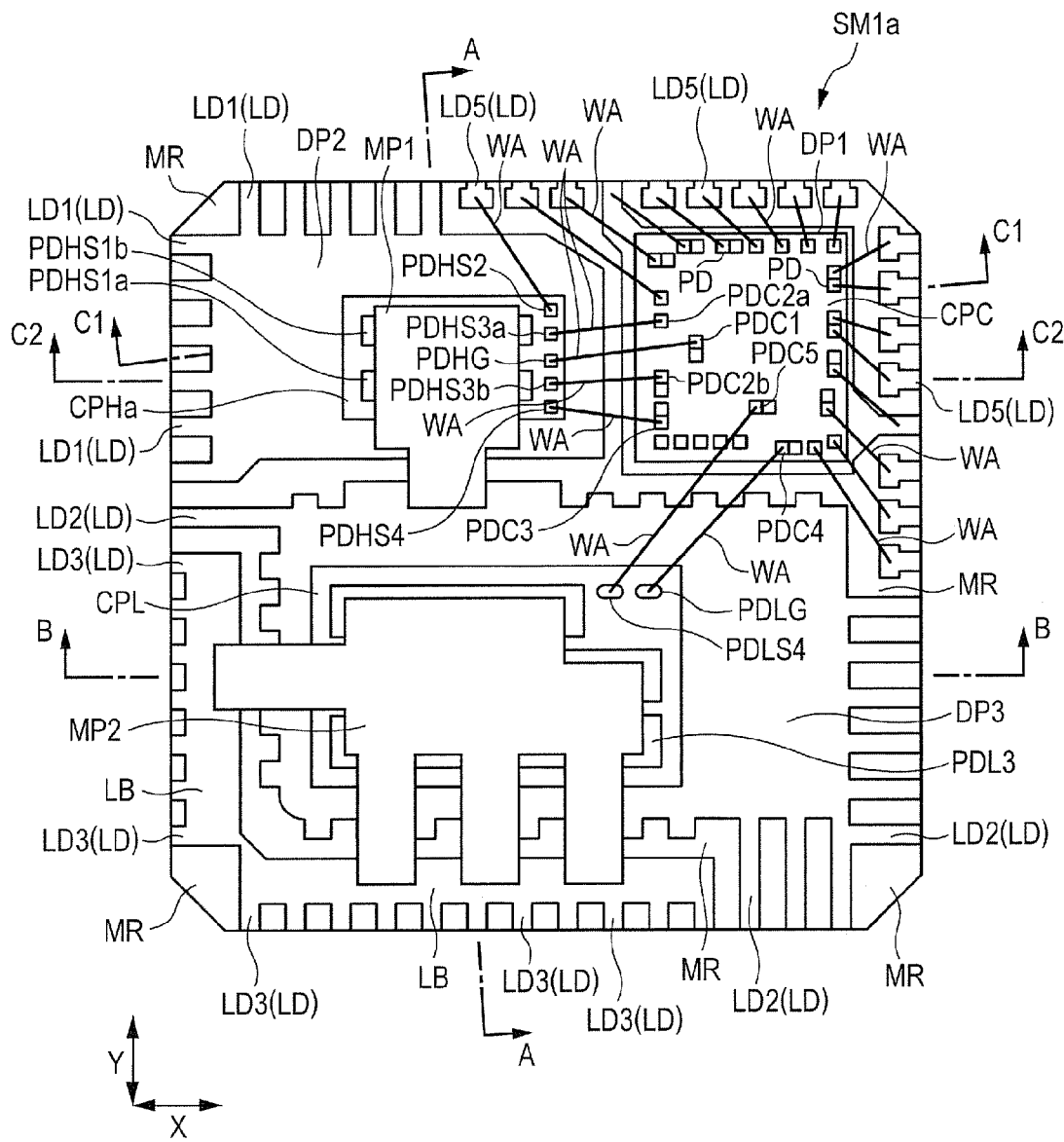
FIG. 30 is a perspective plan view of the semiconductor device of the first modification of the embodiment of the present invention.
Figure 31:
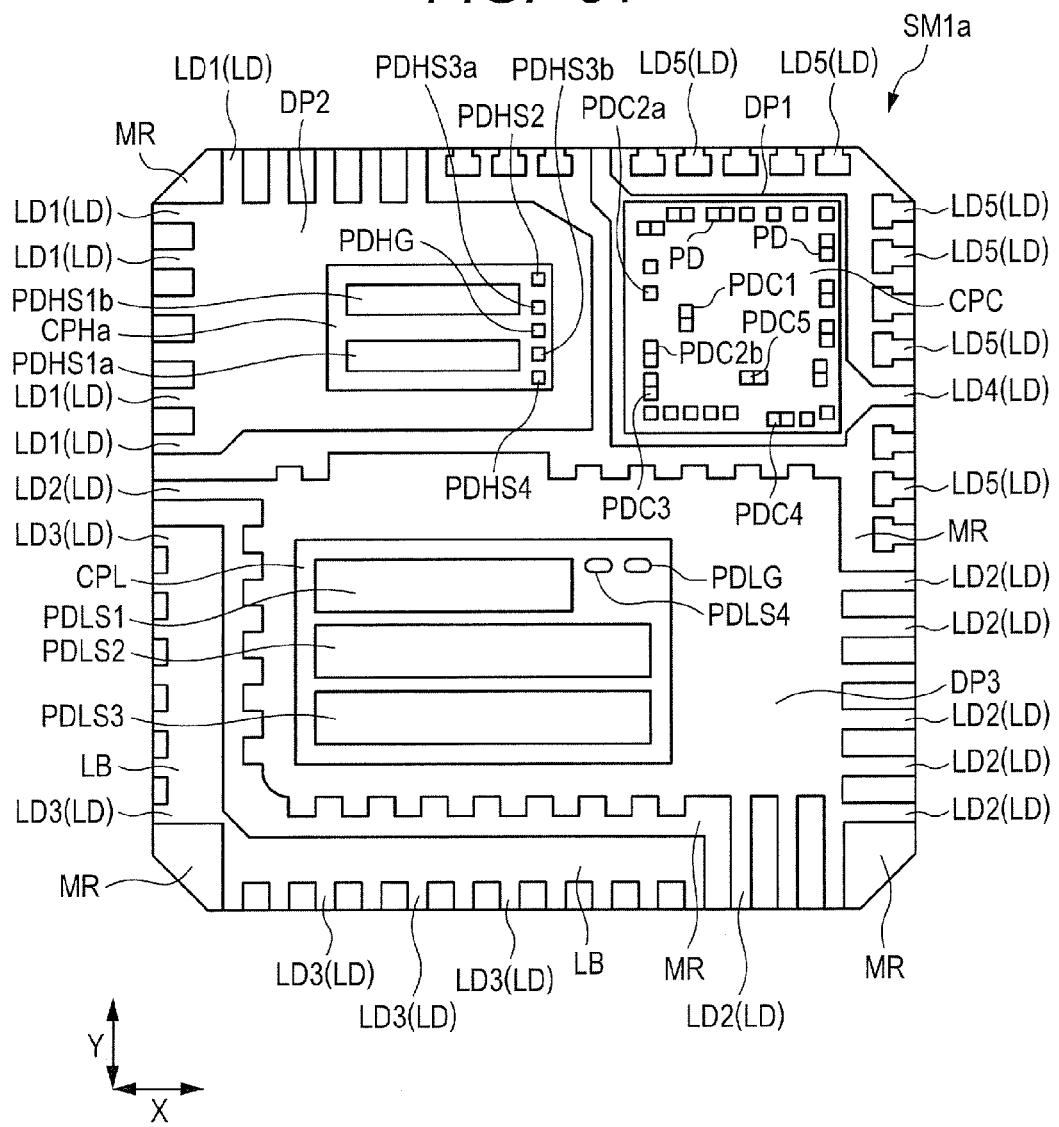
FIG. 31 is a perspective plan view of the semiconductor device of the first modification of the embodiment of the present invention.
Figure 32:
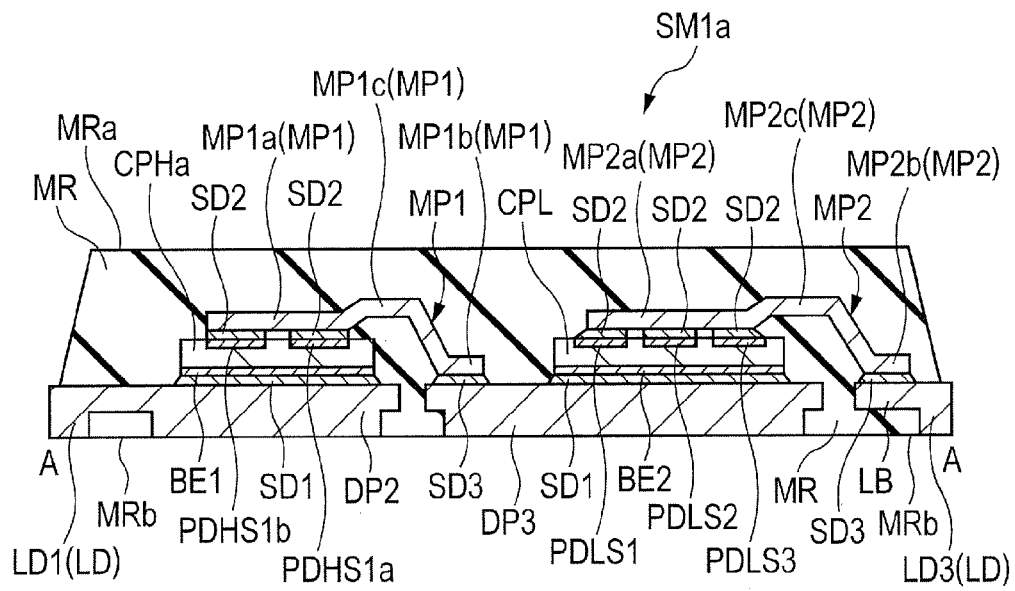
FIG. 32 is a cross-sectional view of the semiconductor device of the first modification of the embodiment of the present invention.
Figure 33:
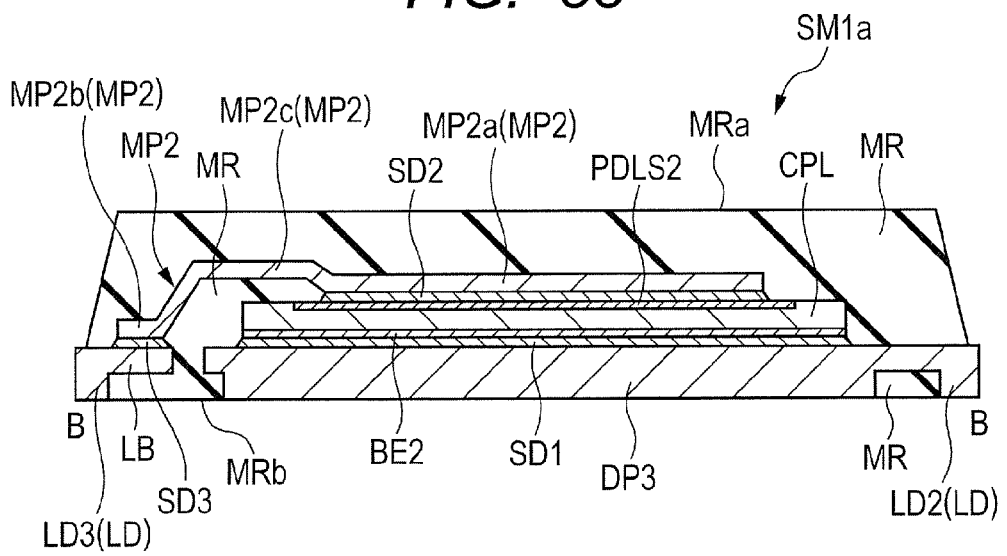
FIG. 33 is a cross-sectional view of the semiconductor device of the first modification of the embodiment of the present invention.
Figure 34:
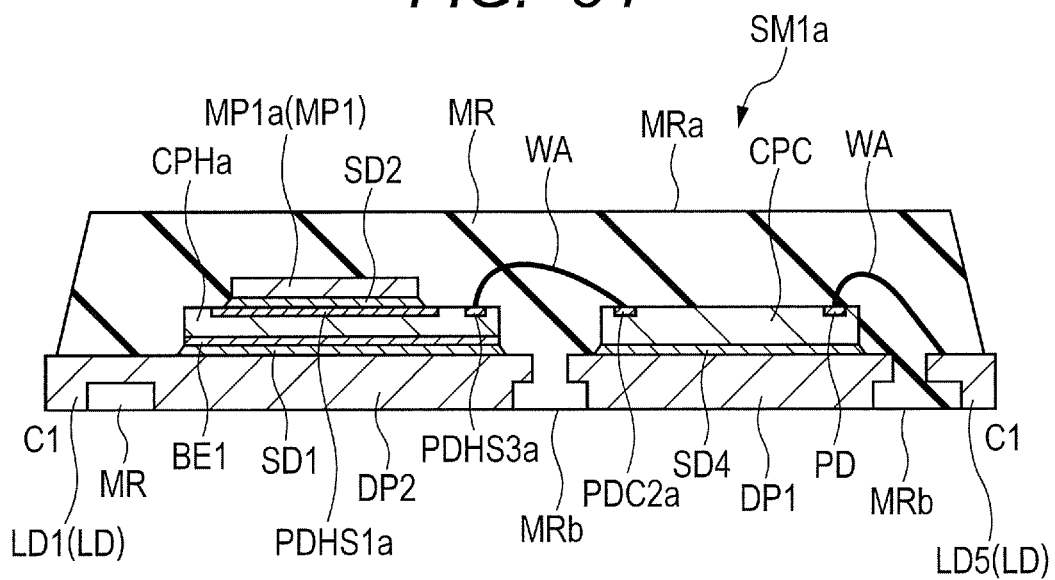
FIG. 34 is a cross-sectional view of the semiconductor device of the first modification of the embodiment of the present invention.
Figure 35:
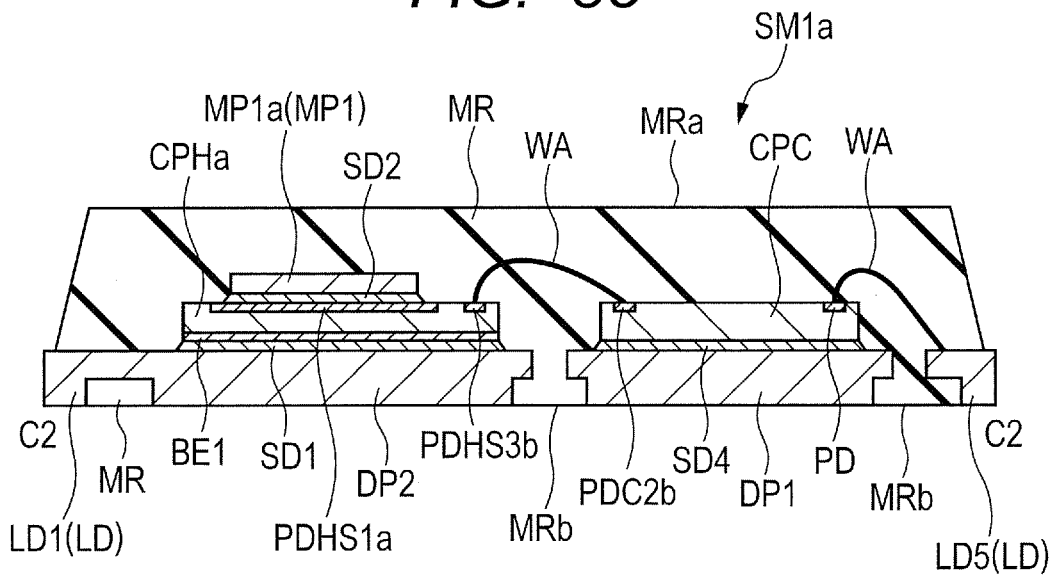
FIG. 35 is a cross-sectional view of the semiconductor device of the first modification of the embodiment of the present invention.
Figure 36:
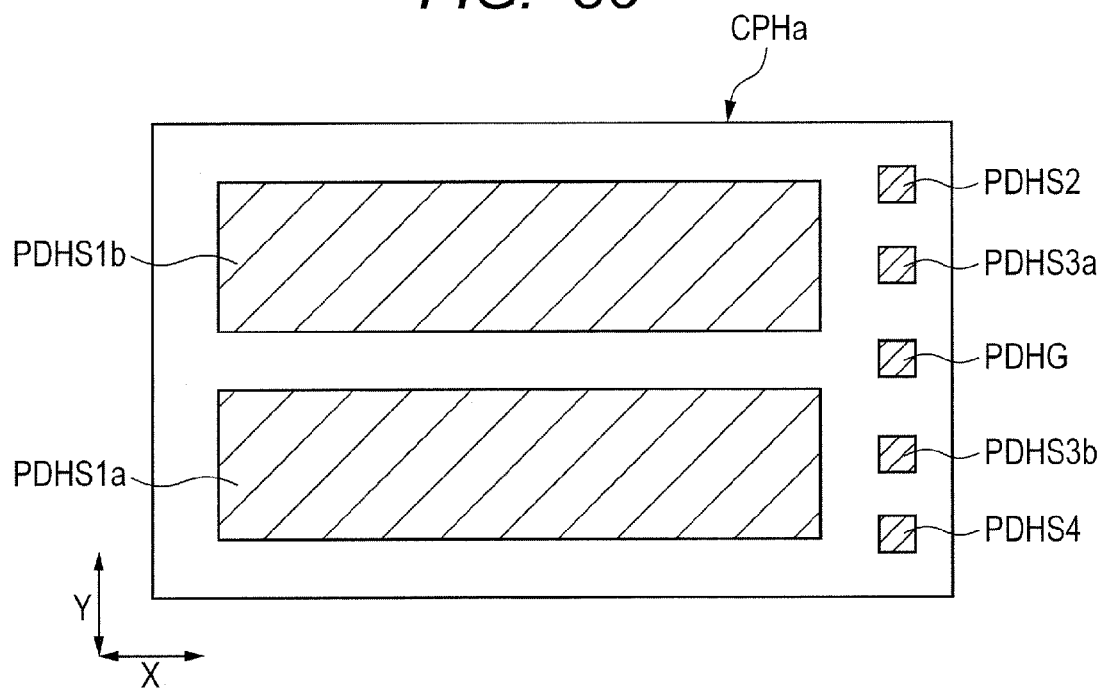
FIG. 36 is a plan view showing a chip layout of a semiconductor chip used in the semiconductor device of the first modification of the embodiment of the present invention.
Figure 37:
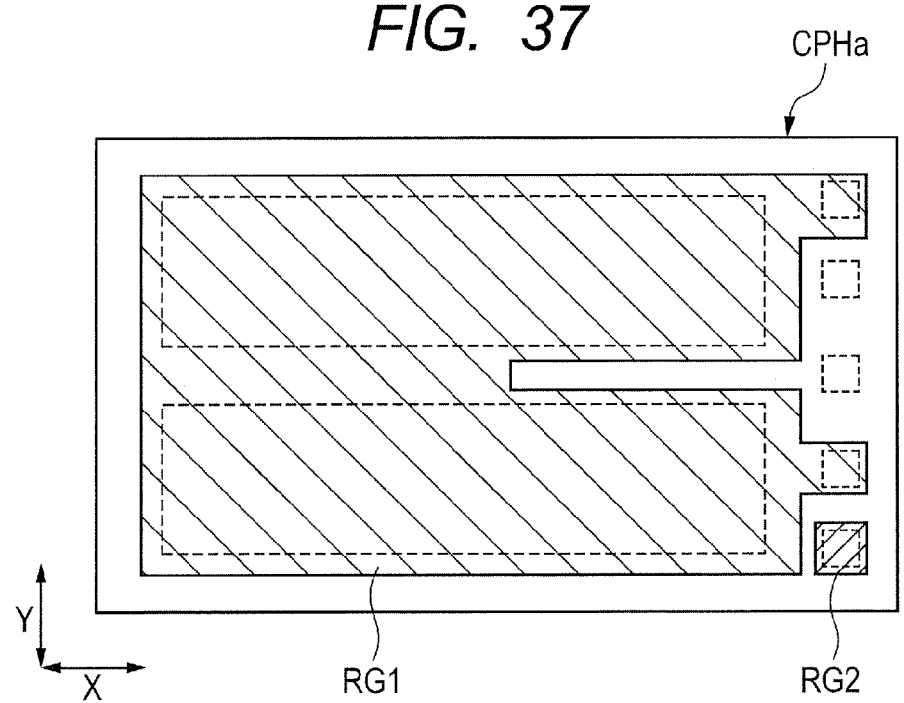
FIG. 37 is a plan view showing the chip layout of the semiconductor chip used in the semiconductor device of the first modification of the embodiment of the present invention.
Figure 38:
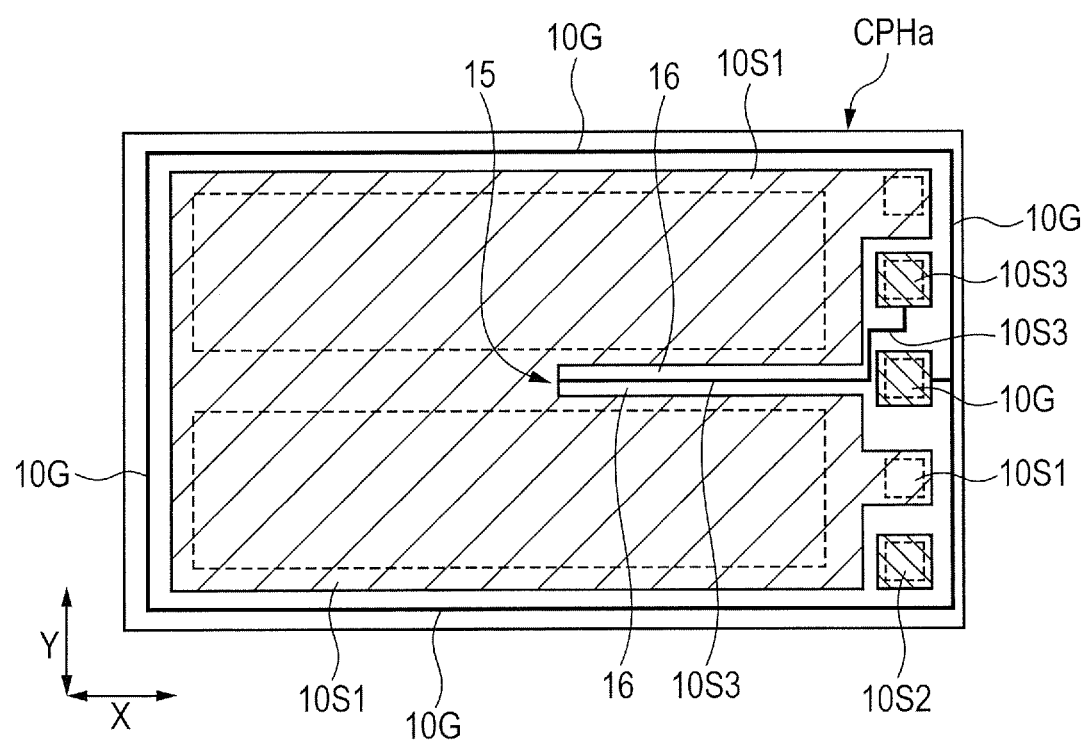
FIG. 38 is a plan view showing the chip layout of the semiconductor chip used in the semiconductor device of the first modification of the embodiment of the present invention.

FIG. 29 is a circuit diagram showing an example of an electronic device (which is a non-insulated-type DC-DC converter here) using the semiconductor device (semiconductor package) SM1a of the first modification, and corresponds to FIG. 1 described above. FIGS. 30 and 31 are perspective plan views of the semiconductor device SM1a of the first modification. FIGS. 32 to 35 are cross-sectional views (side cross-sectional views) of the semiconductor device SM1a. FIG. 30 corresponds to FIG. 2 described above, and shows a plan view (top view) in which the semiconductor device SM1a is viewed from the top side thereof through the sealing portion MR. FIG. 31 corresponds to FIG. 3 described above, and is a perspective plan view of the semiconductor device SM1a in a state where the metal plates MP1 and MP2 and the bonding wires WA, which are shown in FIG. 30, have been removed (when viewed without the metal plates MP1 and MP2 and the bonding wires WA). The perspective plan view of FIG. 31 in a state where the semiconductor chips CPC, CPHa, and CPL have been removed (when the semiconductor device SM1a is viewed without the semiconductor chips CPC, CPHa, and CPL) is the same as that of FIG. 4 described above. FIG. 32 corresponds to FIG. 5 described above, and substantially corresponds to a cross-sectional view along the line A-A of FIG. 30. FIG. 33 corresponds to FIG. 6 described above, and substantially corresponds to a cross-sectional view along the line B-B of FIG. 30. FIG. 34 substantially corresponds to a cross-sectional view along the line C1-C1 of FIG. 30. FIG. 35 substantially corresponds to a cross-sectional view along the line C2-C2 of FIG. 30. FIGS. 36 to 38 are plan views each showing a chip layout of the semiconductor chip CPHa, and respectively correspond to FIGS. 10 to 12 described above. Among them, FIG. 36 is a plan view corresponding to the top view of the semiconductor chip CPHa but, for easier understanding, the bonding pads (pads PDHG, PDHS1a, PDHS1b, PDHS2, PDHS3a, PDHS3b, and PDHS4) are hatched. FIG. 37 shows the main MOSFET region RG1 and the sense MOSFET region RG2 in the semiconductor chip CPHa by hatching, and shows the positions of the bonding pads (pads PDHG, PDHS1a, PDHS1b, PDHS2, PDHS3a, PDHS3b, and PDHS4) by the dotted lines. In FIG. 38, the layout of the metal wires (the gate wire 10G and the source wires 10S1, 10S2, and 10S3) in the semiconductor chip CPHa is shown by the hatched regions and the thick lines, and the positions of the bonding pads (pads PDHG, PDHS1a, PDHS1b, PDHS2, PDHS3a, PDHS3b, and PDHS4) are shown by the dotted lines.

As for commonality between the semiconductor device SM1a of the first modification and the semiconductor device SM1 of FIGS. 2 to 7 described above, a description thereof is basically omitted. A description will be given below to the difference between the semiconductor device SM1a of the first modification and the semiconductor device SM1 of FIGS. 2 to 7 described above.

The semiconductor chip CPHa used in the semiconductor device SM1a has the source pads PDHS3a and PDHS3b, instead of the foregoing source pad PDHS3, over the main surface of the semiconductor chip CPHa. The semiconductor chip CPC has pads PDC2a and PDC2b, instead of the foregoing pad PDC2, over the main surface of the semiconductor chip CPC. Similarly to the foregoing pad PDHS3, the pads PDHS3a and PDHS3b are electrically coupled to the source of the foregoing power MOSFET QH1 formed in the semiconductor chip CPHa. Accordingly, the source pads PDHS3a and PDHS3b of the semiconductor chip CPHa correspond to the source pad (bonding pad) of the foregoing high-side power MOSFET QH1. Also, similarly to the foregoing pad PDHS3, the pads PDHS3a and PDHS3b are electrodes (pad electrodes, electrode pads, or bonding pads) to be coupled to the wires WA.

As also shown in FIGS. 30 and 34, the pad PDHS3a of the semiconductor chip CPHa is electrically coupled to the pad PDC2a over the main surface of the semiconductor chip CPC through the wire or wires WA. That is, one end of the wire WA is bonded to the pad PDHS3a of the semiconductor chip CPHa, while the other end of the wire WA is bonded to the pad PDC2a of the semiconductor chip CPC. Specifically, the source pad PDHS3a of the semiconductor chip CPHa is electrically coupled to the pad PDC2a of the semiconductor chip CPC via the wire WA, and is further electrically coupled to the foregoing amplifier circuit AMP1 in the semiconductor chip CPC through the internal wiring of the semiconductor chip CPC (see FIG. 29 described above). The source pad PDHS3a of the semiconductor chip CPHa is for detecting the source voltage of the power MOSFET QH1. On the other hand, as also shown in FIGS. 30 and 33, the pad PDHS3b of the semiconductor chip CPHa is electrically coupled to the pad PDC2b over the main surface of the semiconductor chip CPC through the wire or wires WA. That is, one end of the wire WA is bonded to the pad PDHS3b of the semiconductor chip CPHa, while the other end of the wire WA is bonded to the pad PDC2b of the semiconductor chip CPC. Specifically, the source pad PDHS3b of the semiconductor chip CPHa is electrically coupled to the pad PDC2b of the semiconductor chip CPC via the wire WA, and is further electrically coupled to the foregoing driver circuit DR1 in the semiconductor chip CPC through the internal wiring of the semiconductor chip CPC (see FIG. 29 described above).

As can also be seen from FIG. 29, in the semiconductor chip CPC, the pad PDC2a is electrically coupled to the amplifier circuit AMP1 through the internal wiring (the internal wiring of the semiconductor chip CPC), but is not coupled to the driver circuit DR1 with the internal wiring. On the other hand, in the semiconductor chip CPC, the pad PDC2b is electrically coupled to the driver circuit DR1 through the internal wiring, but is not coupled to the amplifier circuit AMP1 with the internal wiring. That is, in the semiconductor chip CPC, the internal wiring providing coupling between the pad PDC2a and the amplifier circuit AMP1 and the internal wiring providing coupling between the pad PDC2b and the driver circuit DR1 are separately provided (do not have a common portion). Therefore, it can be said that, in the semiconductor chip CPC, the pad PDC2b is coupled (with the internal wiring) to the driver circuit DR1. It can also be said that, in the semiconductor chip CPC, the pads PDC2a and PDC3 are not coupled (with the internal wiring) to the driver circuit DR1.

Thus, the pad PDHS3a of the semiconductor chip CPHa is coupled to the pad PDC2a of the semiconductor chip CPC via the wire WA. Therefore, the pad PDHS3a of the semiconductor chip CPHa is electrically coupled to the amplifier circuit AMP1 via the wire WA, the pad PDC2a, and the internal wiring (internal wiring different from the internal wiring providing coupling between the pad PDC2b and the driver circuit DR1) of the semiconductor chip CPC. On the other hand, the pad PDHS3b of the semiconductor chip CPHa is coupled to the pad PDC2b of the semiconductor chip CPC via the wire WA. Therefore, the pad PDHS3b of the semiconductor chip CPHa is electrically coupled to the driver circuit DR1 via the wire WA, the pad PDC2b, and the internal wiring (internal wiring different from the internal wiring providing coupling between the pad PDC2a and the amplifier circuit AMP1) of the semiconductor chip CPC.

Here, the pads PDC2a and PDC3 are coupled to the amplifier circuit AMP1 with the internal wiring in the semiconductor chip CPC. The amplifier circuit AMP1 drives the transistor TR1 in accordance with the difference between the input voltage of the pad PDC2a and the input voltage of the pad PDC3a, and controls a current flowing in the sense MOSFET QS1 such that they are the same (equal). Accordingly, a circuit formed of the amplifier circuit AMP1 and the transistor TR1 can be regarded as a circuit (first circuit) which controls the current flowing in the sense MOSFET QS1 such that the voltage (input voltage) of the pad PDC2a and the voltage (input voltage) of the pad PDC3a are the same. The circuit is coupled to the pads PDC2a and PDC3 in the semiconductor chip CPC. Since the pads PDC3a and PDC2a are coupled to each other with one of the wires WA and the pads PDHS4 and PDC3 are coupled to each other with another of the wires WA, the output voltage of the pad PDHS3a of the semiconductor chip CPHa corresponds to the input voltage of the pad PDC2a, and the output voltage of the pad PDHS4 of the semiconductor chip CPHa corresponds to the input voltage of the pad PDC3.

In the semiconductor chip CPH of FIG. 10 described above, over the main surface of the semiconductor chip CPH and along the lateral side (lateral side opposing the semiconductor chip CPC), the pads PDHS2, PDHG, PDHS3, and PDHS4 are arranged. However, as can be seen from FIG. 36, over the main surface of the semiconductor chip CPHa and along the lateral side (lateral side opposing the semiconductor chip CPC), the pads PDHS2, PDHS3a, PDHG, PDHS3b, and PDHS4 are arranged. Specifically, in the semiconductor chip CPH of FIG. 10 described above, over the main surface of the semiconductor chip CPH and along the lateral side, the pad PDHG is disposed in the middle, the pad PDHS2 is disposed closer to one end portion, the pad PDHS4 is disposed closer to the other end portion, and the pad PDHS3 is disposed between the pads PDHG and PDHS4. In the semiconductor chip CPHa of FIG. 36, over the main surface of the semiconductor chip CPHa and along the lateral side, the pad PDHG is disposed in the middle, the pad PDHS2 is disposed closer to one end portion, the pad PDHS4 is disposed closer to the other end portion, the pad PDHS3a is disposed between the pads PDHG and PDHS2, and the pad PDHS3b is disposed between the pads PDHG and PDHS2. That is, the semiconductor chip CPHa of FIG. 36 is basically the same as the semiconductor chip CPH of FIG. 10 described above in terms of the pads PDHS1a, PDHS1b, PDHS2, PDHS4, and PDHG. However, in the semiconductor chip CPHa of FIG. 36, the pad PDHS3b is disposed at the position of the pad PDHS3 in the semiconductor chip CPH of FIG. 10 instead of the pad PDHS3, and the pad PDHS3a is disposed between the pads PDHG and PDHS2.

As can also be seen from FIGS. 36 to 38, the layout of the source wires 10S1, 10S2, and 10S3 and the gate wire 10G in the semiconductor chip CPHa is similar to the layout of the source wires 10S1, 10S2, and 10S3 and the gate wire 10G in the foregoing semiconductor chip CPH of FIGS. 10 to 12 described above, but is different therefrom in terms of the source wires 10S1 and 10S3.

In the foregoing semiconductor chip CPH of FIGS. 10 to 12 described above, the source wire 10S3 exposed from the foregoing opening 13 forms the pad PDHS3. However, in the semiconductor chip CPHa of FIGS. 36 to 38, the source wire 10S3 exposed from the foregoing opening 13 forms the pad PDHS3a. In the foregoing semiconductor chip CPH of FIGS. 10 to 12 described above, the source wire 10S3 extends from the coupled portion 15 to the pad PDHS3 between the pads PDHG and PDHS4. However, in the semiconductor chip CPHa of FIGS. 36 to 38, the source wire 10S3 extends from the coupled portion 15 to the pad PDHS3a between the pads PDHG and PDHS2. Otherwise, in terms of the source wire 10S3, the foregoing semiconductor chip CPH of FIGS. 10 to 12 described above and the semiconductor chip CPHa of FIGS. 36 to 38 are basically the same. Accordingly, the description of the source wire 10S3 (including the description of, e.g., the position of the coupled portion 15, the slit 16 between the source wires 10S1 and 10S3, and the like) given with regard to the foregoing semiconductor chip CPH and the foregoing semiconductor device SM1 using the semiconductor chip CPH is also applicable to the semiconductor chip CPHa and the semiconductor device SM1a using the semiconductor chip CPHa. Therefore, a repeated description thereof is omitted herein.

In the semiconductor chip CPHa of FIGS. 36 to 38, the pad PDHS3a is formed of the source wire 10S1 exposed from the foregoing opening 13. That is, a part of the source wire 10S1 extending over the main MOSFET region RG1 is exposed from the foregoing openings 13 to form the pads PDHS1a and PDHS1b. However, the source wire 10S1 is extended to the region (region between the pads PDHG and PDHS4) where the pad PDHS3b is formed and, there, the source wire 10S1 is exposed from the foregoing opening 13 to form the pad PDHS3b.

Between the source wires 10S1 and 10S3, the slit 16 is interposed. The source wire 10S3 is coupled to the source wire 10S1 at the coupled portion 15, and extends therefrom (from the coupled portion 15) to the pad PDHS3a over the field insulating film (isolation region) 2, while having a wire width smaller than that of the pad PDHS3a. Accordingly, the foregoing resistive component RV4 of the source wire 10S3 has a rather large value. On the other hand, the pad PDHS3b is formed of the source wire 10S1. The source wire 10S1 forming the pad PDHS3b (the portion of the source wire 10S1 serving as the pad PDHS3b) and the source wire 10S1 forming the pad PDHS1a (the portion of the source wire 10S1 serving as the pad PDHS1a) have no slit formed therebetween and are continuously connected, while having a wire width about equal to or larger than the width of the pad PDHS3b. The length of the source wire 10S1 between the pads PDHS3b and PDHS1a is shorter than that of the source wire 10S3 between the coupled portion 15 and the pad PDHS3a. Therefore, when the metal plate MP1 is bonded to the pads PDHS1a and PDHS1b, the resistance from the metal plate MP1 to the pad PDHS3b can be reduced to be smaller than the resistance from the metal plate MP1 to the pad PDHS3b.

The configuration of the semiconductor chip CPHa is otherwise basically the same as that of the foregoing semiconductor chip CPH so that a repeated description thereof is omitted. Also, the configuration of the semiconductor device SM1a is otherwise basically the same as that of the foregoing semiconductor device SM1 so that a repeated description thereof is omitted herein.

In the semiconductor device SM1a of the first modification also, the same effect as that obtained in the foregoing semiconductor device SM1 can be obtained. Briefly, by using the source wire 10S3, even when displacement of the metal plate MP1 occurs (i.e., even when the position at which the metal plate MP1 is bonded in the semiconductor chip CPH varies), the resistance from the metal plate MP1 to the pad PDHS3a does not fluctuate (vary), but can be held substantially constant. Therefore, it is possible to inhibit or prevent the current ratio between the current flowing in the power MOSFET QH1 and the current flowing in the sense MOSFET QS1 from varying. As a result, it is possible to improve the accuracy of sensing the current flowing in the power MOSFET QH1 by means of the sense MOSFET QS1 and improve the reliability of the semiconductor device SM1a. In addition, in the semiconductor device SM1a of the first modification, it is also possible to further obtain an effect as shown below.

That is, the current path IOF when the power MOSFET QH1 is turned OFF, which has been described with reference to FIG. 28 mentioned above, extends from the gate of the power MOSFET QH1 through the driver circuit DR1 to reach the source of the power MOSFET QH1. In the case of the semiconductor device SM1a of the first modification, the current path when the power MOSFET QH1 is turned OFF passes through the source wire 10S1, but does not pass through the source wire 10S3. This is because, in the semiconductor device SM1a of the first modification, the foregoing pad PDHS3 is divided into the pads PDHS3a and PDHS3b, and the pad PDHS3a is coupled to the amplifier circuit AMP1, but is not coupled to the driver circuit DR1, while the pad PDHS3b is coupled to the driver circuit DR1, but is not coupled to the amplifier circuit AMP1. Accordingly, the pad PDHS3a and the source wire 10S3 coupled thereto do not serve as a current path when the power MOSFET QH1 is turned OFF. That is, the current flowing from the driver circuit DR1 to the source of the power MOSFET QH1 when the power MOSFET QH1 is turned OFF flows in the path through the pad PDC2b, the wire WA (wire WA providing coupling between the pads PDC2b and PDHS3b), and the pad PDHS3b, and does not flow in a path through the pad PDC2a, the wire WA (wire WA providing coupling between the pads PDC2a and PDHS3a), and the pad PDHS3a. The source wire 10S3 has a resistance higher than that of the source wire 10S1 and, since the source wire 10S3 having the higher resistance does not serve as the current path when the power MOSFET QH1 is turned OFF, the wiring resistance (resistive component) of the current path when the power MOSFET QH1 is turned OFF can be reduced. This allows an increase in switching speed when the power MOSFET QH1 is turned OFF as well as a reduction in turn-OFF loss. Therefore, it is possible to improve the performance of the semiconductor device SM1a.

In the foregoing semiconductor device SM1 and the semiconductor device SM1a of the first modification, each of the semiconductor chips CHP and CPHa is provided with the source wire 10S3 to allow the resistance from the metal plate MP1 to each of the pads PDHS3 and PDHS3a to be held substantially constant even when displacement of the metal plate MP1 occurs and thereby improve the accuracy of sensing the current flowing in the power MOSFET QH1 by means of the sense MOSFET QS1. Next, a description will be given to a modification not using the source wire 10S3.

<About Second Modification>

The second modification of the present embodiment will be described. It is assumed that, hereinafter, the semiconductor device SM1 of the second modification is referred to as a semiconductor device SM1b, and the semiconductor chip CPH used in the semiconductor device SM1 (i.e., semiconductor device SM1b) of the second modification is referred to as a semiconductor chip CPHb.

Figure 39:
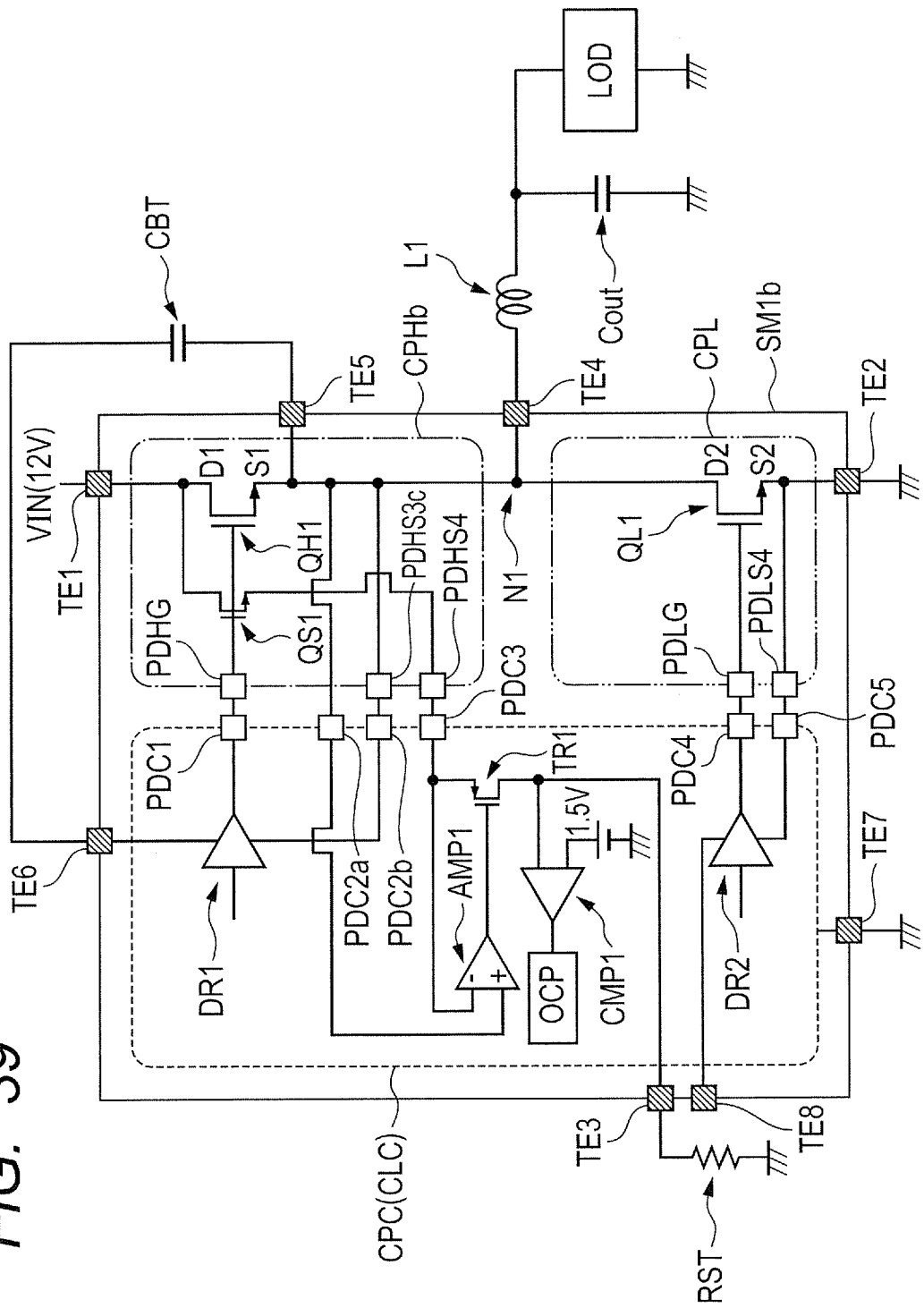
FIG. 39 is a circuit diagram showing an electronic device using a semiconductor device of a second modification of the embodiment of the present invention.
Figure 40:
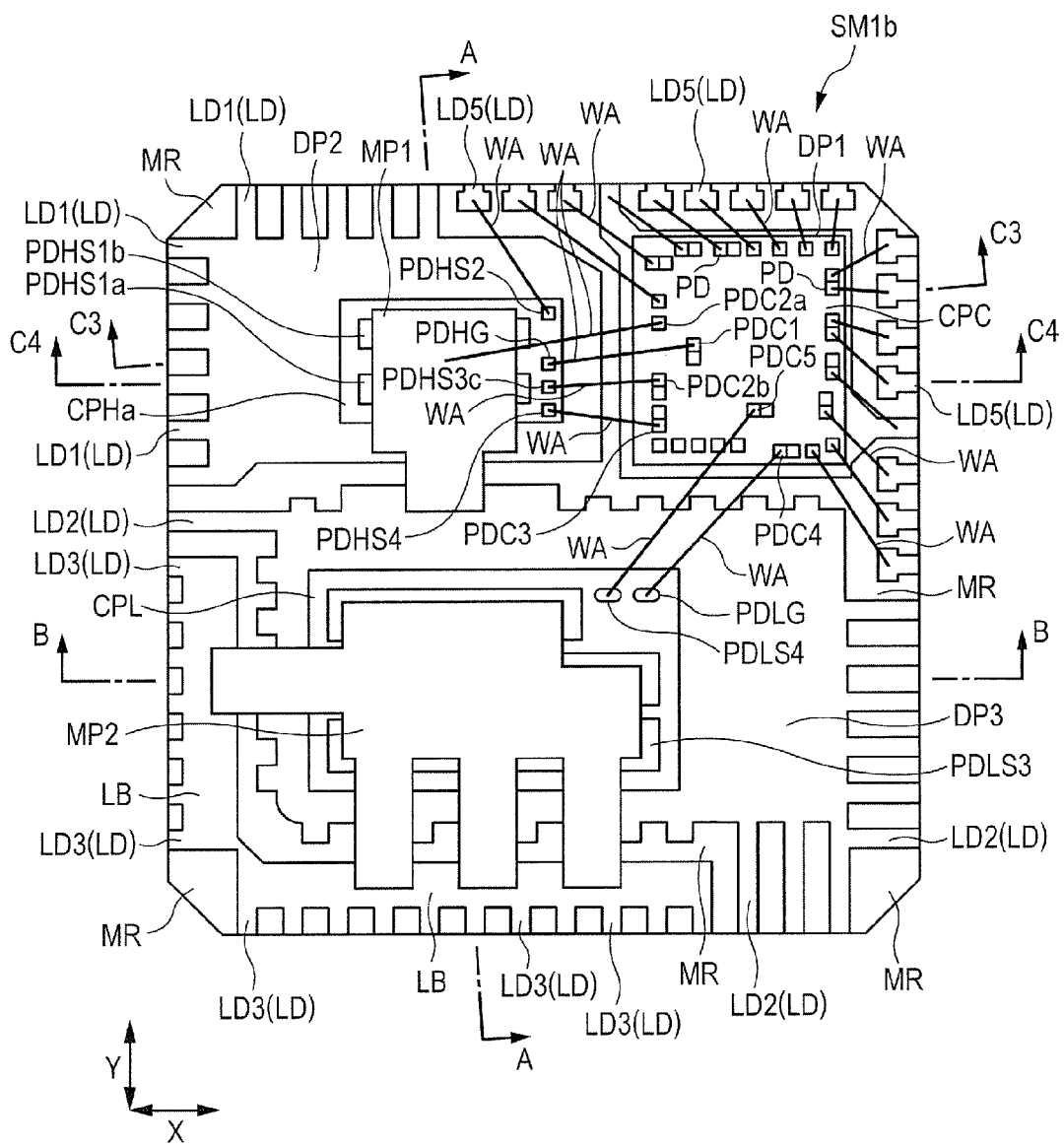
FIG. 40 is a perspective plan view of the semiconductor device of the second modification of the embodiment of the present invention.
Figure 41:
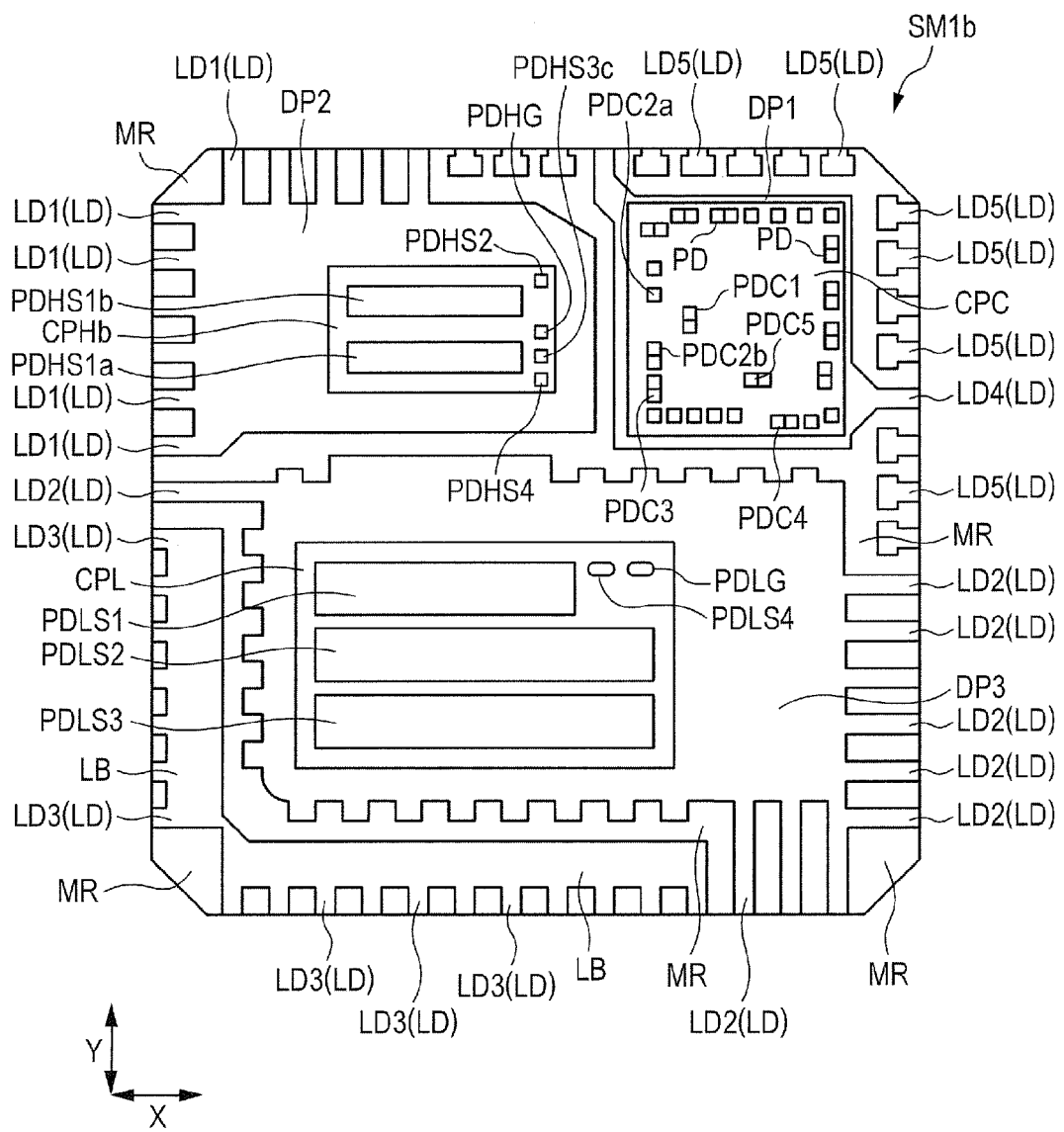
FIG. 41 is a perspective plan view of the semiconductor device of the second modification of the embodiment of the present invention.
Figure 42:
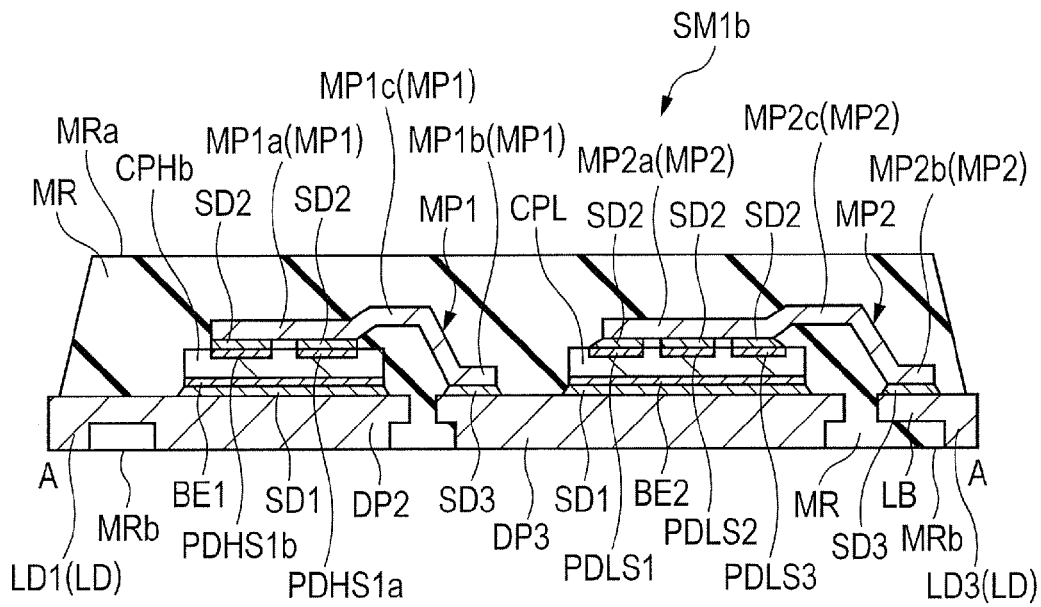
FIG. 42 is a cross-sectional view of the semiconductor device of the second modification of the embodiment of the present invention.
Figure 43:
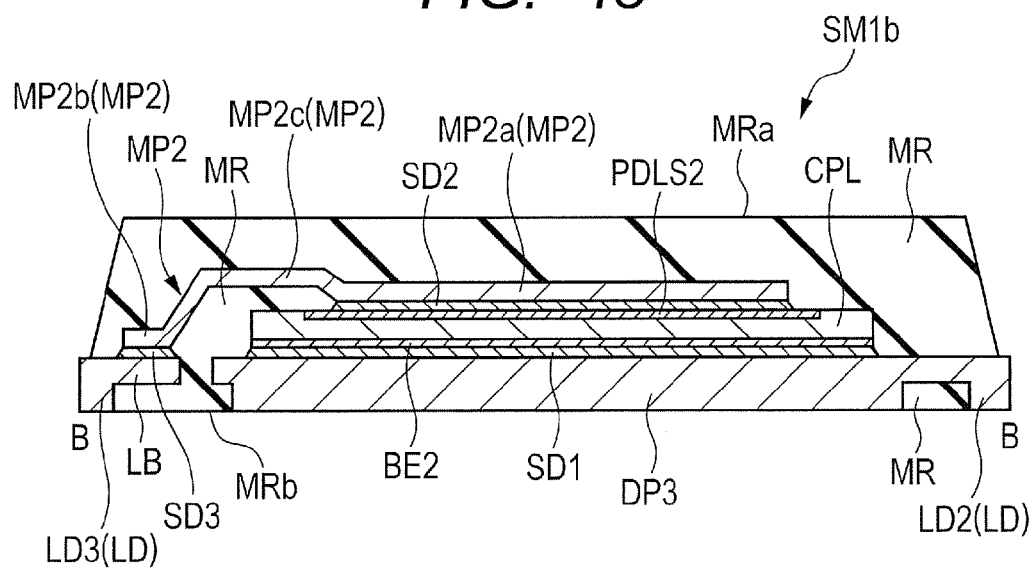
FIG. 43 is a cross-sectional view of the semiconductor device of the second modification of the embodiment of the present invention.
Figure 44:
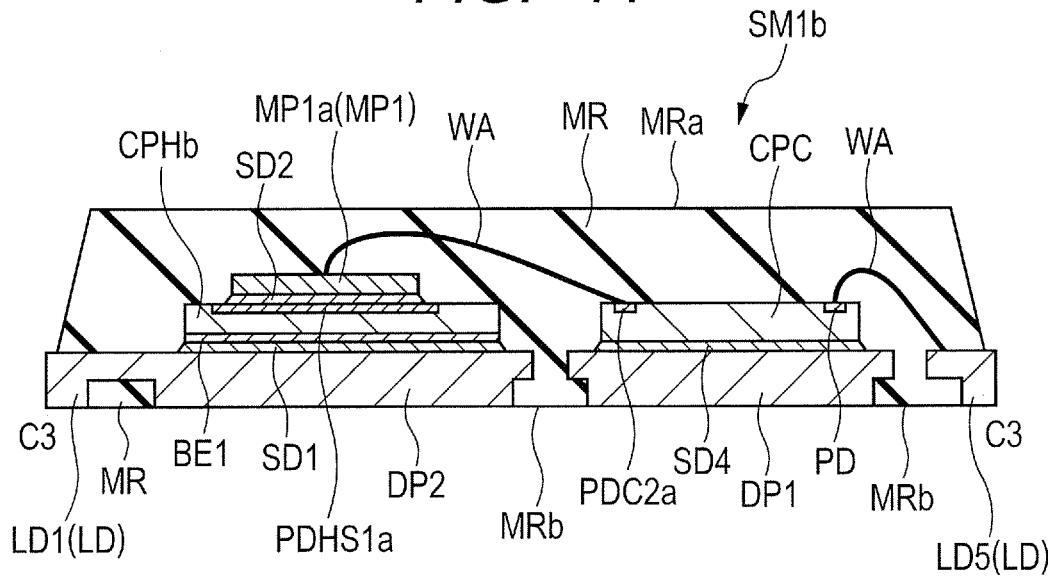
FIG. 44 is a cross-sectional view of the semiconductor device of the second modification of the embodiment of the present invention.
Figure 45:
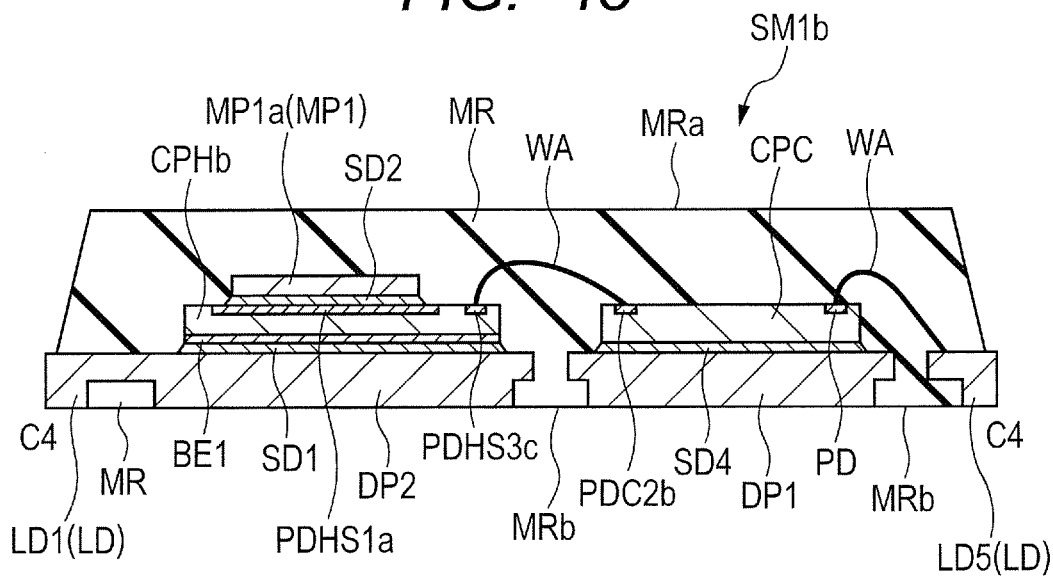
FIG. 45 is a cross-sectional view of the semiconductor device of the second modification of the embodiment of the present invention.
Figure 46:
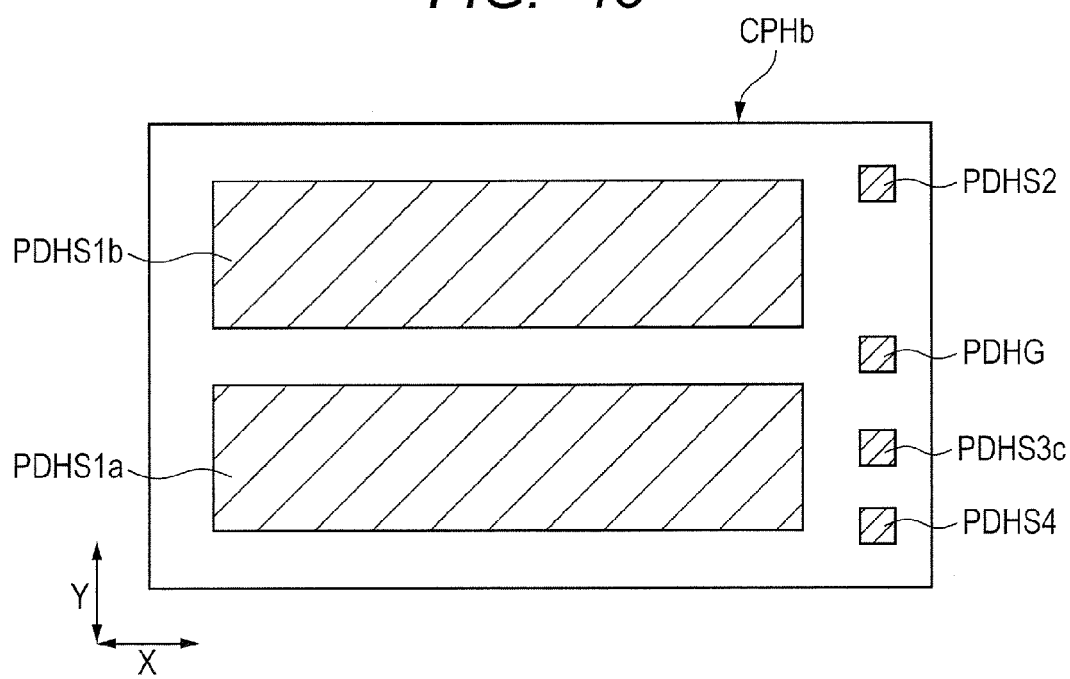
FIG. 46 is a plan view showing a chip layout of a semiconductor chip used in the semiconductor device of the second modification of the embodiment of the present invention.
Figure 47:
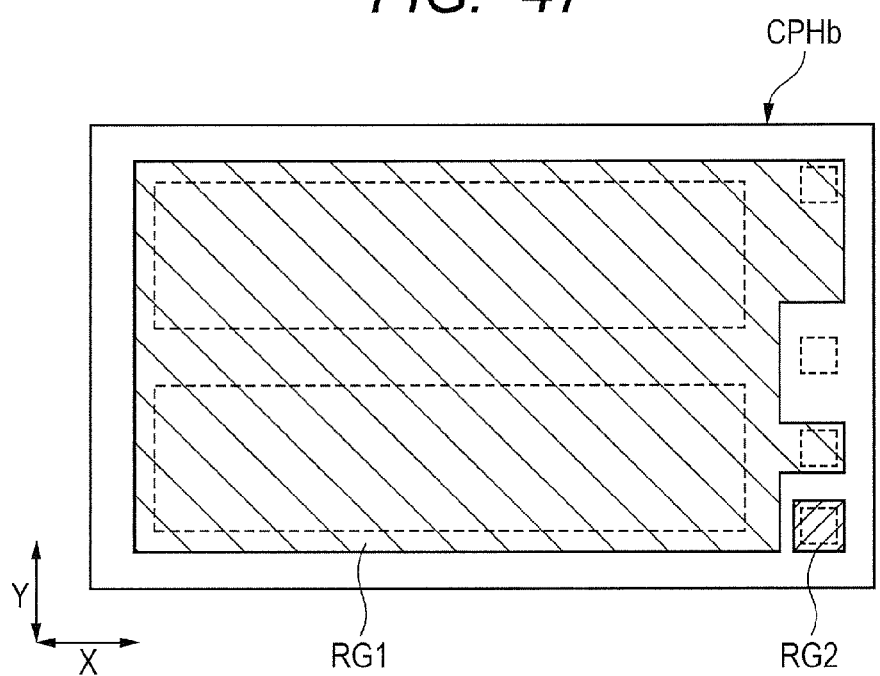
FIG. 47 is a plan view showing the chip layout of the semiconductor chip used in the semiconductor device of the second modification of the embodiment of the present invention.
Figure 48:
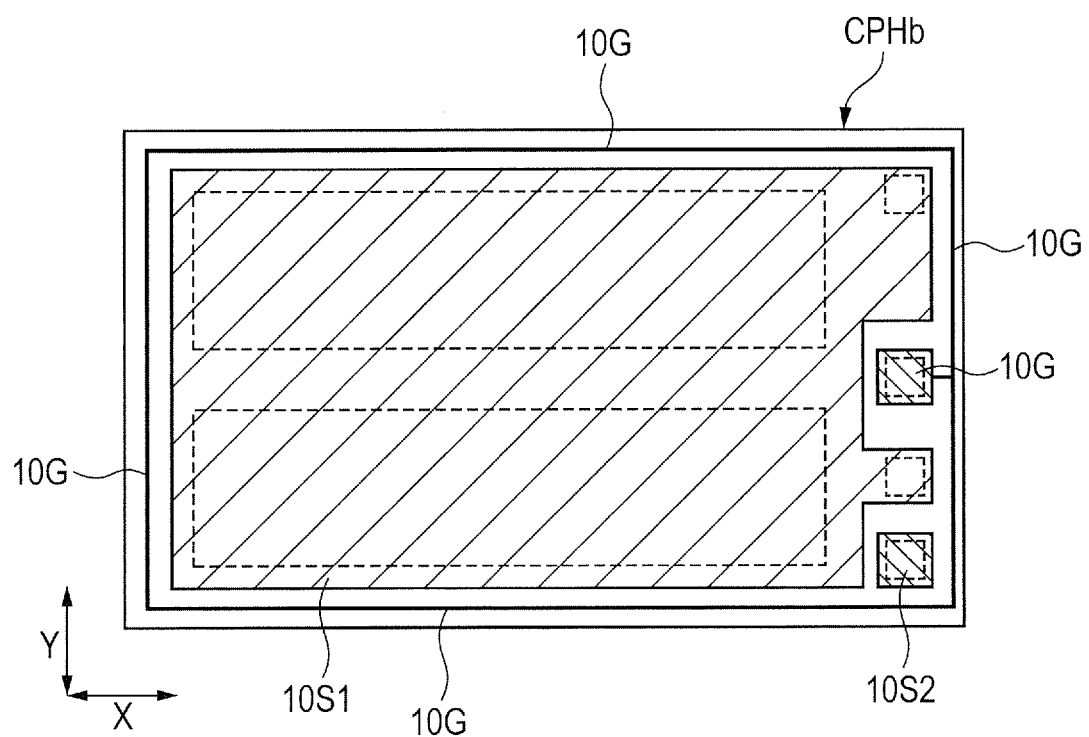
FIG. 48 is a plan view showing the chip layout of the semiconductor chip used in the semiconductor device of the second modification of the embodiment of the present invention.

FIG. 39 is a circuit diagram showing an example of an electronic device (which is a non-insulated-type DC-DC converter here) using the semiconductor device (semiconductor package) SM1b of the second modification, and corresponds to FIGS. 1 and 29 described above. FIGS. 40 and 41 are perspective plan views of the semiconductor device SM1b of the second modification. FIGS. 42 to 45 are cross-sectional views (side cross-sectional views) of the semiconductor device SM1b. FIG. 40 corresponds to FIG. 2 described above, and shows a plan view (top view) in which the semiconductor device SM1b is viewed from the top side thereof through the sealing portion MR. FIG. 41 corresponds to FIG. 3 described above, and is a perspective plan view of the semiconductor device SM1b in a state where the metal plates MP1 and MP2 and the bonding wires WA, which are shown in FIG. 40, have been removed (when viewed without the metal plates MP1 and MP2 and the bonding wires WA). The perspective plan view of FIG. 41 in a state where the semiconductor chips CPC, CPHb, and CPL have been removed (when the semiconductor device SM1b is viewed without the semiconductor chips CPC, CPHb, and CPL); is the same as that of FIG. 4 described above. FIG. 42 corresponds to FIG. 5 described above, and substantially corresponds to a cross-sectional view along the line A-A of FIG. 40. FIG. 43 corresponds to FIG. 6 described above, and substantially corresponds to a cross-sectional view along the line B-B of FIG. 40. FIG. 44 substantially corresponds to a cross-sectional view along the line C3-C3 of FIG. 40. FIG. 45 substantially corresponds to a cross-sectional view along the line C4-C4 of FIG. 40. FIGS. 46 to 48 are plan views each showing a chip layout of the semiconductor chip CPHb, and respectively correspond to FIGS. 10 to 12 described above. Among them, FIG. 46 is a plan view corresponding to the top view of the semiconductor chip CPHb but, for easier understanding, the bonding pads (pads PDHG, PDHS1*a*, PDHS1*b*, PDHS2, PDHS3*c*, and PDHS4) are hatched. FIG. 47 shows the main MOSFET region RG1 and the sense MOSFET region RG2 in the semiconductor chip CPHb by hatching, and shows the positions of the bonding pads (pads PDHG, PDHS1*a*, PDHS1*b*, PDHS2, PDHS3*c*, and PDHS4) by the dotted lines. In FIG. 48, the layout of the metal wires (the gate wire 10G and the source wires 10S1 and 10S2) in the semiconductor chip CPHb is shown by the hatched regions and the thick lines, and the positions of the bonding pads (pads PDHG, PDHS1*a*, PDHS1*b*, PDHS2, PDHS3*c*, and PDHS4) are shown by the dotted lines.

As for commonality between the semiconductor device SM1*b* of the second modification and the semiconductor device SM1 of FIGS. 2 to 7 described above, a description thereof is basically omitted. A description will be given below to the difference between the semiconductor device SM1*b* of the second modification and the semiconductor device SM1 of FIGS. 2 to 7 described above.

The semiconductor chip CPHb used in the semiconductor device SM1*b* has the source pad PDHS3*c*, instead of the foregoing source pad PDHS3, over the main surface of the semiconductor chip CPHb. The semiconductor chip CPC has the pads PDC2*a* and PDC2*b*, instead of the foregoing pad PDC2, over the main surface of the semiconductor chip CPC. The pads PDC2*a* and PDC2*b* are the same as those in the foregoing first modification. The semiconductor chip CPC used in the semiconductor device SM1*b* of the second modification is the same as the semiconductor chip CPC used in the semiconductor device SM1*a* of the foregoing first modification.

That is, as can also be seen from FIG. 39, in the semiconductor chip CPC used in the semiconductor device SM1*b*, the pad. PDC2*a* is electrically coupled to the amplifier circuit AMP1 through the internal wiring (the internal wiring of the semiconductor chip CPC), but is not coupled to the driver circuit DR1 with the internal wiring. On the other hand, in the semiconductor chip CPC, the pad PDC2*b* is electrically coupled to the driver circuit DR1 through the internal wiring, but is not coupled to the amplifier circuit AMP1 with the internal wiring. That is, in the semiconductor chip CPC, the internal wiring providing coupling between the pad PDC2*a* and the amplifier circuit AMP1 and the internal wiring providing coupling between the pad PDC2*b* and the driver circuit DR1 are separately provided (do not have a common portion).

Similarly to the foregoing pad PDHS3, the pad PDHS3*c* is electrically coupled to the source of the foregoing power MOSFET QH1 formed in the semiconductor chip CPHb. Therefore, the source pad PDHS3*c* of the semiconductor chip CPHb corresponds to the source pad (bonding pad) of the foregoing high-side power MOSFET QH1. Similarly to the foregoing pad PDHS3, the pad PDHS3*c* is an electrode (pad electrode, electrode pad, or bonding pad) to be coupled to the wire WA.

As also shown in FIGS. 40 and 45, the pad PDHS3*c* of the semiconductor chip CPHb is electrically coupled to the pad PDC2*b* over the main surface of the semiconductor chip CPC via the wire or wires WA. That is, one end of the wire WA is bonded to the pad PDHS3*c* of the semiconductor chip CPHb, while the other end of the wire WA is bonded to the pad PDC2*b* of the semiconductor chip CPC. Specifically, the source pad PDHS3*c* of the semiconductor chip CPHb is electrically coupled to the pad PDC2*b* of the semiconductor chip CPC via the wire WA, and is further electrically coupled to the foregoing driver circuit DR1 in the semiconductor chip CPC through the internal wiring of the semiconductor chip CPC (see FIG. 39 described above).

As also shown in FIGS. 40 and 44, the pad PDC2*a* over the main surface of the semiconductor chip CPC is electrically coupled to the metal plate MP1 via the wire or wires WA. That is, one end of the wire WA is bonded to the pad PDC2*a* of the semiconductor chip CPC, while the other end of the wire WA is bonded to the metal plate MP1 (to the upper surface of the first portion MP1*a* thereof). Specifically, the metal plate MP1 is electrically coupled to the pad PDC2*a* of the semiconductor chip CPC via the wire WA, and is further electrically coupled to the foregoing amplifier circuit AMP1 in the semiconductor chip CPC through the internal wiring of the semiconductor chip CPC (see FIG. 39 described above). Note that, over the upper surface of the metal plate MP1 and in the region with which the wire WA comes in contact (to which the wire WA is coupled), a plating layer (not shown) comprised of silver (Ag) or the like can also be formed. This allows the wire WA to be more reliably coupled to the metal plate MP1.

Thus, the pad PDHS3*c* of the semiconductor chip CPHb is coupled to the pad PDC2*b* via the wire WA. Therefore, the pad PDHS3*c* of the semiconductor chip CPHb is electrically coupled to the driver circuit DR1 via the wire WA, the pad PDC2*b*, and the internal wiring (internal wiring different from the internal wiring providing coupling between the pad PDC2*a* and the amplifier circuit AMP1) of the semiconductor chip CPC. On the other hand, the metal plate MP1 is coupled to the pad PDC2*a* of the semiconductor chip CPC via the wire WA. Therefore, the metal plate MP1 is electrically coupled to the amplifier circuit AMP1 via the wire WA, the pad PDC2*a*, and the internal wiring (internal wiring different from the internal wiring providing coupling between the pad PDC2*b* and the driver circuit DR1) of the semiconductor chip CPC.

The semiconductor chip CPHb is the same as the semiconductor chip CPH101 of FIGS. 17 to 19 described above. The foregoing pad PDHS103 in the foregoing semiconductor chip CPH101 corresponds to the pad PDHS3*c* in the semiconductor chip CPHb. The foregoing source wire 10S101 in the foregoing semiconductor chip CPH101 corresponds to the source wire 10S1 in the semiconductor chip CPHb. Therefore, unlike in the foregoing semiconductor chips CPH and CPHa, the foregoing source wire 10S3 and the foregoing slit 16 do not exist in the semiconductor chip CPHb, and the source wire 10S1 exposed from the foregoing opening 13 forms the pad PDHS3*c*. The semiconductor chip CPHb is the same as the foregoing semiconductor chip CPHa in that the pad PDHS3*c* is formed of the source wire 10S1 exposed from the foregoing opening 13, similarly to the pad PDHS3*b* in the foregoing semiconductor chip CPHa. Accordingly, the relationship between the source wire 10S1 and the pad PDHS3*c* is basically the same as the relationship between the source wire 10S1 and the pad PDHS3*b* in the foregoing semiconductor chip CPHa. Therefore, the pad PDHS3*c* is formed of the source wire 10S1, and the source wire 10S1 forming the pad PDHS3*c* (the portion of the source wire 10S1 serving as the pad PDHS3*c*) and the source wire 10S1 forming the pad PDHS1*a* (the portion of the source wire 10S1 serving as the pad PDHS1*a*) have no slit formed therebetween and are continuously connected, while having a wire width about equal to or larger than the width of the pad PDHS3*c*. As a result, when the metal plate MP1 is bonded to the pads PDHS1*a* and PDHS1*b*, the resistance from the metal plate MP1 to the pad PDHS3*c* can be reduced.

The configuration of the semiconductor chip CPHb is otherwise basically the same as that of the foregoing semiconductor chip CPH so that a repeated description thereof is omitted herein. Also, the configuration of the semiconductor device SM1b is otherwise basically the same as that of the foregoing semiconductor device SM1 so that a repeated description thereof is omitted herein.

In the semiconductor device SM1b of the second modification, the metal plate MP1 is coupled to the pad PDC2b of the semiconductor chip CPC via the wire WA to be thereby electrically coupled to the driver circuit DR1 through the wire WA, the pad PDC2b, and the internal wiring of the semiconductor chip CPC. As a result, even when displacement of the metal plate MP1 occurs (i.e., even when the position at which the metal plate MP1 is bonded in the semiconductor chip CPHb varies), the resistance from the metal plate MP1 to the pad PDC2a of the semiconductor chip CPC is substantially determined by the resistance of the wire WA, and can be held substantially constant without substantially varying (fluctuating). Therefore, it is possible to inhibit or prevent the current ratio between a current flowing in the power MOSFET QH1 and a current flowing in the sense MOSFET QS1 from varying due to displacement of the metal plate MP1 (i.e., variations in the position at which the metal plate MP1 is bonded in the semiconductor chip CPHb).

That is, in the second modification, if the potential difference between the foregoing potential VIN inputted to the common drain of the power MOSFET QH1 and the sense MOSFET QS1 and the voltage V1 at the foregoing position P1 is assumed to be the same, even when displacement of the metal plate MP1 occurs, the resistance from the metal plate MP1 to the pad PDC2a of the semiconductor chip CPC is substantially constant. Therefore, the input voltage of the pad PDC2a of the semiconductor chip CPC can be set to substantially the same value irrespective of the position at which the metal plate MP1 is bonded. The amplifier circuit AMP1 controls the voltage (input voltage) of the pad PDC2a of the semiconductor chip CPC and the voltage (input voltage) of the pad PDC3 such that they are the same. However, since the voltage (input voltage) of the pad PDC2a of the semiconductor chip CPC is not affected by the position at which the metal plate MP1 is bonded to the semiconductor chip CPHb, the magnitude of the current flowing in the sense MOSFET QS1 is no longer affected by the position at which the metal plate MP1 is bonded to the semiconductor chip CPHb. Therefore, even when displacement of the metal plate MP1 occurs (i.e., even when the position at which the metal plate MP1 is bonded in the semiconductor chip CPHb fluctuates), the current ratio between the current flowing in the power MOSFET QH1 and the current flowing in the sense MOSFET QS1 is substantially the same. Accordingly, it is possible to improve the accuracy of sensing the current flowing in the power MOSFET QH1 by means of the sense MOSFET QS1. This allows an improvement in the reliability of the semiconductor device SM1b.

Also, in the semiconductor device SM1b of the second modification, the current path when the power MOSFET QH1 is turned OFF extends through the pad PDC2b, the wire WA (the wire WA providing coupling between the pads PDC2b and PDHS3b), and the pad PDHS3b. That is, the current flowing from the driver circuit DR1 to the source of the power MOSFET QH1 when the power MOSFET QH1 is turned OFF flows in the path through the pad PDC2b, the wire WA (the wire WA providing coupling between the pads PDC2b and PDHS3b), and the pad PDHS3b, and does not flow in a path through the pad PDC2a, the wire WA (the wire WA providing coupling between the pad PDC2a and the metal plate MP1), and the metal plate MP1. This allows a reduction in wiring resistance (resistive component) when the power MOSFET QH1 is turned OFF, and therefore allows an increase in switching speed when the power MOSFET QH1 is turned OFF as well as a reduction in turn-OFF loss. As a result, it is possible to improve the performance of the semiconductor device SM1b.

Next, a description will be given to a modification of the semiconductor device SM1b of the second modification.

<About Third Modification>

The third modification of the present embodiment will be described. It is assumed that, hereinafter, the semiconductor device SM1 of the third modification is referred to as a semiconductor device SM1c, and the semiconductor chip CPH used in the semiconductor device SM1 (i.e., semiconductor device SM1c) of the third modification is referred to as a semiconductor chip CPHc.

Figure 49:
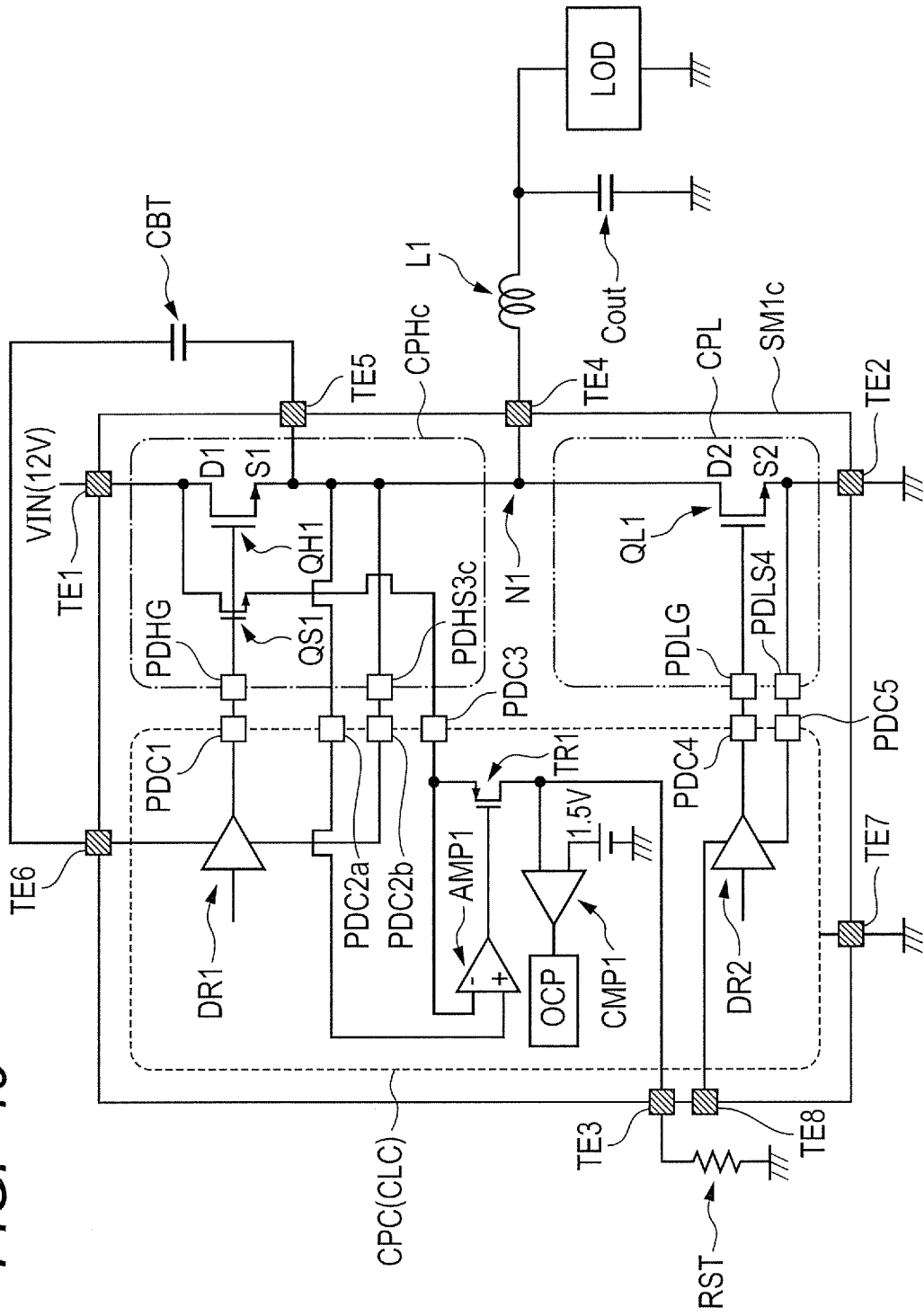
FIG. 49 is a circuit diagram showing an electronic device using a semiconductor device of a third second modification of the embodiment of the present invention.
Figure 50:
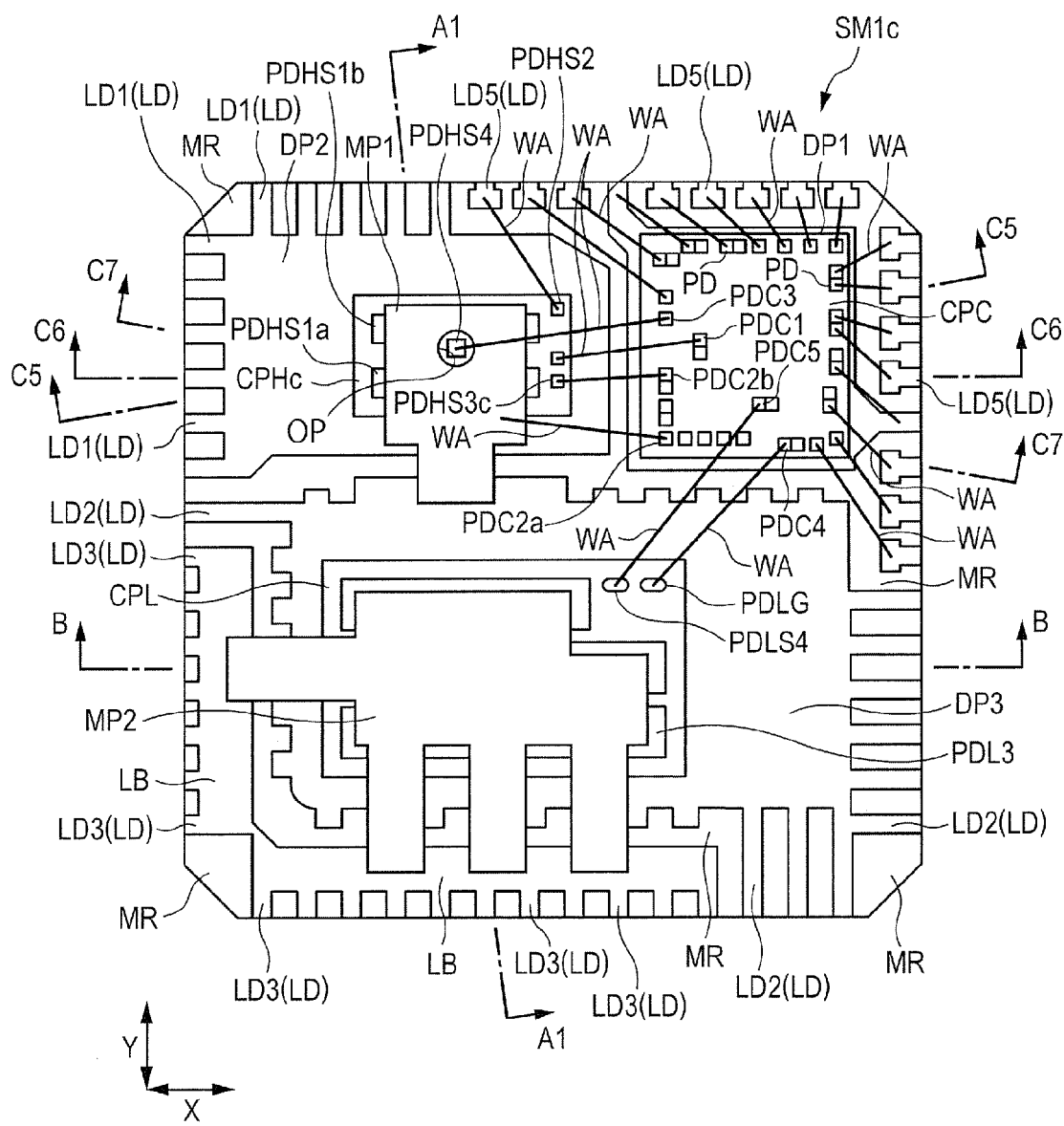
FIG. 50 is a perspective plan view of the semiconductor device of the third modification of the embodiment of the present invention.
Figure 51:
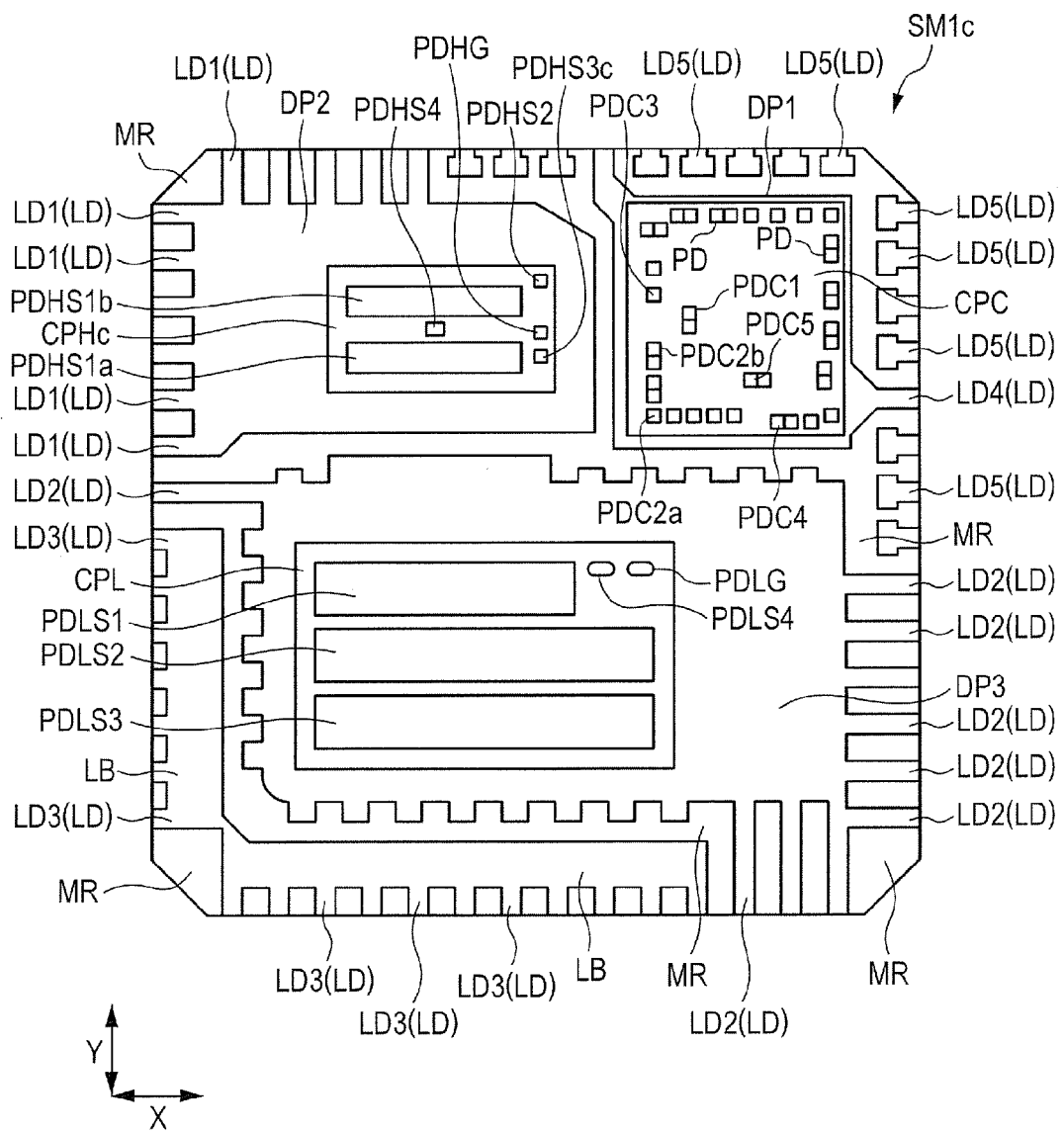
FIG. 51 is a perspective plan view of the semiconductor device of the third modification of the embodiment of the present invention.
Figure 52:
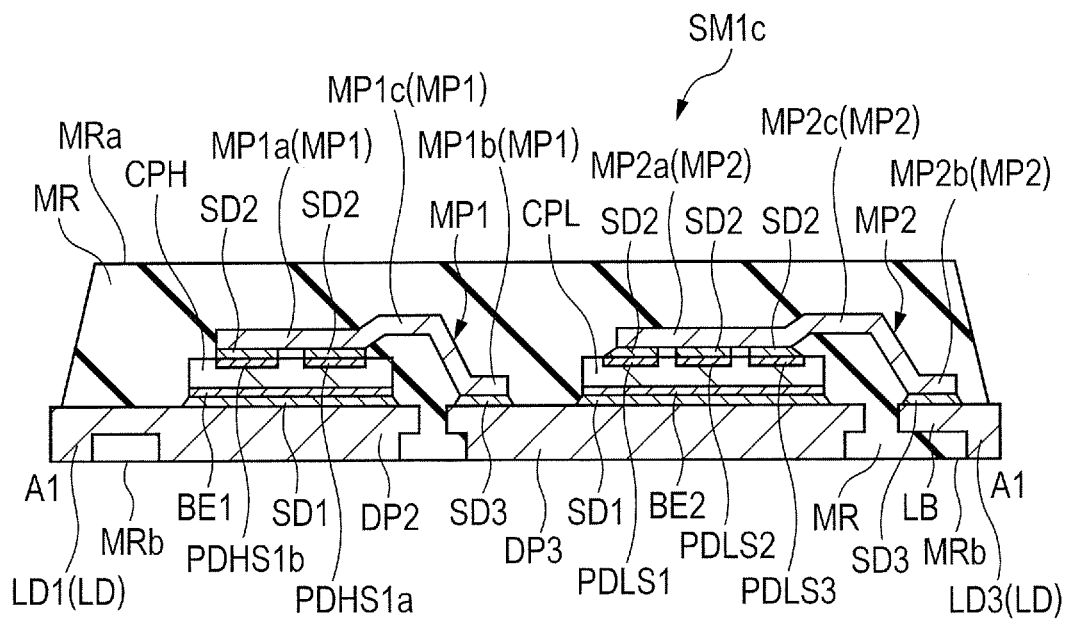
FIG. 52 is a cross-sectional view of the semiconductor device of the third modification of the embodiment of the present invention.
Figure 53:
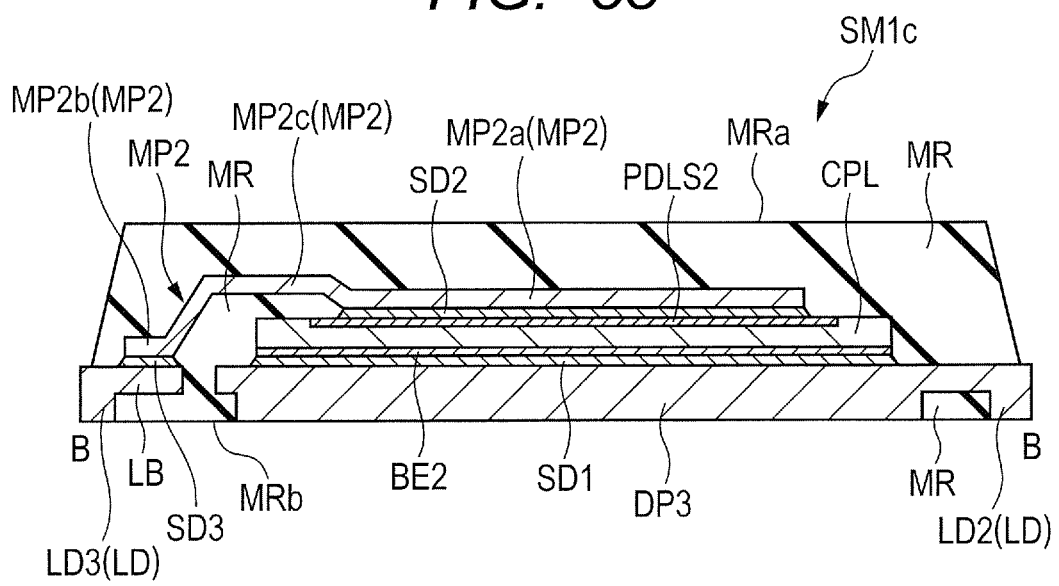
FIG. 53 is a cross-sectional view of the semiconductor device of the third modification of the embodiment of the present invention.
Figure 54:
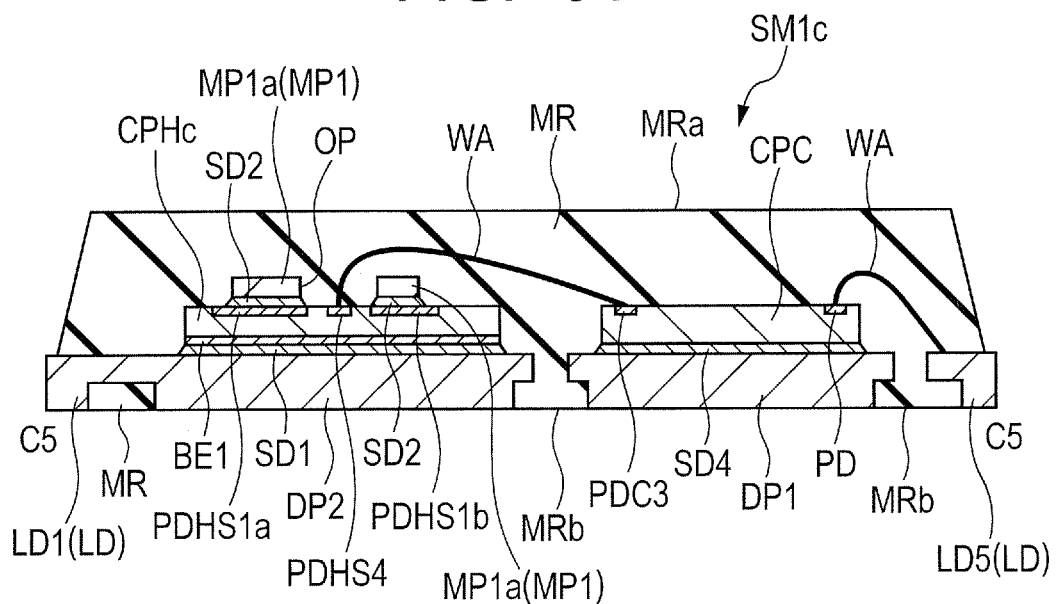
FIG. 54 is a cross-sectional view of the semiconductor device of the third modification of the embodiment of the present invention.
Figure 55:
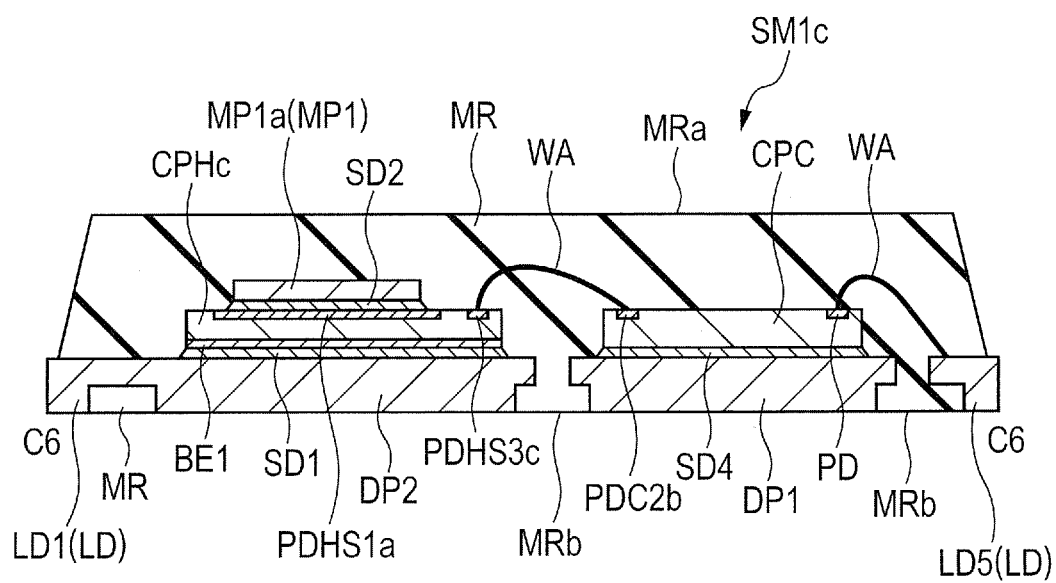
FIG. 55 is a cross-sectional view of the semiconductor device of the third modification of the embodiment of the present invention.
Figure 56:
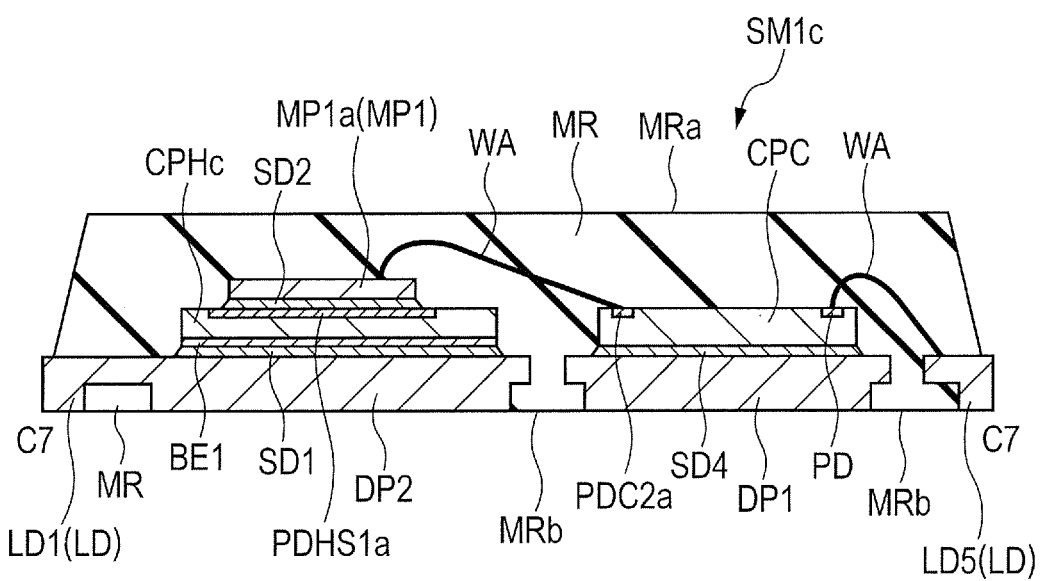
FIG. 56 is a cross-sectional view of the semiconductor device of the third modification of the embodiment of the present invention.
Figure 57:
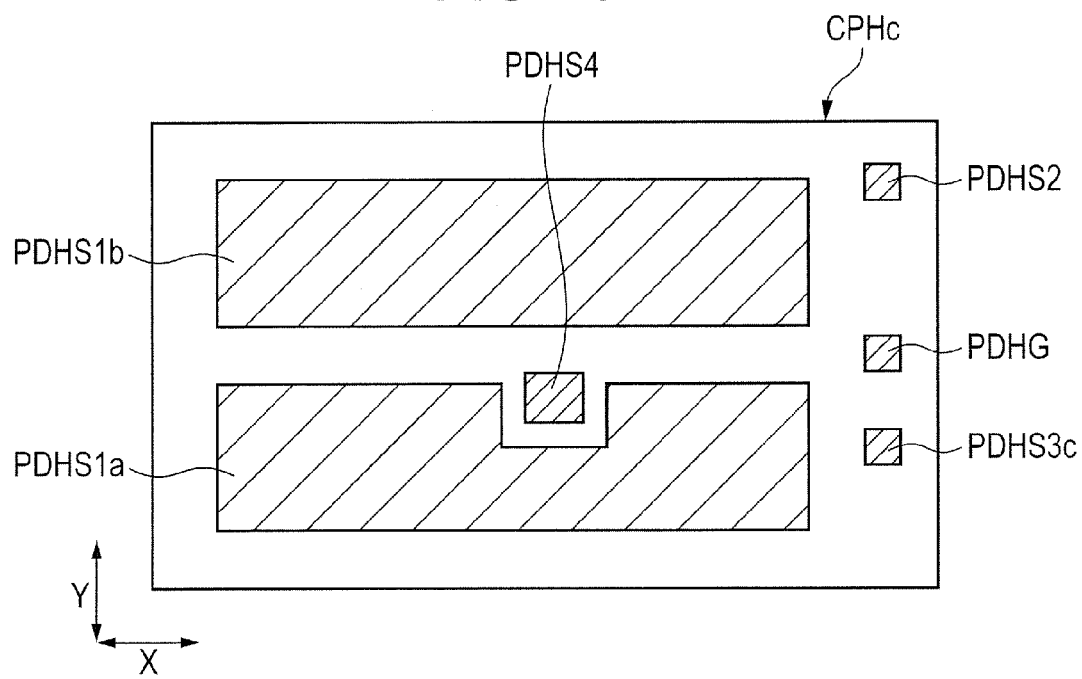
FIG. 57 is a plan view showing a chip layout of a semiconductor chip used in the semiconductor device of the third modification of the embodiment of the present invention.
Figure 58:
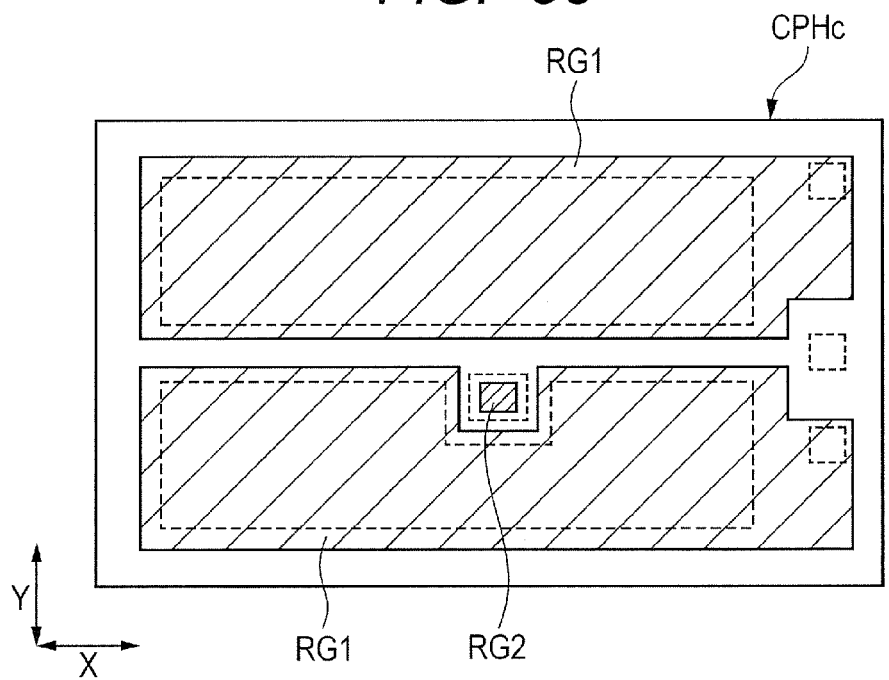
FIG. 58 is a plan view showing the chip layout of the semiconductor chip used in the semiconductor device of the third modification of the embodiment of the present invention.
Figure 59:
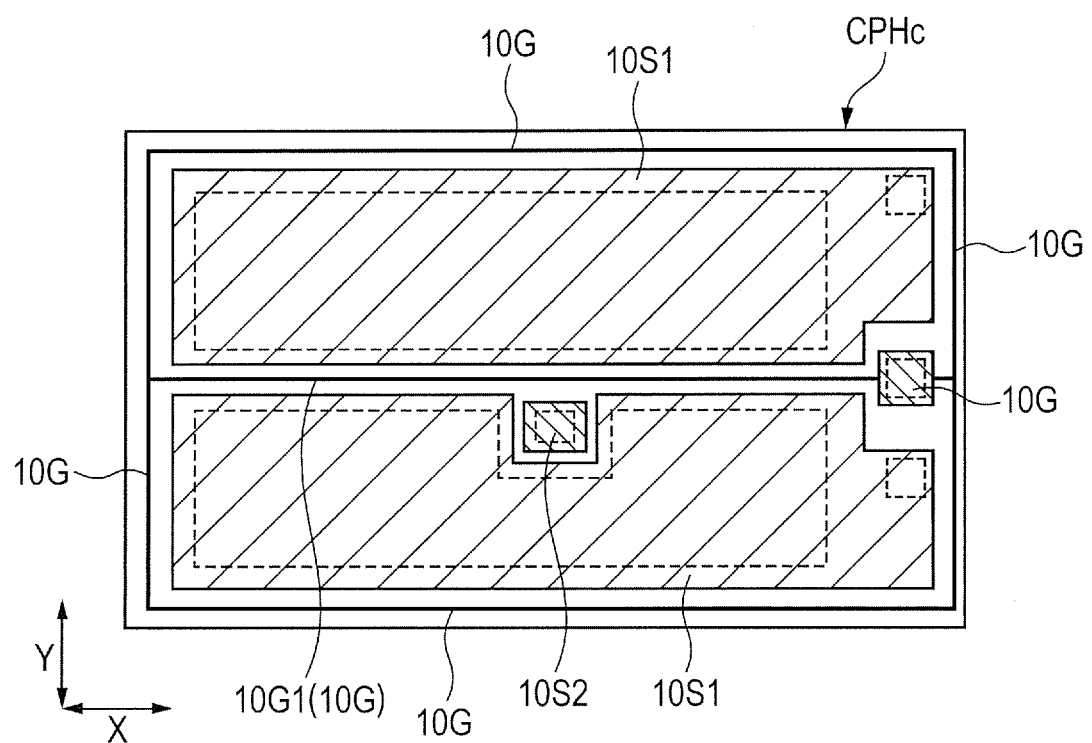
FIG. 59 is a plan view showing the chip layout of the semiconductor chip used in the semiconductor device of the third modification of the embodiment of the present invention.

FIG. 49 is a circuit diagram showing an example of an electronic device (which is a non-insulated-type DC-DC converter here) using the semiconductor device (semiconductor package) SM1c of the third modification, and corresponds to FIGS. 1, 29, and 39 described above. FIGS. 50 and 51 are perspective plan views of the semiconductor device SM1c of the third modification. FIGS. 52 to 56 are cross-sectional views (side cross-sectional views) of the semiconductor device SM1c. FIG. 50 corresponds to FIG. 2 described above, and shows a plan view (top view) in which the semiconductor device SM1c is viewed from the top side thereof through the sealing portion MR. FIG. 51 corresponds to FIG. 3 described above, and is a perspective plan view of the semiconductor device SM1c in a state where the metal plates MP1 and MP2 and the bonding wires WA, which are shown in FIG. 50, have been removed (when viewed without the metal plates MP1 and MP2 and the bonding wires WA). The perspective plan view of FIG. 51 in a state where the semiconductor chips CPC, CPHc, and CPL have been removed (when the semiconductor device SM1c is viewed without the semiconductor chips CPC, CPHc, and CPL) is the same as that of FIG. 4 described above. FIG. 52 substantially corresponds to a cross-sectional view along the line A1-A1 of FIG. 50. FIG. 53 corresponds to FIG. 6 described above, and substantially corresponds to a cross-sectional view along the line B-B of FIG. 50. FIG. 54 substantially corresponds to a cross-sectional view along the line C5-C5 of FIG. 50. FIG. 55 substantially corresponds to a cross-sectional view along the line C6-C6 of FIG. 50. FIG. 56 substantially corresponds to a cross-sectional view along the line C7-C7 of FIG. 50. FIGS. 57 to 59 are plan views each showing a chip layout of the semiconductor chip CPHc, and respectively correspond to FIGS. 10 to 12 described above. Among them, FIG. 57 is a plan view corresponding to the top view of the semiconductor chip CPHc but, for easier understanding, the bonding pads (pads PDHG, PDHS1a, PDHS1b, PDHS2, PDHS3c, and PDHS4) are hatched. FIG. 58 shows the main MOSFET region RG1 and the sense MOSFET region RG2 in the semiconductor chip CPHc by hatching, and shows the positions of the bonding pads (pads PDHG, PDHS1a, PDHS1b, PDHS2, PDHS3c, and PDHS4) by the dotted lines. In FIG. 59, the layout of the metal wires (the gate wire 10G and the source wires 10S1 and 10S2) in the semiconductor chip CPHc is shown by the hatched regions and the thick lines, and the positions of the bonding pads (pads PDHG, PDHS1a, PDHS1b, PDHS2, PDHS3c, and PDHS4) are shown by the dotted lines.

The semiconductor device SM1c of the third modification is a modification of the semiconductor device SM1b of the foregoing second modification. Therefore, as for commonality between the semiconductor device SM1c of the third modification and the semiconductor device SM1b of the foregoing second modification, a description thereof is basically omitted. A description will be given below to the difference between the semiconductor device SM1c of the third modification and the semiconductor device SM1b of the second modification.

As shown in FIGS. 57 and 58, in the semiconductor chip CPHc used in the semiconductor device SM1c, the pad PDHS4 is disposed in the vicinity of the center of the main surface of the semiconductor chip CPHc. Since the pad PDHS4 is formed of the source wire 10S2 exposed from the foregoing opening 13, the source wire 10S2 is also disposed in the vicinity of the center of the main surface of the semiconductor chip CPHc, and the sense MOSFET region RG2 is disposed under the source wire 10S2. In other words, the sense MOSFET region RG2 is disposed in the vicinity of the center of the main surface of the semiconductor chip CPHc, and the source wire 10S2 and the pad PDHS4 are formed thereover. Since the sense MOSFET region RG2 is disposed in the vicinity of the center of the main surface of the semiconductor chip CPHc, the sense MOSFET region RG2 is in a state surrounded by the main MOSFET region RG1 in planar view. In the main surface of the semiconductor chip CPHc, the pad PDHS4 overlaps the sense MOSFET region RG2 in planar view, and is also in a state surrounded by the pads PDHS1a and PDHS1b in planar view. Since the sense MOSFET region RG2 is disposed in the vicinity of the center of the main surface of the semiconductor chip CPHc, it can also be said that, in the main surface of the semiconductor chip CPHc, the pad PDHS4 is disposed inwardly of the gate pad PDHG.

In the main surface of the semiconductor chip CPHc, not only in the outer peripheral portion, but also between the pads PDHS1a and PDHS1b in planar view, the gate wire (wire for gate) 10G extends (specifically extends in the first direction X). Of the gate wire 10G, the portion extending between the source pads PDHS1a and PDHS1b in planar view is provided with the mark 10G1 and referred to as a gate wire 10G1. The gate wire 10G1 is coupled to the foregoing wiring portions (wiring portions for gate extraction) 7a, electrically coupled to the plurality of gate electrodes 7 formed in the main MOSFET region RG1 via the wiring portions 7a, and also electrically coupled to the plurality of gate electrodes 7 formed in the sense MOSFET region RG2 via the wiring portions 7a.

In the semiconductor device SM1c, as can be also seen from FIGS. 50 to 54, an opening (hole or through hole) OP is formed in the metal plate MP1. The opening OP is formed at a position and in a shape at and in which the pad PDHS4 of the semiconductor chip CPHc is exposed. The pad PDHS4 of the semiconductor chip CPHc is coupled to the pad PDC3 of the semiconductor CPC with the wire WA, which extends through the opening OP of the metal plate MP1.

When the semiconductor device SM1c is manufactured, prior to a wire bonding step, the bonding of the metal plate MP1 to the semiconductor chip CPHc and the die pad DP3 and the bonding of the metal plate MP2 to the semiconductor chip CPL and the lead wire LB is performed. At this time, the metal plate MP1 is bonded to the pads PDHS1a and PDHS1b of the semiconductor chip CPHc so as to expose the pad PDHS4 of the semiconductor chip CPHc from the opening OP of the metal plate MP1 in planar view. Thereafter, the wire bonding step is performed. At this time, the pad PDHS4 of the semiconductor chip CPHc exposed from the opening OP of the metal plate MP1 is bonded to the pad PDC3 of the semiconductor chip CPC with the wire WA. That is, one end of the wire WA is coupled to the pad PDHS4 of the semiconductor chip CPHc exposed from the opening OP of the metal plate MP1, while the other end of the wire WA is coupled to the pad PDC3 of the semiconductor chip CPC.

Thus, the wire WA having one end thereof coupled to the pad PDHS4 of the semiconductor chip CPHc extends through the opening OP provided in the metal plate MP1, while having the other end thereof coupled to the pad PDC3 of the semiconductor chip CPC.

The configurations of the semiconductor chip CPHc and the semiconductor device SM1c are otherwise basically the same as the configurations of the semiconductor chip CPHb and the semiconductor device SM1b of the foregoing second modification so that a repeated description thereof is omitted herein. Accordingly, in the semiconductor device SM1 also, the pad PDHS3c of the semiconductor chip CPHc is electrically coupled to the pad PDC2b over the main surface of the semiconductor chip CPC through the wire or wires WA, and the pad PDC2a of the semiconductor chip CPC is electrically coupled to the metal plate PM1 through the wire or wires WA.

In the semiconductor device SM1c of the third modification, substantially the same effect as obtained in the semiconductor device SM1b of the foregoing second modification can be obtained.

Moreover, in the semiconductor device SM1c of the third modification, the sense MOSFET region RG2 is disposed in the vicinity of the center of the main surface of the semiconductor chip CPHc. As a result, even if a crack occurs in the foregoing adhesive layer SD1 due to a thermal stress, the crack is less likely to extend under the sense MOSFET region RG2. Accordingly, the current flowing in the sense MOSFET QS1 is less likely to be affected by the crack. Therefore, it is possible to inhibit or prevent the accuracy of sensing the current flowing in the power MOSFET QH1 by means of the sense MOSFET QS1 from being degraded by the crack. In addition, the pad PDHS4 is disposed at a position overlapping the sense MOSFET region RG2 disposed in the vicinity of the center of the main surface of the semiconductor chip CPHc in planar view to allow a reduction in the area of the source wire 10S2 coupling the sense MOSFET region RG2 and the pad PDHS4. This makes it easy to ensure an area size for the main MOSFET region RG1. Furthermore, even when such a semiconductor chip CPHc is used, the metal plate MP1 does not interrupt the coupling of the wire WA to the pad PDHS4 to allow the semiconductor device SM1c to be manufactured. Additionally, since the wire WA coupled to the pad PDHS4 can be reliably prevented from coming in contact with the metal plate MP1, the reliability of the semiconductor device SM1c can be further improved.

In each of the semiconductor device SM1b of the second modification and the semiconductor device SM1c of the third modification, the pad PDC2a of the semiconductor chip CPC is coupled to the metal plate MP1 with the wire WA. By contrast, in a modification described below, the pad PDC2a of the semiconductor chip CPC is coupled to the die pad DP3 with the wire WA.

<About Fourth Modification>

The fourth modification of the present embodiment will be described. It is assumed that, hereinafter, the semiconductor device SM1 of the fourth modification is referred to as a semiconductor device SM1d. The semiconductor chip CPH used in the semiconductor device SM1 (i.e., semiconductor device SM1d) of the fourth modification is the same as the foregoing semiconductor chip CPHb used in the semiconductor device SM1b of the foregoing second modification. Therefore, the semiconductor chip CPH is also referred to as the semiconductor chip CPHb herein.

Figure 60:
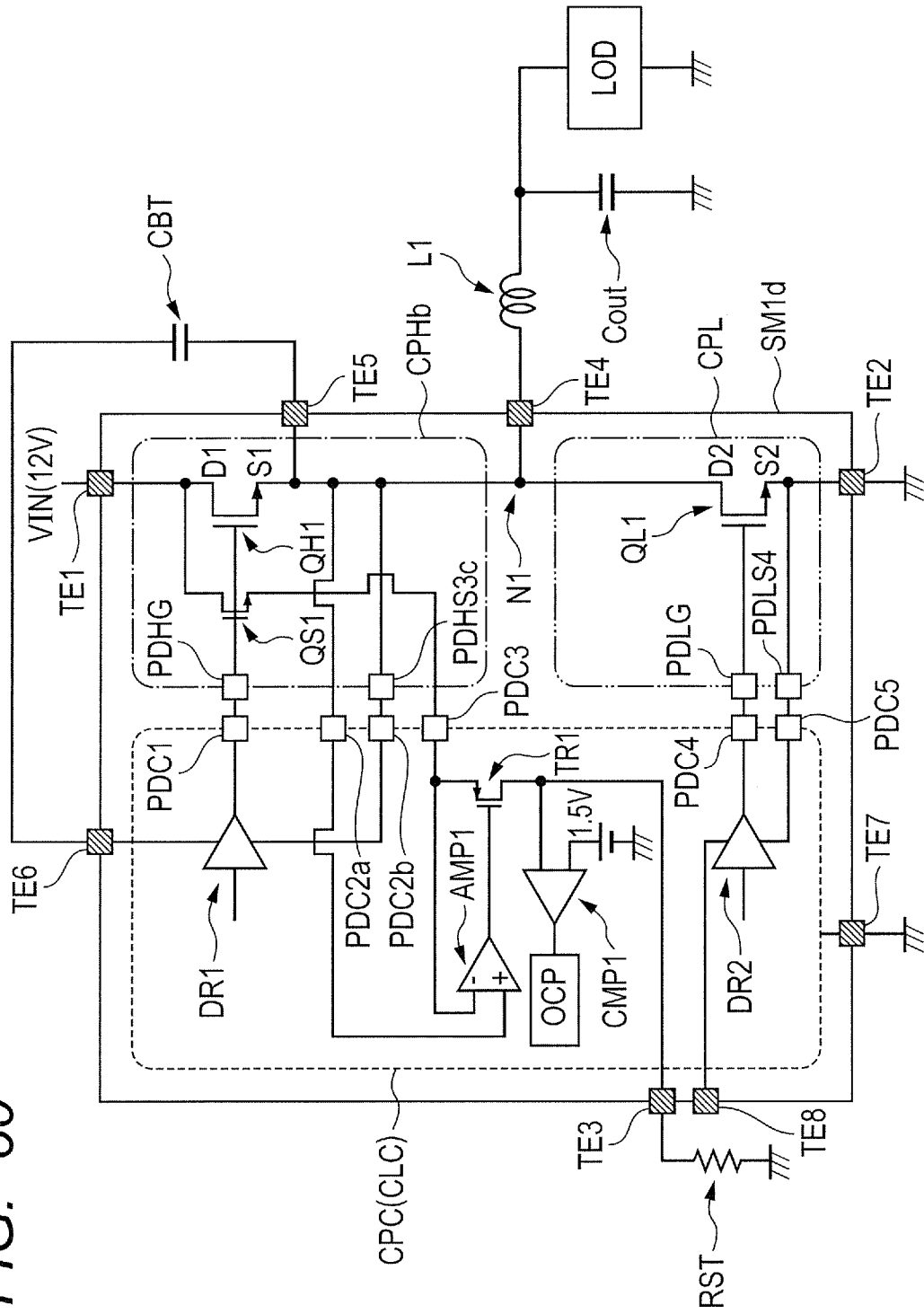
FIG. 60 is a circuit diagram showing an electronic device using a semiconductor device of a fourth modification of the embodiment of the present invention.
Figure 61:
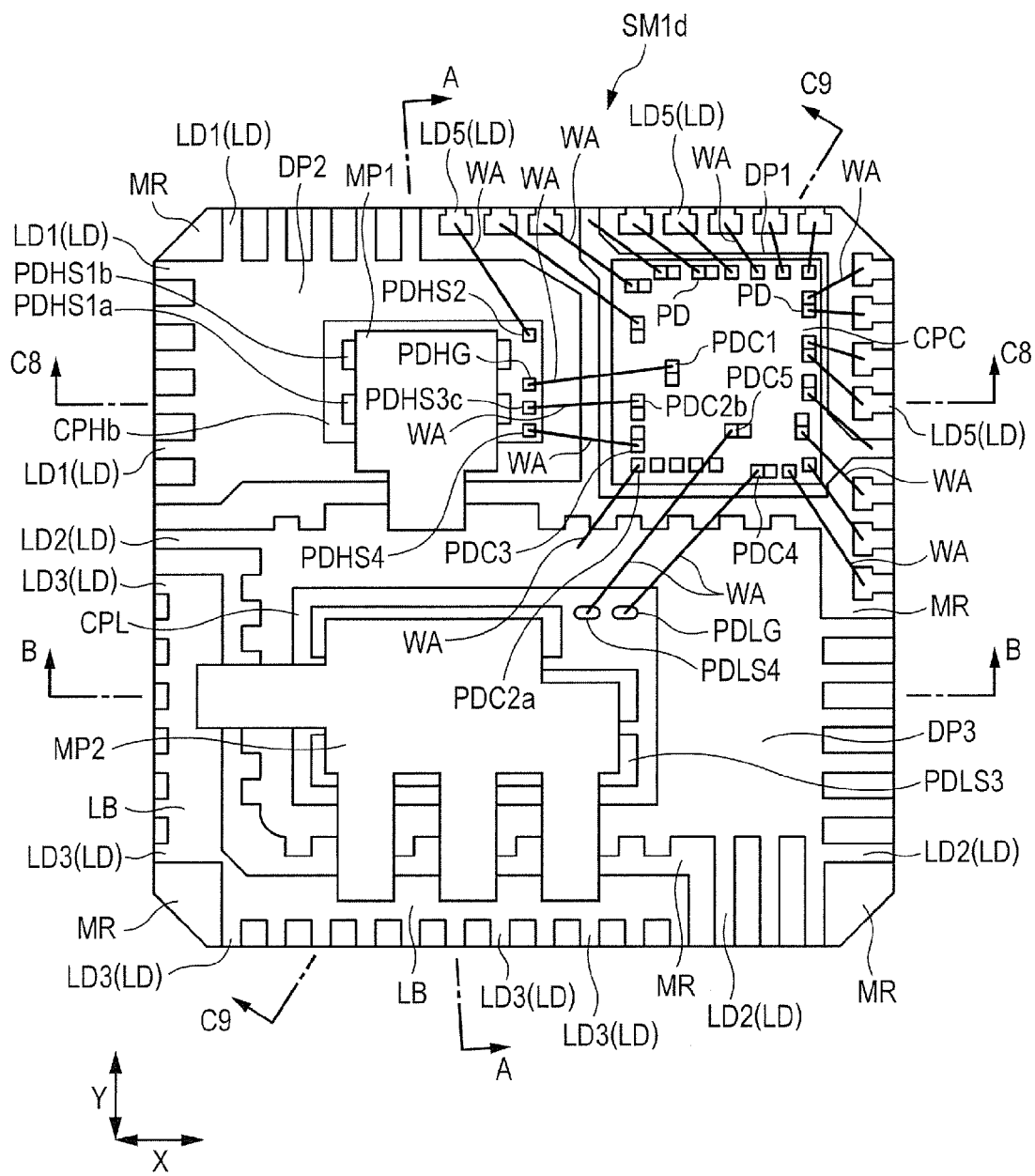
FIG. 61 is a perspective plan view of the semiconductor device of the fourth modification of the embodiment of the present invention.
Figure 62:
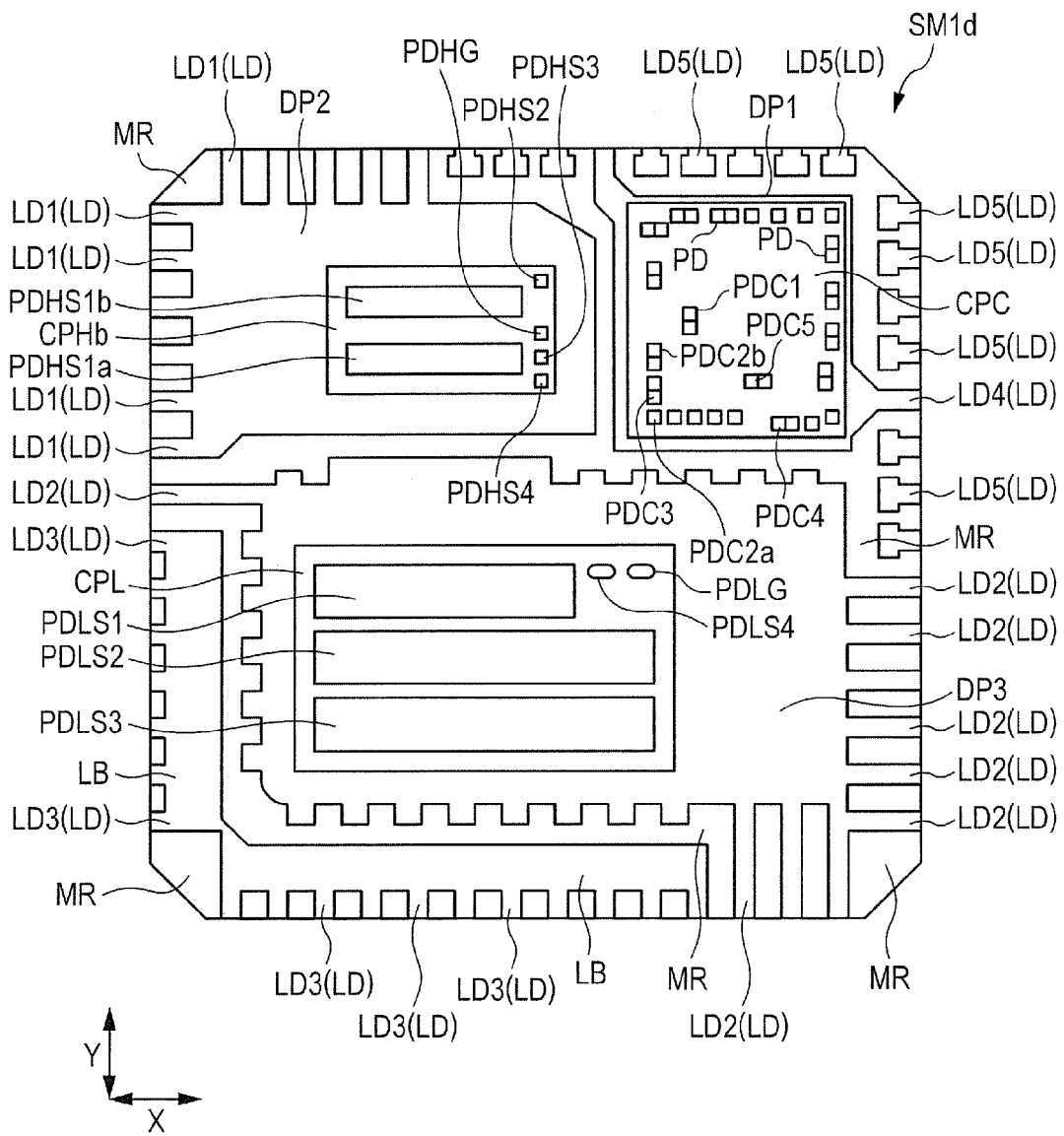
FIG. 62 is a perspective plan view of the semiconductor device of the fourth modification of the embodiment of the present invention.
Figure 63:
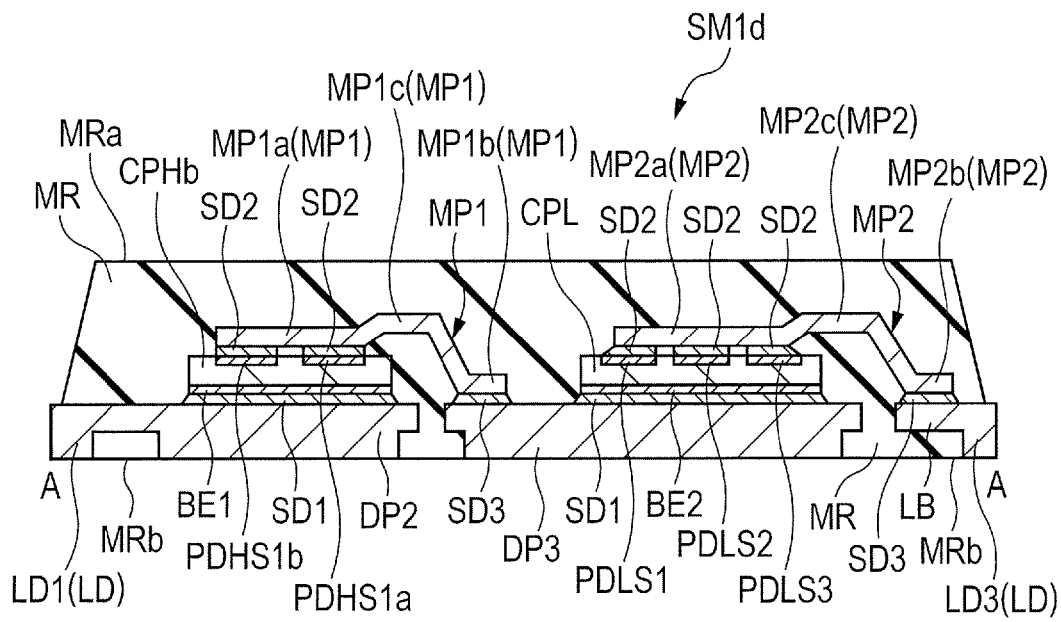
FIG. 63 is a cross-sectional view of the semiconductor device of the fourth modification of the embodiment of the present invention.
Figure 64:
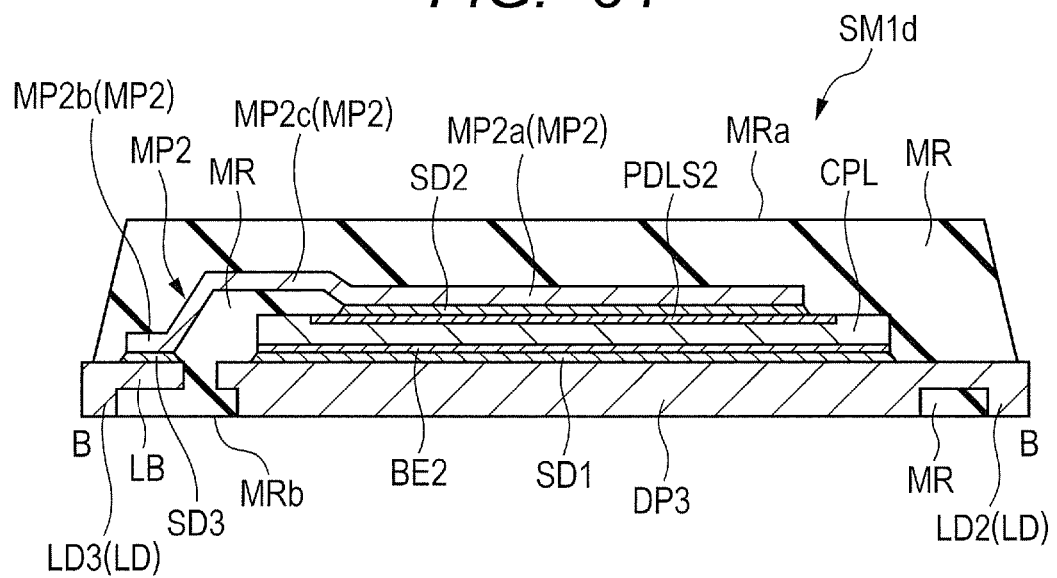
FIG. 64 is a cross-sectional view of the semiconductor device of the fourth modification of the embodiment of the present invention.
Figure 65:
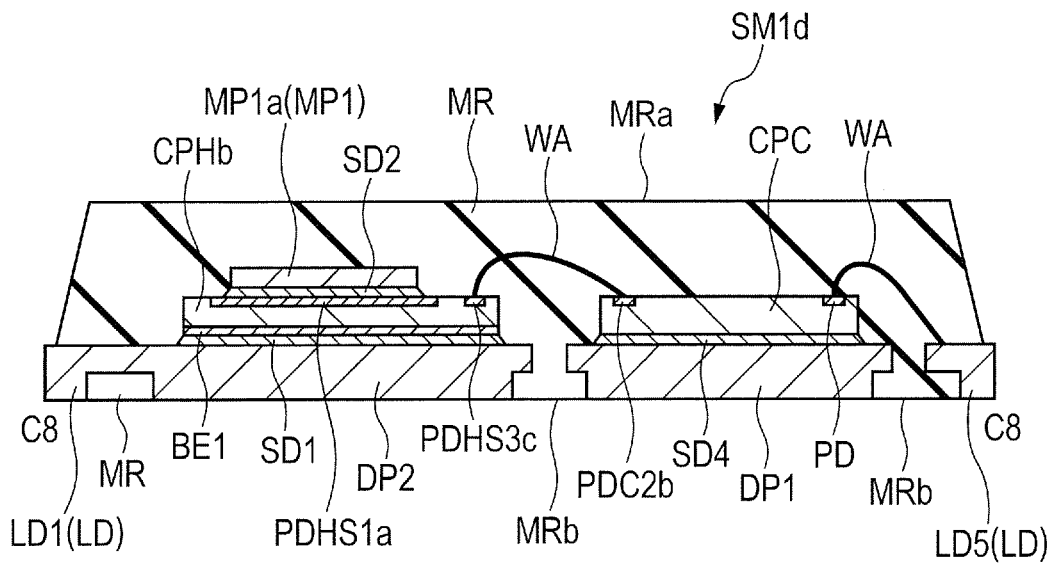
FIG. 65 is a cross-sectional view of the semiconductor device of the fourth modification of the embodiment of the present invention.
Figure 66:
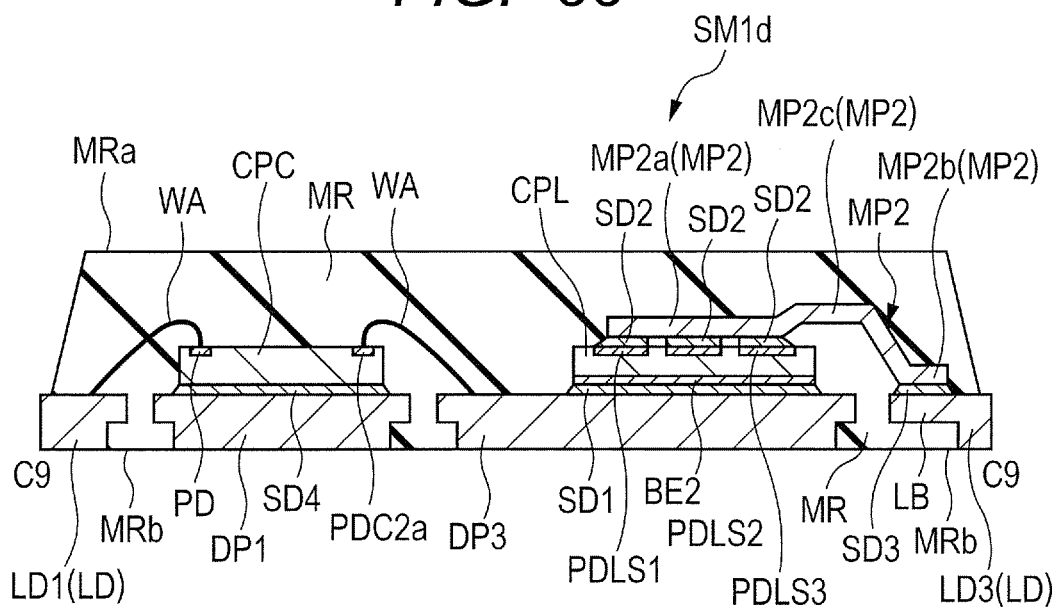
FIG. 66 is a cross-sectional view of the semiconductor device of the fourth modification of the embodiment of the present invention.

FIG. 60 is a circuit diagram showing an example of an electronic device (which is a non-insulated-type DC-DC converter here) using the semiconductor device (semiconductor package) SM1*d* of the fourth modification, and corresponds to FIGS. 1, 29, 39, and 49 described above. FIGS. 61 and 62 are perspective plan views of the semiconductor device SM1*d* of the fourth modification. FIGS. 63 to 66 are cross-sectional views (side cross-sectional views) of the semiconductor device SM1*d*. FIG. 61 corresponds to FIG. 2 described above, and shows a plan view (top view) in which the semiconductor device SM1*d* is viewed from the top side thereof through the sealing portion MR. FIG. 62 corresponds to FIG. 3 described above, and is a perspective plan view of the semiconductor device SM1*d* in a state where the metal plates MP1 and MP2 and the bonding wires WA, which are shown in FIG. 61, have been removed (when viewed without the metal plates MP1 and MP2 and the bonding wires WA). The perspective plan view of FIG. 62 in a state where the semiconductor chips CPC, CPHb, and CPL have been removed (when the semiconductor device SM1*d* is viewed without the semiconductor chips CPC, CPHb, and CPL) is the same as that of FIG. 4 described above. FIG. 63 corresponds to FIG. 5 described above, and substantially corresponds to a cross-sectional view along the line A-A of FIG. 61. FIG. 64 corresponds to FIG. 6 described above, and substantially corresponds to a cross-sectional view along the line B-B of FIG. 61. FIG. 65 substantially corresponds to a cross-sectional view along the line C8-C8 of FIG. 61. FIG. 66 substantially corresponds to a cross-sectional view along the line C9-C9 of FIG. 61.

The semiconductor device SM1*d* of the fourth modification is another modification of the semiconductor device SM1*b* of the foregoing second modification. Therefore, as for commonality between the semiconductor device SM1*d* of the fourth modification and the semiconductor device SM1*b* of the foregoing second modification, a description thereof is basically omitted. A description will be given below to the difference between the semiconductor device SM1*d* of the fourth modification and the semiconductor device SM1*b* of the second modification.

In the semiconductor device SM1*b* of the foregoing second modification, the pad PDC2*a* over the main surface of the semiconductor chip CPC is electrically coupled to the metal plate MP1 through the wire or wires WA.

By contrast, in the semiconductor device SM1*d* of the fourth modification, as also shown in FIGS. 61 and 66, the pad PDC2*a* over the main surface of the semiconductor chip CPC is electrically coupled to the die pad DP3 through the wire or wires WA. That is, one end of the wire WA is bonded to the pad PDC2*a* of the semiconductor chip CPC, while the other end of the wire WA is bonded to the die pad DP3 (to the upper surface thereof). Specifically, the die pad DP3 is electrically coupled to the pad PDC2*a* of the semiconductor chip CPC via the wire WA, and is further electrically coupled to the foregoing amplifier circuit AMP1 in the semiconductor chip CPC through the internal wiring of the semiconductor chip CPC (see FIG. 39 described above). Note that, over the upper surface of the die pad DP3 and in the region with which the wire WA comes in contact (to which the wire WA is bonded), a plating layer (not shown) comprised of silver (Ag) or the like can also be formed. This allows the wire WA to be more reliably coupled to the die pad DP3.

The metal plate MP1 is electrically coupled to the die pad DP3 via the conductive adhesive layer SD3, and the die pad DP3 is coupled to the pad PDC2*a* of the semiconductor chip CPC via the wire WA. Therefore, the metal plate MP1 is electrically coupled to the amplifier circuit AMP1 through the adhesive layer SD3 (adhesive layer SD3 bonding the metal plate MP1 to the die pad DP3), the die pad DP3, the wire WA, the pad PDC2*a*, and the internal wiring (internal wiring different from the internal wiring providing coupling between the pad PDC2*b* and the driver circuit DR1) of the semiconductor chip CPC. On the other hand, the pad PDHS3*c* of the semiconductor chip CPHb is coupled to the pad PDC2*b* via the wire WA. Therefore, the pad PDHS3*c* of the semiconductor chip CPHb is electrically coupled to the driver circuit DR1 through the wire WA, the pad PDC2*b*, and the internal wiring (internal wiring different from the internal wiring providing coupling between the pad PDC2*a* and the amplifier circuit AMP1) of the semiconductor chip CPC.

The configuration of the semiconductor device SMP1*d* is otherwise basically the same as that of the semiconductor device SM1*b* of the foregoing second modification so that a repeated description thereof is omitted herein.

In the semiconductor device SM1*d* of the fourth modification, the metal plate MP1 is coupled to the die pad DP3 with the conductive adhesive layer SD3 to couple the die pad DP3 to the pad PDC2*b* of the semiconductor chip CPC via the wire WA. In this manner, the metal plate MP1 is electrically coupled to the driver circuit DR1 through the adhesive layer SD3, the wire WA, the pad PDC2*b*, and the internal wiring of the semiconductor chip CPC. The resistance from the bonded portion between the semiconductor chip CPHb (the pads PDHS1*a* and PDHS1*b* thereof) and the metal plate MP1 to the pad PDC2*a* of the semiconductor chip CPC is substantially determined by the resistance of the metal plate MP1, the adhesive layer SD3, the die pad, and the wire WA. However, the thickness of the metal plate MP1 is sufficiently larger than the thickness of the foregoing conductor film 10, and the resistance of the metal plate MP1 is smaller than the spreading resistance (the foregoing resistive component RV1) produced in the source wire 10S1. Accordingly, even when displacement of the metal plate MP1 occurs (i.e., even when the position at which the metal plate MP1 is bonded in the semiconductor chip CPHb varies), the resistance from the bonded portion between the semiconductor chip CPHb (the pads PDHS1*a* and PDHS1*b* thereof) and the metal plate MP1 to the pad PDC2*a* of the semiconductor chip CPC barely varies (barely fluctuates) but can be held substantially constant. This can inhibit or prevent the current ratio between the current flowing in the power MOSFET QH1 and the current flowing in the sense MOSFET QS1 from varying due to displacement of the metal plate MP1 (i.e., variations in the position at which the metal plate MP1 is bonded in the semiconductor chip CPHb). Therefore, it is possible to improve the accuracy of sensing the current flowing in the power MOSFET QH1 by means of the sense MOSFET QS1, and improve the reliability of the semiconductor device SM1*d*.

Also, in the semiconductor device SM1*d* of the fourth modification, the current path when the power MOSFET QH1 is turned OFF extends through the pad PDC2*b*, the wire WA (the wire WA providing coupling between the pads PDC2*b* and PDHS3*b*), and the pad PDHS3*b*. That is, the current flowing from the driver circuit DR1 to the source of the power MOSFET QH1 when the power MOSFET QH1 is turned OFF flows in the path through the pad PDC2*b*, the wire WA (the wire WA providing coupling between the pads PDC2*b* and PDHS3*b*), and the pad PDHS3*b*, and does not flow in a path through the pad PDC2*a*, the wire WA (the wire WA providing coupling between the pad PDC2*a* and the die pad DP3), the die pad DP3, and the metal plate MP1. This allows a reduction in wiring resistance (resistive component) when the power MOSFET QH1 is turned OFF, and therefore allows an increase in switching speed when the power MOSFET QH1 is turned OFF as well as a reduction in turn-OFF loss. As a result, it is possible to improve the performance of the semiconductor device SM1d.

Compared to the height (loop height or the height of the uppermost portion) of the wire WA coupling the metal plate MP1 to the pad PDC2a of the semiconductor chip CPC, the height (loop height or the height of the uppermost portion) of the wire WA coupling the die pad DP3 to the pad PDC2a of the semiconductor chip CPC can be set lower. Accordingly, in the semiconductor device SM1d of the fourth modification, a target object to which the pad PDC2a of the semiconductor chip CPC is coupled with the wire WA is not the metal plate MP1, but the die pad DP3. This can reduce the height of the wire WA coupled to the pad PDC2a of the semiconductor chip CPC and reduce the thickness of the semiconductor device SM1d. Therefore, in terms of reducing the thickness of the semiconductor device, the semiconductor device SM1d of the fourth modification is advantageous over the semiconductor device SM1b of the foregoing second modification.

In the case of the foregoing second modification, even when displacement of the metal plate MP1 occurs (i.e., even when the position at which the metal plate MP1 is bonded in the semiconductor chip CPHb varies), the resistance from the metal plate MP1 to the pad PDC2a of the semiconductor chip CPC is substantially determined by the resistance of the wire WA. By contrast, in the fourth modification, the resistance up to the pad PDC2a of the semiconductor chip CPC is substantially determined by the resistance of the metal plate MP1, the adhesive layer SD3, the die pad, and the wire WA. Thus, the fourth modification has a larger number of factors which may cause resistance variations. Accordingly, in the case of the foregoing second modification, compared to the fourth modification, the current ratio between the current flowing in the power MOSFET QH1 and the current flowing in the sense MOSFET QS1 can be more reliably inhibited or prevented from varying due to displacement of the metal plate MP1 (i.e., variations in the position at which the metal plate MP1 is bonded in the semiconductor chip CPHb). Therefore, the second modification has the advantage of allowing a further improvement in the accuracy of sensing the current flowing in the power MOSFET QH1 by means of the sense MOSFET QS1 and allowing a further improvement in the reliability of the semiconductor device SM1b.

Likewise, in the case of the foregoing first modification also, even when displacement of the metal plate MP1 occurs (i.e., even when the position at which the metal plate MP1 is bonded in the semiconductor chip CPHa varies), the resistance from the metal plate MP1 to the pad PDC2a of the semiconductor chip CPC is substantially determined by the resistance of the wire WA. By contrast, in the fourth modification, the resistance up to the pad PDC2a of the semiconductor chip CPC is substantially determined by the resistance of the metal plate MP1, the adhesive layer SD3, the die pad, and the wire WA. Thus, the fourth modification has a larger number of factors which may cause resistance variations. Accordingly, in the case of the foregoing first modification, compared to the fourth modification, the current ratio between the current flowing in the power MOSFET QH1 and the current flowing in the sense MOSFET QS1 can be more reliably inhibited or prevented from fluctuating due to displacement of the metal plate MP1 (i.e., variations in the position at which the metal plate MP1 is bonded in the semiconductor chip CPHa). Therefore, the first modification has the advantage of allowing a further improvement in the accuracy of sensing the current flowing in the power MOSFET QH1 by means of the sense MOSFET QS1 and allowing a further improvement in the reliability of the semiconductor device SM1a.

A description will be given to a modification when the semiconductor chip CPC is disposed outside a semiconductor device (semiconductor package).

<About Fifth Modification>

The fifth modification of the present embodiment will be described. It is assumed that, hereinafter, the semiconductor device SM1 of the fifth modification is referred to as a semiconductor device SM1e.

Figure 67:
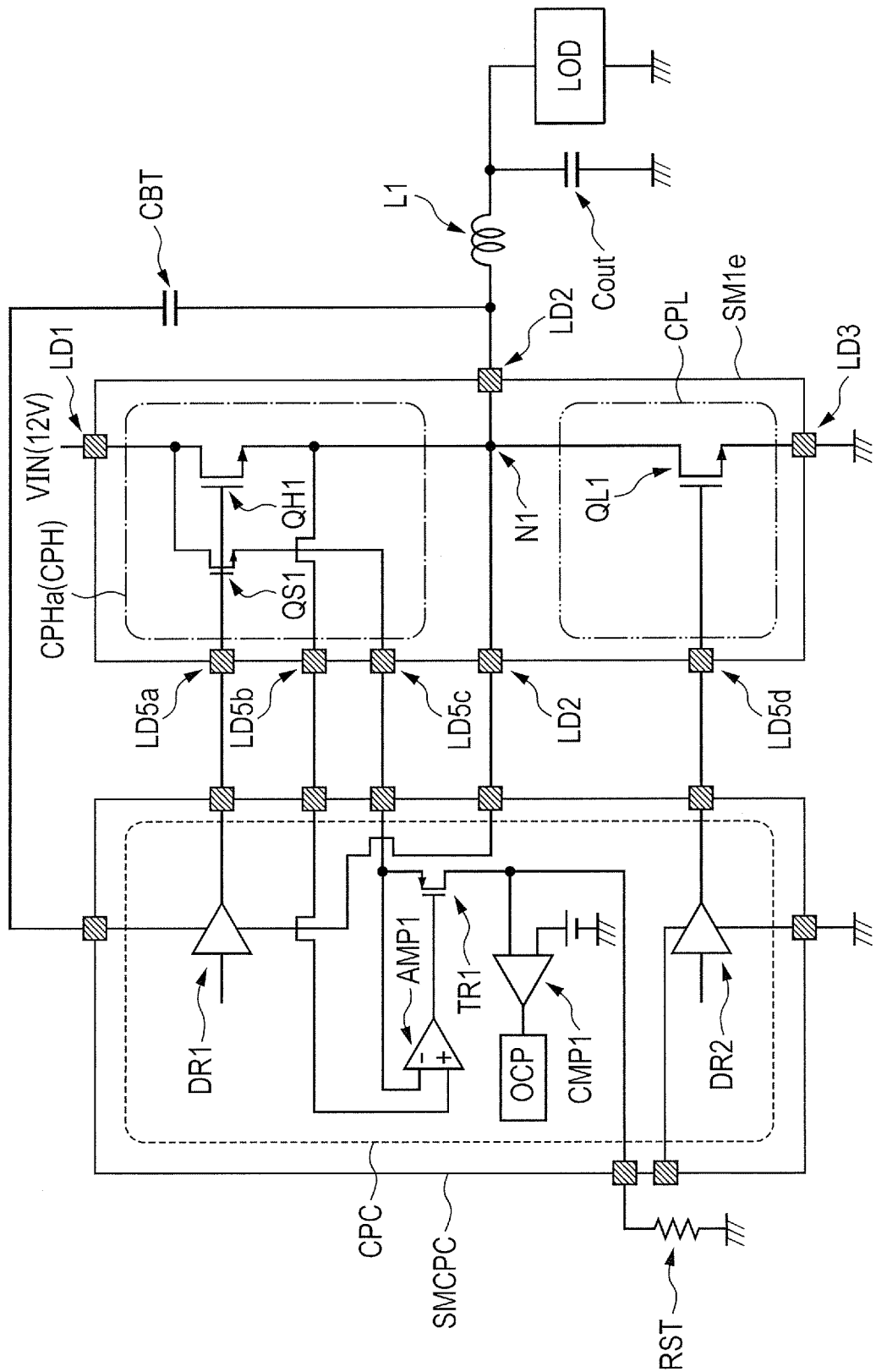
FIG. 67 is a circuit diagram showing an electronic device using a semiconductor device of a fifth modification of the embodiment of the present invention.
Figure 68:
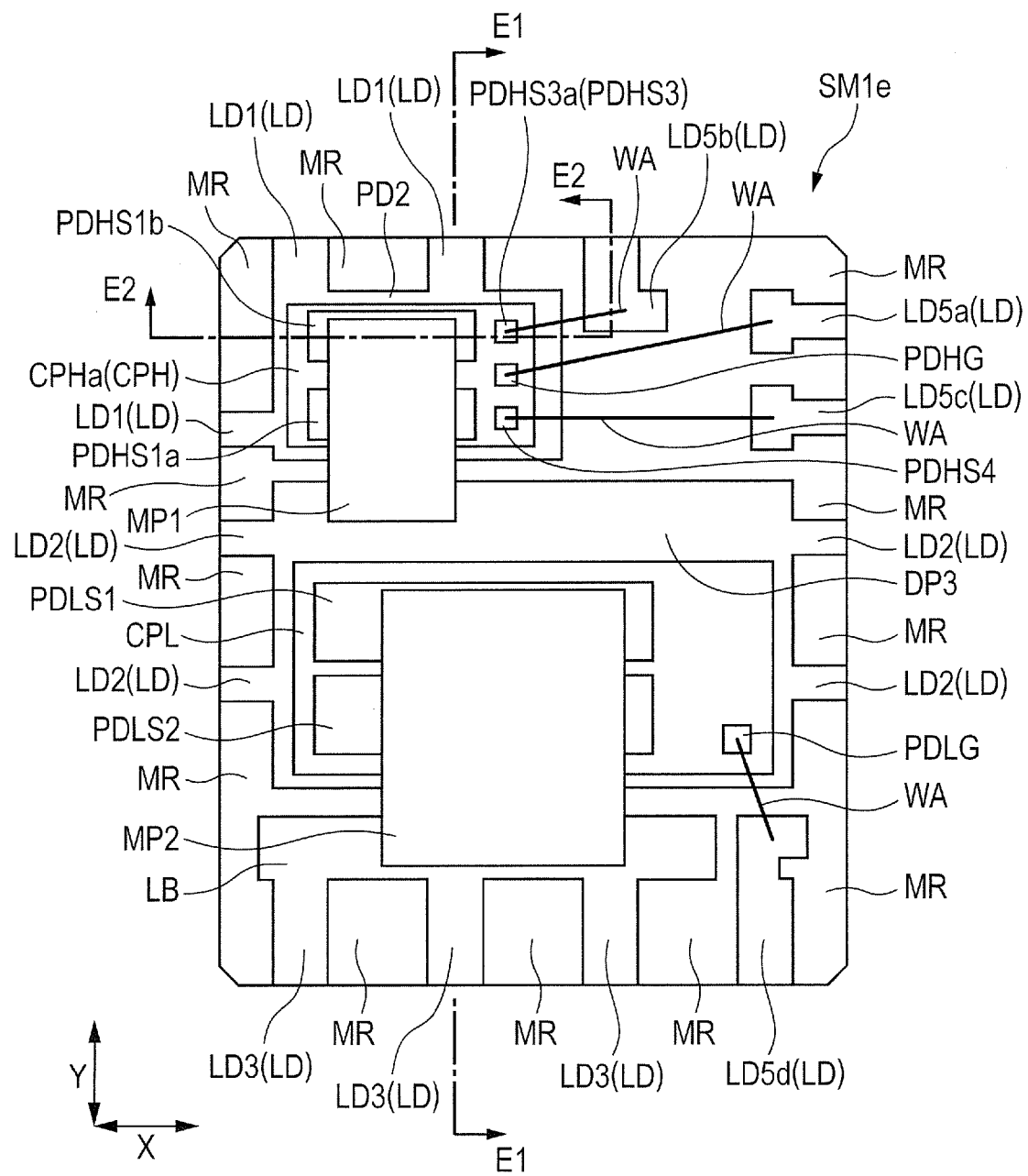
FIG. 68 is a perspective plan view of the semiconductor device of the fifth modification of the embodiment of the present invention.
Figure 69:
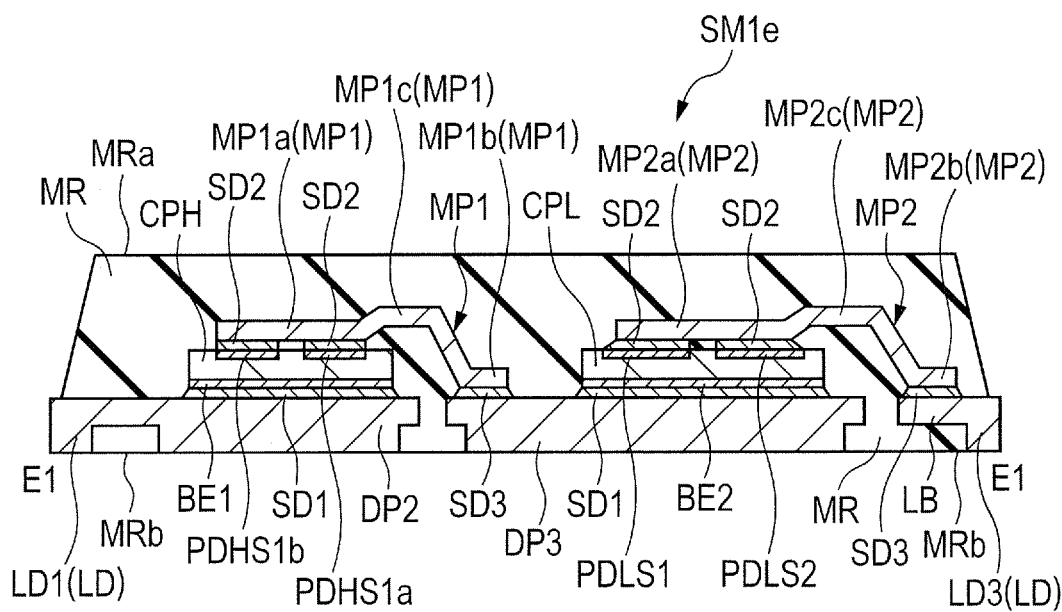
FIG. 69 is a cross-sectional view of the semiconductor device of the fifth modification of the embodiment of the present invention.
Figure 70:
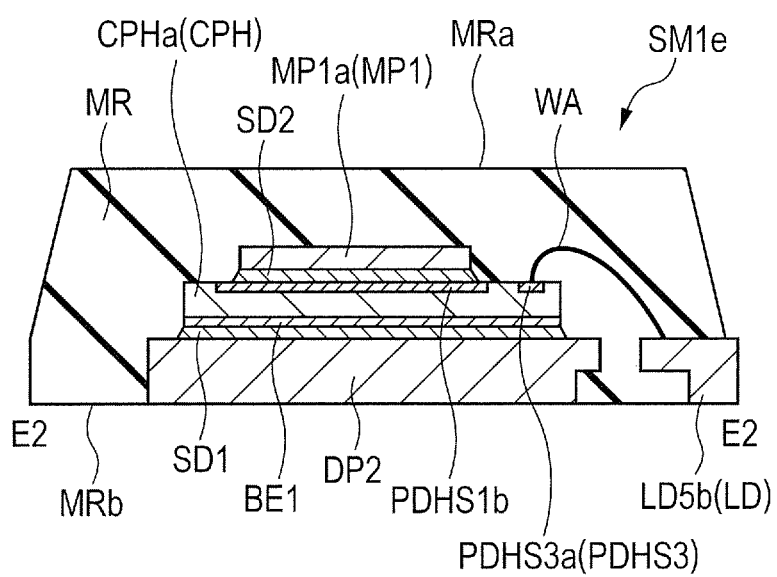
FIG. 70 is a cross-sectional view of the semiconductor device of the fifth modification of the embodiment of the present invention.

FIG. 67 is a circuit diagram showing an example of an electronic device (which is a non-insulated-type DC-DC converter here) using the semiconductor device (semiconductor package) SM1e of the fifth modification, and corresponds to FIGS. 1 and 29 described above. FIG. 68 is a perspective plan view of the semiconductor device SM1e of the fifth modification. FIGS. 69 and 70 are cross-sectional views (side cross-sectional views) of the semiconductor device SM1e. FIG. 68 corresponds to FIG. 2 described above, and shows a plan view (top view) in which the semiconductor device SM1e is viewed from the top side thereof through the sealing portion MR. FIG. 69 substantially corresponds to a cross-sectional view along the line E1-E1 of FIG. 68. FIG. 70 substantially corresponds to a cross-sectional view along the line E2-E2 of FIG. 68.

The semiconductor device SM1e of the fifth modification is a modification of the semiconductor device SM1a of the foregoing first modification. The semiconductor device SM1e of FIGS. 67 to 70 is different from the semiconductor device SM1a of the foregoing first modification in that the semiconductor device SM1e does not have the semiconductor chip CPC and the die pad DP1 for mounting the semiconductor chip CPC.

In the semiconductor device SM1e of FIGS. 68 to 70, correspondingly to the fact that the semiconductor chip CPC is not provided therein, the gate pad PDHG of the semiconductor chip CPHa is electrically coupled to a lead LD5a through the wire or wires WA, and the source pad PDHS3a of the semiconductor chip CPHa is electrically coupled to a lead LD5b through the wire or wires WA. On the other hand, the source pad PDHS4 of the semiconductor chip CPHa is electrically coupled to a lead LD5c through the wire or wires WA, and the gate pad PDLG of the semiconductor chip CPL is electrically coupled to a lead LD5d through the wire or wires WA. The leads LD5a, LD5b, LD5c, and LD5d are those of the plurality of leads LD which are not coupled to the die pads DP2 and DP3, and are also not coupled to each other.

In the semiconductor device SM1e of FIGS. 68 to 70, instead of the semiconductor chip CPHa, the foregoing semiconductor chip CPH can also be used. In this case, in FIGS. 68 to 79, the pad PDHS3a is replaced by the foregoing pad PDHS3, and the source pad PDHS3 of the semiconductor chip CPH is electrically coupled to the lead LD5b through the wire or wires WA.

In the semiconductor device SM1e of FIGS. 68 to 70, an equivalent to the semiconductor chip CPHa of the foregoing first modification or an equivalent to the foregoing semiconductor chip CPH is used, but the foregoing pads PDHS2 and PDHS3b are not provided. This is because, instead of the foregoing pads PDHS2 and PDHS3b, the lead LD2 coupled to the die pad DP3 can be used. Also in FIGS. 68 to 70, the semiconductor chip CPL is not formed with the foregoing pads PDLS3 and PDLS4. In the case of providing the foregoing pad PDLS3 in the semiconductor chip CPL, the pad PDLS3 is bonded to the first portion MP2d of the metal plate MP2 via the adhesive layer SD2.

The configuration of the semiconductor device SM1e is otherwise basically the same as that of the semiconductor device SM1a of the foregoing first modification so that a description thereof is omitted herein.

The semiconductor chip CPC is not embedded in the semiconductor device SM1e, and a semiconductor device SMCPC obtained by packaging the semiconductor chip CPC is mounted together with the semiconductor device SM1e over, e.g., the foregoing wiring substrate 21. The semiconductor device SMCPC (semiconductor chip CPC) mounted over the foregoing wiring substrate 21 is electrically coupled to the leads LD of the semiconductor device SM1e through the wiring of the foregoing wiring substrate 21 so that a configuration as shown in the circuit diagram of FIG. 67 described above is obtained.

Specifically, the lead LD5a electrically coupled to the gate (gate pad PDHG) of each of the power MOSFET QH1 and the sense MOSFET QS1 is coupled to the driver circuit DR1 of the semiconductor device SMCPC (semiconductor chip CPC). Also, the lead LD5b electrically coupled to the source (source pad PDHS3a) of the power MOSFET QH1 is coupled to the amplifier circuit AMP1 of the semiconductor device SMCPC (semiconductor chip CPC), and the lead LD5c electrically coupled to the source (source pad PDHS4) of the sense MOSFET QS1 is coupled to the amplifier circuit AMP1 of the semiconductor chip CPC. Also, the lead LD5d electrically coupled to the gate (gate pad PDLG) of the power MOSFET QL1 is coupled to the driver circuit DR1 of the semiconductor device SMCPC (semiconductor chip CPC). Also, the lead LD2 electrically coupled to the source (source pads PDHS1a and PDHS1b) of the power MOSFET QH1 is coupled to the driver circuit DR1 of the semiconductor device SMCPC (semiconductor chip CPC), the coil L1, and the capacitor CBT. Also, the lead LD1 electrically coupled to the drain (drain back-side electrode BE1) of each of the power MOSFET QH1 and the sense MOSFET QS1 is coupled to the high-side potential (power source potential) VIN. Also, the lead LD3 electrically coupled to the source (source pads PDLS1 and PDLS2) of the power MOSFET QL1 is coupled to the ground potential.

Accordingly, the power MOSFETs QH1 and QL1 and the sense MOSFET QS1 which are formed in the semiconductor chips CPHa and CPL embedded in the semiconductor device SM1e are controlled by the semiconductor chip CPC (or the semiconductor device SMCPC obtained by packaging the semiconductor chip CPC) outside the semiconductor device SM1e.

In the semiconductor device SM1e also, in the same manner as in the foregoing semiconductor devices SM1 and SM1a, the foregoing source wire 10S3 in the semiconductor chip CPHa (CPH) is used. Therefore, even when displacement of the metal plate MP1 occurs (i.e., even when the position at which the metal plate MP1 is bonded in the semiconductor chip CPHa varies), the resistance from the metal plate MP1 to the pad PDHS3a does not vary (fluctuate), but can be held substantially constant. This can inhibit or prevent the current ratio between the current flowing in the power MOSFET QH1 and the current flowing in the sense MOSFET QS1 from varying. Therefore, it is possible to improve the accuracy of sensing the current flowing in the power MOSFET QH1 by means of the sense MOSFET QS1, and improve the reliability of the semiconductor device SM1e or the electronic device using the semiconductor device SM1e.

As in the circuit diagram of FIG. 67, it is preferable to couple (electrically couple) the lead LD5b coupled to the pad PDHS3a of the semiconductor chip CPHa with the wire WA to the amplifier circuit AMP1 in the semiconductor chip CPC outside the semiconductor device SM1e through wiring outside the semiconductor device SM1e, and not to couple (electrically couple) the lead LD5b to the driver circuit DR1. This can allow a current path when the power MOSFET QH1 is turned OFF to pass through the foregoing source wire 10S1, and prevent the current path when the power MOSFET QH1 is turned OFF from passing through the foregoing source wire 10S3. As described above, the foregoing source wire 10S3 is higher in resistance than the foregoing source wire 10S1. However, by keeping the high-resistance source wire 10S3 from serving as the current path when the power MOSFET QH1 is turned OFF, it is possible to reduce the wiring resistance (resistive component) of the current path when the power MOSFET QH1 is turned OFF. This allows an increase in switching speed when the power MOSFET QH1 is turned OFF as well as a reduction in turn-OFF loss.

Next, a description will be given to a modification when the semiconductor chips CPC and CPL are disposed outside a semiconductor device (semiconductor package).

<About Sixth Modification>

The sixth modification of the present embodiment will be described. It is assumed that, hereinafter, the semiconductor device SM1 of the sixth modification is referred to as a semiconductor device SM1f.

Figure 71:
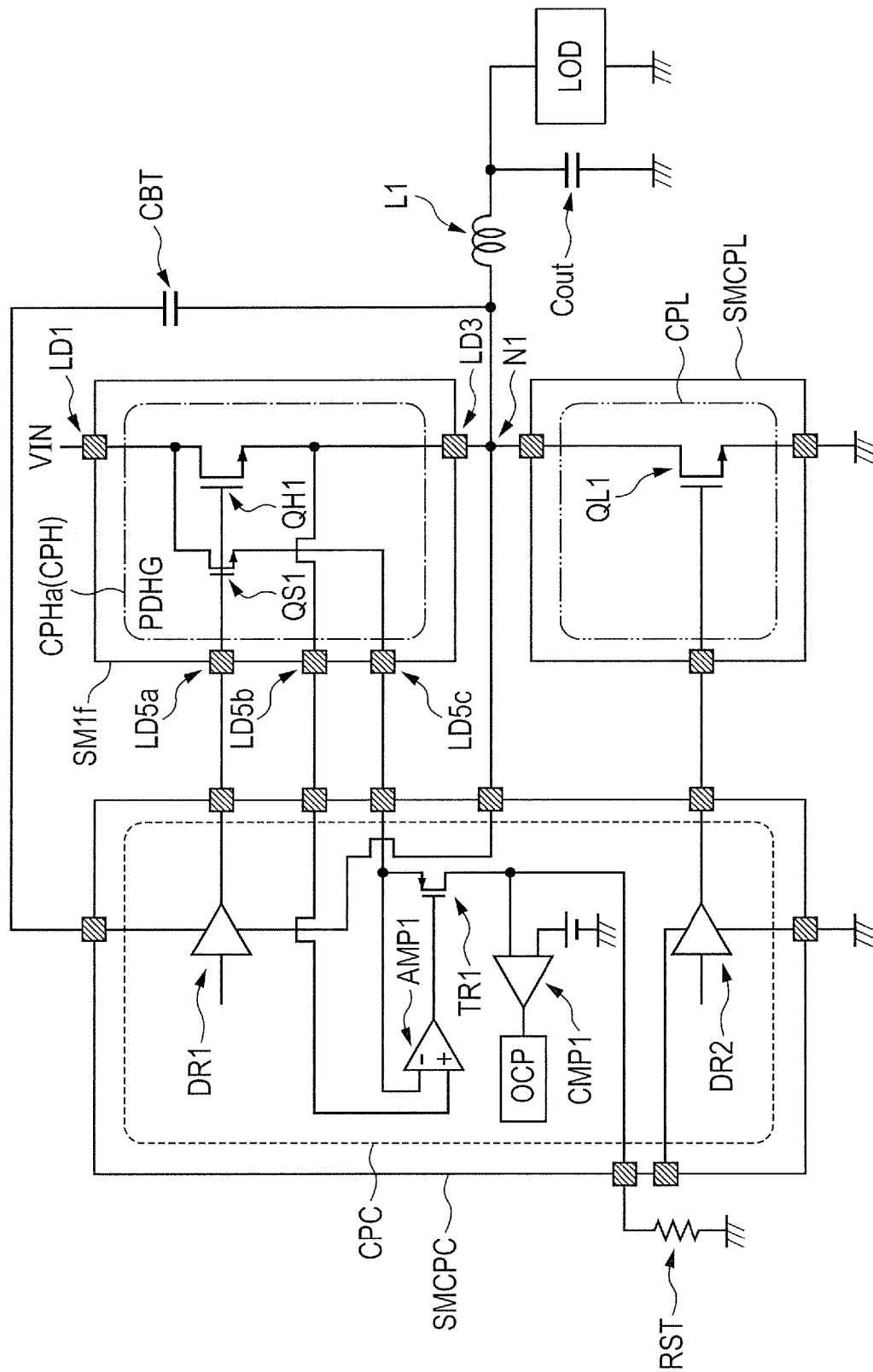
FIG. 71 is a circuit diagram showing an electronic device using a semiconductor device of a sixth modification of the embodiment of the present invention.
Figure 72:
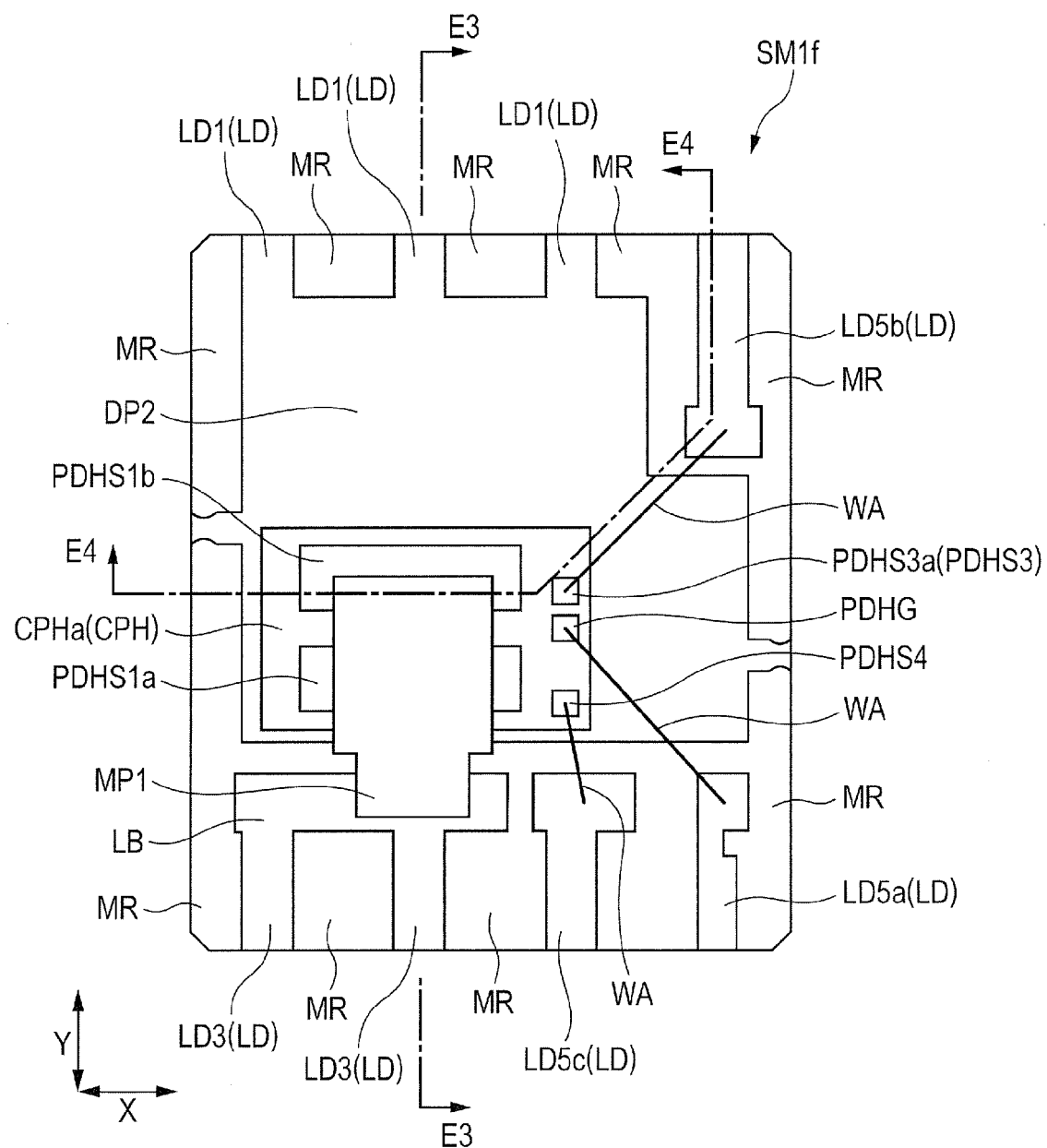
FIG. 72 is a perspective plan view of the semiconductor device of the sixth modification of the embodiment of the present invention.
Figure 73:
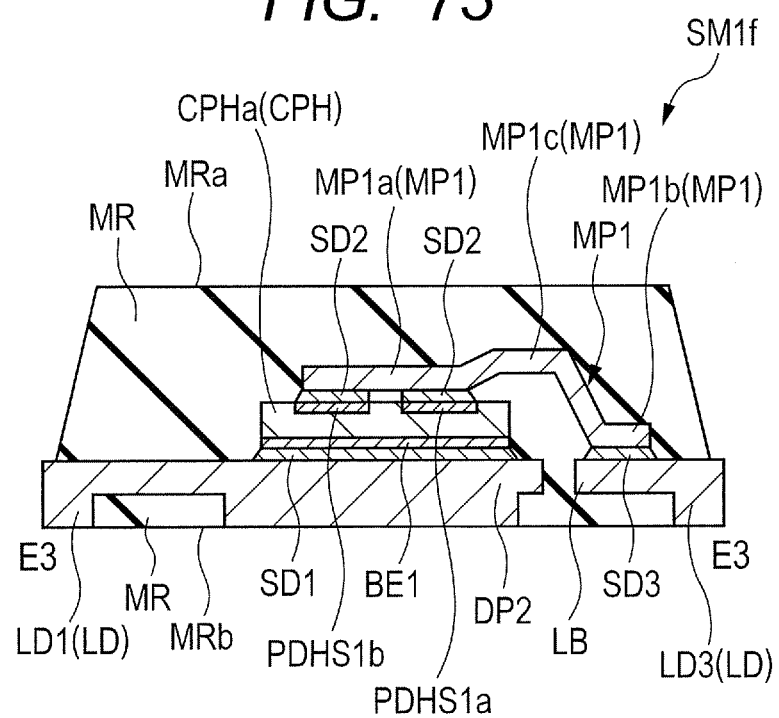
FIG. 73 is a cross-sectional view of the semiconductor device of the sixth modification of the embodiment of the present invention.
Figure 74:
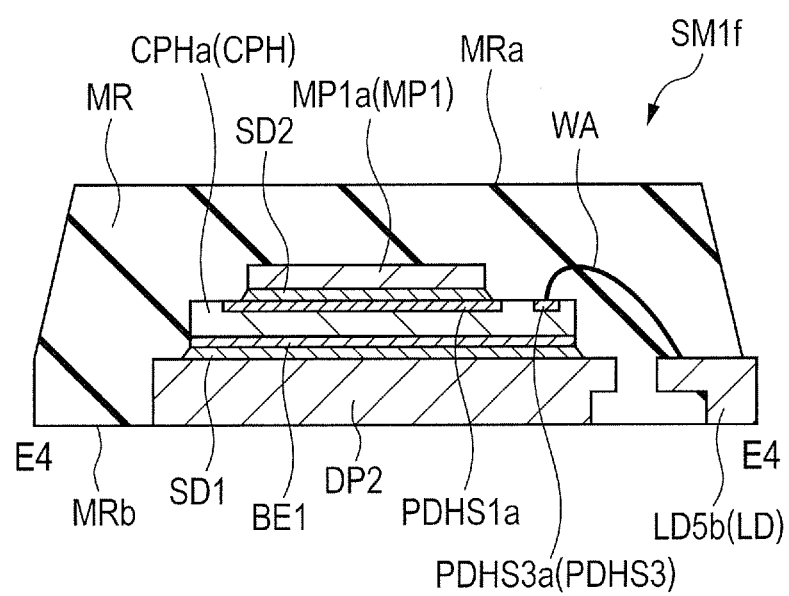
FIG. 74 is a cross-sectional view of the semiconductor device of the sixth modification of the embodiment of the present invention.

FIG. 71 is a circuit diagram showing an example of an electronic device (which is a non-insulated-type DC-DC converter here) using the semiconductor device (semiconductor package) SM1f of the sixth modification, and corresponds to FIGS. 1 and 29 described above. FIG. 72 is a perspective plan view of the semiconductor device SM1f of the sixth modification. FIGS. 73 and 74 are cross-sectional views (side cross-sectional views) of the semiconductor device SM1f. FIG. 72 corresponds to FIG. 2 described above, and shows a plan view (top view) in which the semiconductor device SM1f is viewed from the top side thereof through the sealing portion MR. FIG. 73 substantially corresponds to a cross-sectional view along the line E3-E3 of FIG. 72. FIG. 74 substantially corresponds to a cross-sectional view along the line E4-E4 of FIG. 72.

The semiconductor device SM1f of the sixth modification is a modification of the semiconductor device SM1e of the foregoing fifth modification. The semiconductor device SM1f of FIGS. 71 to 74 is different from the semiconductor device SM1e of the foregoing fifth modification in that the semiconductor device SM1f does not have the semiconductor chip CPL, the die pad DP3 for mounting the semiconductor chip CPL, and the metal plate MP2.

In the semiconductor device SM1f of FIGS. 72 to 74, correspondingly to the fact that that the semiconductor chip CPL and the die pad DP3 are not provided therein, the source pads PDHS1a and PDHS1b of the semiconductor chip CPHa are electrically coupled to the lead wire LB via the metal plate MP1. That is, the foregoing first portion MP1a of the metal plate MP1 is bonded to the source pads PDHS1a and PDHS1b of the semiconductor chip CPHa via the adhesive layer SD2 to be electrically coupled thereto. The foregoing second portion MP1b of the metal plate MP1 is bonded to the lead wire LB (to the upper surface thereof) via the adhesive layer SD3 to be electrically coupled thereto.

In the same manner as in the semiconductor device SM1e of FIGS. 68 to 70 described above, in the semiconductor device MS1f of FIGS. 72 to 74 also, the foregoing semiconductor chip CPH can be used instead of the semiconductor chip CPHa. In this case, in FIGS. 72 to 74, the pad PDHS3a is replaced by, the foregoing pad PDHS3, and the source pad PDHS3 of the semiconductor chip CPH is electrically coupled to the lead LD5b through the wire or wires WA.

The configuration of the semiconductor device SM1f of FIGS. 72 to 74 is otherwise basically similar to that of the semiconductor device SM1e of FIGS. 68 to 70 described above so that a description thereof is omitted herein.

The semiconductor chips CPC and CPL are not embedded in the semiconductor device SM1f, and the semiconductor device SMCPC obtained by packaging the semiconductor chip CPC and a semiconductor device SMCPL obtained by packaging the semiconductor chip CPL are mounted together with the semiconductor device SM1f over, e.g., the foregoing wiring substrate 21. The semiconductor devices SMCPC and SMCPL mounted over the foregoing wiring substrate 21 are electrically coupled to the leads LD of the semiconductor device SM1f through the wiring of the foregoing wiring substrate 21 so that a configuration as shown in the circuit diagram of FIG. 71 described above is obtained.

Specifically, the lead LD5a electrically coupled to the gate (gate pad PDHG) of each of the power MOSFET QH1 and the sense MOSFET QS1 is coupled to the driver circuit DR1 of the semiconductor device SMCPC (semiconductor chip CPC). Also, the lead LD5b electrically coupled to the source (source pad PDHS3a) of the power MOSFET QH1 is coupled to the amplifier circuit AMP1 of the semiconductor device SMCPC (semiconductor chip CPC), and the lead LD5c electrically coupled to the source (source pad PDHS4) of the sense MOSFET QS1 is coupled to the amplifier circuit AMP1 of the semiconductor chip CPC. Also, the lead LD3 electrically coupled to the source (source pads PDHS1a and PDHS1b) of the power MOSFET QH1 is coupled to the power MOSFET QL1 of the semiconductor device SMCPL (semiconductor chip CPL), the driver circuit DR1 of the semiconductor device SMCPC (semiconductor chip CPC), the coil L1, and the capacitor CBT of the semiconductor device SMCPC (semiconductor chip CPC). Also, the lead LD1 electrically coupled to the drain (drain back-side electrode BE1) of each of the power MOSFET QH1 and the sense MOSFET QS1 is coupled to the high-side potential (power source potential) VIN.

Accordingly, the power MOSFET QH1 and the sense MOSFET QS1 which are formed in the semiconductor chip CPHa embedded in the semiconductor device SM1f and the power MOSFET QL1 provided outside the semiconductor device SM1f (semiconductor chip CPL in the semiconductor device SMCPL) are controlled by the semiconductor chip CPC (or semiconductor device SMCPC obtained by packaging the semiconductor chip CPC) outside the semiconductor device SM1f.

In the semiconductor device SM1f also, in the same manner as in the foregoing semiconductor devices SM1, SM1a, and SM1e, the foregoing source wire 10S3 in the semiconductor chip CPHa (CPH) is used. Therefore, even when displacement of the metal plate MP1 occurs (i.e., even when the position at which the metal plate MP1 is bonded in the semiconductor chip CPHa varies), the resistance from the metal plate MP1 to the pad PDHS3a does not vary (fluctuate), but can be held substantially constant. This can inhibit or prevent the current ratio between the current flowing in the power MOSFET QH1 and the current flowing in the sense MOSFET QS1 from varying. Therefore, it is possible to improve the accuracy of sensing the current flowing in the power MOSFET QH1 by means of the sense MOSFET QS1, and improve the reliability of the semiconductor device SM1f or the electronic device using the semiconductor device SM1f.

As in the circuit diagram of FIG. 71, it is preferable to couple (electrically couple) the lead LD5b coupled to the pad PDHS3a of the semiconductor chip CPHa with the wire WA to the amplifier circuit AMP1 in the semiconductor chip CPC outside the semiconductor device SM1f, and not to couple (electrically couple) the lead LD5b to the driver circuit DR1.

This can allow a current path when the power MOSFET QH1 is turned OFF to pass through the foregoing source wire 10S1, and prevent the current path when the power MOSFET QH1 is turned OFF from passing through the foregoing source wire 10S3. As described above, the foregoing source wire 10S3 is higher in resistance than the foregoing source wire 10S1. However, by keeping the high-resistance source wire 10S3 from serving as the current path when the power MOSFET QH1 is turned OFF, it is possible to reduce the wiring resistance (resistive component) of the current path when the power MOSFET QH1 is turned OFF. This allows an increase in switching speed when the power MOSFET QH1 is turned OFF as well as a reduction in turn-OFF loss.

Next, a description will be given to a modification when the semiconductor chip CPC of the semiconductor device SM1c of the third modification of FIGS. 49 to 56 described above is disposed outside the semiconductor device SM1c.

<About Seventh Modification>

The seventh modification of the present embodiment will be described. It is assumed that, hereinafter, the semiconductor device SM1 of the seventh modification is referred to as a semiconductor device SM1g.

Figure 75:
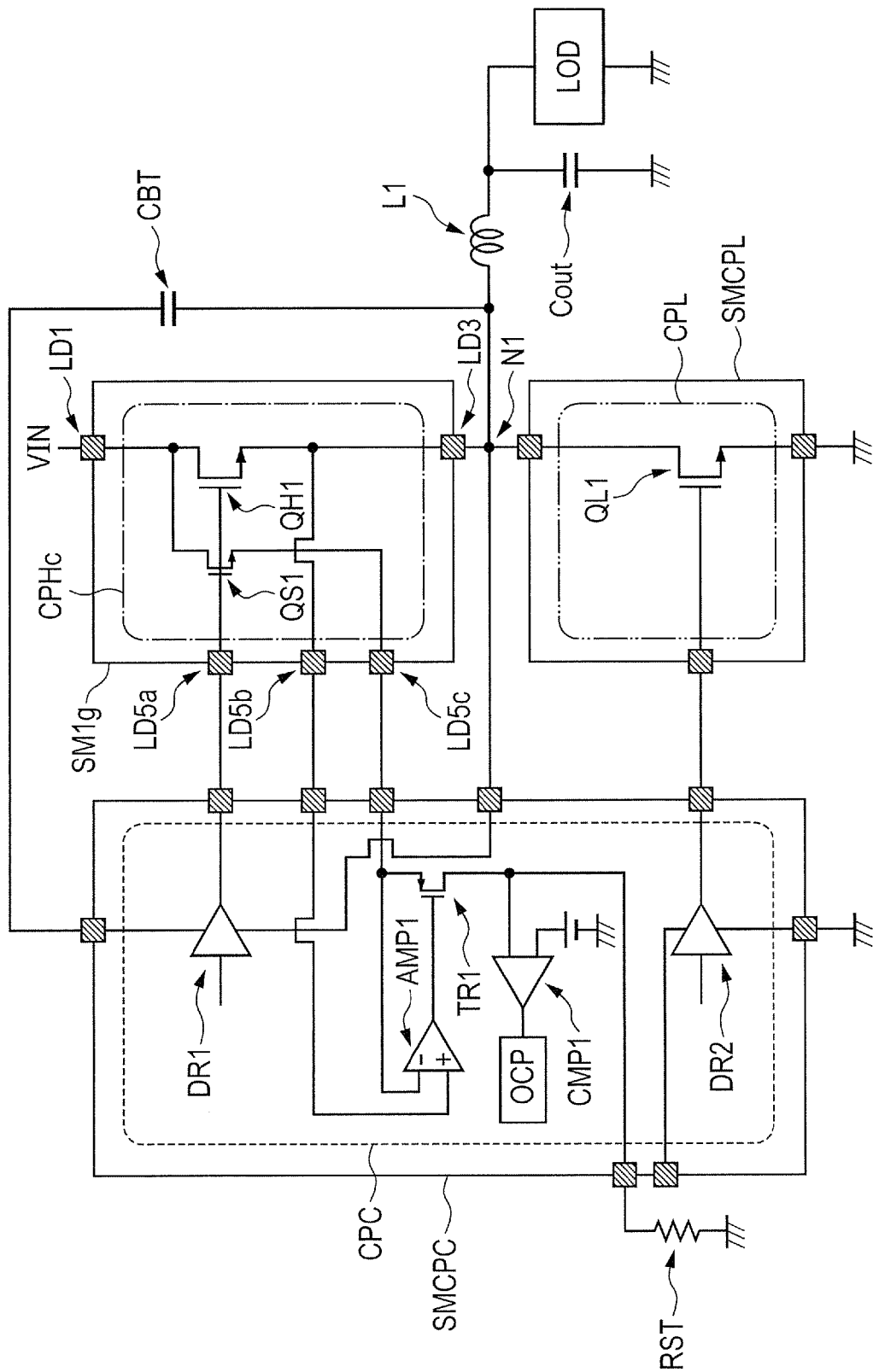
FIG. 75 is a circuit diagram showing an electronic device using a semiconductor device of a seventh modification of the embodiment of the present invention.
Figure 76:
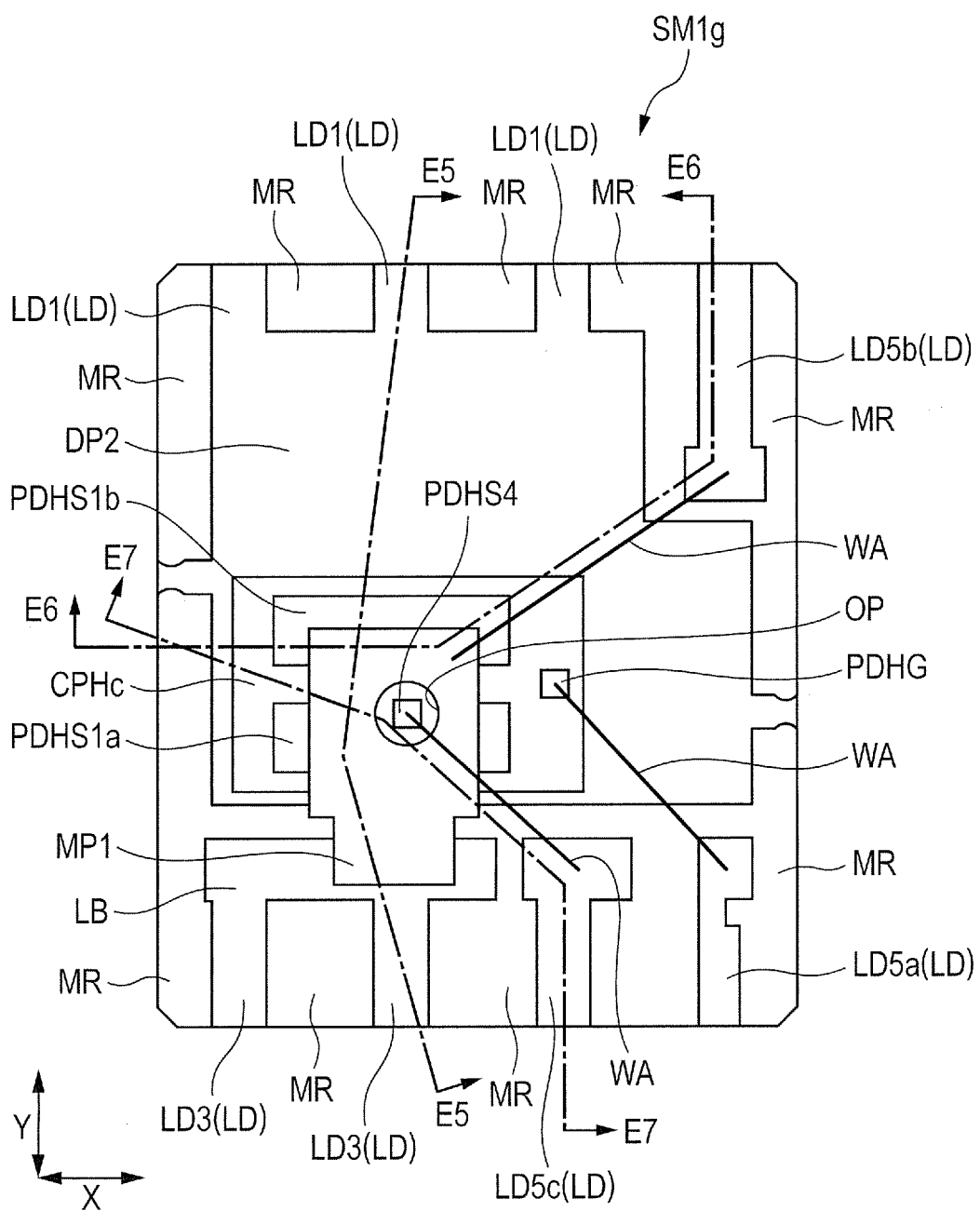
FIG. 76 is a perspective plan view of the semiconductor device of the seventh modification of the embodiment of the present invention.
Figure 77:
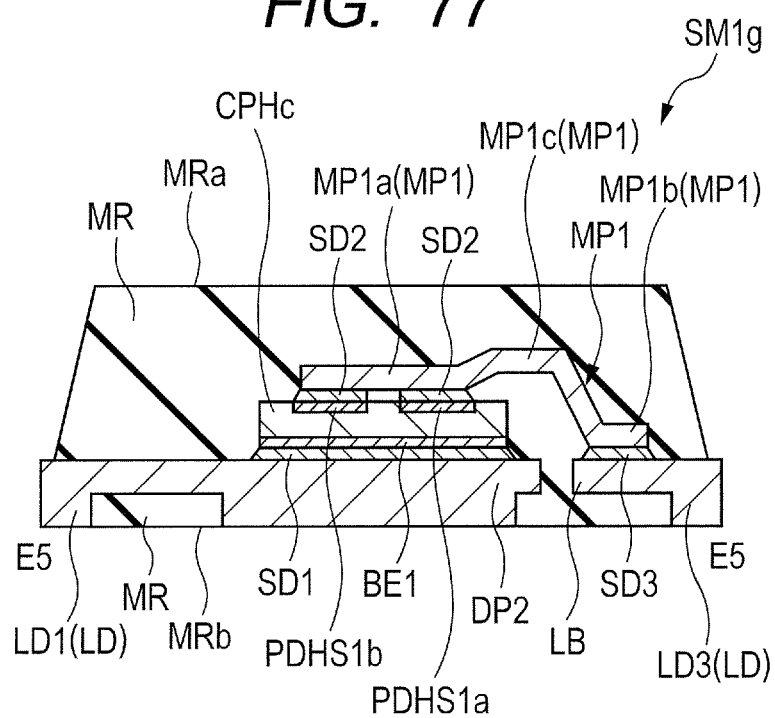
FIG. 77 is a cross-sectional view of the semiconductor device of the seventh modification of the embodiment of the present invention.
Figure 78:
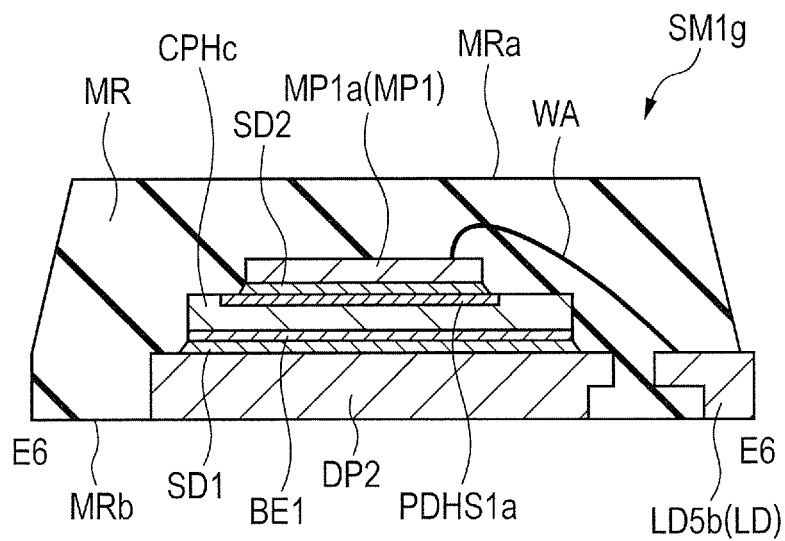
FIG. 78 is a cross-sectional view of the semiconductor device of the seventh modification of the embodiment of the present invention.
Figure 79:
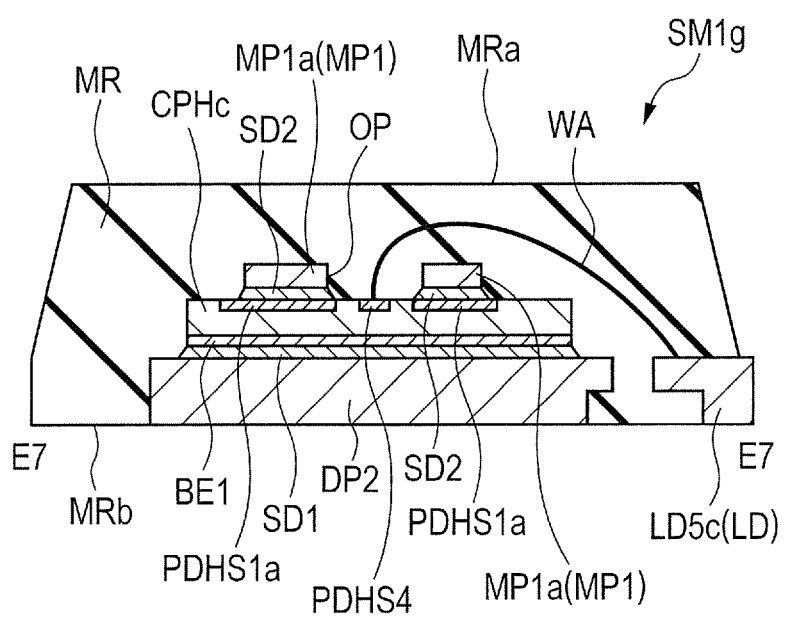
FIG. 79 is a cross-sectional view of the semiconductor device of the seventh modification of the embodiment of the present invention.

FIG. 75 is a circuit diagram showing an example of an electronic device (which is a non-insulated-type DC-DC converter here) using the semiconductor device (semiconductor package) SM1g of the seventh modification, and corresponds to FIGS. 1 and 49 described above. FIG. 76 is a perspective plan view of the semiconductor device SM1g of the seventh modification. FIGS. 77 to 79 are cross-sectional views (side cross-sectional views) of the semiconductor device SM1g. FIG. 76 corresponds to FIG. 2 described above, and shows a plan view (top view) in which the semiconductor device SM1g is viewed from the top side thereof through the sealing portion MR. FIG. 77 substantially corresponds to a cross-sectional view along the line E5-E5 of FIG. 76. FIG. 78 substantially corresponds to a cross-sectional view along the line E6-E6 of FIG. 76. FIG. 79 substantially corresponds to a cross-sectional view along the line E7-E7 of FIG. 76.

The semiconductor device SM1g of the seventh modification is a modification of the semiconductor device SM1c of the foregoing third modification. The semiconductor device SM1g of FIGS. 75 to 79 is different from the semiconductor device SM1c of the foregoing third modification in that the semiconductor device SM1g does not have the semiconductor chips CPC and CPL, and the die pads DP1 and DP3 for mounting the semiconductor chips CPC and CPL.

In the semiconductor device SM1g of FIGS. 76 to 79, correspondingly to the fact that that the semiconductor chips CPC and CPL and the die pads DP1 and DP3 are not provided therein, the gate pad PDHG of the semiconductor chip CPHc is electrically coupled to the lead LD5a through the wire or wires WA, and the source pads PDHS1a and PDHS1b of the semiconductor chip CPHa are electrically coupled to the lead wire LB (lead LD3) via the metal plate MP1. That is, the foregoing first portion MP1a of the metal plate MP1 is bonded to the source pads PDHS1a and PDHS1b of the semiconductor chip CPHa via the adhesive layer SD2 to be electrically coupled thereto. The foregoing second portion MP1b of the metal plate MP1 is bonded to the lead wire LB (to the upper surface thereof) via the adhesive layer SD3 to be electrically coupled thereto.

In the semiconductor device SM1c of the foregoing third modification, the pad DPC2a of the foregoing semiconductor chip CPC is electrically coupled to the metal plate MP1 through the wire WA. By contrast, in the semiconductor device SM1g of FIGS. 76 to 79, correspondingly to the fact that the semiconductor chip CPC is not provided therein, as can be also seen from FIGS. 76 and 78, the lead LD5b is electrically coupled to the metal plate MP1 through the wire or wires WA. That is, one end of the wire WA is bonded to the lead LD5b (to the upper surface thereof), while the other end thereof is bonded to the metal plate MP1 (to the upper surface of the first portion MP1a thereof).

In the semiconductor device SM1c, the pad PDC3 of the semiconductor chip CPC is electrically coupled to the pad PDHS4 of the semiconductor chip CPHc via the wire WA extending through the opening OP of the metal plate MP1. By contrast, in the semiconductor device SM1g of FIGS. 76 to 79, correspondingly to the fact that that the semiconductor chip CPC is not provided therein, the lead LD5c is electrically coupled to the pad PDHS4 of the semiconductor chip CPHc via the wire WA extending through the opening OP of the metal plate MP1. That is, one end of the wire WA is bonded to the pad PDHS4 of the semiconductor chip CPHc exposed from the opening OP of the metal plate MP1, while the other end of the wire WA is bonded to the lead LD5b (to the upper surface thereof), and the wire WA extends through the opening OP provided in the metal plate MP1.

In the semiconductor device SM1g also, in the same manner as in the foregoing semiconductor device SM1c, as can be also seen from FIGS. 76 to 79, an opening (hole or through hole) OP is formed in the metal plate MP1. The opening OP is formed at a position and in a shape at and in which the pad PDHS4 of the semiconductor chip CPHc is exposed. The pad PDHS4 of the semiconductor chip CPHc is coupled to the pad PDC3 of the semiconductor CPC with the wire WA, which extends through the opening OP of the metal plate MP1.

In the semiconductor device SM1g of FIGS. 76 to 79, an equivalent to the semiconductor chip CPHc of the foregoing third modification is used, but the foregoing pads PDHS2 and PDHS3c are not provided. This is because, instead of the foregoing pads PDHS2 and PDHS3c, the lead LD3 (which is electrically coupled to the pads PDHS1a and PDHS1b of the semiconductor chip CPHa via the metal plate MP1) can be used.

The configuration of the semiconductor device SM1g is otherwise basically the same as that of the semiconductor device SM1c of the foregoing third modification so that a description thereof is omitted herein.

The semiconductor chips CPC and CPL are not embedded in the semiconductor device SM1g, and the semiconductor device SMCPC obtained by packaging the semiconductor chip CPC and the semiconductor device SMCPL obtained by packaging the semiconductor chip CPL are mounted together with the semiconductor device SM1g over, e.g., the foregoing wiring substrate 21. The semiconductor devices SMCPC and SMCPL mounted over the foregoing wiring substrate 21 are electrically coupled to the leads LD of the semiconductor device SM1g through the wiring of the foregoing wiring substrate 21 so that a configuration as shown in the circuit diagram of FIG. 75 described above is obtained.

Specifically, the lead LD5a electrically coupled to the gate (gate pad PDHG) of the gate of each of the power MOSFET QH1 and the sense MOSFET QS1 is coupled to the driver circuit DR1 of the semiconductor device SMCPC (semiconductor chip CPC). Also, the lead LD5b electrically coupled to the source (metal plate MP1 bonded to the source pads PDHS1a and PDHS1b) of the power MOSFET QH1 is coupled to the amplifier circuit AMP1 of the semiconductor device SMCPC (semiconductor chip CPC), and the lead LD5c electrically coupled to the source (source pad PDHS4) of the sense MOSFET QS1 is coupled to the amplifier circuit AMP1 of the semiconductor chip CPC. Also, the lead LD3 electrically coupled to the source (source pads PDHS1a and PDHS1b) of the power MOSFET QH1 is coupled to the power MOSFET QL1 of the semiconductor device SMCPL (semiconductor chip CPL) and to the driver circuit DR1 of the semiconductor device SMPCPC (semiconductor chip CPC), the coil L1, and the capacitor CBT of the semiconductor device SMCPC (semiconductor chip CPC). Also, the lead LD1 electrically coupled to the drain (drain back-side electrode BE1) of each of the power MOSFET QH1 and the sense MOSFET QS1 is coupled to the high-side potential (power source potential) VIN.

Accordingly, the power MOSFET QH1 and the sense MOSFET QS1 which are formed in the semiconductor chip CPHc embedded in the semiconductor device SM1g and the power MOSFET QL1 provided outside the semiconductor device SM1g (in the semiconductor chip CPL in the semiconductor device SMCPL) are controlled by the semiconductor chip CPC (or the semiconductor device SMCPC obtained by packaging the semiconductor chip CPC) outside the semiconductor device SM1g.

In the semiconductor device SM1g also, the lead LD5b (corresponding to the pad PDC2a in the foregoing semiconductor device SM1c) coupled to the amplifier circuit AMP1 is coupled to the metal plate MP1 with the wire WA. Therefore, even when displacement of the metal plate MP1 occurs (i.e., even when the position at which the metal plate MP1 is bonded in the semiconductor chip CPHc varies), the resistance from the metal plate MP1 to the lead LD5b does not vary (fluctuate), but can be held substantially constant. This can inhibit or prevent the current ratio between the current flowing in the power MOSFET QH1 and the current flowing in the sense MOSFET QS1 from varying. Therefore, it is possible to improve the accuracy of sensing the current flowing in the power MOSFET QH1 by means of the sense MOSFET QS1, and improve the reliability of the semiconductor device SM1g or the electronic device using the semiconductor device SM1g.

The semiconductor device SM1g of FIGS. 76 to 79 is based on the semiconductor device SM1c of the foregoing third modification. However, the semiconductor device SM1g can also be based on the semiconductor device SM1b of the foregoing second modification. In this case, the semiconductor device SM1g is based on the semiconductor chip CPHb, instead of being based on the semiconductor chip CPHc. Consequently, the pad PDHS4 is coupled to the lead LD5c with the wire WA not extending through the foregoing opening OP.

Second Embodiment

In the foregoing first embodiment, the source pads and the gate pads are formed on the top surface side of the semiconductor chips CPH and CPL, and the drain back-side electrodes are formed on the back surface side thereof. However, by forming LDMOSFETs instead of the trench-gate MOSFETs in the semiconductor chips CPH and CPL and thereby replacing the source pads on the top surface side with the drain pads, it is also possible to replace the source pads on the top surface side with the drain pads, and replace the drain back-side electrode with a source back-side electrode. In the present embodiment, a description will be given to the case.

That is, in the foregoing first embodiment, in the semiconductor chips CPH and CPL, the vertical MOSFETs each having the trench-gate structure are formed, and each of the foregoing power MOSFETs QH1 and QL1 and the sense MOSFET QS1 is formed of the trench-gate MISFET. By contrast, in the present embodiment, in the semiconductor chips CPH and CPL, the LDMOSFETs are formed, and each of the foregoing power MOSFETs QH1 and QL1 and the sense MOSFET QS1 is formed of the LDMOSFET (Laterally Diffused Metal-Oxide-Semiconductor Field Effect Transistor or laterally-diffused MOSFET).

The foregoing pad PDHG of the semiconductor chip CPH is the gate pad of each of the power MOSFET QH1 and the sense MOSFET QS1 in the foregoing first embodiment, and is also the gate pad of each of the power MOSFET QH1 and the sense MOSFET QS1 in the present embodiment. On the other hand, the foregoing pads PDHS1a, PDHS1b, PDHS2, PDHS3, PDHS3a, PDHS3b, and PDHS3c are the source pads of the power MOSFET QH1 in the foregoing first embodiment, but are the drain pads of the power MOSFET QH1 in the present embodiment. Also, the foregoing pad PDHS4 of the semiconductor chip CPH is the source pad of the sense MOSFET QS1 in the foregoing first embodiment, but is the drain pad of the sense MOSFET QS1 in the present embodiment. Also, the foregoing back-side electrode BE1 of the semiconductor chip CPH is the drain back-side electrode of each of the power MOSFET QH1 and the sense MOSFET QS1 in the foregoing first embodiment, but is the source back-side electrode of each of the power MOSFET QH1 and the sense MOSFET QS1 in the present embodiment.

The foregoing pad PDLG of the semiconductor chip CPL is the gate pad of the power MOSFET QL1 in the foregoing first embodiment, and is also the gate pad of the power MOSFET QL1 in the present embodiment. On the other hand, the foregoing pads PDLS1, PDLS2, PDLS3, and PDLS4 of the semiconductor chip CPL are the source pads of the power MOSFET QL1 in the foregoing first embodiment, but are the drain pad of the power MOSFET QL1 in the present embodiment. Also, the foregoing back-side electrode BE2 of the semiconductor chip CPL is the drain back-side electrode of the power MOSFET QL in the foregoing first embodiment, but is the source back-side electrode of the power MOSFET QL1 in the present embodiment.

In the case where the semiconductor chips CPH and CPL have such configurations (present embodiment) also, the main features of the foregoing first embodiment (including each of the foregoing modifications) can be applied thereto.

A configuration of the semiconductor chip CPHa when the LDMOSFETs are formed instead of the trench-gate MOSFETs will be described with reference to FIGS. 80 to 84. The description will be given here to the case where the present embodiment is applied to the chip layout of the semiconductor chip CPHa used in the first modification of the foregoing first embodiment. However, the present embodiment is also similarly applicable to the chip layout of each of the other semiconductor chips CPH, CPHa, CPHb, and CPHc of the foregoing first embodiment.

Figure 80:
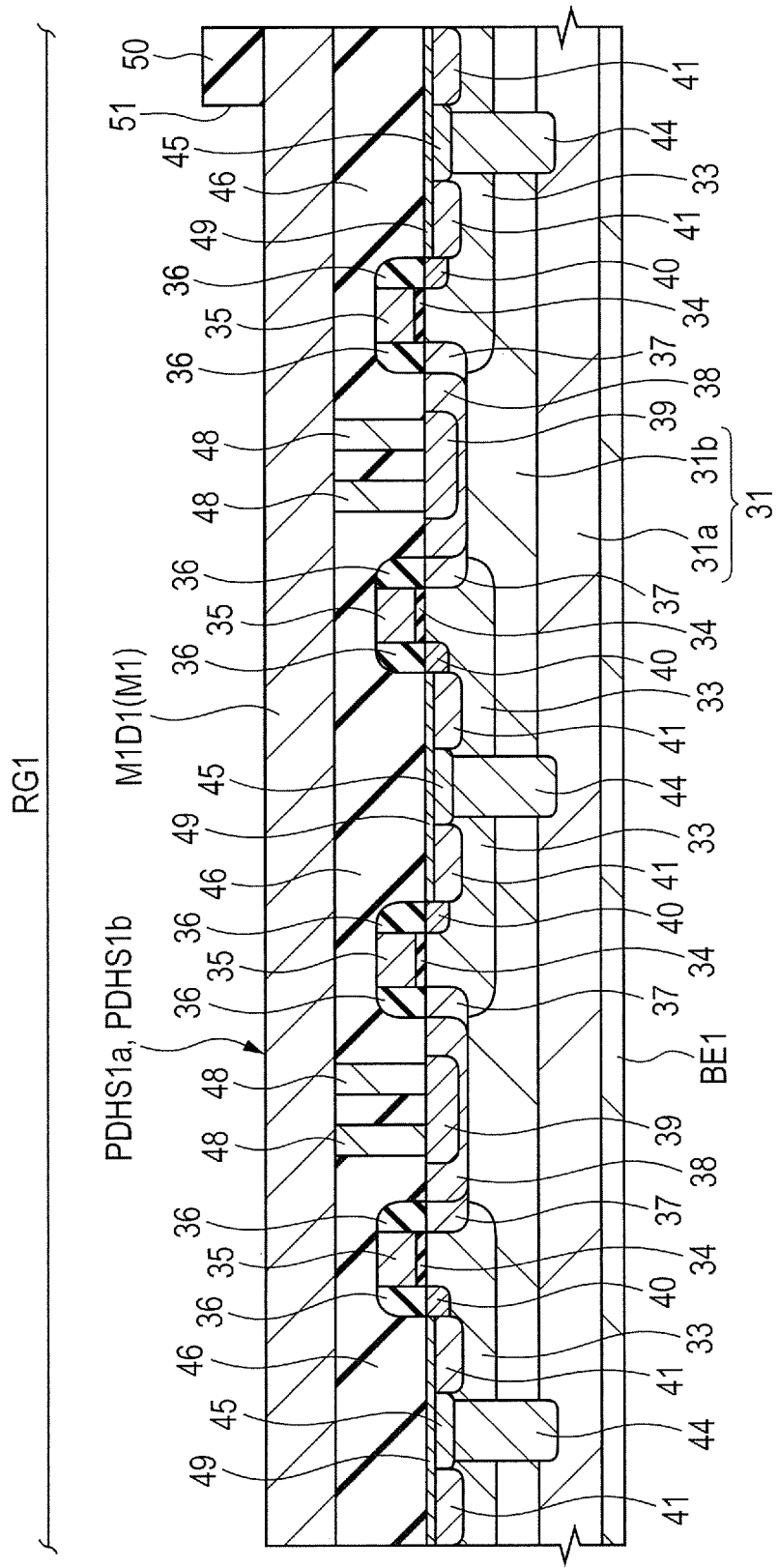
FIG. 80 is a main-portion cross-sectional view of a semiconductor chip of another embodiment of the present invention.
Figure 81:
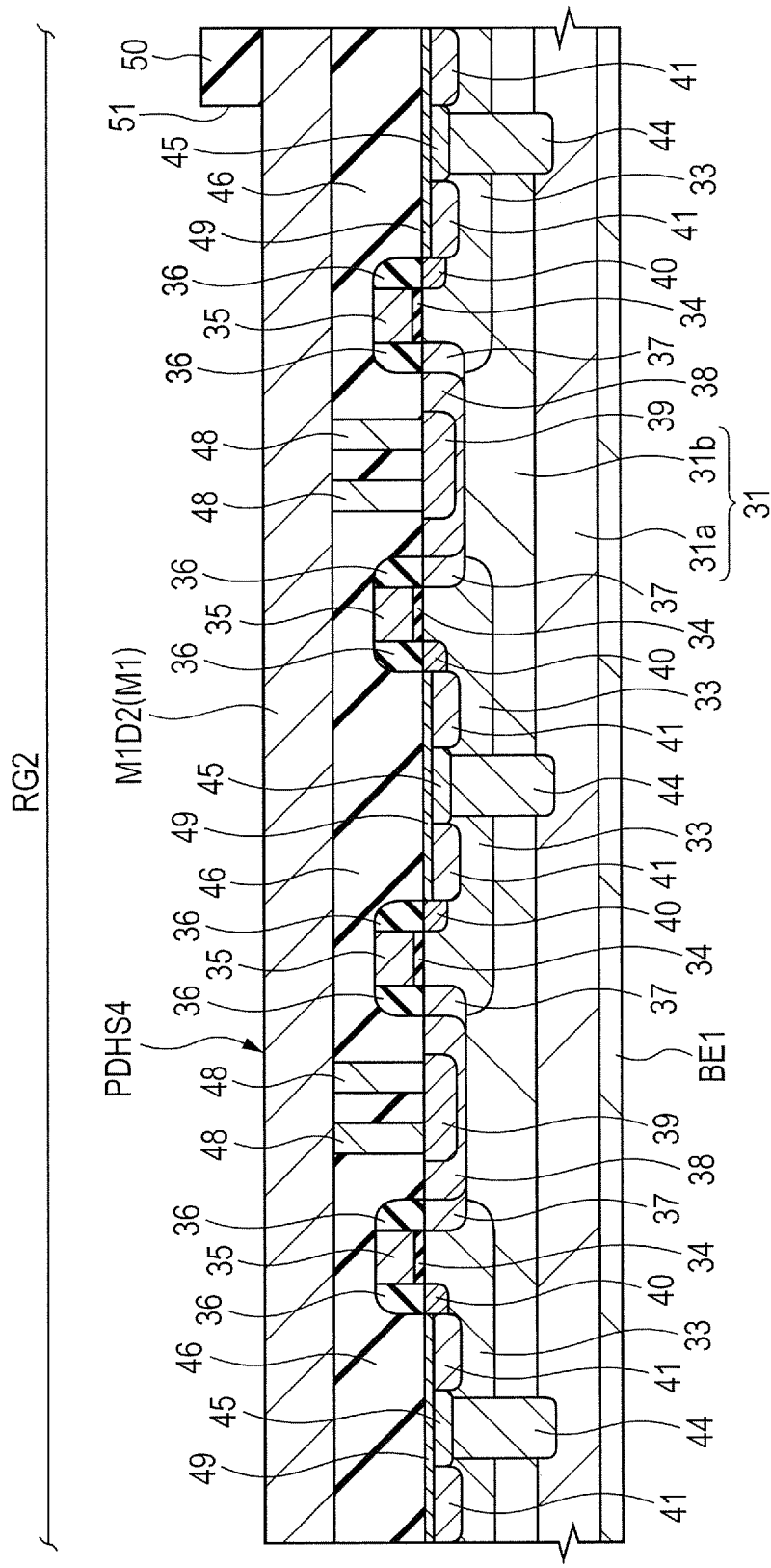
FIG. 81 is a main-portion cross-sectional view of the semiconductor chip of the other embodiment of the present invention.
Figure 82:
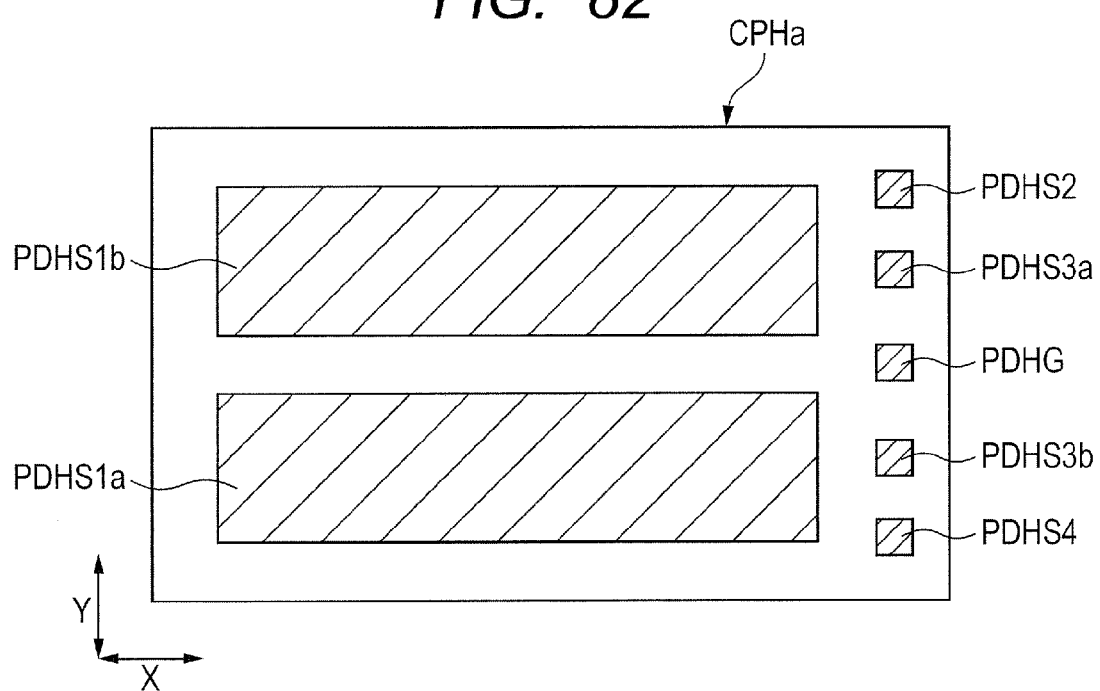
FIG. 82 is a plan view showing a chip layout of the semiconductor chip of the other embodiment of the present invention.
Figure 83:
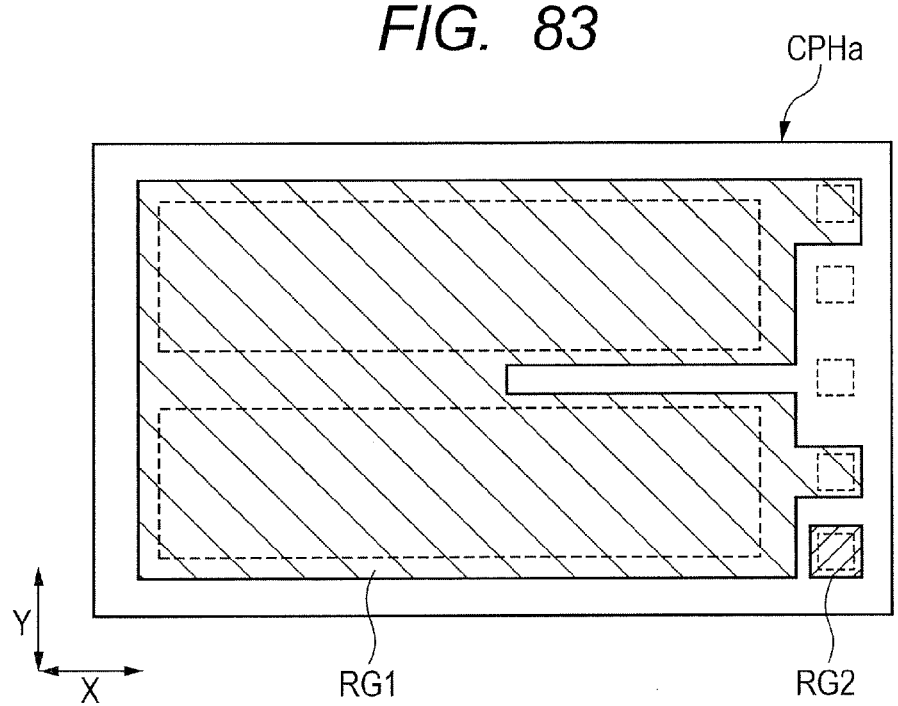
FIG. 83 is a plan view showing the chip layout of the semiconductor chip of the other embodiment of the present invention.
Figure 84:
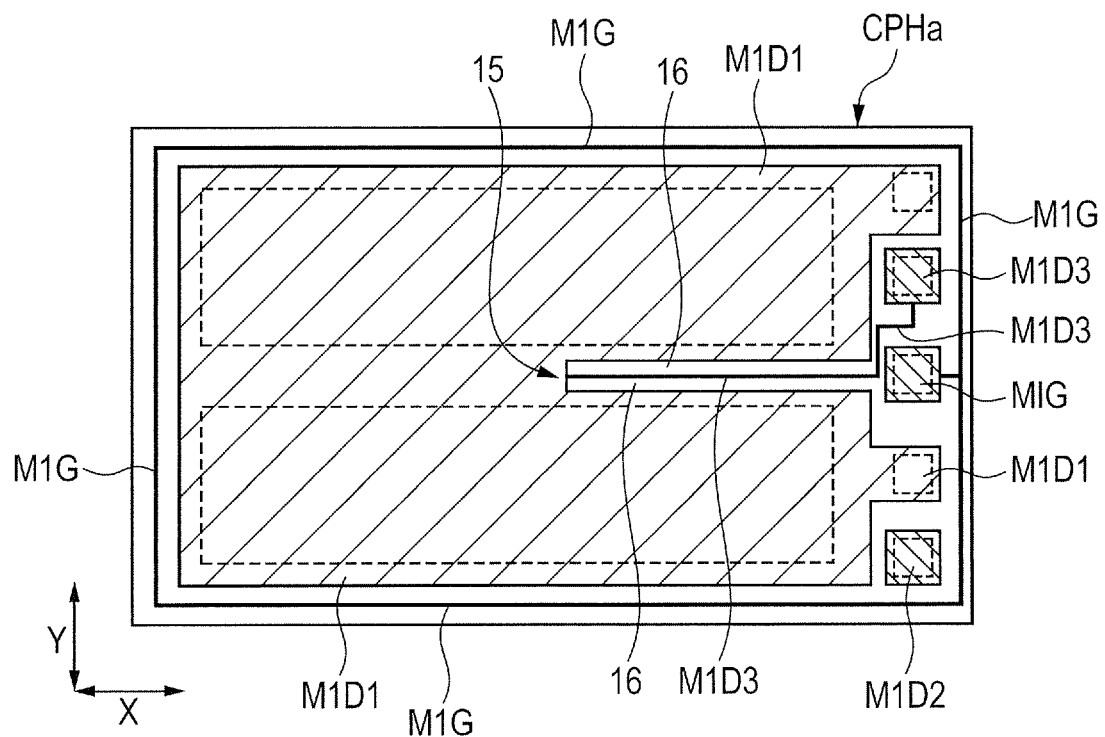
FIG. 84 is a plan view showing the chip layout of the semiconductor chip of the other embodiment of the present invention.

FIGS. 80 and 81 are main-portion cross-sectional views of the semiconductor chip CPHa when the LDMOSFETs are formed instead of the trench-gate MOSFETs. FIG. 80 shows the main-portion cross-sectional view of the main MOSFET region RG1. FIG. 81 shows the main-portion cross-sectional view of the sense MOSFET region RG2. FIGS. 82 to 84 are plan views each showing a chip layout of the semiconductor chip CPHa of the present embodiment. FIG. 82 corresponds to FIG. 36 described above, FIG. 83 corresponds to FIG. 37 described above, and FIG. 84 corresponds to FIG. 38 described above. Note that the chip layout of each of FIGS. 82 to 84 corresponds to a case where the present embodiment is applied to the chip layout of the first modification (FIGS. 36 to 38) of the foregoing first embodiment. The description will be given below to the configuration of the semiconductor chip CPHa with reference to FIGS. 80 to 84. However, basically the same description can be applied also to the configuration of the semiconductor chip CPL except that there is no sense MOSFET region RG2 therein.

The foregoing power MOSFET QH1 is formed over the main surface of a semiconductor substrate (hereinafter simply referred to as a substrate) 31 forming the semiconductor chip CPHs. As shown in FIGS. 80 and 81, the substrate 31 has a substrate main body (semiconductor substrate or semiconductor wafer) 31a comprised of $p^+$-type single-crystal silicon or the like, and an epitaxial layer (semiconductor layer) 31b comprised of, e.g., $p^-$-type single-crystal silicon and formed over the main surface of the substrate main body 31a. Accordingly, the substrate 31 is a so-called epitaxial wafer. In the epitaxial layer 31b, an isolation region (not shown here) comprised of an insulator is formed.

The isolation region is formed by, e.g., a STI (Shallow Trench Isolation) method, a LOCOS (Local Oxidization of Silicon) method, or the like. By the isolation region, an active region for the main MOSFET region RG1 and an active region for the sense MOSFET region RG2 are defined (formed) in the main surface (main surface of the epitaxial layer 31b) of the semiconductor substrate 31, a plurality of LDMOSFET cells (unit LDMOSFET elements) are formed in the active region for the main MOSFET region RG1, and the plurality of LDMOSFET cells (unit LDMOSFET elements) are formed in the active region for the sense MOSFET region RG2. The foregoing power MOSFET QH1 is formed of the plurality of unit LDMOSFET cells provided in the main MOSFET region RG1 (the active region therefor) and coupled in parallel to each other. The foregoing sense MOSFET QS1 is formed of the plurality of unit LDMOSFET cells provided in the sense MOSFET region RG2 (the active region therefor) and coupled in parallel to each other.

In parts of the main surface of the epitaxial layer 31b, p-type wells 33 each functioning as a punch-through stopper for suppressing the extension of a depletion layer from the drain of each of the LDMOSFETs to the source thereof are formed. Over the surfaces of the p-type wells 33, gate electrodes 35 of the LDMOSFETs are formed via gate insulating films 34 each comprised of a silicon oxide or the like. Each of the gate electrodes 35 is comprised of, e.g., a single-layer n-type polysilicon film or a laminate film of an n-type polysilicon film and a metal silicide film, or the like. Over the side walls of the gate electrodes 35, sidewall spacers (side-wall insulating films) 36 each comprised of a silicon oxide or the like are formed.

In regions spaced apart from each other with channel formation regions (regions immediately under the gate electrodes 35) in the epitaxial layer 31b, the sources and drains of the LDMOSFETs are formed. Each of the drains includes a first $n^-$-type drain region 37 in contact with the channel formation region, a second $n^-$-type drain region 38 formed in contact with the first $n^-$-type drain region to be spaced apart from the channel formation region, and an $n^+$-type drain region (high-concentration drain region or high-concentration n-type drain region) 39 formed in contact with the second $n^-$-type drain region to be further spaced apart from the channel formation region.

Of the first $n^-$-type drain region 37, the second $n^-$-type drain region 38, and the $n^+$-type drain region 39, the first $n^-$-type drain region 37 closest to the gate electrode 35 has the lowest impurity concentration, and the $n^+$-type drain region 39 most distant from the gate electrode 35 has the highest impurity concentration. The junction depth of the second $n^-$-type drain region 38 is substantially the same as the junction depth of the first $n^-$-type drain region 37, but the $n^+$-type drain region 39 is formed shallower than the second $n^-$-type drain region 38 and the first $n^-$-type drain region 37.

The first n⁻-type drain region (first low-concentration n-type drain region or first n-type LDD region) 37 is self-alignedly formed with respect to the gate electrode 35 to terminate under the side wall of the gate electrode 35 such that the end portion thereof is in contact with the channel formation region. The second n⁻-type drain region (second low-concentration n-type drain region or second n-type LDD region) 38 is self-alignedly formed with respect to the sidewall spacer 36 formed over the drain-side side wall of the gate electrode 35, and is therefore formed to be spaced apart from the gate electrode 35 by a distance corresponding to the film thickness of the sidewall spacer 36 along the gate length direction.

The source of each of the LDMOSFETs includes an n⁻-type source region 40 in contact with the channel formation region, and an n⁺-type source region 41 formed in contact with the n⁻-type source region 40 to be spaced apart from the channel formation region, and having an impurity concentration higher than that of the n⁻-type source region 40.

The n⁻-type source region 40 is self-alignedly formed with respect to the gate electrode 35 to terminate under the side wall of the gate electrode 35 such that the end portion thereof is in contact with the channel formation region. Under the n⁻-type source region 40, a p-type halo region (not shown) can also be formed. The p-type halo region need not necessarily be formed but, in the case where it is formed, the spreading of an impurity from the source into the channel formation region is further suppressed, and a short-channel effect is further suppressed. Accordingly, a reduction in threshold voltage can further be suppressed.

The n⁺-type source region 41 is self-alignedly formed with respect to the sidewall spacer 36 formed over the source-side side wall of the gate electrode 35, and is therefore formed in contact with the n⁻-type source region 40 to be spaced apart from the channel formation region by a distance corresponding to the film thickness of the sidewall spacer 36 along the gate length direction. The position of the bottom portion of the n⁺-type source region 41 is deeper than the position of the bottom portion of the n⁻-type source region 40.

Thus, the low-concentration n-type drain region (n-type LDD region) interposed between the gate electrode 35 and the n⁺-type drain region 39 is provided with a double structure in which the impurity concentration of the first n⁻-type drain region 37 closest to the gate electrode 35 is set relatively low, and the impurity concentration of the second n⁻-type drain region 38 spaced apart from the gate electrode 35 is set relatively high. As a result, the depletion layer expands between the gate electrode 35 and the drain so that a feedback capacitance (Cgd) formed between the gate electrode 35 and the first n⁻-type drain region 37 in the vicinity thereof decreases. In addition, since the impurity concentration of the second n⁻-type drain region 38 is high, the ON resistance (Ron) also decreases. Since the second n⁻-type drain region 38 is formed at a position distant from the gate electrode 35, the influence exerted thereby on the feedback capacitance (Cgd) is small. Therefore, each of the ON resistance (Ron) and the feedback capacitance (Cgd) can be reduced to allow an improvement in the power added efficiency, of an amplifier circuit.

Note that, in the present invention, when a MOSFET or an LDMOSFET is mentioned, it is assumed to include not only a MISFET using an oxide film (silicon oxide film) as the gate insulating film, but also a MISFET using an insulating film other than an oxide film (silicon oxide film) as the gate insulating film.

Here, an LDMOSFET is a MISFET (Metal Insulator Semiconductor Field Effect Transistor: MIS field effect transistor) element having the following features (first to third features).

The first feature is that, in the LDMOSFET, to allow a high-voltage operation with a short channel length, an LDD (Lightly doped drain) region is formed on the drain side of the gate electrode 35. That is, the drain of the LDMOSFET includes the n⁺-type region (which is the n⁺-type drain region 39 here) at a high impurity concentration, and the LDD region (which is the first n⁻-type drain region 37 and the second n⁻-type drain region 38) at an impurity concentration lower than that thereof. The n⁺-type region (n⁺-type drain region 39) is formed to be spaced apart from the gate electrode 35 (or the channel formation region under the gate electrode 35) via the LDD region. This allows a high breakdown voltage to be achieved. An amount of charge (impurity concentration) in the drain-side LDD region and the distance between the end portion of the gate electrode 35 and the n⁺-type drain region (high-concentration drain region) 39 along a plane (main surface of the epitaxial layer 31b) should be optimized such that the breakdown voltage of the LDMOSFET has a maximal value.

The second feature is that, in the LDMOSFET, in a source-side source formation region (n⁻-type source region 40 and n⁺-type source region 41) and the channel formation region, the punchthrough-stopper p-type wells (p-type base regions) 33 are formed. On the drain side (drain formation region) of the LDMOSFET, the p-type well 33 is not formed, or is formed only to come in contact with a part of the drain formation region closer to the channel region.

The third feature is that, in the LDMOSFET, the source (which is the source region comprised of the n⁻-type source region 40 and the n⁺-type source region 41 here) and the drain (which is the drain region comprised of the first n⁻-type drain region 37, the second n⁻-type drain region 38, and the n⁺-type drain region 39) have an asymmetrical structure relative to the gate electrode 35.

In the end portion (opposite to the end portion in contact with the n⁻-type source region 40) of the n⁺-type source region 41, a p-type punchthrough layer (p-type semiconductor region) 44 in contact with the n⁺-type source region 41 is formed. In the vicinity of the surface of the p-type punchthrough layer 44, a p⁺-type semiconductor region 45 having an impurity concentration higher than that of the p-type punchthrough layer 44 is formed. The p-type punchthrough layer 44 is a conductive layer for electrically coupling the source of the LDMOSFET to the substrate main body 31a, and is formed of, e.g., a p-type polysilicon film embedded in a trench formed in the epitaxial layer 31b. The tip portion (bottom portion) of the p-type punchthrough layer 44 reaches the substrate main body 31a. The p-type punchthrough layer 44 can also be formed of a metal layer embedded in a trench formed in the substrate 31.

In the top surfaces (upper portions) of the n⁺-type source region 41 and the p⁺-type semiconductor region 45, metal silicide layers (e.g., nickel silicide layers or cobalt silicide layers) 49 are formed using a Salicide (Self Aligned Silicide) technique or the like. Through the metal silicide layers 49, the n⁺-type source regions 41 are electrically coupled to the p⁺-type semiconductor regions 45.

Over the main surface of the epitaxial layer 31b, an insulating film (interlayer insulating film) 46 is formed so as to cover the gate electrodes 35 and the sidewall spacers 36. The insulating film 46 is comprised of a laminate film of, e.g., a thin silicon nitride film and a thick silicon oxide film provided thereover or the like. The top surface of the insulating film 46 is planarized.

In the insulating film 46, contact holes (openings or through holes) are formed. In the contact holes, plugs (embedded conductor to be coupled) 48 each formed mainly of a tungsten (W) film are embedded. The contact holes and the plugs 48 to be embedded therein are formed over the drains ($n^+$-type drain regions 39), the gate electrodes 35, and the like.

Over the insulating film 46 having the plugs 48 embedded therein, a wiring (first-layer wiring) M1 comprised of a conductor film formed mainly of aluminum (Al) or the like is formed. The wiring M1 is formed by patterning a conductor film formed over the insulating film 46 having the plugs 48 embedded therein. It is also possible to form the conductor film for the wiring M1 over the insulating film 46 so as to fill the contact holes therewith out forming the plugs 48, and pattern the conductor film to form the wiring M1 integrated with plug portions filling the contact holes. In this case, the plugs 48 are each formed of the same material as that of the wiring M1 and integrated with the wiring M1.

The wiring M1 has a gate wire M1G and drain wires M1D1, M1D2, and M1D3. Among them, the gate wire M1G is electrically coupled to the gate electrodes 7 formed in the main MOSFET region RG1 and the sense MOSFET region RG2 via the plugs 48. The drain wire M1D1 is electrically coupled to the $n^+$-type drain region 39 formed in the main MOSFET region RG1 via the plug 48. The drain wire M1D2 is electrically coupled to the $n^+$-type drain region 39 formed in the sense MOSFET region RG2 via the plug 48.

The drain wire M1D3 extends over the isolation region (not shown). Under the drain wire M1D3, no unit transistor cell is formed. That is, as can be also seen from FIGS. 82 and 83, the main MOSFET region RG1 is provided so as to avoid the drain wire M1D3 (i.e., so as not to overlap the drain wire M1D3) in planar view. However, since one end (coupled portion 15) of the drain wire M1D3 is coupled to the drain wire MID1 and the drain wires M1D3 and M1D1 are integrally formed, the drain wires MID3 and M1D1 are electrically coupled to each other. Consequently, the drain wire M1D3 is electrically coupled to the $n^+$-type drain region 39 formed in the main MOSFET region RG1 through the drain wire M1D1 and the plug 48 at a position two-dimensionally overlapping the drain wire M1D1 (in planar view).

The wiring M1 is covered with an insulating protective film (insulating film) 50 comprised of a polyimide region or the like. That is, over the insulating film 46, the protective film 50 is formed so as to cover the wiring M1. The protective film 50 is an uppermost-layer film (insulating film) in the semiconductor chip CPHa. The protective film 50 is formed with a plurality of openings 51. From each of the openings 51, a part of the wiring M1 is exposed. The wiring M1 exposed from the opening 51 serves as a pad electrode (bonding pad).

That is, of the gate wire M1G exposed from the opening 51, the foregoing gate pad PDHG of each of the foregoing power MOSFET QH1 and sense MOSFET QS1 is formed. Also, of the drain wire M1D1 exposed from the openings 51, the foregoing drain pads PDHS1a, PDHS1b, PDHS2, and PDHS3b of the foregoing power MOSFET QH1 are formed. Of the drain wire M1D3 exposed from the opening 51, the foregoing drain pad PDHS3a of the foregoing power MOSFET QH1 is formed. Also, of the drain wire M1D2 exposed from the opening 51, the foregoing drain pad PDHS4 of the foregoing sense MOSFET QS1 is formed. The foregoing drain pads PDHS1a, PDHS1b, PDHS2, and PDHS3b of the foregoing power MOSFET QH1 are separated by the uppermost-layer protective film 50, but are electrically coupled to each other through the drain wire M1D1. The foregoing drain pad PDHS3a of the foregoing power MOSFET QH1 is electrically coupled to the foregoing drain pads PDHS1a, PDHS1b, PDHS2, and PDHS3b of the foregoing power MOSFET QH1 through the drain wires M1D1 and M1D3. On the other hand, since the drain wire M1D2 is separated from the drain wires M1D1 and M1D3, the foregoing drain pad PDHS4 of the sense MOSFET QS1 is electrically isolated from the foregoing drain pads PDHS1a, PDHS1b, PDHS2, PDHS3a, and PDHS3b of the power MOSFET QH1 without being short-circuited thereto.

Over the top surfaces of the pads PDHS1a, PDHS1b, PDHS2, PDHS3a, PDHS3b, PDHS4, and PDHG (i.e., over the portions of the wiring M1 exposed at the bottom portions of the openings 51), the same metal layers (not shown here) as the foregoing metal layer 14 may also be formed by a plating method or the like.

Over the back surface (main surface opposite to the main surface formed with the epitaxial layer 31b) of the substrate 31, the back-side electrode BE1 is formed. In the foregoing first embodiment, the back-side electrode BE1 is the drain back-side electrode while, in the present embodiment, the back-side electrode BE1 is the source back-side electrode. The back-side electrode BE1 is formed over the entire back surface of the substrate 31 forming the semiconductor chip CPHa.

The sources of the LDMOSFETs ($n^-$-type source region 40 and $n^+$-type source region 41) formed in the epitaxial layer 31b in the main MOSFET region RG1 and the sense MOSFET region RG2 are electrically coupled to the substrate main body 31a via the metal silicide layers 49 and the p-type punchthrough layers 44, and are further electrically coupled to the source back-side electrode BE1 via the substrate main body 31a.

The drain of the LDMOSFET (first $n^-$-type drain region, second $n^-$-type drain region 38, and $n^+$-type drain region 39) formed in the epitaxial layer 31b in the main MOSFET region RG1 is electrically coupled to the drain pads PDHS1a, PDHS1b, PDHS2, and PDHS3b via the plugs 48 (plugs 48 disposed over the $n^+$-type drain regions 39) and the drain wire M1D1. The drain of the LDMOSFET (first $n^-$-type drain region 37, second $n^-$-type drain region 38, and $n^+$-type drain region 39) formed in the epitaxial layer 31b in the main MOSFET region RG1 is also electrically coupled to the drain pad PDHS3a via the plugs 48 (plugs 48 disposed over the $n^+$-type drain regions 39) and the drain wires M1D1 and M1D3.

The drain of the LDMOSFET (first $n^-$-type drain region 37, second $n^-$-type drain region 38, and $n^+$-type drain region 39) formed in the epitaxial layer 31b in the sense MOSFET region RG2 is electrically coupled to the drain pad PDHS4 via the plugs 48 (plugs 48 disposed over the $n^+$-type drain regions 39) and the drain wire M1D2.

The gate electrodes 35 of the LDMOSFETs formed in the epitaxial layer 31 in the main MOSFET region RG1 and the sense MOSFET region RG2 are electrically coupled to the gate pad PDHG via the plugs 48 (plugs 48 disposed over the gate electrodes 35) and the gate wire M1G.

Thus, in the present embodiment, in the semiconductor chip CPHa, the LDMOSFET for the power MOSFET QH1 and the LDMOSFET for the sense MOSFET QS1 are formed. Also, in the present embodiment, over the main surface (upper surface or top surface) of the semiconductor chip CPHa, the foregoing pads PDHS1a, PDHS1b, PDHS2, PDHS3a, PDHS3b, and PDHS4 are formed as the drain pads. Over the main surface of the semiconductor chip CPHa, the foregoing pad PDHG is formed as the gate pad while, over the back surface of the semiconductor chip CPHa, the foregoing back-side electrode BE1 is formed as the source back-side electrode.

In the present embodiment, the structure (cross-sectional structure) of the semiconductor chip CPL is basically the same as the structure (cross-sectional structure) of the semiconductor chip CPHa. In the semiconductor chip CPL, the LDMOSFET is formed over the same substrate as the foregoing substrate 31. The structure of each of the unit LDMOSFET cells formed in the semiconductor chip CPH is basically the same as that of each of the unit LDMOSFET cells in the semiconductor chip CPHa. However, in the semiconductor chip CPL, the sense MOSFET QS1 is not formed and, in the entire region obtained by combining the foregoing main MOSFET region RG1 with the sense MOSFET region RG2, the plurality of unit LDMOSFET cells forming the power MOSFET QL1 are formed. Of the plurality of unit LDMOSFET cells coupled in parallel to each other, the power MOSFET QL1 is formed.

As for the layout of the main MOSFET region RG1, the sense MOSFET region RG2, the pads PDHG, PDHS1a, PDHS1b, PDHS2, PDHS3a, PDHS3b, and PDHS4 in the semiconductor chip CPHa, it is basically the same as the chip layout of FIGS. 36 to 38 described above (first modification of the foregoing first embodiment) so that a description thereof is omitted herein. As for the layout of the gate wire M1G and the drain wires M1D1, M1D2, and M1D3 in the semiconductor chip CPHa, it is basically the same as that of the gate wire 10G and the source wires 10S1, 10S2, and 10S3 in the chip layout of FIGS. 36 to 38 described above (first modification of the foregoing first embodiment) so that a description thereof is omitted herein. The present embodiment can also be applied to the chip layout of the semiconductor chip CPH of FIGS. 10 to 12 described above, to the chip layout of the semiconductor chip CPHb of FIGS. 46 to 48 described above, and to the chip layout of the semiconductor chip CPHc of FIGS. 57 to 59 described above.

That is, in the semiconductor chips CPH, CPHa, CPHb, CPHc, and CPL of the foregoing first embodiment, by forming the LDMOSFETs instead of the trench-gate MOSFETs, it is possible to replace the source pads over the top surfaces of the chips with the drain pads, replace the drain back-side electrodes (BE1 and BE2) on the chip back surface side with the source back-side electrodes, and replace the source wires (10S1, 10S2, and 10S3) with the drain wires. In such a case also, the foregoing first embodiment is effective so that a repeated description thereof is omitted. However, by way of example, a description will be given to the case where the semiconductor chip CPHa of the present embodiment is applied to the semiconductor device SM1f of FIGS. 71 to 74 described above.

Figure 85:
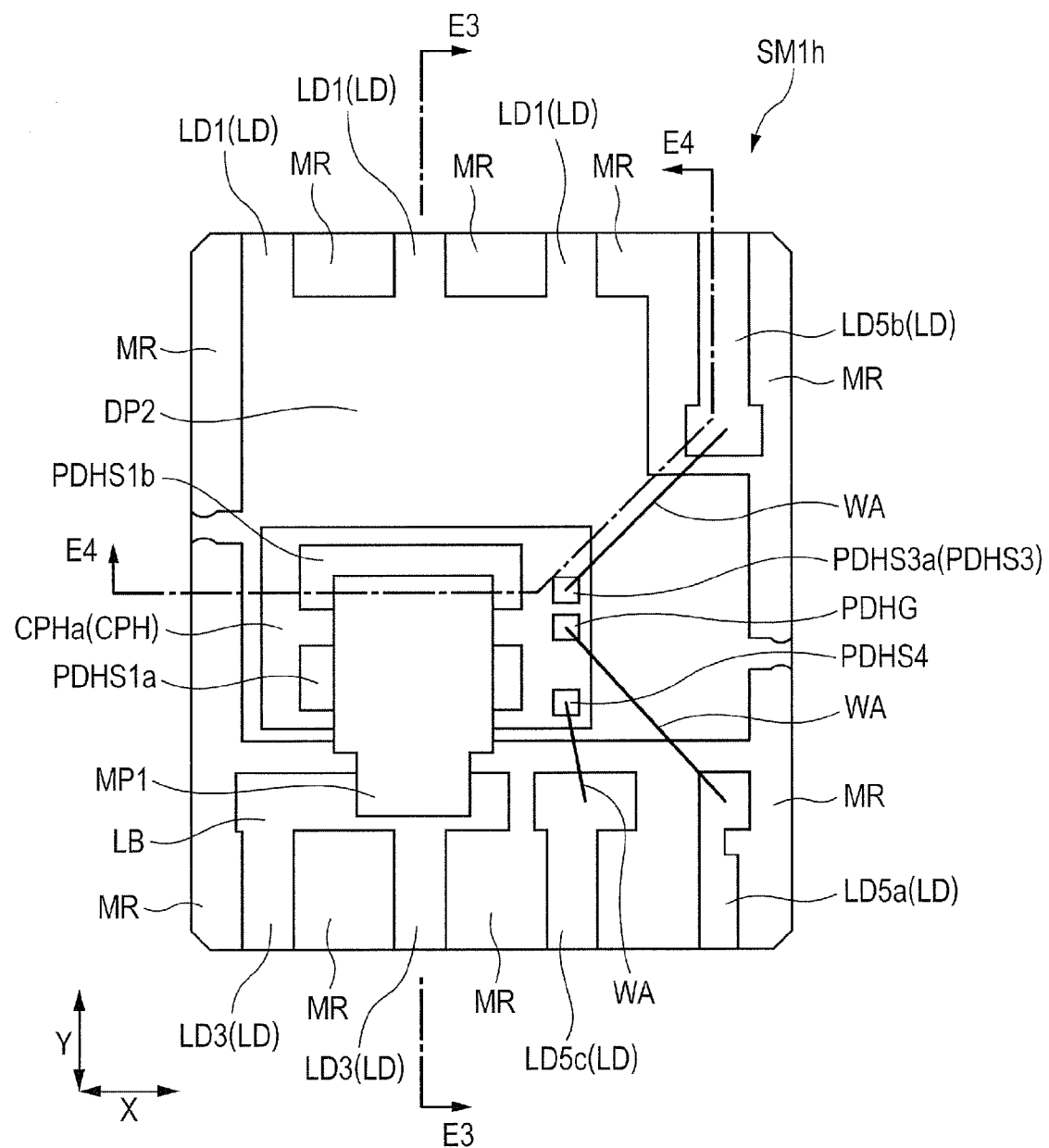
FIG. 85 is a perspective plan view of a semiconductor device using the semiconductor chip of FIGS. 80 to 84.
Figure 86:
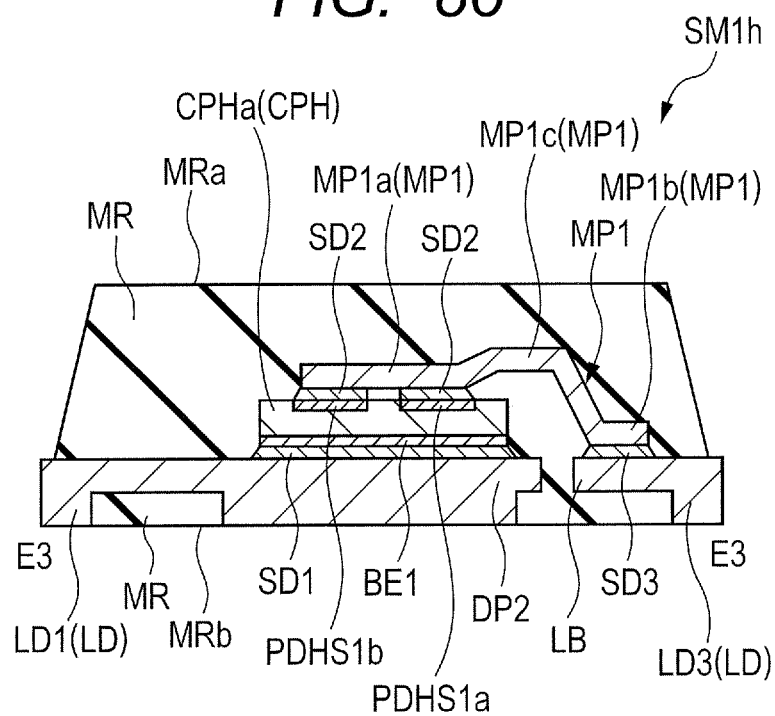
FIG. 86 is a cross-sectional view of the semiconductor device of FIG. 85.
Figure 87:
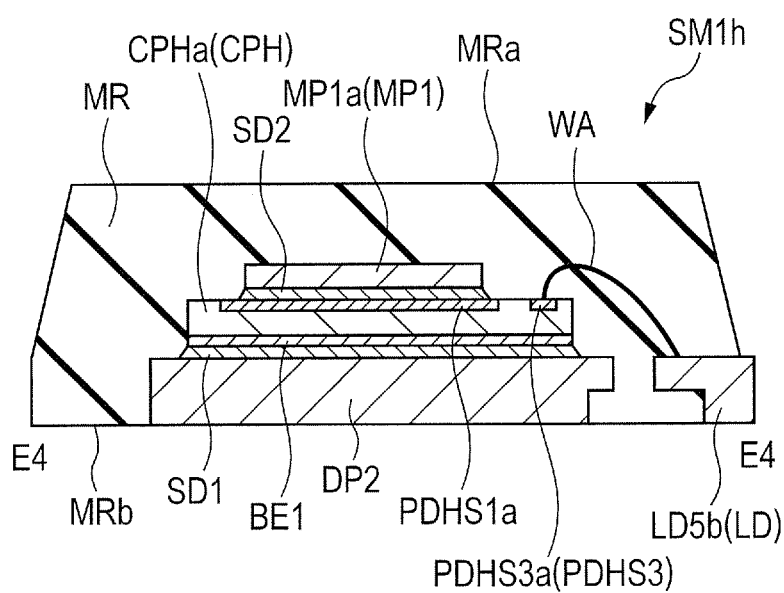
FIG. 87 is a cross-sectional, view of the semiconductor device of FIG. 85.

FIG. 85 is a perspective plan view showing the case where the semiconductor chip CPHa of the present embodiment is applied to the semiconductor device SM1f of the sixth modification of the foregoing first embodiment shown in FIGS. 71 to 74 described above, and corresponds to FIG. 72. FIGS. 86 and 87 are cross-sectional views of the semiconductor device SM1f of FIG. 85, and respectively correspond to FIGS. 73 and 74 described above. The cross-sectional view along the line E3-E3 of FIG. 85 corresponds to FIG. 86. The cross-sectional view along the line E4-E4 of FIG. 85 corresponds to FIG. 87. The semiconductor device SM1f shown in FIGS. 85 to 87 to which the semiconductor chip CPHa of the present embodiment is applied will be hereinafter referred to as a semiconductor device SM1h.

As for the difference with the semiconductor chip CPHa, it has been described above. The following is the difference between the semiconductor device SM1f of FIGS. 72 to 74 described above and the semiconductor device SM1h of FIGS. 85 to 87 with regard to the other components.

That is, in the semiconductor device SM1f of FIGS. 72 to 74 described above, the pads PDHS1a and PDHS1b of the semiconductor chip CPHa are electrically coupled to the lead wire LB via the metal plate MP1. Since the pads PDHS1a and PDHS1b are the source pads of the power MOSFET QH1, the lead wire LB (lead LD3) coupled to the pads PDHS1a and PDHS1b with the metal plate MP1 is the source lead wire of the power MOSFET QH1. Also, in the semiconductor device SM1f of FIGS. 72 to 74 described above, the pad PDHS4 of the semiconductor chip CPHa is electrically coupled to the lead LD5c via the wire WA. Since the pad PDHS4 is the source pad of the sense MOSFET QS1, the lead LD5c coupled to the pad PDHS4 with the wire WA is the source lead of the sense MOSFET QS1. Also, in the semiconductor device SM1f of FIGS. 72 to 74 described above, the pad PDHS3a of the semiconductor chip CPHa is electrically coupled to the lead LD5b via the wire WA. Since the pad PDHS3a is the source pad of the power MOSFET QH1, the lead LD5b coupled to the pad PDHS3a with the wire WA is the source lead of the power MOSFET QH1. Also, in the semiconductor device SM1f of FIGS. 72 to 74 described above, the foregoing back-side electrode BE1 of the semiconductor chip CPHa is the drain back-side electrode. Therefore, the die pad DP2 electrically coupled to the foregoing back-side electrode BE1 of the semiconductor chip CPHa via the foregoing adhesive layer SD1 and the lead LD1 coupled to the die pad DP2 are the drain die pad and the drain lead of each of the power MOSFET QH1 and the sense MOSFET QS1.

By contrast, in the semiconductor device SM1h of FIGS. 85 to 87, the pads PDHS1a and PDHS1b of the semiconductor chip CPHa are electrically coupled to the lead wire LB via the metal plate MP1. Since the pads PDHS1a and PDHS1b are the drain pads of the power MOSFET QH1, the lead wire LB (lead LD3) coupled to the pads PDHS1a and PDHS1b with the metal plate MP1 is the drain lead wire of the power MOSFET QH1. Also, in the semiconductor device SM1h of FIGS. 85 to 87, the pad PDHS4 of the semiconductor chip CPHa is electrically coupled to the lead LD5c via the wire WA. Since the pad PDHS4 is the drain pad of the sense MOSFET QS1, the lead LD5c coupled to the pad PDHS4 with the wire WA is the drain lead of the sense MOSFET QS1. Also, in the semiconductor device SM1h of FIGS. 85 to 87, the pad PDHS3a of the semiconductor chip CPHa is electrically coupled to the lead LD5b via the wire WA. Since the pad PDHS3a is the drain pad of the power MOSFET QH1, the lead LD5b coupled to the pad PDHS3a with the wire WA is the drain lead of the power MOSFET QH1. Also, in the semiconductor device SM1h of FIGS. 85 to 87, the foregoing back-side electrode BE1 of the semiconductor chip CPHa is the source back-side electrode. Therefore, the die pad DP2 electrically coupled to the foregoing back-side electrode BE1 of the semiconductor chip CPHa via the foregoing adhesive layer SD1 and the lead LD1 coupled to the die pad DP2 are the source die pad and the source lead of each of the power MOSFET QH1 and the sense MOSFET QS1.

The configuration of the semiconductor device SM1h of FIGS. 85 to 87 is basically otherwise the same as that of the semiconductor device SM1f of FIGS. 72 to 74 described above so that a description thereof is omitted herein. In the case where the present embodiment is applied to the semiconductor device SM1g of FIGS. 76 to 79 described above also, the difference is the same as in the case where the description has been given to the semiconductor device SM1h of FIGS. 85 to 88.

The semiconductor chips CPH, CPHa, CPHb, CPHc, and CPL to which the present embodiment is applied can also be applied to the foregoing semiconductor devices SM1, SM1a, SM1b, SM1c, SM1d, and SM1e.

FIG. 85 is a circuit diagram when the present embodiment is applied, and corresponds to FIG. 71 described above.

In the semiconductor chips CPH, CPHa, CPHb, and CPHc of the foregoing first embodiment, the drain of the power MOSFET QH1 is common to the drain of the sense MOSFET QS1. However, in the semiconductor chips CPH, CPHa, CPHb, and CPHc to which the present embodiment is applied, the source of the power MOSFET QH1 is common to the source of the sense MOSFET QS1. In response thereto, it is preferable to change the circuit of FIG. 71 described above to a circuit as shown in FIG. 88.

That is, in the foregoing first embodiment, the current Idh flowing in the power MOSFET QH1 is outputted from the output node N1 so that the current Ise flowing in the sense MOSFET QS1 is not outputted from the output node N1. Therefore, in the foregoing first embodiment, it is possible to directly use the current Ise and allow the current Ise to flow to the resistor RST to detect the value of the current Ise (actually, the current Ise is converted to a voltage and detected), as shown in FIG. 1 described above. On the other hand, in the case of the present embodiment, since the source of the power MOSFET QH1 is common to the source of the sense MOSFET QS1, the total sum of the current Idh flowing in the power MOSFET QH1 and the current Ise flowing in the sense MOSFET QS1 is outputted from the output node N1. Accordingly, in the circuit of FIG. 88, a current Iref equal to the current Ise flowing in the sense MOSFET QS1 is generated and allowed to flow to the resistor RST such that the value of the current Ise is detected (actually, a current Iref is converted to a voltage and detected). In this manner, the value of the current Ise flowing in the sense MOSFET QS1 can be indirectly detected. In the case of the circuit of FIG. 88 also, the description given above with reference to FIG. 1 is otherwise basically the same so that a description thereof is omitted herein.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

The present invention is effective when applied to a semiconductor device.

What is claimed is:

1. A semiconductor device, comprising:
   a first chip mounting portion;
   a first conductor lead portion;
   a first semiconductor chip having a first main surface, and a first back surface opposite to the first main surface and bonded to the first chip mounting portion; and
   a sealing portion sealing therein the first semiconductor chip, and at least a part of each of the first chip mounting portion and the first conductor lead portion,
   wherein the first semiconductor chip is formed with a first MOSFET and a second MOSFET which have respective drains thereof electrically coupled to each other, and respective gates thereof electrically coupled to each other,
   wherein the first MOSFET is formed in a first region of the first main surface of the first semiconductor chip, and the second MOSFET is configured to detect a current flowing in the first MOSFET and is formed in a second region of the first main surface of the first semiconductor chip,
   wherein the second region has an area smaller than that of the first region,
   wherein a first gate pad electrically coupled to the gates of the first and second MOSFETs, first and second source pads electrically coupled to a source of the first MOSFET, and a third source pad electrically coupled to a source of the second MOSFET are formed over the first main surface of the first semiconductor chip,
   wherein a drain electrode electrically coupled to the drains of the first and second MOSFETs is formed over the first back surface of the first semiconductor chip,
   wherein the first and second source pads are electrically coupled to the first conductor lead portion via a first conductor plate,
   wherein the first and second source pads of the first semiconductor chip are constructed to output a current flowing in the first MOSFET, and the third source pad is constructed to sense a source voltage of the first MOSFET,
   wherein a first source wire is formed over the first and second source pads, and a second source wire is formed over the third source pad,
   wherein the second source wire has one end coupled to the first source wire via a coupled portion, and
   wherein, in a plan view, the third source pad is disposed such that it does not overlap with the first conductor plate, and the coupled portion of the second source wire and the first source wire is disposed such that it overlaps with the first conductor plate, such that a resistance between the first conductor plate and the first and second source pads is a constant value which is independent of a bonding displacement of the first conductor plate with respect to the first and second source pads.

2. The semiconductor device according to claim 1, wherein, in the first main surface of the first semiconductor chip, the second source wire is formed in a same layer as that of the first source wire, and is formed in a region other than the first and second regions.

3. The semiconductor device according to claim 2, wherein the first source wire and the second source wire are integrally formed, and are separated by a slit between the first source wire and the second source wire, and
wherein, in a plan view, an end portion of the slit is disposed at a position which overlaps with the first conductor plate.

4. The semiconductor device according to claim 3, wherein the first conductor plate is a metal plate.

5. The semiconductor device according to claim 4, wherein the first conductor plate is formed of copper, a copper alloy, aluminum, or an aluminum alloy.

6. The semiconductor device according to claim 5, wherein the third source pad is electrically coupled to the source region of the first MOSFET formed in the first region via the second source wire and the first source wire.

7. The semiconductor device according to claim 6, further comprising:
   a second chip mounting portion;
   a second semiconductor chip having a second main surface, and a second back surface opposite to the second main surface and bonded to the second chip mounting portion,
   wherein the second semiconductor chip and at least a part of the second chip mounting portion are sealed in the sealing portion,
   wherein the second semiconductor chip is formed with a control circuit for controlling the first and second MOSFETs, wherein first, second, and third pads are formed over the second main surface of the second semiconductor chip, and wherein the first gate pad is electrically coupled to the first pad of the second semiconductor chip via a first wire, the second source pad is electrically coupled to the second pad of the second semiconductor chip via a second wire, and the third source pad is electrically coupled to the third pad of the second semiconductor chip via a third wire.

8. The semiconductor device according to claim 7, wherein the first MOSFET is configured to be controlled in accordance with a current flowing in the second MOSFET.

9. The semiconductor device according to claim 8, wherein the control circuit includes:

a first drive circuit coupled to the first pad in the second semiconductor chip to supply a gate signal to the gates of the first and second MOSFETs; and a first circuit coupled to the second and third pads in the second semiconductor chip and configured to control a current flowing in the second MOSFET such that an input voltage of the second pad and an input voltage of the third pad are the same.

* * * * *